United States Patent
Nakano et al.

(10) Patent No.: US 12,156,467 B2
(45) Date of Patent: Nov. 26, 2024

(54) ORGANIC ELECTROLUMINESCENCE DEVICE AND ELECTRONIC APPLIANCE USING THE SAME

(71) Applicant: IDEMITSU KOSAN CO., LTD., Tokyo (JP)

(72) Inventors: Yuki Nakano, Sodegaura (JP); Taro Yamaki, Sodegaura (JP); Satomi Tasaki, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 781 days.

(21) Appl. No.: 17/268,082

(22) PCT Filed: Aug. 14, 2019

(86) PCT No.: PCT/JP2019/031944
§ 371 (c)(1),
(2) Date: Feb. 11, 2021

(87) PCT Pub. No.: WO2020/036197
PCT Pub. Date: Feb. 20, 2020

(65) Prior Publication Data
US 2021/0336154 A1    Oct. 28, 2021

(30) Foreign Application Priority Data
Aug. 15, 2018 (JP) ................................ 2018-152971

(51) Int. Cl.
*H10K 85/60* (2023.01)
*H10K 50/11* (2023.01)
(Continued)

(52) U.S. Cl.
CPC ......... *H10K 85/6572* (2023.02); *H10K 85/40* (2023.02); *H10K 85/622* (2023.02);
(Continued)

(58) Field of Classification Search
None
See application file for complete search history.

(56) References Cited

U.S. PATENT DOCUMENTS

| 2015/0236274 A1 | 8/2015 | Hatakeyama et al. |
| 2018/0040821 A1 | 2/2018 | Hatakeyama et al. |

(Continued)

FOREIGN PATENT DOCUMENTS

| JP | 2014-096418 A | 5/2014 |
| JP | 2018-043984 A | 3/2018 |

(Continued)

OTHER PUBLICATIONS

International Search Authority, "International Preliminary Report on Patentability and Written Opinion" dated Feb. 16, 2021 for corresponding International Patent Application No. PCT/JP2019/031944.

(Continued)

*Primary Examiner* — Jeffrey D Washville
(74) *Attorney, Agent, or Firm* — Foley & Lardner LLP

(57) ABSTRACT

An organic electroluminescence device, comprising:
a cathode;
an anode; and
an emitting layer disposed between the cathode and the anode,
wherein the emitting layer includes a compound represented by the following formula (1) and a compound represented by the following formula (11),
provided that at least one of $Ar_{101}$ and $Ar_{102}$ is a monovalent group represented by the following formula (12).

(Continued)

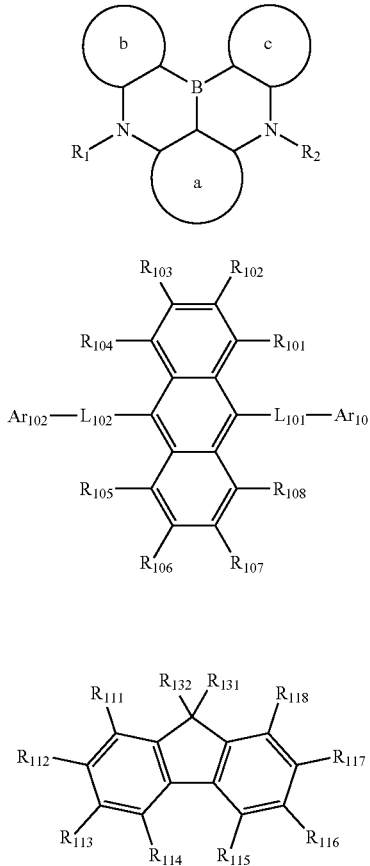

(51) Int. Cl.
*H10K 85/40* (2023.01)
*H10K 101/10* (2023.01)
(52) U.S. Cl.
CPC ....... *H10K 85/631* (2023.02); *H10K 85/6574* (2023.02); *H10K 50/11* (2023.02); *H10K 2101/10* (2023.02)

(56) References Cited

U.S. PATENT DOCUMENTS

| | | |
|---|---|---|
| 2018/0069182 A1 | 3/2018 | Hatakeyama et al. |
| 2018/0301629 A1 | 10/2018 | Hatakeyama et al. |
| 2019/0027694 A1 | 1/2019 | Hatakeyama et al. |
| 2019/0058124 A1 | 2/2019 | Hatakeyama et al. |
| 2019/0207112 A1 | 7/2019 | Hatakeyama et al. |
| 2020/0091431 A1 | 3/2020 | Hatakeyama et al. |
| 2020/0144513 A1 | 5/2020 | Hatakeyama et al. |
| 2020/0144514 A1 | 5/2020 | Hatakeyama et al. |
| 2020/0144515 A1 | 5/2020 | Hatakeyama et al. |
| 2020/0220083 A1 | 7/2020 | Hatakeyama et al. |
| 2020/0259089 A1 | 8/2020 | Hatakeyama et al. |
| 2021/0050528 A1* | 2/2021 | Cha .................. H10K 85/6576 |
| 2021/0053998 A1* | 2/2021 | Kim .................. H10K 85/6572 |

FOREIGN PATENT DOCUMENTS

| | | |
|---|---|---|
| WO | WO-2015/102118 A1 | 7/2015 |
| WO | WO-2016/143624 A1 | 9/2016 |
| WO | WO-2016/143819 A1 | 9/2016 |
| WO | WO-2016/152418 A1 | 9/2016 |
| WO | WO-2016/152544 A1 | 9/2016 |
| WO | WO-2017/126443 A1 | 7/2017 |
| WO | WO-2017/138526 A1 | 8/2017 |
| WO | WO-2017/188111 A1 | 11/2017 |
| WO | WO-2018/150832 A1 | 8/2018 |

OTHER PUBLICATIONS

International Search Authority, "International Search Report" dated Nov. 12, 2019 for corresponding International Patent Application No. PCT/JP2019/031944.

\* cited by examiner

23 Claims, 1 Drawing Sheet

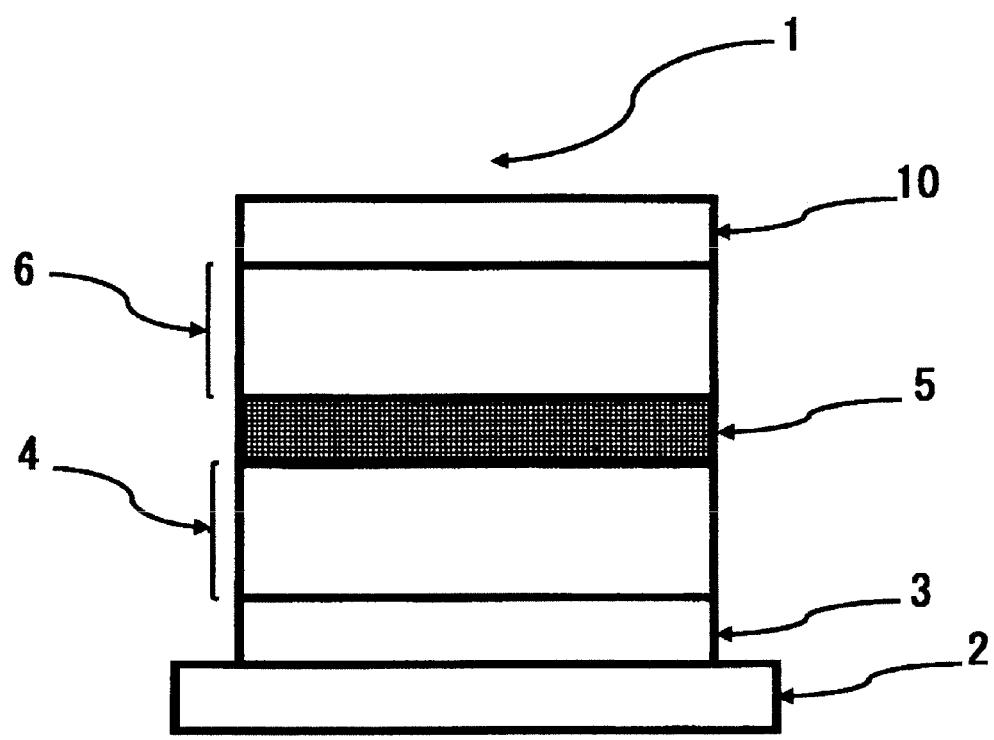

ORGANIC ELECTROLUMINESCENCE DEVICE AND ELECTRONIC APPLIANCE USING THE SAME

CROSS-REFERENCE TO RELATED APPLICATIONS

The present application claims priority under 37 U.S.C. § 371 to International Patent Application No. PCT/JP2019/031944, filed Aug. 14, 2019, which claims priority to and the benefit of Japanese Patent Application No. 2018-152971, filed on Aug. 15, 2018. The contents of these applications are hereby incorporated by reference in their entireties.

TECHNICAL FIELD

The invention relates to an organic electroluminescence device and an electronic appliance using the same.

BACKGROUND ART

When voltage is applied to an organic electroluminescence device (hereinafter, referred to as an organic EL device in several cases), holes and electrons are injected into an emitting layer from an anode and a cathode, respectively. Then, thus injected holes and electrons are recombined in the emitting layer, and excitons are formed therein.

Patent Documents 1 to 8 disclose that compounds having a specific fused ring structure are used as a dopant material of an emitting layer of an organic EL device.

RELATED ART DOCUMENTS

Patent Documents

[Patent Document 1] WO 2015/102118 A1
[Patent Document 2] WO 2016/143624 A1
[Patent Document 3] WO 2016/143819 A1
[Patent Document 4] WO 2016/152544 A1
[Patent Document 5] WO 2017/126443 A1
[Patent Document 6] WO 2017/138526 A1
[Patent Document 7] WO 2017/188111 A1
[Patent Document 8] JP 2018-043984 A

SUMMARY OF THE INVENTION

However, the organic EL devices disclosed in Patent Documents 1 to 8 did not have sufficiently high luminous efficiency, and there was room for improvement.

It is an object of the invention to provide an organic EL device having excellent luminous efficiency, and an electronic appliance using the organic EL device.

As a result of intensive studies by the inventors, it has been found that an organic EL device exhibiting a high luminous efficiency can be obtained by using in combination a compound represented by the formula (1) (dopant) and a compound having a specific structure represented by the formula (11) (host material) in an emitting layer, thereby completing the invention.

According to the invention, the following organic EL device and the electronic appliance can be provided.

1. An organic electroluminescence device, comprising:
   a cathode;
   an anode; and
   an emitting layer disposed between the cathode and the anode,
   wherein the emitting layer comprises a compound represented by the following formula (1) and a compound represented by the following formula (11):

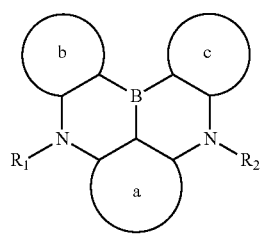

(1)

wherein in the formula (1),
ring a, ring b, and ring c are independently
a substituted or unsubstituted aromatic hydrocarbon ring including 6 to 50 carbon atoms that form a ring (hereinafter referred to as "ring carbon atoms"), or
a substituted or unsubstituted heterocyclic ring including 5 to 50 atoms that form a ring (hereinafter referred to as "ring atoms");
$R_1$ and $R_2$ independently form a substituted or unsubstituted heterocyclic ring by bonding with the ring a, the ring b, or the ring c, or do not form a substituted or unsubstituted heterocyclic ring; and
$R_1$ and $R_2$ which do not form the substituted or unsubstituted heterocyclic ring are independently
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms;

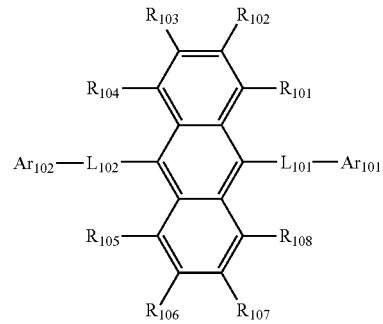

(11)

wherein in the formula (11),
$R_{101}$ to $R_{108}$ is independently
a hydrogen atom, a halogen atom, a cyano group, a nitro group,
a substituted or unsubstituted alkyl group including 1 to 50 carbon atoms,
a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$)($R_{907}$), a substituted or unsubstituted aryl group including 6 to 50 ring carbon atoms, or a substituted or unsubstituted monovalent heterocyclic group including 5 to 50 ring atoms;

adjacent two or more among $R_{101}$ to $R_{104}$, and adjacent two or more among $R_{106}$ to $R_{108}$ do not form a ring by bonding with each other, $R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms;

when two or more of each of $R_{901}$ to $R_{907}$ are present, the two or more of each of $R_{901}$ to $R_{907}$ may be the same or different;

$L_{101}$ and $L_{102}$ are independently a single bond, a substituted or unsubstituted arylene group including 6 to 30 ring carbon atoms, or a substituted or unsubstituted divalent heterocyclic group including 5 to 30 ring atoms;

at least one of $Ar_{101}$ and $Ar_{102}$ is a monovalent group represented by the following formula (12);

$Ar_{101}$ and $Ar_{102}$ which are not the monovalent group represented by the following formula (12) are a substituted or unsubstituted aryl group including 6 to 50 ring carbon atoms, or a substituted or unsubstituted monovalent heterocyclic group including 5 to 50 ring atoms; and when $Ar_{101}$ and $Ar_{102}$ are both the monovalent groups represented by the following formula (12), $Ar_{101}$ and $Ar_{102}$ which are the monovalent groups represented by the following formula (12) may be the same as or different from each other:

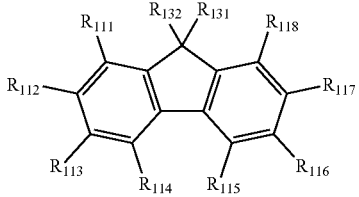

(12)

wherein in the formula (12), $R_{131}$ and $R_{132}$ are independently a hydrogen atom, a halogen atom, a cyano group, a nitro group, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, or a substituted or unsubstituted cycloalkyl group including 3 to 50 ring carbon atoms;

$R_{131}$ and $R_{132}$ do not form a ring by bonding with each other; and one or more sets of adjacent two of $R_{111}$ to $R_{118}$ form an unsaturated ring represented by the following formula (20) by bonding with each other, or do not form the unsaturated ring represented by the following formula (20):

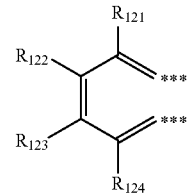

(20)

wherein in the formula (20), "***" indicates a position bonding to adjacent two among $R_{111}$ to $R_{118}$;

when one or more sets of adjacent two among $R_{111}$ to $R_{118}$ form the unsaturated ring represented by the formula (20) by bonding with each other, one of $R_{111}$ to $R_{118}$ and $R_{121}$ to $R_{124}$ which do not form the unsaturated ring represented by the formula (20) is a single bond bonding with $L_{101}$ or $L_{102}$;

when two or more of the unsaturated rings represented by the formula (20) are formed, a plurality of each of $R_{121}$ to $R_{124}$ may be the same as or different from each other, when one or more sets of adjacent two among $R_{111}$ to $R_{118}$ do not form the unsaturated ring represented by the formula (20), one of $R_{111}$ to $R_{118}$ is a single bond bonding with $L_{101}$ or $L_{102}$;

in the case when the unsaturated ring represented by the formula (20) is formed and in the case when the unsaturated ring represented by the formula (20) is not formed, one or more sets of adjacent two among $R_{111}$ to $R_{118}$ which do not form the unsaturated ring represented by the formula (20) and are not a single bond bonding with $L_{101}$ or $L_{102}$ form a substituted or unsubstituted, saturated or unsaturated ring other than the unsaturated ring represented by the formula (20) or do not form a substituted or unsubstituted, saturated or unsaturated ring;

$R_{111}$ to $R_{118}$ which do not form the unsaturated ring represented by the formula (20), do not form a substituted or unsubstituted, saturated or unsaturated ring other than the unsaturated ring represented by the formula (20), and are not a single bond bonding with $L_{101}$ or $L_{102}$, and $R_{121}$ to $R_{124}$ which are not a single bond bonding with $L_{101}$ or $L_{102}$ are independently a hydrogen atom, a halogen atom, a cyano group, a nitro group, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$)($R_{907}$), a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formula (11).

2. An electronic appliance provided with the organic electroluminescence device according to 1.

According to the invention, an organic EL device having excellent luminous efficiency and an electronic appliance using the organic EL device can be provided.

BRIEF DESCRIPTION OF THE DRAWINGS

The FIGURE is a diagram showing a schematic configuration of an aspect of an organic EL device of the invention.

MODE FOR CARRYING OUT THE INVENTION

Definition

In this specification, a hydrogen atom means an atom including isotopes different in the number of neutrons, namely, a protium, a deuterium and a tritium.

In this specification, to a bondable position in which a symbol such as "R", or "D" representing a deuterium atom is not specified in a chemical formula, a hydrogen atom, that is, a light hydrogen atom, a deuterium atom, or a tritium atom is bonded thereto.

In this specification, a term "ring carbon atoms" represents the number of carbon atoms among atoms forming a subject ring itself of a compound having a structure in which atoms are bonded in a ring form (for example, a monocyclic compound, a fused ring compound, a cross-linked compound, a carbocyclic compound or a heterocyclic compound). When the subject ring is substituted by a substituent, the carbon contained in the substituent is not included in the number of ring carbon atoms. The same shall apply to the "ring carbon atoms" described below, unless otherwise noted. For example, a benzene ring has 6 ring carbon atoms, a naphthalene ring has 10 ring carbon atoms, a pyridine ring has 5 ring carbon atoms, and a furan ring has 4 ring carbon atoms. Further, for example, a 9,9-diphenylfluorenyl group has 13 ring carbon atoms, and a 9,9'-spirobifluorenyl group has 25 ring carbon atoms.

Further, when the benzene ring or the naphthalene ring is substituted by an alkyl group as a substituent, for example, the number of carbon atoms of the alkyl group is not included in the ring carbon atoms.

In this specification, a term "ring atoms" represents the number of atoms forming a subject ring itself of a compound having a structure in which atoms are bonded in a ring form (for example, a monocycle, a fused ring and a ring assembly) (for example, a monocyclic compound, a fused ring compound, a cross-linked compound, a carbocyclic compound or a heterocyclic compound). The term "ring atoms" does not include atoms which do not form the ring (for example, a hydrogen atom which terminates a bond of the atoms forming the ring) or atoms contained in a substituent when the ring is substituted by the substituent. The same shall apply to the "ring atoms" described below, unless otherwise noted. For example, a pyridine ring has 6 ring atoms, a quinazoline ring has 10 ring atoms, and a furan ring has 5 ring atoms. A hydrogen atom bonded with a carbon atom of the pyridine ring or the quinazoline ring or an atom forming the substituent is not included in the number of the ring atoms.

In this specification, a term "XX to YY carbon atoms" in an expression of "substituted or unsubstituted ZZ group including XX to YY carbon atoms" represents the number of carbon atoms when the ZZ group is unsubstituted. The number of carbon atoms of a substituent when the ZZ group is substituted is not included. Here, "YY" is larger than "XX", and "XX" and "YY" each mean an integer of 1 or more.

In this specification, a term "XX to YY atoms" in an expression of "substituted or unsubstituted ZZ group including XX to YY atoms" represents the number of atoms when the ZZ group is unsubstituted. The number of atoms of a substituent when the group is substituted is not included. Here, "YY" is larger than "XX", and "XX" and "YY" each mean an integer of 1 or more.

A term "unsubstituted" in the case of "substituted or unsubstituted ZZ group" means that the ZZ group is not substituted by a substituent, and a hydrogen atom is bonded therewith. Alternatively, a term "substituted" in the case of "substituted or unsubstituted ZZ group" means that one or more hydrogen atoms in the ZZ group are substituted by a substituent. Similarly, a term "substituted" in the case of "BB group substituted by an AA group" means that one or more hydrogen atoms in the BB group are substituted by the AA group.

Hereinafter, the substituent described herein will be described.

The number of the ring carbon atoms of the "unsubstituted aryl group" described herein is 6 to 50, preferably 6 to 30, and more preferably 6 to 18, unless otherwise specified.

The number of the ring carbon atoms of the "unsubstituted heterocyclic group" described herein is 5 to 50, preferably 5 to 30, and more preferably 5 to 18, unless otherwise specified.

The number of the carbon atoms of the "unsubstituted alkyl group" described herein is 1 to 50, preferably 1 to 20, and more preferably 1 to 6, unless otherwise specified.

The number of the carbon atoms of the "unsubstituted alkenyl group" described herein is 2 to 50, preferably 2 to 20, and more preferably 2 to 6, unless otherwise specified.

The number of the carbon atoms of the "unsubstituted alkynyl group" described herein is 2 to 50, preferably 2 to 20, and more preferably 2 to 6, unless otherwise specified.

The number of the ring carbon atoms of the "unsubstituted cycloalkyl group" described herein is 3 to 50, preferably 3 to 20, and more preferably 3 to 6, unless otherwise specified.

The number of the ring carbon atoms of the "unsubstituted arylene group" described herein is 6 to 50, preferably 6 to 30, and more preferably 6 to 18, unless otherwise specified.

The number of the ring atoms of the "unsubstituted divalent heterocyclic group" described herein is 5 to 50, preferably 5 to 30, and more preferably 5 to 18, unless otherwise specified.

The number of the carbon atoms of the "unsubstituted alkylene group" described herein is 1 to 50, preferably 1 to 20, and more preferably 1 to 6, unless otherwise specified.

Specific examples (specific example group G1) of the "substituted or unsubstituted aryl group" described herein include an unsubstituted aryl group and a substituted aryl group described below. (Here, a term "unsubstituted aryl group" refers to a case where the "substituted or unsubstituted aryl group" is the "unsubstituted aryl group," and a term "substituted aryl group" refers to a case where the "substituted or unsubstituted aryl group" is the "substituted aryl group". Hereinafter, a case of merely "aryl group" includes both the "unsubstituted aryl group" and the "substituted aryl group".

The "substituted aryl group" refers to a case where the "unsubstituted aryl group" has a substituent, and specific examples thereof include a group in which the "unsubstituted aryl group" has the substituent, and a substituted aryl group described below. It should be noted that examples of the "unsubstituted aryl group" and examples of the "substituted aryl group" listed herein are only one example, and the "substituted aryl group" described herein also includes a group in which a group in which "unsubstituted aryl group" has a substituent further has a substituent, and a group in which "substituted aryl group" further has a substituent, and the like.

An unsubstituted aryl group:
a phenyl group,
a p-biphenyl group,
an m-biphenyl group,
an o-biphenyl group,
a p-terphenyl-4-yl group,
a p-terphenyl-3-yl group,
a p-terphenyl-2-yl group,
an m-terphenyl-4-yl group,
an m-terphenyl-3-yl group,
an m-terphenyl-2-yl group,
an o-terphenyl-4-yl group,
an o-terphenyl-3-yl group,
an o-terphenyl-2-yl group,
a 1-naphthyl group,
a 2-naphthyl group,
an anthryl group,
a benzanthryl group,
a phenanthryl group,
a benzophenanthryl group,
a phenalenyl group,
a pyrenyl group,
a chrysenyl group,
a benzochrysenyl group,
a triphenylenyl group,
a benzotriphenylenyl group,
a tetracenyl group,
a pentacenyl group,
a fluorenyl group,
a 9,9'-spirobifluorenyl group,
a benzofluorenyl group,
a dibenzofluorenyl group,
a fluoranthenyl group,
a benzofluoranthenyl group, and
a perylenyl group.

A substituted aryl group:
an o-tolyl group,
an m-tolyl group,
a p-tolyl group,
a p-xylyl group,
an m-xylyl group,
an o-xylyl group,
a p-isopropyl phenyl group,
an m-isopropyl phenyl group,
an o-isopropyl phenyl group,
a p-t-butylphenyl group,
an m-t-butylphenyl group,
an o-t-butylphenyl group,
a 3,4,5-trimethylphenyl group,
a 9,9-dimethylfluorenyl group,
a 9,9-diphenylfluorenyl group
a 9,9-di(4-methylphenyl)fluorenyl group,
a 9,9-di(4-isopropylphenyl)fluorenyl group,
a 9,9-di(4-t-butylphenyl)fluorenyl group,
a cyanophenyl group,
a triphenylsilylphenyl group,
a trimethylsilylphenyl group,
a phenylnaphthyl group, and
a naphthylphenyl group.

The "heterocyclic group" described herein is a ring group including at least one hetero atom in the ring atom. Specific examples of the hetero atom include a nitrogen atom, an oxygen atom, a sulfur atom, a silicon atom, a phosphorus atom and a boron atom.

The "heterocyclic group" described herein may be a monocyclic group, or a fused ring group.

The "heterocyclic group" described herein may be an aromatic heterocyclic group, or an aliphatic heterocyclic group.

Specific examples (specific example group G2) of the "substituted or unsubstituted heterocyclic group" include an unsubstituted heterocyclic group and a substituted heterocyclic group described below. (Here, the unsubstituted heterocyclic group refers to a case where the "substituted or unsubstituted heterocyclic group" is the "unsubstituted heterocyclic group," and the substituted heterocyclic group refers to a case where the "substituted or unsubstituted heterocyclic group" is the "substituted heterocyclic group". Hereinafter, the case of merely "heterocyclic group" includes both the "unsubstituted heterocyclic group" and the "substituted heterocyclic group".

The "substituted heterocyclic group" refers to a case where the "unsubstituted heterocyclic group" has a substituent, and specific examples thereof include a group in which the "unsubstituted heterocyclic group" has a substituent, and a substituted heterocyclic group described below. It should be noted that examples of the "unsubstituted heterocyclic group" and examples of the "substituted heterocyclic group" listed herein are merely one example, and the "substituted heterocyclic group" described herein also includes a group in which "unsubstituted heterocyclic group" which has a substituent further has a substituent, and a group in which "substituted heterocyclic group" further has a substituent, and the like.

An unsubstituted heterocyclic group including a nitrogen atom:
a pyrrolyl group,
an imidazolyl group,
a pyrazolyl group,
a triazolyl group,
a tetrazolyl group,
an oxazolyl group,
an isoxazolyl group,
an oxadiazolyl group,
a thiazolyl group,
an isothiazolyl group,
a thiadiazolyl group,
a pyridyl group,
a pyridazinyl group,
a pyrimidinyl group,
a pyrazinyl group,
a triazinyl group,
an indolyl group,
an isoindolyl group,
an indolizinyl group, a quinolizinyl group,
a quinolyl group,
an isoquinolyl group,
a cinnolyl group,
a phthalazinyl group,
a quinazolinyl group,
a quinoxalinyl group,
a benzimidazolyl group,
an indazolyl group,
a phenanthrolinyl group,
a phenanthridinyl group
an acridinyl group,
a phenazinyl group,
a carbazolyl group,
a benzocarbazolyl group,
a morpholino group,
a phenoxazinyl group,
a phenothiazinyl group,
an azacarbazolyl group, and
a diazacarbazolyl group.

An unsubstituted heterocyclic group including an oxygen atom:
a furyl group,
an oxazolyl group,
an isoxazolyl group,
an oxadiazolyl group,
a xanthenyl group,
a benzofuranyl group,
an isobenzofuranyl group,
a dibenzofuranyl group,
a naphthobenzofuranyl group,
a benzoxazolyl group,
a benzisoxazolyl group,
a phenoxazinyl group,
a morpholino group,
a dinaphthofuranyl group,
an azadibenzofuranyl group,
a diazadibenzofuranyl group,
an azanaphthobenzofuranyl group, and
a diazanaphthobenzofuranyl group.

An unsubstituted heterocyclic group including a sulfur atom:
a thienyl group,
a thiazolyl group,
an isothiazolyl group,
a thiadiazolyl group,
a benzothiophenyl group,
an isobenzothiophenyl group,
a dibenzothiophenyl group,
a naphthobenzothiophenyl group,
a benzothiazolyl group,
a benzisothiazolyl group,
a phenothiazinyl group,
a dinaphthothiophenyl group,
an azadibenzothiophenyl group,
a diazadibenzothiophenyl group,
an azanaphthobenzothiophenyl group, and
a diazanaphthobenzothiophenyl group.

A substituted heterocyclic group including a nitrogen atom:
a (9-phenyl)carbazolyl group,
a (9-biphenylyl)carbazolyl group,
a (9-phenyl)phenylcarbazolyl group,
a (9-naphthyl)carbazolyl group,
a diphenylcarbazol-9-yl group,
a phenylcarbazol-9-yl group,
a methylbenzimidazolyl group,
an ethylbenzimidazolyl group,
a phenyltriazinyl group,
a biphenylyltriazinyl group,
a diphenyltriazinyl group,
a phenylquinazolinyl group, and
a biphenylylquinazolinyl group.

A substituted heterocyclic group including an oxygen atom:
a phenyldibenzofuranyl group,
a methyldibenzofuranyl group,
a t-butyldibenzofuranyl group, and
a monovalent residue of spiro[9H-xanthene-9,9'-[4H]fluorene].

A substituted heterocyclic group including a sulfur atom:
a phenyldibenzothiophenyl group,
a methyldibenzothiophenyl group,
a t-butyldibenzothiophenyl group, and
a monovalent residue of spiro[9H-thioxantene-9,9'-[4H]fluorene].

A monovalent group derived from the following unsubstituted heterocyclic ring containing at least one of a nitrogen atom, an oxygen atom and a sulfur atom by removal of one hydrogen atom bonded to the ring atoms thereof, and a monovalent group in which a monovalent group derived from the following unsubstituted heterocyclic ring has a substituent by removal of one hydrogen atom bonded to the ring atoms thereof:

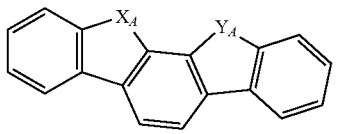

(XY-1)

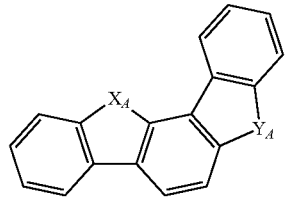

(XY-2)

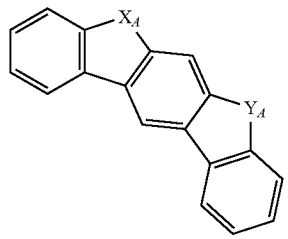

(XY-3)

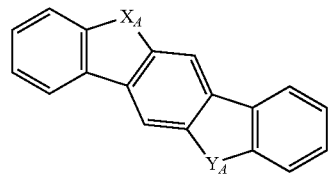

(XY-4)

(XY-5)
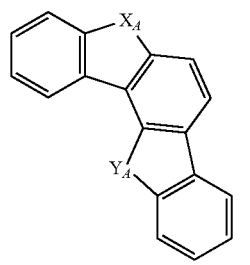

(XY-6)
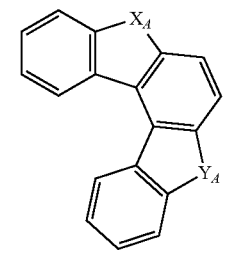

(XY-7)
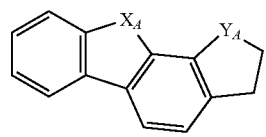

(XY-8)
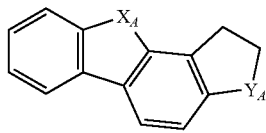

(XY-9)
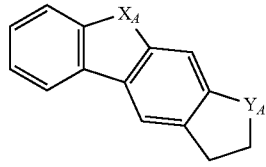

(XY-10)
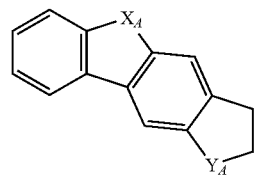

(XY-11)
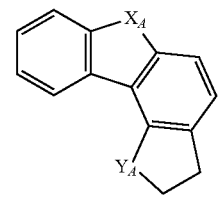

(XY-12)
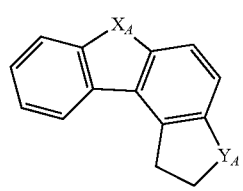

(XY-13)
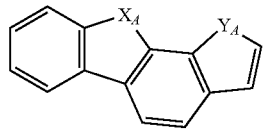

(XY-14)
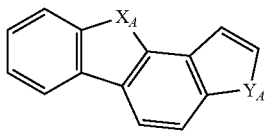

(XY-15)
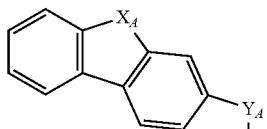

(XY-16)
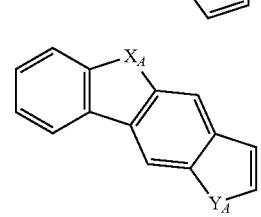

(XY-17)
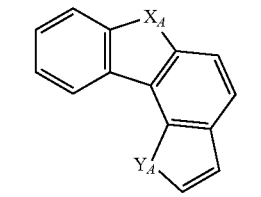

(XY-18)
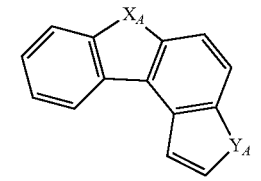

In the formulas (XY-1) to (XY-18), $X_A$ and $Y_A$ are independently an oxygen atom, a sulfur atom, NH or $CH_2$. However, at least one of $X_A$ and $Y_A$ is an oxygen atom, a sulfur atom or NH.

The heterocyclic ring represented by the formulas (XY-1) to (XY-18) becomes a monovalent heterocyclic group including a bond at an arbitrary position.

An expression "the monovalent group derived from the unsubstituted heterocyclic ring represented by the formulas (XY-1) to (XY-18) has a substituent" refers to a case where the hydrogen atom bonded with the carbon atom which constitutes a skeleton of the formulas is substituted by a substituent, or a state in which $X_A$ or $Y_A$ is NH or $CH_2$, and the hydrogen atom in the NH or $CH_2$ is replaced with a substituent.

Specific examples (specific example group G3) of the "substituted or unsubstituted alkyl group" include an unsubstituted alkyl group and a substituted alkyl group described below. (Here, the unsubstituted alkyl group refers to a case where the "substituted or unsubstituted alkyl group" is the "unsubstituted alkyl group," and the substituted alkyl group refers to a case where the "substituted or unsubstituted alkyl group" is the "substituted alkyl group"). Hereinafter, the case of merely "alkyl group" includes both the "unsubstituted alkyl group" and the "substituted alkyl group".

The "substituted alkyl group" refers to a case where the "unsubstituted alkyl group" has a substituent, and specific examples thereof include a group in which the "unsubstituted alkyl group" has a substituent, and a substituted alkyl group described below. It should be noted that examples of the "unsubstituted alkyl group" and examples of the "substituted alkyl group" listed herein are merely one example, and the "substituted alkyl group" described herein also includes a group in which "unsubstituted alkyl group" has a substituent further has a substituent, a group in which "substituted alkyl group" further has a substituent, and the like.

An unsubstituted alkyl group:
a methyl group,
an ethyl group,
an n-propyl group,
an isopropyl group,
an n-butyl group,
an isobutyl group,
a s-butyl group, and
a t-butyl group.
A substituted alkyl group:
a heptafluoropropyl group (including an isomer),
a pentafluoroethyl group,
a 2,2,2-trifluoroethyl group, and
a trifluoromethyl group.

Specific examples (specific example group G4) of the "substituted or unsubstituted alkenyl group" include an unsubstituted alkenyl group and a substituted alkenyl group described below. (Here, the unsubstituted alkenyl group refers to a case where the "substituted or unsubstituted alkenyl group" is the "unsubstituted alkenyl group," and the substituted alkenyl group refers to a case where the "substituted or unsubstituted alkenyl group" is the "substituted alkenyl group"). Hereinafter, the case of merely "alkenyl group" includes both the "unsubstituted alkenyl group" and the "substituted alkenyl group".

The "substituted alkenyl group" refers to a case where the "unsubstituted alkenyl group" has a substituent, and specific examples thereof include a group in which the "unsubstituted alkenyl group" has a substituent, and a substituted alkenyl group described below. It should be noted that examples of the "unsubstituted alkenyl group" and examples of the "substituted alkenyl group" listed herein are merely one example, and the "substituted alkenyl group" described herein also includes a group in which "unsubstituted alkenyl group" has a substituent further has a substituent, a group in which "substituted alkenyl group" further has a substituent, and the like.

An unsubstituted alkenyl group and a substituted alkenyl group:
a vinyl group,
an allyl group,
a 1-butenyl group,
a 2-butenyl group,
a 3-butenyl group,
a 1,3-butanedienyl group,
a 1-methylvinyl group,
a 1-methylallyl group,
a 1,1-dimethylallyl group,
a 2-methylallyl group, and
a 1,2-dimethylallyl group.

Specific examples (specific example group G5) of the "substituted or unsubstituted alkynyl group" include an unsubstituted alkynyl group described below. (Here, the unsubstituted alkynyl group refers to a case where the "substituted or unsubstituted alkynyl group" is the "unsubstituted alkynyl group"). Hereinafter, a case of merely "alkynyl group" includes both the "unsubstituted alkynyl group" and the "substituted alkynyl group".

The "substituted alkynyl group" refers to a case where the "unsubstituted alkynyl group" has a substituent, and specific examples thereof include a group in which the "unsubstituted alkynyl group" described below has a substituent.

An unsubstituted alkynyl group:
an ethynyl group.

Specific examples (specific example group G6) of the "substituted or unsubstituted cycloalkyl group" described herein include an unsubstituted cycloalkyl group and a substituted cycloalkyl group described below. (Here, the unsubstituted cycloalkyl group refers to a case where the "substituted or unsubstituted cycloalkyl group" is the "unsubstituted cycloalkyl group," and the substituted cycloalkyl group refers to a case where the "substituted or unsubstituted cycloalkyl group" is the "substituted cycloalkyl group"). Hereinafter, a case of merely "cycloalkyl group" includes both the "unsubstituted cycloalkyl group" and the "substituted cycloalkyl group".

The "substituted cycloalkyl group" refers to a case where the "unsubstituted cycloalkyl group" a the substituent, and specific examples thereof include a group in which the "unsubstituted cycloalkyl group" has a substituent, and a substituted cycloalkyl group described below. It should be noted that examples of the "unsubstituted cycloalkyl group" and examples of the "substituted cycloalkyl group" listed herein are merely one example, and the "substituted cycloalkyl group" described herein also includes a group in which "unsubstituted cycloalkyl group" has a substituent further has a substituent, a group in which "substituted cycloalkyl group" further has a substituent, and the like.

An unsubstituted aliphatic ring group:
a cyclopropyl group,
a cyclobutyl group,
a cyclopentyl group,
a cyclohexyl group,
a 1-adamantyl group,
a 2-adamantyl group,
a 1-norbornyl group, and
a 2-norbornyl group.
A substituted cycloalkyl group:
a 4-methylcyclohexyl group.

Specific examples (specific example group G7) of the group represented by —Si($R_{901}$)($R_{902}$)($R_{903}$) described herein include
—Si(G1)(G1)(G1),
—Si(G1)(G2)(G2),
—Si(G1)(G1)(G2),
—Si(G2)(G2)(G2),
—Si(G3)(G3)(G3),
—Si(G5)(G5)(G5), and
—Si(G6)(G6)(G6).
In which,
G1 is the "aryl group" described in the specific example group G1.
G2 is the "heterocyclic group" described in the specific example group G2.
G3 is the "alkyl group" described in the specific example group G3.
G5 is the "alkynyl group" described in the specific example group G5.
G6 is the "cycloalkyl group" described in the specific example group G6.

Specific examples (specific example group G8) of the group represented by —O—($R_{904}$) described herein include
- —O(G1),
- —O(G2),
- —O(G3), and
- —O(G6).

In which,

G1 is the "aryl group" described in the specific example group G1.

G2 is the "heterocyclic group" described in the specific example group G2.

G3 is the "alkyl group" described in the specific example group G3.

G6 is the "cycloalkyl group" described in the specific example group G6.

Specific examples (specific example group G9) of the group represented by —S—($R_{905}$) described herein include
- —S(G1),
- —S(G2),
- —S(G3), and
- —S(G6).

In which,

G1 is the "aryl group" described in the specific example group G1.

G2 is the "heterocycle group" described in the specific example group G2.

G3 is the "alkyl group" described in the specific example group G3.

G6 is the "cycloalkyl group" described in the specific example group G6.

Specific examples (specific example group G10) of the group represented by —N($R_{906}$)($R_{907}$) described herein include
- —N(G1)(G1),
- —N(G2)(G2),
- —N(G1)(G2),
- —N(G3)(G3), and
- —N(G6)(G6).

In which,

G1 is the "aryl group" described in the specific example group G1.

G2 is the "heterocycle group" described in the specific example group G2.

G3 is the "alkyl group" described in the specific example group G3.

G6 is the "cycloalkyl group" described in the specific example group G6.

Specific examples (specific example group G11) of the "halogen atom" described herein include a fluorine atom, a chlorine atom, a bromine atom and an iodine atom.

Specific examples of the "alkoxy group" described herein include a group represented by —O(G3), where G3 is the "alkyl group" described in the specific example group G3. The number of carbon atoms of the "unsubstituted alkoxy group" are 1 to 50, preferably 1 to 30, and more preferably 1 to 18, unless otherwise specified.

Specific examples of the "alkylthio group" described herein include a group represented by —S(G3), where G3 is the "alkyl group" described in the specific example group G3. The number of carbon atoms of the "unsubstituted alkylthio group" are 1 to 50, preferably 1 to 30, and more preferably 1 to 18, unless otherwise specified.

Specific examples of the "aryloxy group" described herein include a group represented by —O(G1), where G1 is the "aryl group" described in the specific example group G1. The number of ring carbon atoms of the "unsubstituted aryloxy group" are 6 to 50, preferably 6 to 30, and more preferably 6 to 18, unless otherwise specified.

Specific examples of the "arylthio group" described herein include a group represented by —S(G1), where G1 is the "aryl group" described in the specific example group G1. The number of ring carbon atoms of the "unsubstituted arylthio group" are 6 to 50, preferably 6 to 30, and more preferably 6 to 18, unless otherwise specified.

Specific examples of the "aralkyl group" described herein include a group represented by -(G3)-(G1), where G3 is the "alkyl group" described in the specific example group G3, and G1 is the "aryl group" described in the specific example group G1. Accordingly, the "aralkyl group" is one embodiment of the "substituted alkyl group" substituted by the "aryl group". The number of carbon atoms of the "unsubstituted aralkyl group," which is the "unsubstituted alkyl group" substituted by the "unsubstituted aryl group," are 7 to 50, preferably 7 to 30, and more preferably 7 to 18, unless otherwise specified.

Specific example of the "aralkyl group" include a benzyl group, a 1-phenylethyl group, a 2-phenylethyl group, a 1-phenylisopropyl group, a 2-phenylisopropyl group, a phenyl-t-butyl group, an α-naphthylmethyl group, a 1-α-naphthylethyl group, a 2-α-naphthylethyl group, a 1-α-naphthylisopropyl group, a 2-α-naphthylisopropyl group, a β-naphthylmethyl group, a 1-β-naphthylethyl group, a 2-β-naphthylethyl group, a 1-β-naphthylisopropyl group, and a 2-β-naphthylisopropyl group.

The substituted or unsubstituted aryl group described herein is, unless otherwise specified, preferably a phenyl group, a p-biphenyl group, an m-biphenyl group, an o-biphenyl group, a p-terphenyl-4-yl group, a p-terphenyl-3-yl group, a p-terphenyl-2-yl group, an m-terphenyl-4-yl group, an m-terphenyl-3-yl group, an m-terphenyl-2-yl group, an o-terphenyl-4-yl group, an o-terphenyl-3-yl group, an o-terphenyl-2-yl group, a 1-naphthyl group, a 2-naphthyl group, an anthryl group, a phenanthryl group, a pyrenyl group, a chrysenyl group, a triphenylenyl group, a fluorenyl group, a 9,9'-spirobifluorenyl group, a 9,9-diphenylfluorenyl group, or the like.

The substituted or unsubstituted heterocyclic group described herein is, unless otherwise specified, preferably a pyridyl group, a pyrimidinyl group, a triazinyl group, a quinolyl group, an isoquinolyl group, a quinazolinyl group, a benzimidazolyl group, a phenanthrolinyl group, a carbazolyl group (a 1-carbazolyl group, a 2-carbazolyl group, a 3-carbazolyl group, a 4-carbazolyl group, or a 9-carbazolyl group), a benzocarbazolyl group, an azacarbazolyl group, a diazacarbazolyl group, a dibenzofuranyl group, a naphthobenzofuranyl group, an azadibenzofuranyl group, a diazadibenzofuranyl group, a dibenzothiophenyl group, a naphthobenzothiophenyl group, an azadibenzothiophenyl group, a diazadibenzothiophenyl group, a (9-phenyl)carbazolyl group (a (9-phenyl)carbazol-1-yl group, a (9-phenyl)carbazol-2-yl group, a (9-phenyl)carbazol-3-yl group, or a (9-phenyl)carbazol-4-yl group), a (9-biphenylyl)carbazolyl group, a (9-phenyl)phenylcarbazolyl group, a diphenylcarbazole-9-yl group, a phenylcarbazol-9-yl group, a phenyltriazinyl group, a biphenylyltriazinyl group, diphenyltriazinyl group, a phenyldibenzofuranyl group, a phenyldibenzothiophenyl group, an indrocarbazolyl group, a pyrazinyl group, a pyridazinyl group, a quinazolinyl group, a cinnolinyl group, a phthalazinyl group, a quinoxalinyl group, a pyrrolyl group, an indolyl group, a pyrrolo[3,2,1-jk]carbazolyl group, a furanyl group, a benzofuranyl group, a thiophenyl group, a benzothiophenyl group, a pyrazolyl group, an imidazolyl group, a benzimidazolyl group, a triazolyl group, an oxazolyl group, a benzoxazolyl group, a thiazolyl group, a benzothiazolyl group, an isothiazolyl group, a benzisothiazolyl group, a thiadiazolyl group, an isoxazolyl group, a benzisoxazolyl group, a pyrrolidinyl group, a piperidinyl group, a piperazinyl group, an imidazolidinyl group, an indro[3,2,1-jk]carbazolyl group, a dibenzothiophenyl group, or the like.

The dibenzofuranyl group and the dibenzothiophenyl group as described above are specifically any group described below, unless otherwise specified.

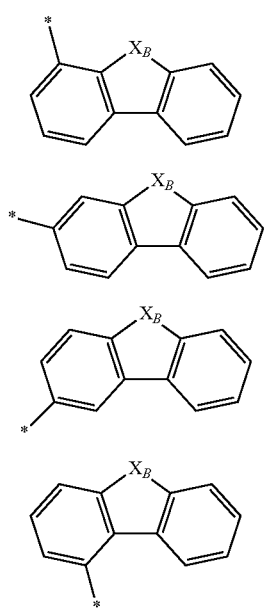

In the formulas (XY-76) to (XY-79), $X_B$ is an oxygen atom or a sulfur atom.

The substituted or unsubstituted alkyl group described herein is, unless otherwise specified, preferably a methyl group, an ethyl group, a propyl group, an isopropyl group, an n-butyl group, an isobutyl group, a t-butyl group, or the like.

The "substituted or unsubstituted arylene group" descried herein refers to a group in which the above-described "aryl group" is converted into divalence, unless otherwise specified. Specific examples (specific example group G12) of the "substituted or unsubstituted arylene group" include a group in which the "aryl group" described in the specific example group G1 is converted into divalence. Namely, specific examples (specific example group G12) of the "substituted or unsubstituted arylene group" refer to a group derived from the "aryl group" described in specific example group G1 by removal of one hydrogen atom bonded to the ring carbon atoms thereof.

Specific examples (specific example group G13) of the "substituted or unsubstituted divalent heterocyclic group" include a group in which the "heterocyclic group" described in the specific example group G2 is converted into divalence. Namely, specific examples (specific example group G13) of the "substituted or unsubstituted divalent heterocyclic group" refer to a group derived from the "heterocyclic group" described in specific example group G2 by removal of one hydrogen atom bonded to the ring atoms thereof.

Specific examples (specific example group G14) of the "substituted or unsubstituted alkylene group" include a group in which the "alkyl group" described in the specific example group G3 is converted into divalence. Namely, specific examples (specific example group G14) of the "substituted or unsubstituted alkylene group" refer to a group derived from the "alkyl group" described in specific example group G3 by removal of one hydrogen atom bonded to the carbon atoms constituting the alkane structure thereof.

The substituted or unsubstituted arylene group described herein is any group described below, unless otherwise specified.

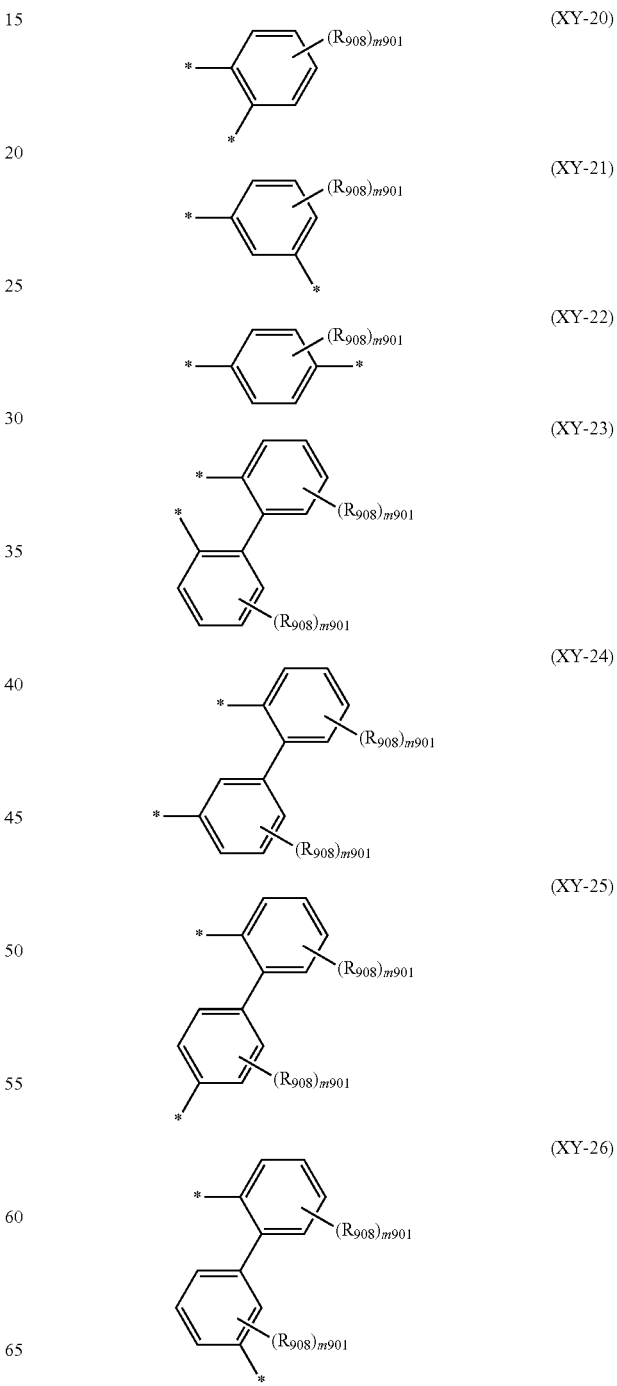

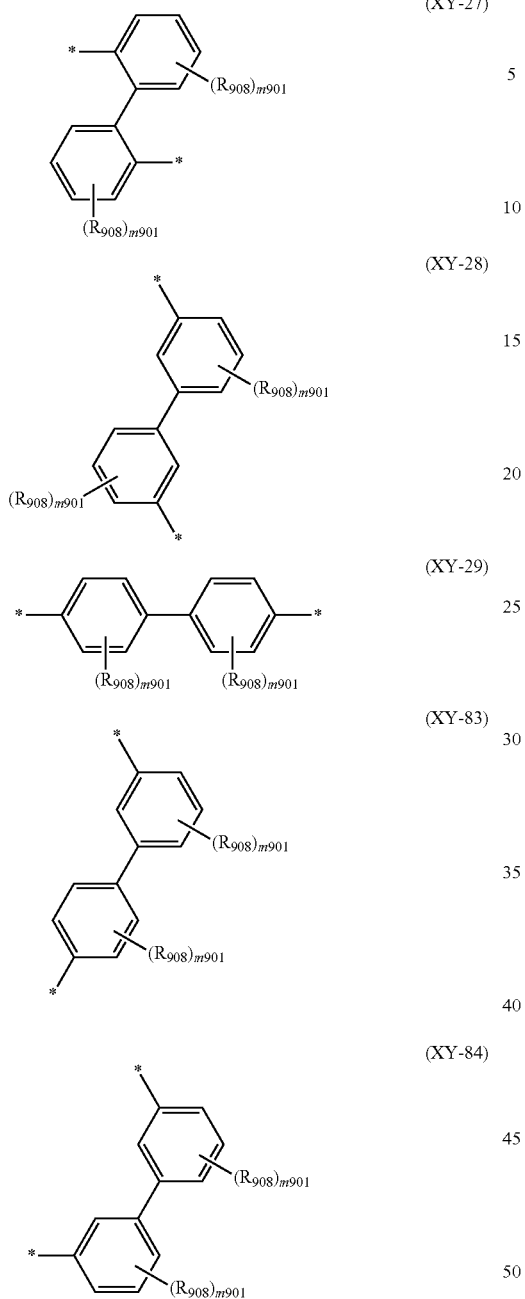
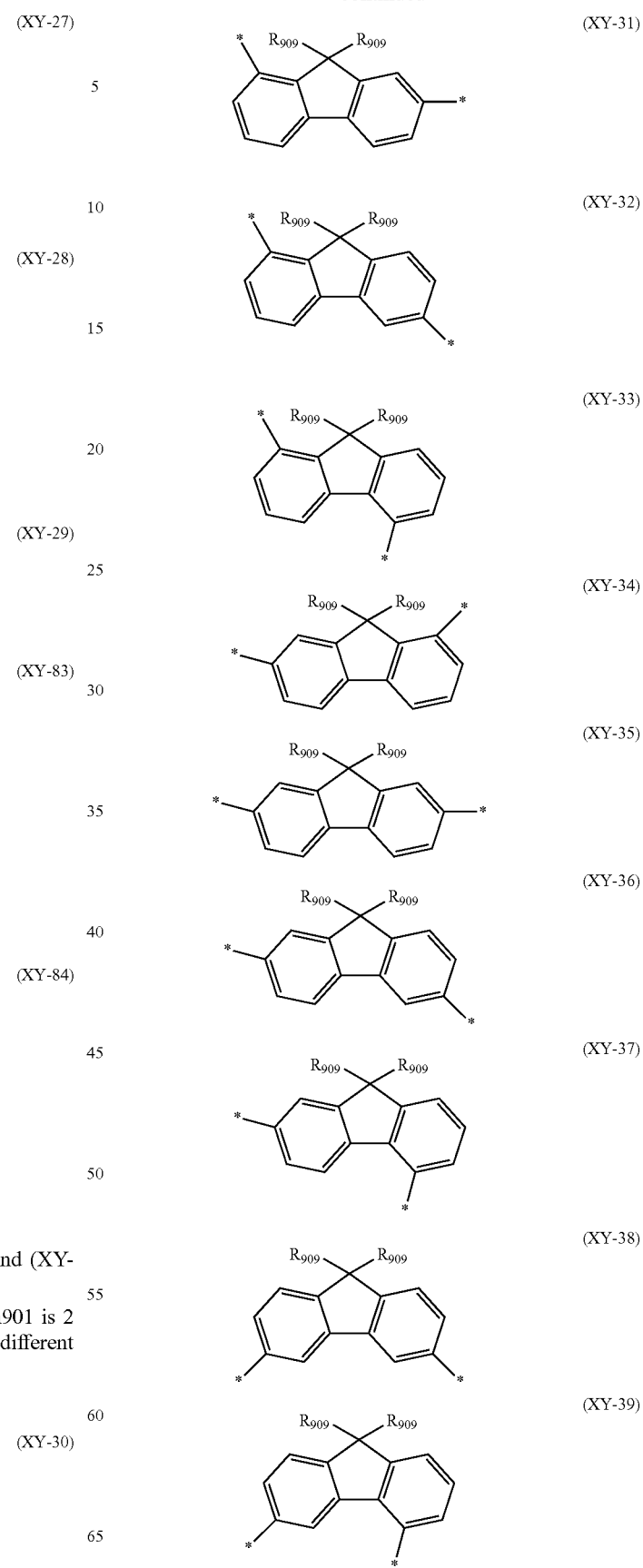
In the formulas (XY-20) to (XY-29), (XY-83) and (XY-84), $R_{908}$ is a substituent.
Then, m901 is an integer of 0 to 4, and when m901 is 2 or more, a plurality of $R_{908}$ may be the same with or different from each other.
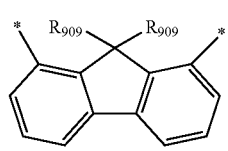

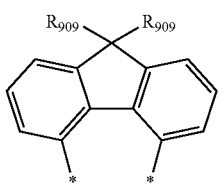
(XY-40)

In the formulas (XY-30) to (XY-40), $R_{909}$ is independently a hydrogen atom or a substituent. Two of $R_{909}$ may form a ring by bonding with each other through a single bond.

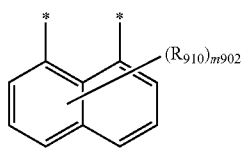
(XY-41)

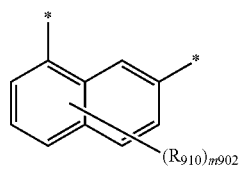
(XY-42)

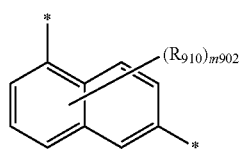
(XY-43)

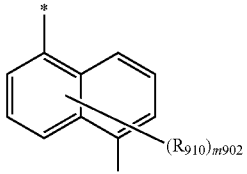
(XY-44)

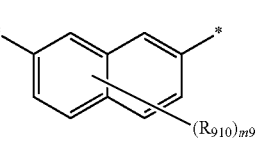
(XY-45)

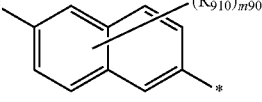
(XY-46)

In the formulas (XY-41) to (XY-46), $R_{910}$ is a substituent.

Then, m902 is an integer of 0 to 6. When m902 is 2 or more, a plurality of $R_{910}$ may be the same with or different from each other.

The substituted or unsubstituted divalent heterocyclic group described herein is preferably any group described below, unless otherwise specified.

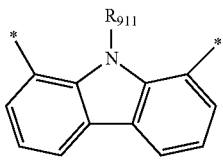
(XY-50)

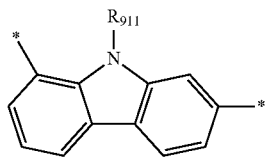
(XY-51)

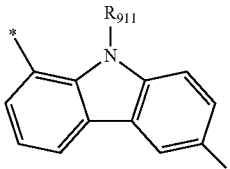
(XY-52)

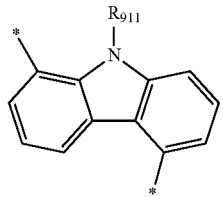
(XY-53)

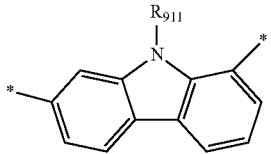
(XY-54)

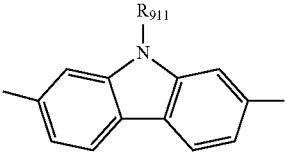
(XY-55)

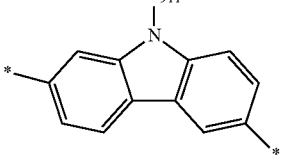
(XY-56)

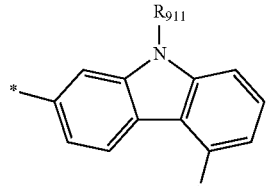
(XY-57)

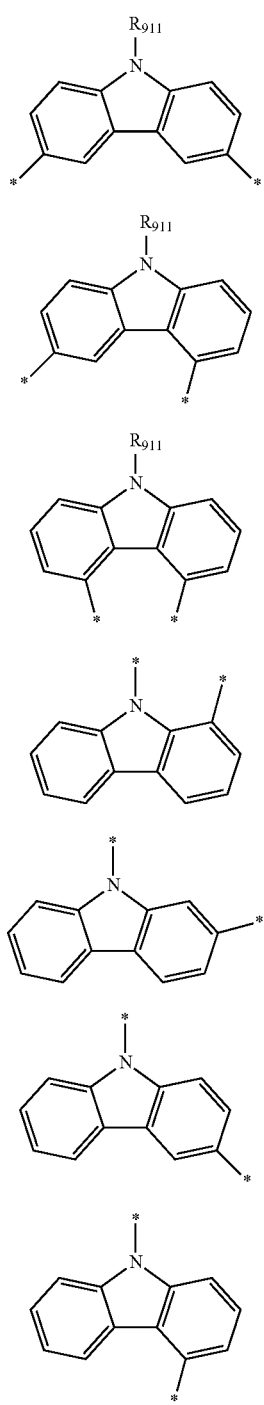
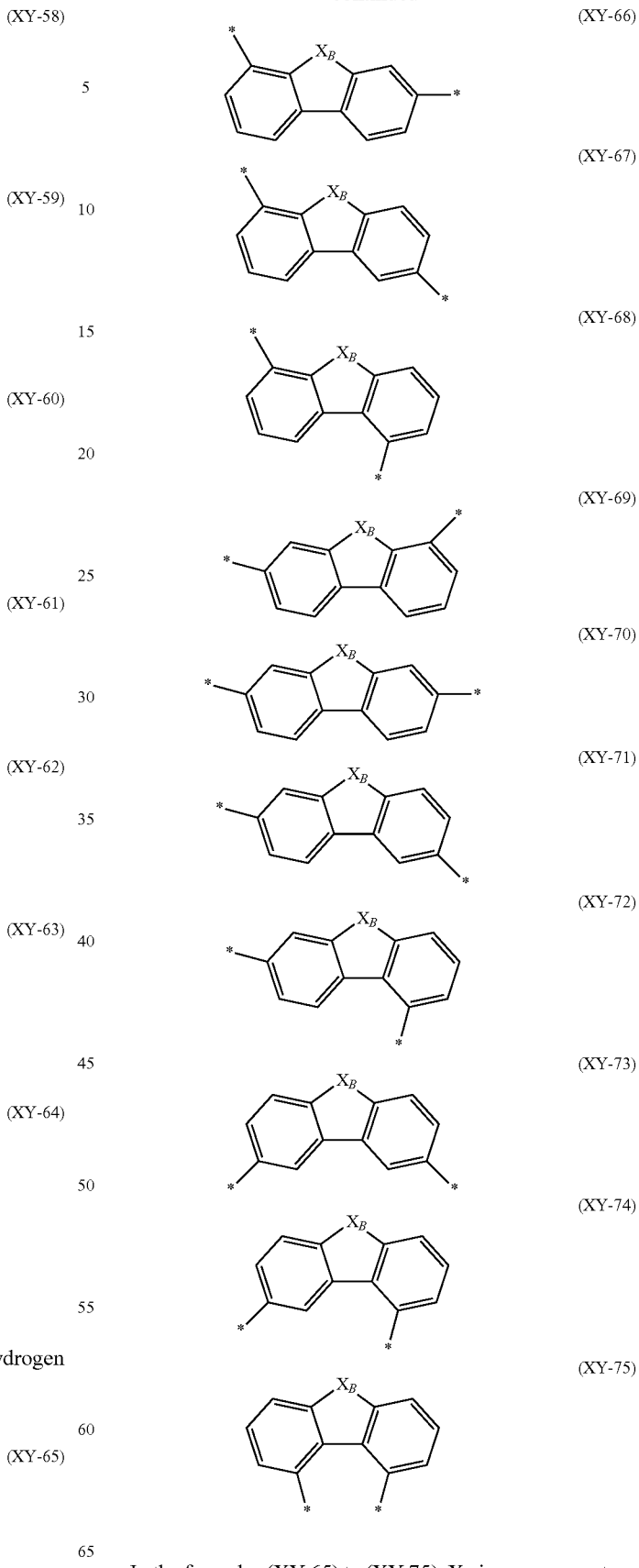
In the formulas (XY-50) to (XY-60), $R_{911}$ is a hydrogen atom or a substituent.
In the formulas (XY-65) to (XY-75), $X_B$ is an oxygen atom or a sulfur atom.

Herein, a case where "one or more sets of two or more groups adjacent to each other form a substituted or unsubstituted and saturated or unsaturated ring by bonding with each other" will be described by taking, as an example, a case of an anthracene compound represented by the following formula (XY-80) in which a mother skeleton is an anthracene ring.

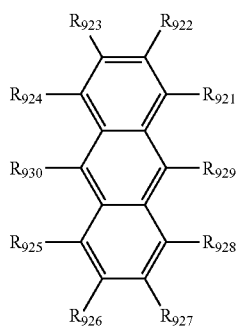

(XY-80)

For example, two adjacent to each other into one set when "one or more sets of two or more groups adjacent to each other form the ring by bonding with each other" among $R_{921}$ to $R_{930}$ include $R_{921}$ and $R_{922}$, $R_{922}$ and $R_{923}$, $R_{923}$ and $R_{924}$, $R_{924}$ and $R_{930}$, $R_{930}$ and $R_{925}$, $R_{925}$ and $R_{926}$, $R_{926}$ and $R_{927}$, $R_{927}$ and $R_{928}$, $R_{928}$ and $R_{929}$, and $R_{929}$ and $R_{921}$.

The above-described "one or more sets" means that two or more sets of two groups adjacent to each other may simultaneously form the ring. For example, a case where $R_{921}$ and $R_{922}$ form a ring A by bonding with each other, and simultaneously $R_{925}$ and $R_{926}$ form a ring B by bonding with each other is represented by the following formula (XY-81).

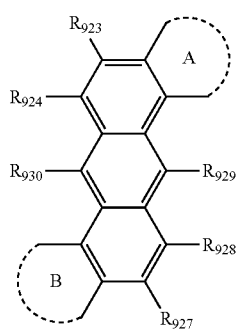

(XY-81)

A case where "two or more groups adjacent to each other" form a ring means that, for example, $R_{921}$ and $R_{922}$ form a ring A by bonding with each other, and $R_{922}$ and $R_{923}$ form a ring C by bonding with each other. A case where the ring A and ring C sharing $R_{922}$ are formed, in which the ring A and the ring C are fused to the anthracene mother skeleton by three of $R_{921}$ to $R_{923}$ adjacent to each other, is represented by the following (XY-82).

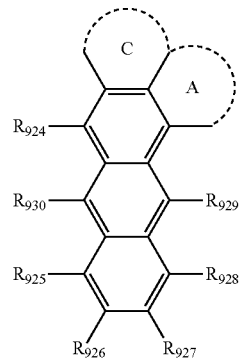

(XY-82)

The rings A to C formed in the formulas (XY-81) and (XY-82) are a saturated or unsaturated ring.

A term "unsaturated ring" means an aromatic hydrocarbon ring or an aromatic heterocyclic ring. A term "saturated ring" means an aliphatic hydrocarbon ring or an aliphatic heterocyclic ring.

For example, the ring A formed by $R_{921}$ and $R_{922}$ being bonded with each other, represented by the formula (XY-81), means a ring formed by a carbon atom of the anthracene skeleton bonded with $R_{921}$, a carbon atom of the anthracene skeleton bonded with $R_{922}$, and one or more arbitrary elements. Specific examples include, when the ring A is formed by $R_{921}$ and $R_{922}$, a case where an unsaturated ring is formed of a carbon atom of an anthracene skeleton bonded with $R_{921}$, a carbon atom of the anthracene skeleton bonded with $R_{922}$, and four carbon atoms, in which a ring formed by $R_{921}$ and $R_{922}$ is formed into a benzene ring. Further, when a saturated ring is formed, the ring is formed into a cyclohexane ring.

Here, "arbitrary elements" are preferably a C element, a N element, an O element and a S element. In the arbitrary elements (for example, a case of the C element or the N element), the bond(s) that is(are) not involved in the formation of the ring may be terminated by a hydrogen atom, or may be substituted by an arbitrary substituent. When the ring contains the arbitrary elements other than the C element, the ring to be formed is a heterocyclic ring.

The number of "one or more arbitrary elements" forming the saturated or unsaturated ring is preferably 2 or more and 15 or less, more preferably 3 or more and 12 or less, and further preferably 3 or more and 5 or less.

As specific examples of the aromatic hydrocarbon ring, a structure in which the aryl group described in specific example group G1 is terminated with a hydrogen atom may be mentioned.

As specific examples of the aromatic heterocyclic ring, a structure in which the aromatic heterocyclic group described in specific example group G2 is terminated with a hydrogen atom may be mentioned.

As specific examples of the aliphatic hydrocarbon ring, a structure in which the cycloalkyl group described in specific example group G6 is terminated with a hydrogen atom may be mentioned.

When the above-described "saturated or unsaturated ring" has a substituent, the substituent is an "arbitrary substituent" as described below, for example. When the above-mentioned "saturated or unsaturated ring" has a substituent, specific examples of the substituent refer to the substituents described in above-mentioned "the substituent described herein".

In one embodiment of this specification, the substituent (hereinafter, referred to as an "arbitrary substituent" in several cases) in the case of the "substituted or unsubstituted" is a group selected from the group consisting of an unsubstituted alkyl group including 1 to 50 carbon atoms,
an unsubstituted alkenyl group including 2 to 50 carbon atoms,
an unsubstituted alkynyl group including 2 to 50 carbon atoms,
an unsubstituted cycloalkyl group including 3 to 50 ring carbon atoms,
—Si($R_{901}$)($R_{902}$)($R_{903}$),
—O—($R_{904}$),
—S—($R_{905}$)
—N($R_{906}$)($R_{907}$)

Wherein,
$R_{901}$ to $R_{907}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms; and when two or more of $R_{901}$ to $R_{907}$ exist, two or more of $R_{901}$ to $R_{907}$ may be the same with or different from each other,
a halogen atom, a cyano group, a nitro group,
an unsubstituted aryl group including 6 to 50 ring carbon atoms, and
an unsubstituted monovalent heterocyclic group including 5 to 50 ring atoms.

In one embodiment, the substituent in the case of "substituted or unsubstituted" is a group selected from the group consisting of
an alkyl group including 1 to 50 carbon atoms,
an aryl group including 6 to 50 ring carbon atoms, and
a monovalent heterocyclic group including 5 to 50 ring atoms.

In one embodiment, the substituent in the case of "substituted or unsubstituted" is a group selected from the group consisting of
an alkyl group including 1 to 18 carbon atoms,
an aryl group including 6 to 18 ring carbon atoms, and
a monovalent heterocyclic group including 5 to 18 ring atoms.

Specific examples of each group of the arbitrary substituent described above are as described above.

Herein, unless otherwise specified, the saturated or unsaturated ring (preferably substituted or unsubstituted and saturated or unsaturated five-membered or six-membered ring, more preferably a benzene ring) may be formed by the arbitrary substituents adjacent to each other.

Herein, unless otherwise specified, the arbitrary substituent may further have the substituent. Specific examples of the substituent that the arbitrary substituent further has include to the ones same as the arbitrary substituent described above.

[Organic Electroluminescence Device]

An organic electroluminescence device according to an aspect of the invention contains:
a cathode;
an anode; and
an emitting layer disposed between the cathode and the anode,
wherein the emitting layer contains a compound represented by the following formula (1) and a compound represented by the following formula (11).

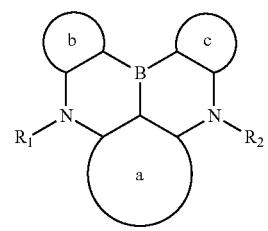

(1)

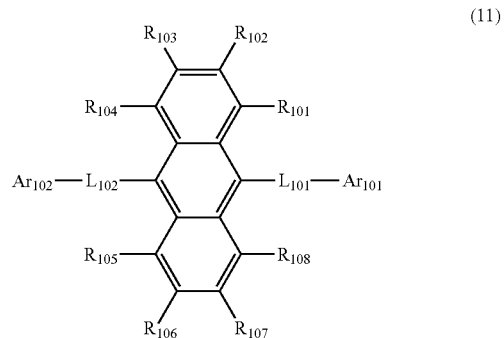

(11)

Each substituent in the formulas (1) and (11) will be described later.

Schematic configuration of organic EL device according to one aspect of the invention will be explained referring to the FIGURE.

The organic EL device 1 according to an aspect of the invention includes a substrate 2, an anode 3, an emitting layer 5, a cathode 10, an organic layer 4 between the anode 3 and the emitting layer 5, and an organic layer 6 between the emitting layer 5 and the cathode 10.

The compound represented by the formula (1) and the compound represented by the formula (11) are contained in the emitting layer 5 between the anode 3 and the cathode 10. Each of the compound represented by the formula (1) and the compound represented by the formula (11) contained in the emitting layer 5, may be used alone, or in combination of two or more kinds.

(Compound Represented by the Formula (1))

Next, a compound represented by the formula (1) will be described.

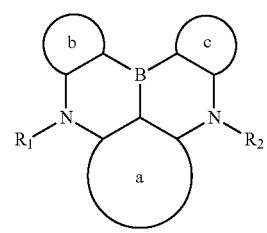

(1)

In the formula (1),
ring a, ring b, and ring c are independently
a substituted or unsubstituted aromatic hydrocarbon ring including 6 to 50 ring carbon atoms, or
a substituted or unsubstituted heterocyclic ring including 5 to 50 ring atoms;

$R_1$ and $R_2$ independently form a substituted or unsubstituted heterocyclic ring by bonding with the ring a, the ring b, or the ring c, or do not form a substituted or unsubstituted heterocyclic ring; and $R_1$ and $R_2$ which do not form the substituted or unsubstituted heterocyclic ring are independently a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

Each of the ring a, the ring b, and the ring c is a ring which is fused with a central fused bicyclic structure of the formula (1) composed of B atom, two N atoms, and carbon atom, and a substituted or unsubstituted aromatic hydrocarbon ring including 6 to 50 ring carbon atoms, or a substituted or unsubstituted heterocyclic ring including 5 to 50 ring atoms.

The "aromatic hydrocarbon ring" for the ring a, the ring b, and the ring c has the same structure as a compound obtained by introducing a hydrogen atom to the "aryl group" described above. The "aromatic hydrocarbon ring" for the ring a contains 3 carbon atoms constituting the central fused bicyclic structure of the formula (1) as the ring atoms. The "aromatic hydrocarbon ring" for the ring b and the ring c contains two carbon atoms constituting the central fused bicyclic structure of the formula (1) as the ring atoms. Specific examples of the "substituted or unsubstituted aromatic hydrocarbon ring including 6 to 50 ring carbon atoms" include the compound obtained by introducing a hydrogen atom to the "aryl group" described in the specific example group G1.

The "heterocyclic ring" for the ring a, the ring b, and the ring c is the same structure as a compound obtained by introducing a hydrogen atom to the "heterocyclic group" described above. The "heterocyclic ring" for the ring a contains 3 carbon atoms constituting the central fused bicyclic structure of the formula (1) as the ring atoms. The "heterocyclic ring" for the ring b and the ring c contains two carbon atoms constituting the central fused bicyclic structure of the formula (1) as the ring atoms. Specific examples of the "substituted or unsubstituted heterocyclic ring including 5 to 50 ring atoms" include compounds obtained by introducing a hydrogen atom to the "heterocyclic group" described in the specific example group G2.

$R_1$ and $R_2$ may independently form a substituted or unsubstituted heterocyclic ring by bonding with the ring a, the ring b, or the ring c. The heterocyclic ring formed in this case contains a nitrogen atom constituting the central fused bicyclic structure of the formula (1). The heterocyclic ring in this case may contain a hetero atom other than the nitrogen atom. An expression "$R_1$ and $R_2$ are bonded with the ring a, the ring b, and the ring c" specifically means that the atoms constituting the ring a, the ring b, and the ring c are bonded with the atoms constituting $R_1$ and $R_2$. For example, $R_1$ may form a fused bicyclic (or tricyclic or more) nitrogen-containing heterocyclic ring in which the ring containing $R_1$ and the ring a is fused by bonding with the ring a. Specific examples of the nitrogen-containing heterocyclic ring include a compound corresponding to a nitrogen-containing fused heterocyclic rings constituted with 2 or more rings in the specific example group G2.

The cases when $R_1$ is bonded with the ring b, $R_2$ is bonded with the ring a, and $R_2$ is bonded with the ring c are the same as above.

In one embodiment, the ring a, the ring b, and the ring c in the formula (1) are independently a substituted or unsubstituted aromatic hydrocarbon ring including 6 to 50 ring carbon atoms.

In one embodiment, the ring a, the ring b, and the ring c in the formula (1) are independently a substituted or unsubstituted benzene ring or a substituted or unsubstituted naphthalene ring.

In one embodiment, $R_1$ and $R_2$ in the formula (1) are independently a substituted or unsubstituted aryl group including 6 to 50 ring carbon atoms, or a substituted or unsubstituted monovalent heterocyclic group including 5 to 50 ring atoms, and preferably a substituted or unsubstituted aryl group including 6 to 50 ring carbon atoms.

In one embodiment, the compound represented by the formula (1) is a compound represented by the following formula (2).

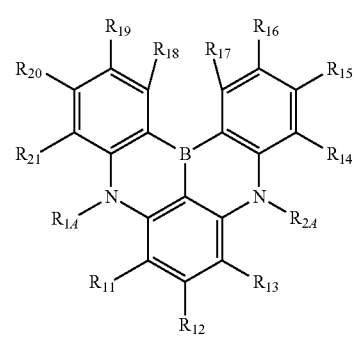

(2)

In the formula (2), $R_{1A}$ forms a substituted or unsubstituted heterocyclic ring by bonding with one or more selected from the group consisting of $R_{11}$ and $R_{21}$, or do not form a substituted or unsubstituted heterocyclic ring;

$R_{2A}$ forms a substituted or unsubstituted heterocyclic ring by bonding with one or more selected from the group consisting of $R_{13}$ and $R_{14}$, or do not form a substituted or unsubstituted heterocyclic ring;

$R_{1A}$ and $R_{2A}$ which do not form the substituted or unsubstituted heterocyclic ring are independently a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms;

one or more sets of adjacent two or more among $R_{11}$ to $R_{21}$ form a substituted or unsubstituted, saturated or unsaturated ring by bonding with each other, or do not form a substituted or unsubstituted, saturated or unsaturated ring;

$R_{11}$ to $R_{21}$ which do not form the substituted or unsubstituted heterocyclic ring or the substituted or unsubstituted, saturated or unsaturated ring are independently
a hydrogen atom,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
—N($R_{906}$)($R_{907}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms; and
$R_{901}$ to $R_{907}$ are as defined in the formula (11).
$R_{1A}$ and $R_{2A}$ in the formula (2) are the groups corresponding to $R_1$ and $R_2$ in the formula (1).

For example, a nitrogen-containing fused heterocyclic ring containing 2 rings (or 3 or more rings) may be formed by fusing a ring containing $R_{1A}$ and $R_{11}$ which are bonded with each other, and the benzene ring corresponding to the ring a. Specific examples of the nitrogen-containing heterocyclic ring include a compound corresponding to a nitrogen-containing fused heterocyclic group containing two or more rings in the specific example group G2. The cases when $R_{1A}$ is bonded with $R_{12}$, $R_{2A}$ is bonded with $R_{13}$, and $R_{2A}$ is bonded with $R_{14}$ are the same as above.

One or more sets of adjacent two or more among $R_{11}$ to $R_{21}$ may form a substituted or unsubstituted, saturated or unsaturated ring by bonding with each other. For example, a structure in which a benzene ring, an indole ring, a pyrrole ring, a benzofuran ring, or a benzothiophene ring formed by bonding $R_{11}$ and $R_{12}$ with each other is fused to a 6-membered ring to which $R_{11}$ and $R_{12}$ are bonded, may be formed. The fused ring formed is a naphthalene ring, a carbazole ring, an indole ring, a dibenzofuran ring, or a dibenzothiophene ring.

In one embodiment, $R_{11}$ to $R_{21}$ which are not involved in the ring formation are independently a hydrogen atom, a substituted or unsubstituted alkyl group including 1 to 50 carbon atoms, a substituted or unsubstituted aryl group including 6 to 50 ring carbon atoms, or a substituted or unsubstituted monovalent heterocyclic group including 5 to 50 ring atoms.

In one embodiment, $R_{11}$ to $R_{21}$ which are not involved in the ring formation are independently a hydrogen atom, a substituted or unsubstituted aryl group including 6 to 50 ring carbon atoms, or a substituted or unsubstituted monovalent heterocyclic group including 5 to 50 ring atoms.

In one embodiment, $R_{11}$ to $R_{21}$ which are not involved in the ring formation are independently a hydrogen atom, or a substituted or unsubstituted alkyl group including 1 to 50 carbon atoms.

In one embodiment, $R_{11}$ to $R_{21}$ which are not involved in the ring formation are independently a hydrogen atom, or a substituted or unsubstituted alkyl group including 1 to 50 carbon atoms, and at least one of them is a substituted or unsubstituted alkyl group including 1 to 50 carbon atoms.

In one embodiment, the compound represented by the formula (2) is a compound represented by the following formula (3).

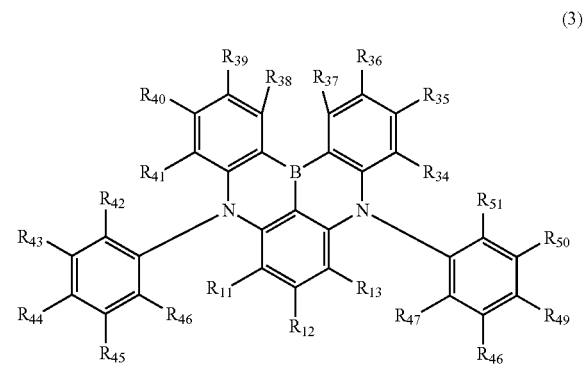

In the formula (3),
$R_{31}$ forms a substituted or unsubstituted heterocyclic ring by bonding with $R_{46}$, or does not form a substituted or unsubstituted heterocyclic ring;
$R_{33}$ forms a substituted or unsubstituted heterocyclic ring by bonding with $R_{47}$, or does not form a substituted or unsubstituted heterocyclic ring;
$R_{34}$ forms a substituted or unsubstituted heterocyclic ring by bonding with $R_{51}$, or does not form a substituted or unsubstituted heterocyclic ring;
$R_{41}$ forms a substituted or unsubstituted heterocyclic ring by bonding with $R_{42}$, or does not form a substituted or unsubstituted heterocyclic ring;
one or more sets of adjacent two or more among $R_{31}$ to $R_{51}$ form a substituted or unsubstituted, saturated or unsaturated ring by bonding with each other, or do not form a substituted or unsubstituted, saturated or unsaturated ring;
$R_{31}$ to $R_{51}$ which do not form the substituted or unsubstituted heterocyclic ring or the substituted or unsubstituted, saturated or unsaturated ring are independently
a hydrogen atom,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
—N($R_{906}$)($R_{907}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms; and
$R_{901}$ to $R_{907}$ are as defined in the formula (11).

$R_{31}$ may form a substituted or unsubstituted heterocyclic ring by bonding with $R_{46}$. For example, a nitrogen-containing fused heterocyclic ring constituted with 3 or more rings in which a benzene ring to which $R_{46}$ is bonded, the ring containing N, and the benzene ring corresponding to the ring a are fused by bonding $R_{31}$ and $R_{46}$ with each other. Specific examples of the nitrogen-containing heterocyclic ring include compounds corresponding to a nitrogen-containing fused heterocyclic ring constituted with 3 or more rings in the specific example group G2. The cases when $R_{33}$ is bonded with $R_{47}$, $R_{34}$ is bonded with $R_{51}$, and $R_{41}$ is bonded with $R_{42}$ are the same as above.

In one embodiment, $R_{31}$ to $R_{51}$ which are not involved in the ring formation are independently a hydrogen atom, a substituted or unsubstituted alkyl group including 1 to 50 carbon atoms, a substituted or unsubstituted aryl group including 6 to 50 ring carbon atoms, or a substituted or unsubstituted monovalent heterocyclic group including 5 to 50 ring atoms.

In one embodiment, $R_{31}$ to $R_{51}$ which are not involved in the ring formation are independently a hydrogen atom, a substituted or unsubstituted aryl group including 6 to 50 ring carbon atoms, or a substituted or unsubstituted monovalent heterocyclic group including 5 to 50 ring atoms.

In one embodiment, $R_{31}$ to $R_{51}$ which are not involved in the ring formation are independently a hydrogen atom, or a substituted or unsubstituted alkyl group including 1 to 50 carbon atoms.

In one embodiment, $R_{31}$ to $R_{51}$ which are not involved in the ring formation are independently a hydrogen atom, or a substituted or unsubstituted alkyl group including 1 to 50 carbon atoms, and at least one of them is a substituted or unsubstituted alkyl group including 1 to 50 carbon atoms.

In one embodiment, the compound represented by the formula (3) is a compound represented by the following formula (3A).

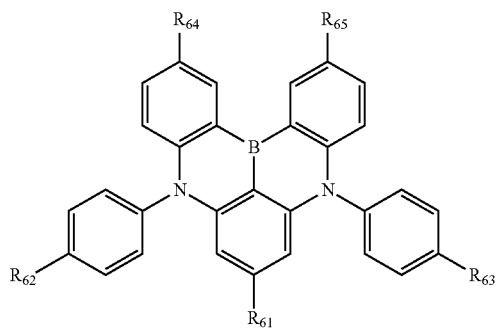

(3A)

In the formula (3A), $R_{61}$ is a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, or a substituted or unsubstituted aryl group including 6 to 50 ring carbon atoms; and $R_{62}$ to $R_{65}$ are independently a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, or a substituted or unsubstituted aryl group including 6 to 50 ring carbon atoms.

In one embodiment, $R_{61}$ to $R_{65}$ are independently a substituted or unsubstituted alkyl group including 1 to 50 carbon atoms; or a substituted or unsubstituted aryl group including 6 to 50 ring carbon atoms.

In one embodiment, $R_{61}$ to $R_{65}$ are independently a substituted or unsubstituted alkyl group including 1 to 50 carbon atoms.

In one embodiment, the compound represented by the formula (3) is a compound represented by the following formula (3B).

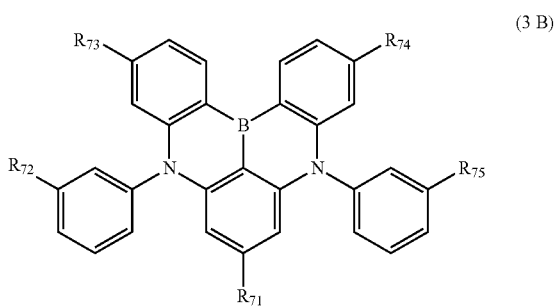

(3B)

In the formula (3B), $R_{71}$ and $R_{72}$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —N($R_{606}$)($R_{607}$), or a substituted or unsubstituted aryl group including 6 to 50 ring carbon atoms;

$R_{73}$ to $R_{75}$ are independently a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —N($R_{906}$)($R_{907}$), or a substituted or unsubstituted aryl group including 6 to 50 ring carbon atoms; and $R_{906}$ and $R_{907}$ are as defined in the formula (11).

In one embodiment, the compound represented by the formula (3) is a compound represented by the following formula (3B').

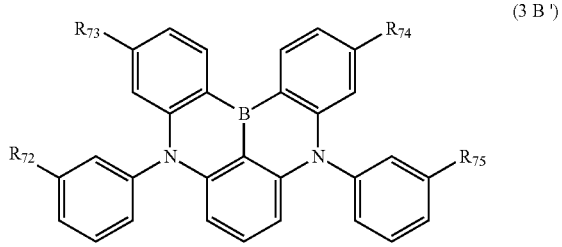

In the formula (3B'), $R_{72}$ to $R_{75}$ is as defined in the formula (3B).

In one embodiment, at least one of $R_{71}$ to $R_{75}$ is
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—$N(R_{906})(R_{907})$, or
a substituted or unsubstituted aryl group including 6 to 50 ring carbon atoms.

In one embodiment,
$R_{72}$ is
a hydrogen atom,
a substituted or unsubstituted alkyl group including 1 to 50 carbon atoms,
—$N(R_{906})(R_{907})$, or
a substituted or unsubstituted aryl group including 6 to 50 ring carbon atoms; and
$R_{71}$ and $R_{73}$ to $R_{75}$ are independently
a substituted or unsubstituted alkyl group including 1 to 50 carbon atoms,
—$N(R_{906})(R_{907})$, or
a substituted or unsubstituted aryl group including 6 to 50 ring carbon atoms.

In one embodiment, the compound represented by the formula (3) is a compound represented by the following formula (3C).

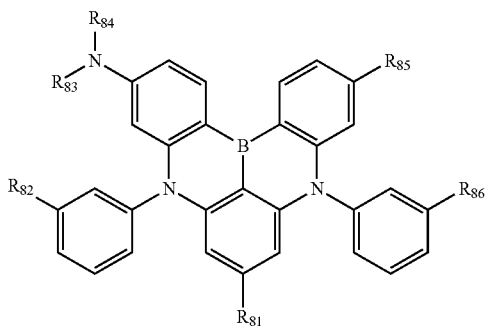

In the formula (3C),
$R_{81}$ and $R_{82}$ are independently
a hydrogen atom,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms, or
a substituted or unsubstituted aryl group including 6 to 50 ring carbon atoms; and
$R_{83}$ to $R_{86}$ are independently
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms, or
a substituted or unsubstituted aryl group including 6 to 50 ring carbon atoms.

In one embodiment, the compound represented by the formula (3) is a compound represented by the following formula (3C').

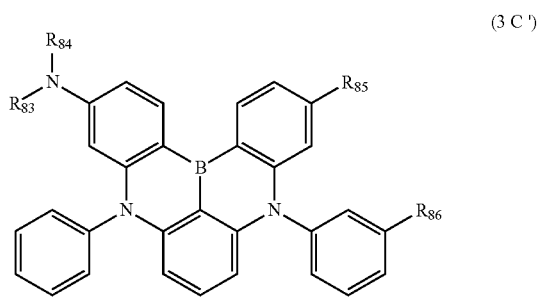

In the formula (3C'), $R_{83}$ to $R_{86}$ are as defined in the formula (3C).

In one embodiment, $R_{81}$ to $R_{86}$ are independently a substituted or unsubstituted alkyl group including 1 to 50 carbon atoms, or a substituted or unsubstituted aryl group including 6 to 50 ring carbon atoms.

In one embodiment, $R_{81}$ to $R_{86}$ are independently a substituted or unsubstituted aryl group including 6 to 50 ring carbon atoms.

Specific examples of the compound represented by the formula (1) will be described below, but these are merely examples, and the compound represented by the formula (1) is not limited to the following specific examples.

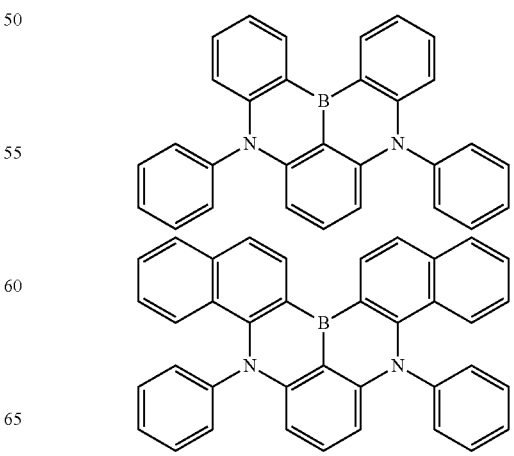

37
-continued
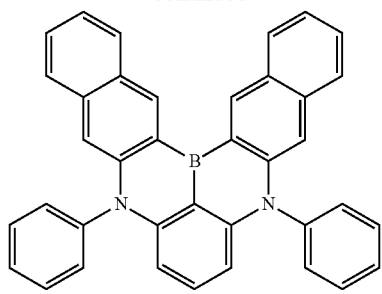
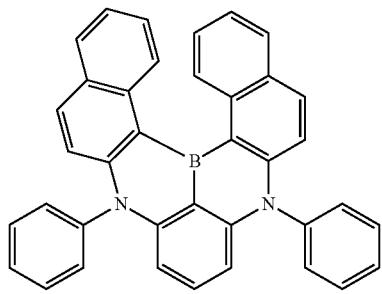
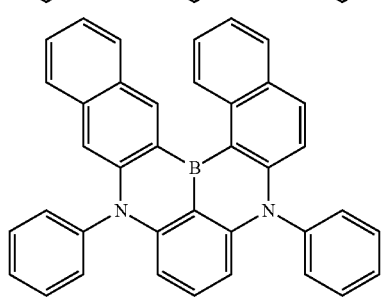
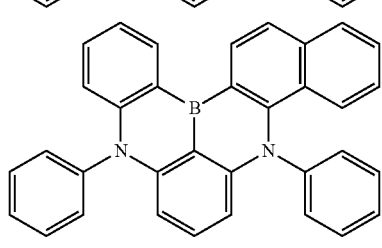
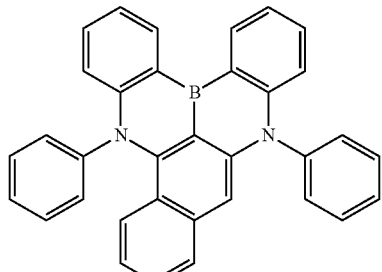
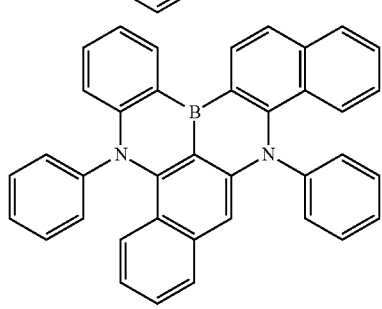
38
-continued
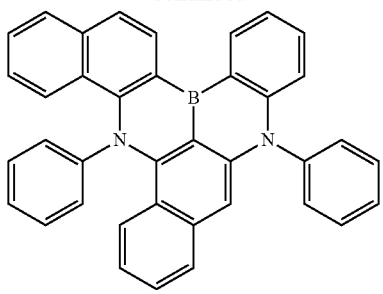
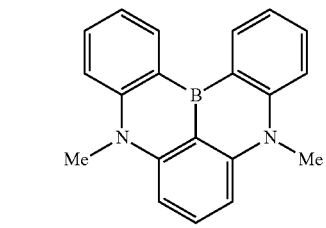
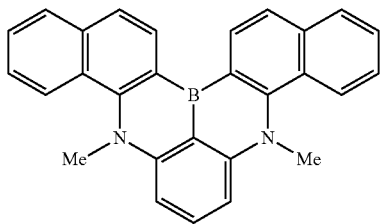
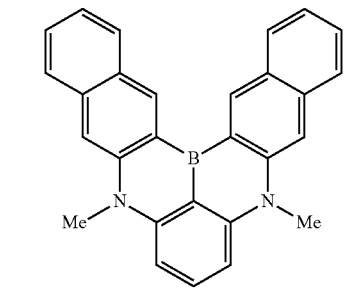
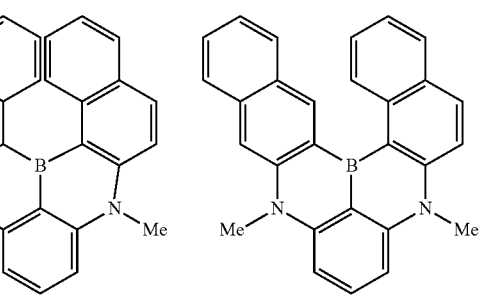
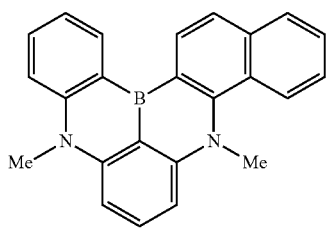

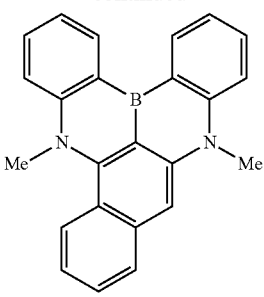
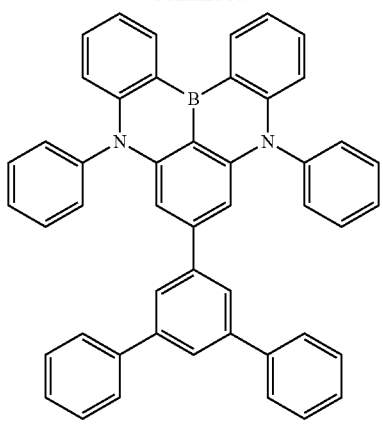
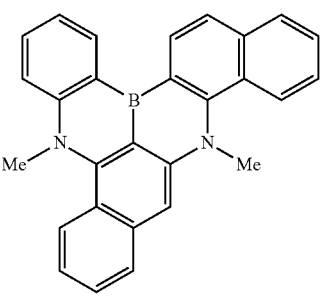
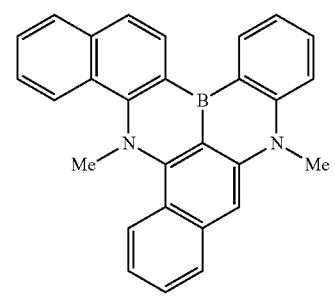
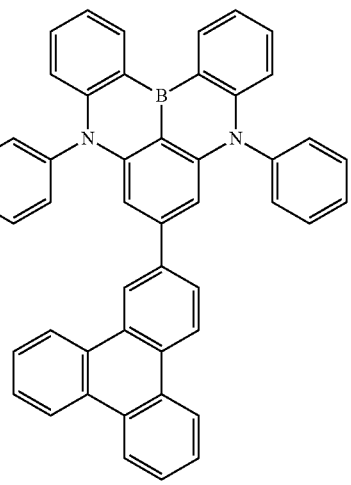
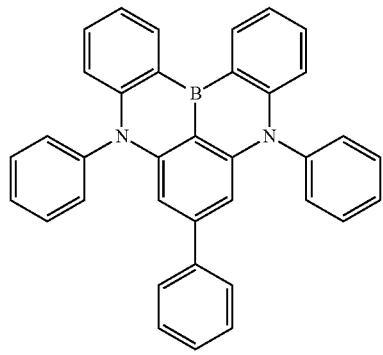
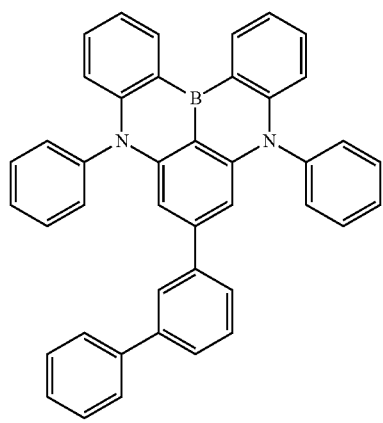
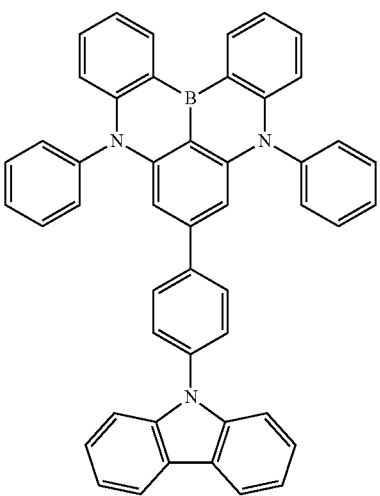

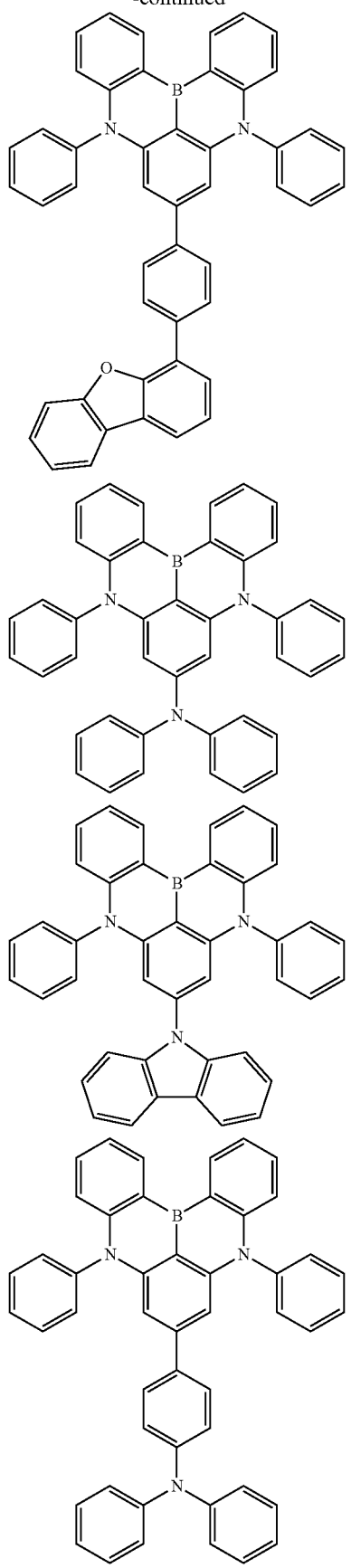
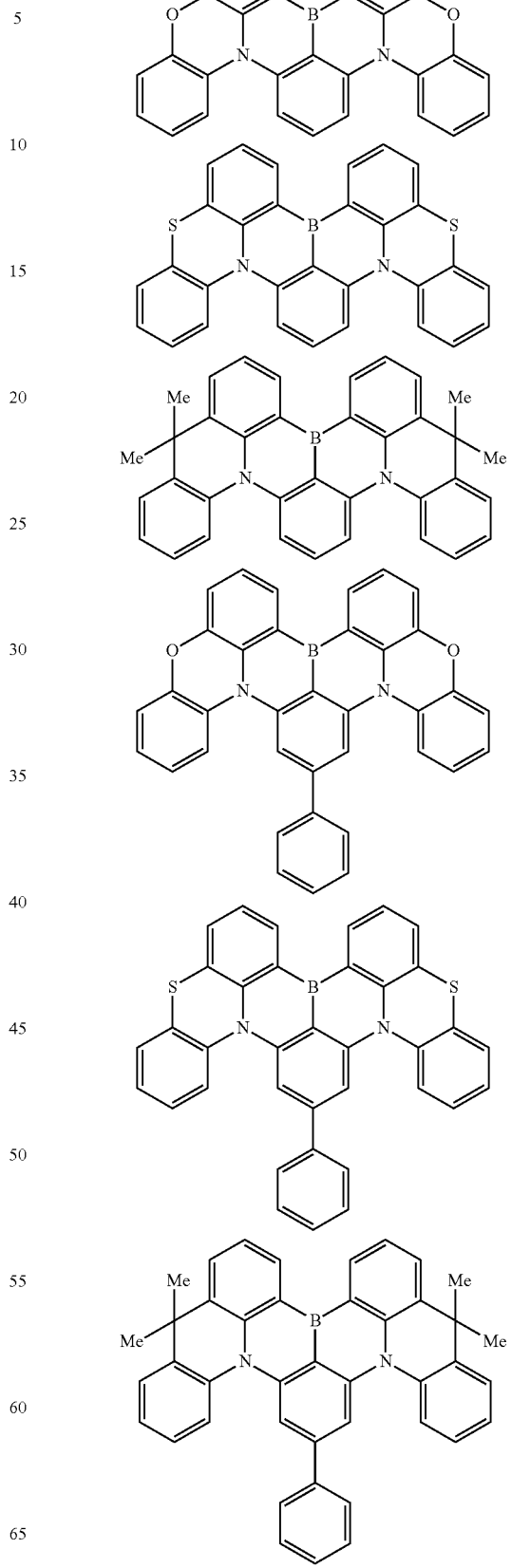

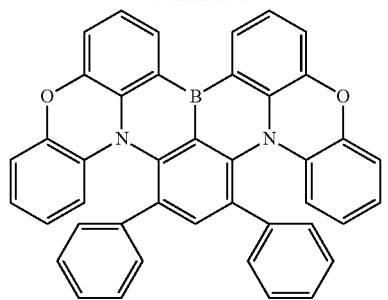
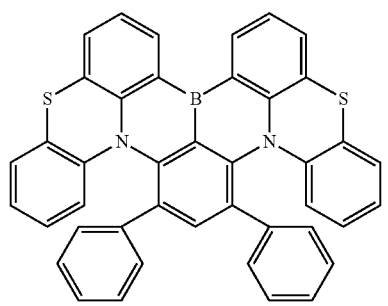
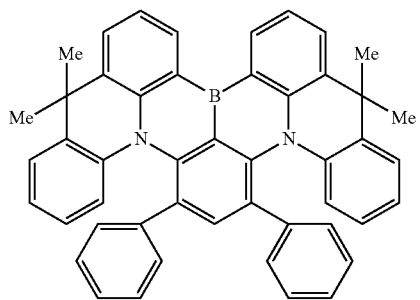
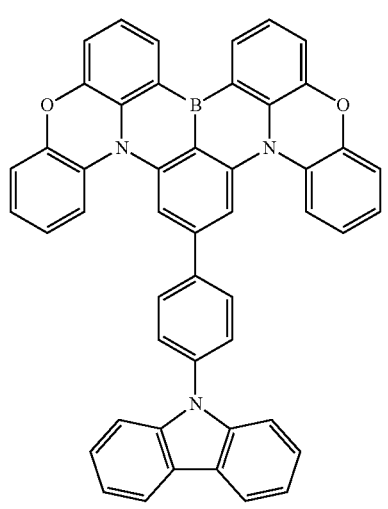
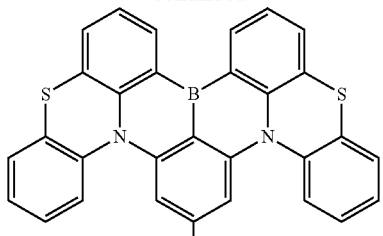
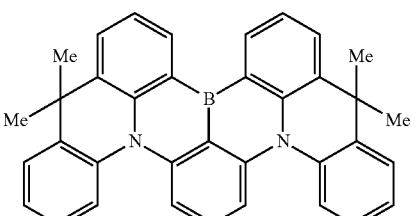
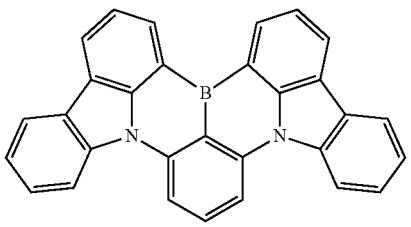
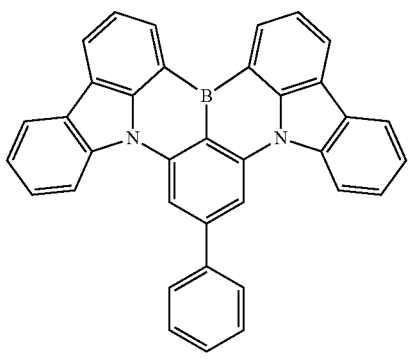

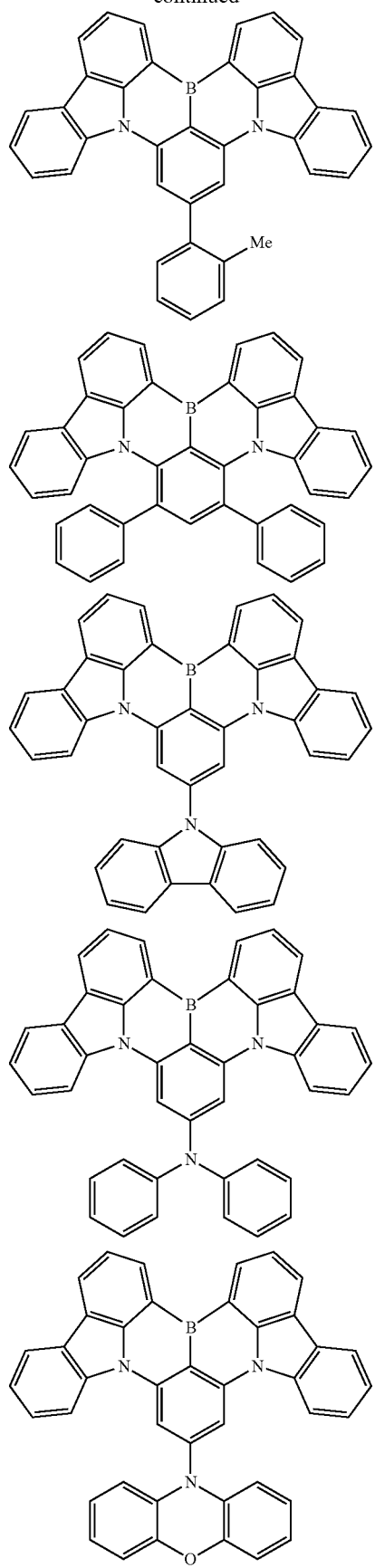
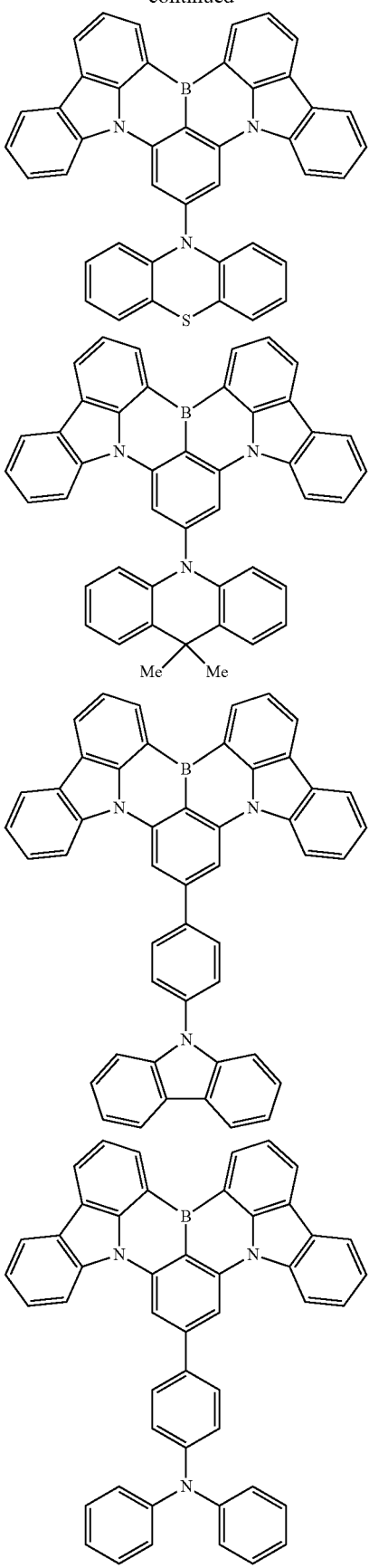

47
-continued
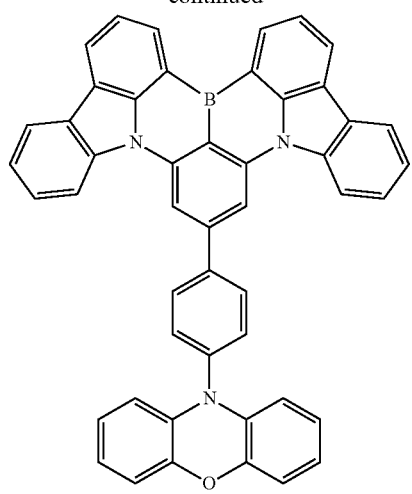
48
-continued
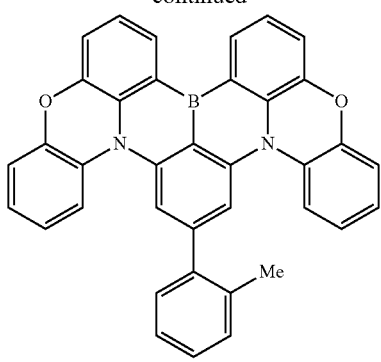
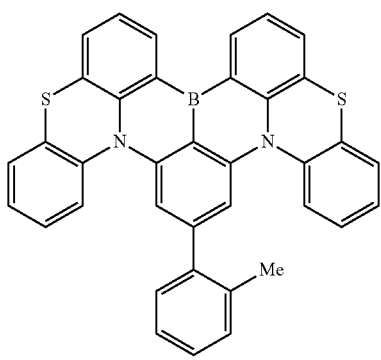
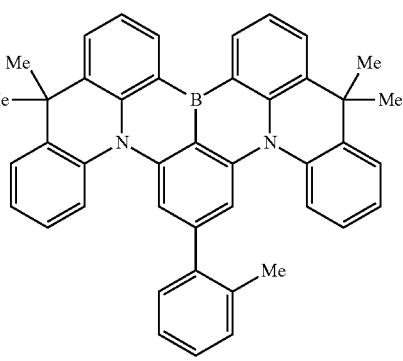
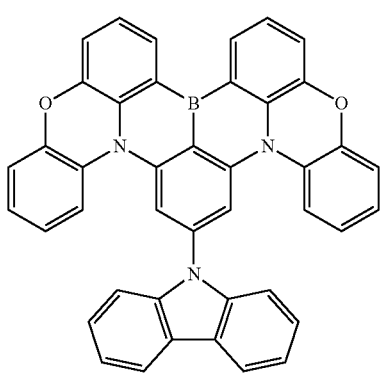

-continued
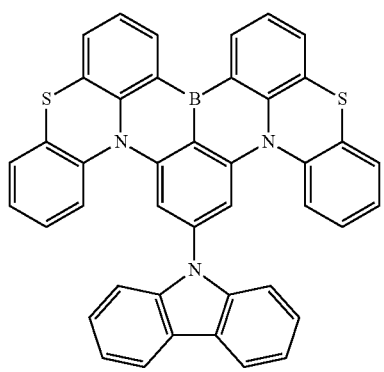
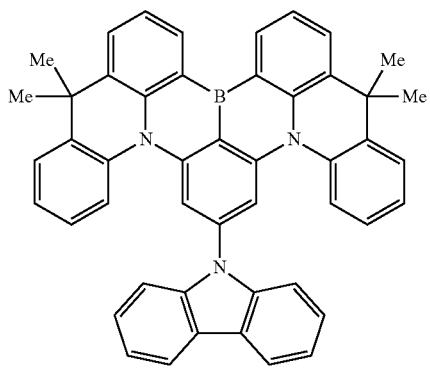
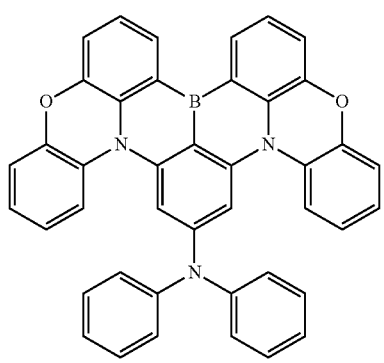
-continued
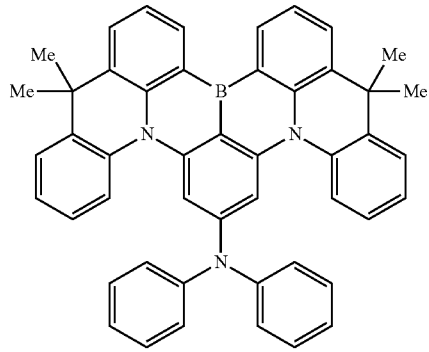
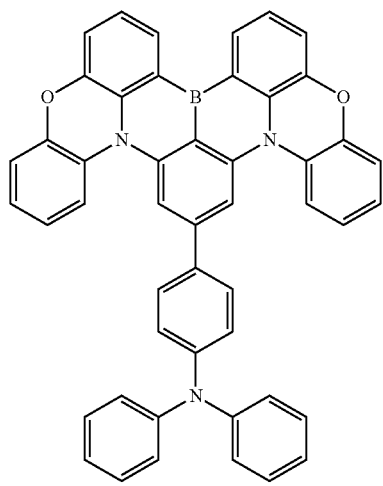
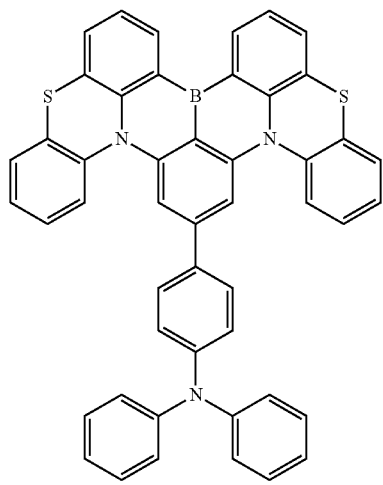

51
-continued
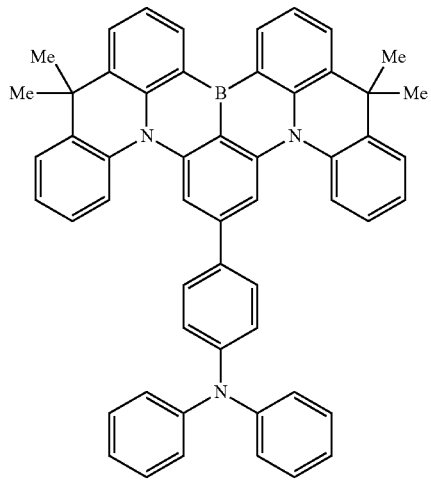
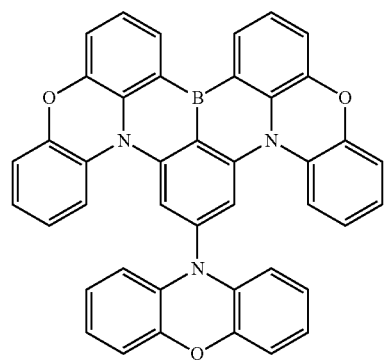
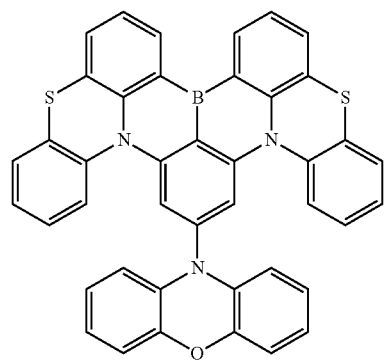
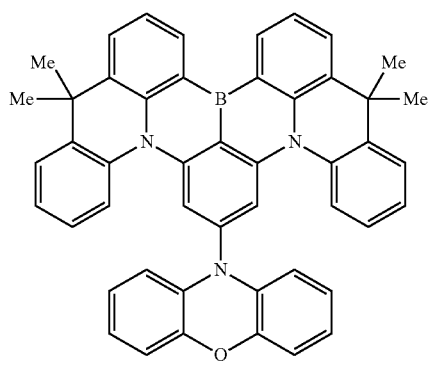
52
-continued
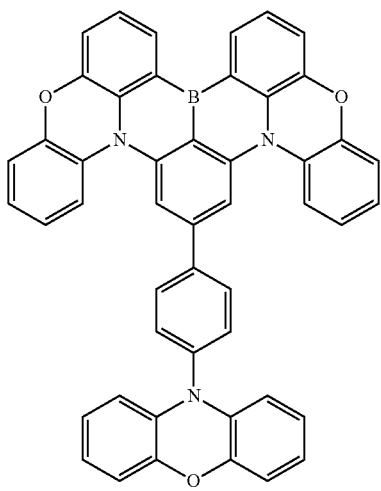
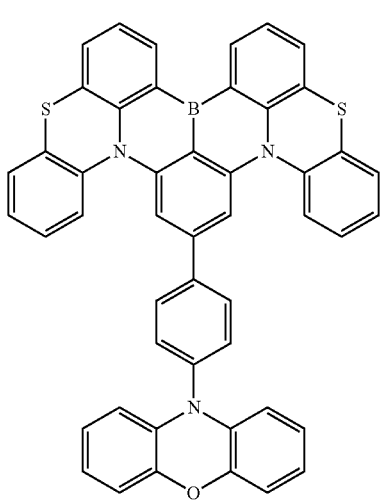
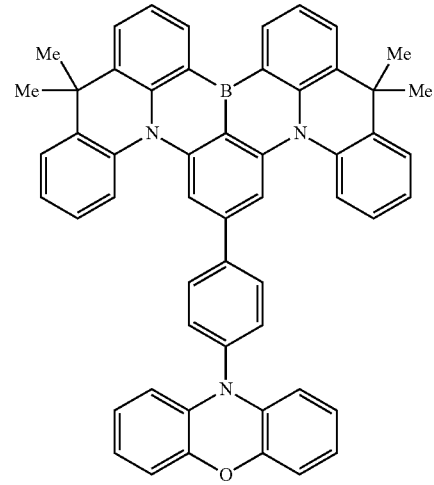

53
-continued
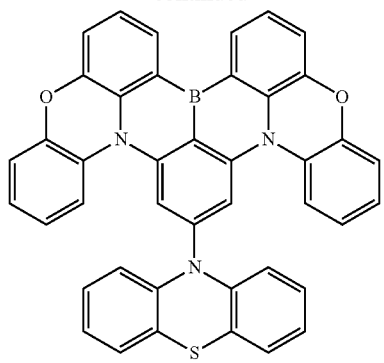
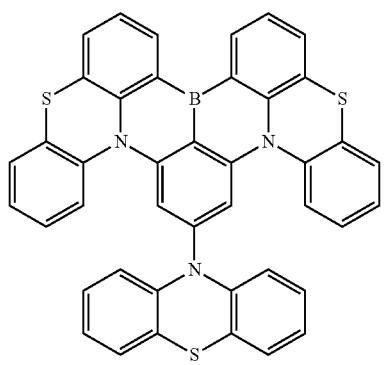
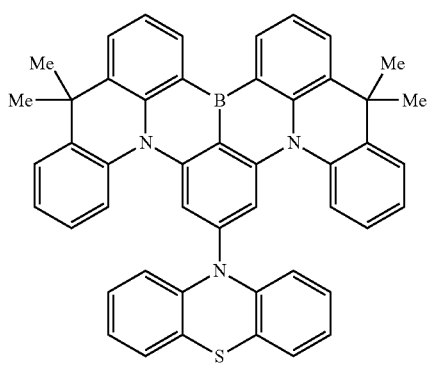
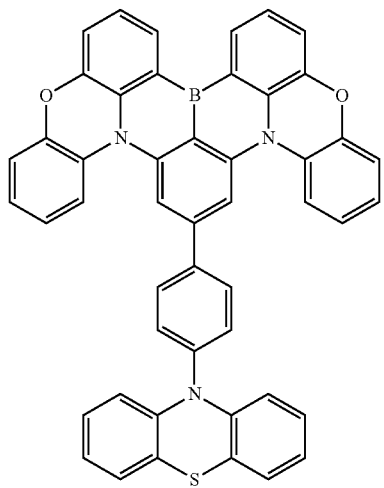
54
-continued
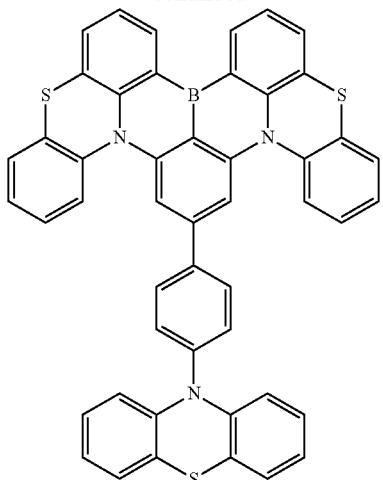
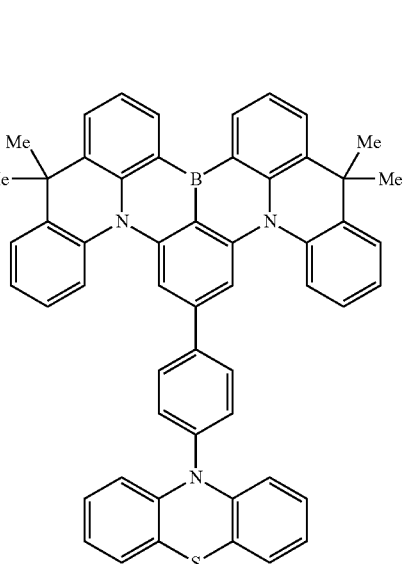
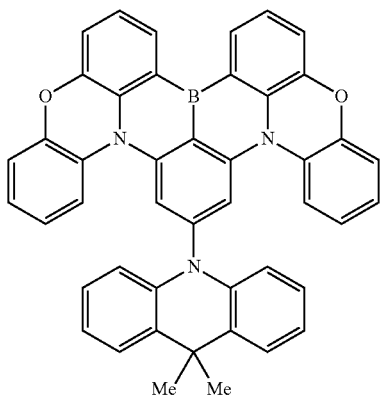

55
-continued
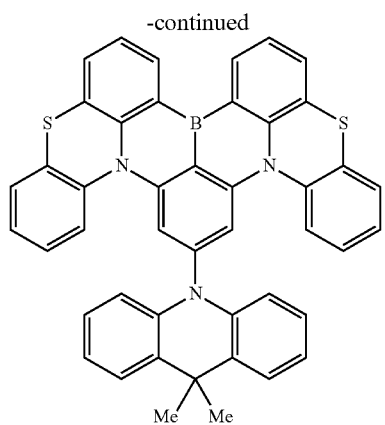
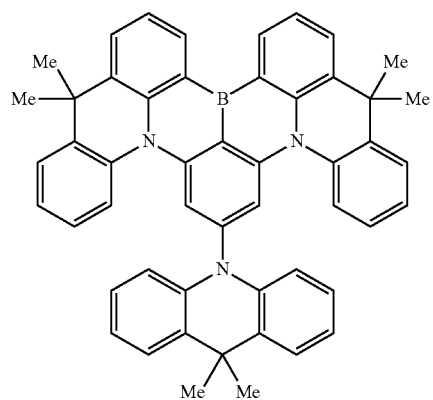
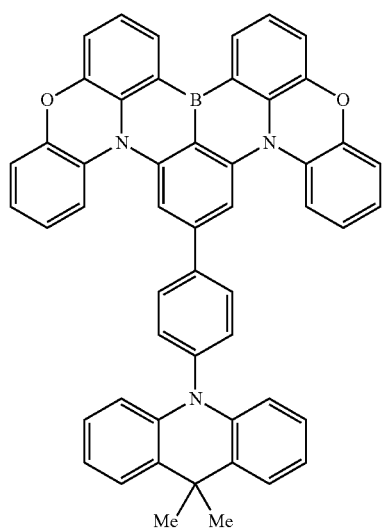
56
-continued
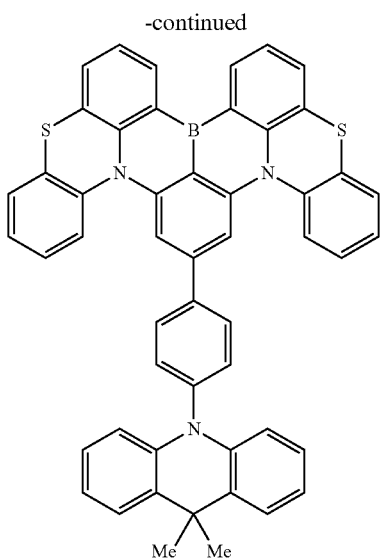
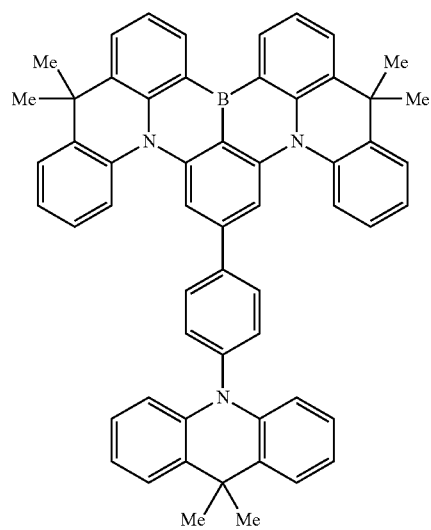
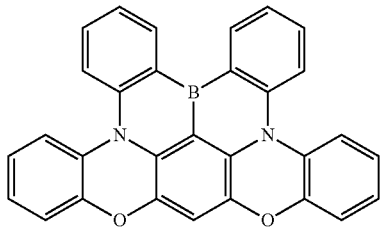
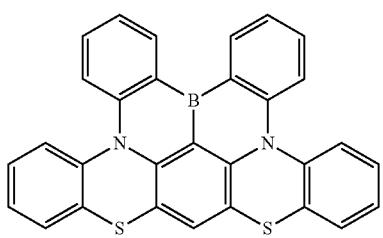

57
-continued
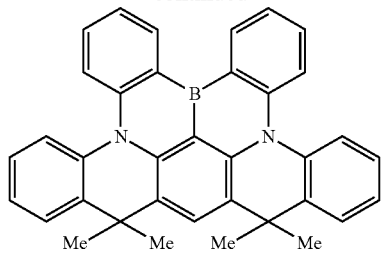
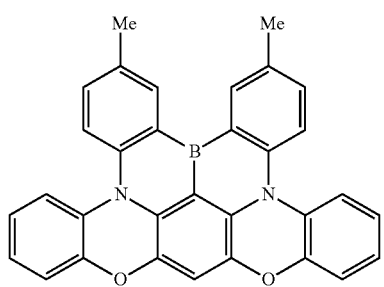
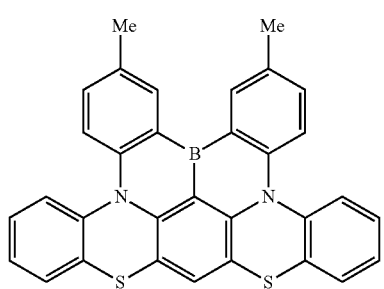
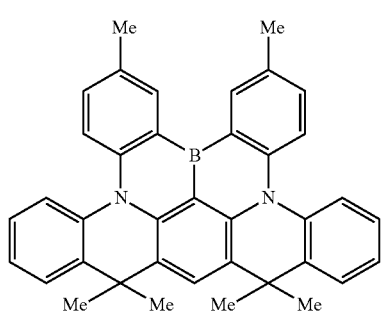
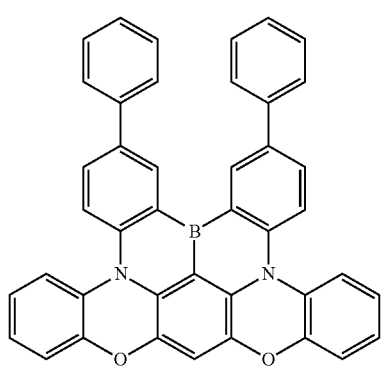
58
-continued
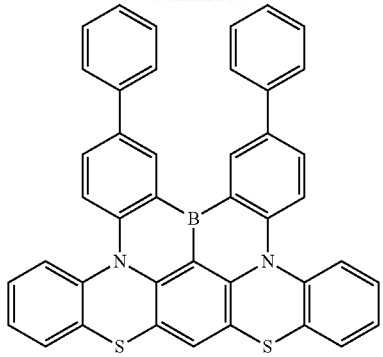
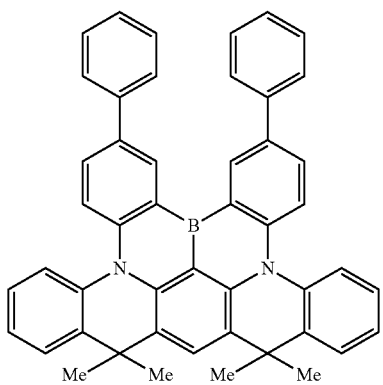
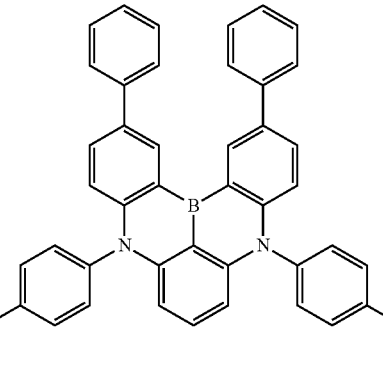
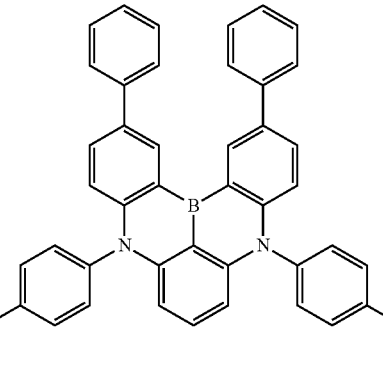
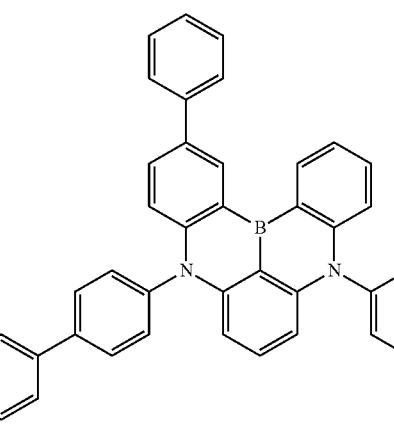

59
-continued
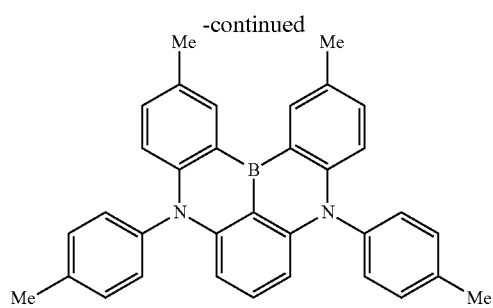
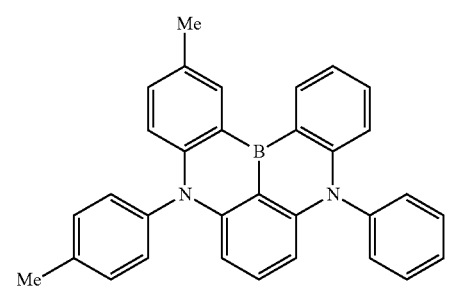
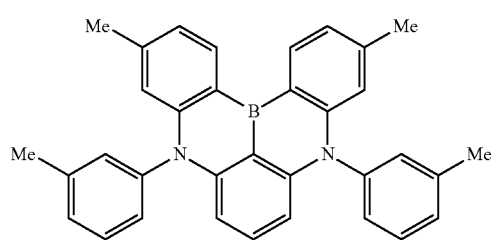
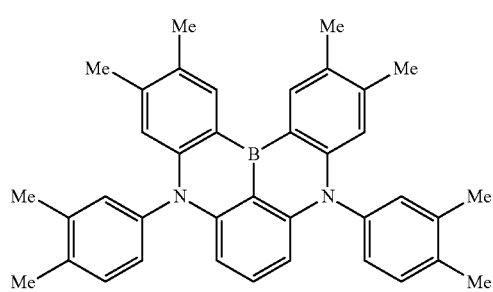
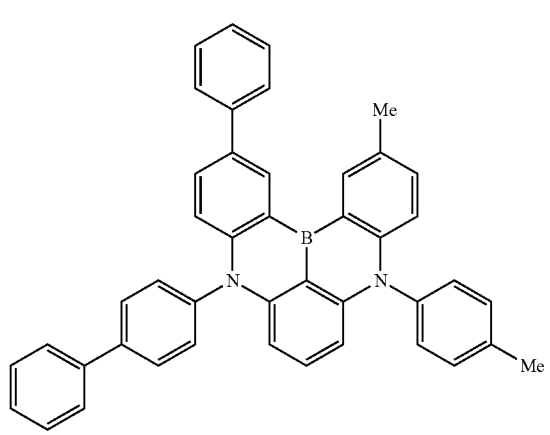
60
-continued
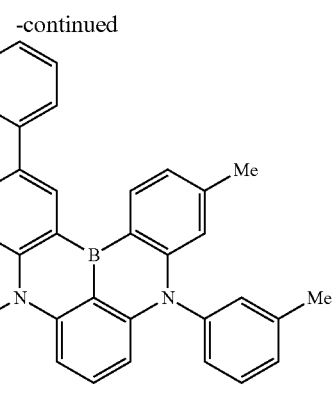
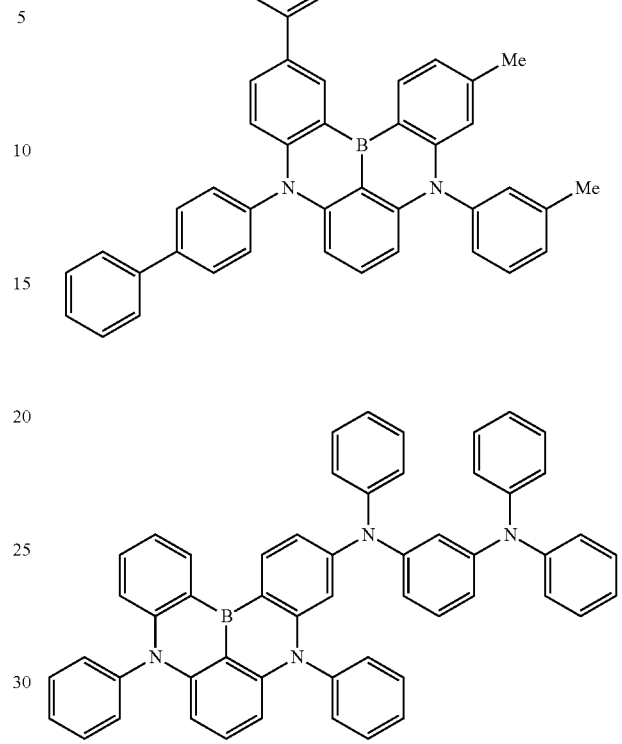
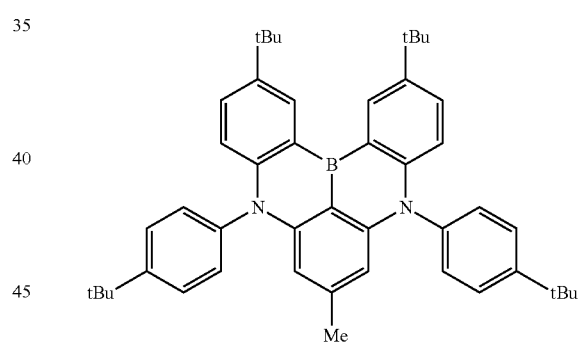
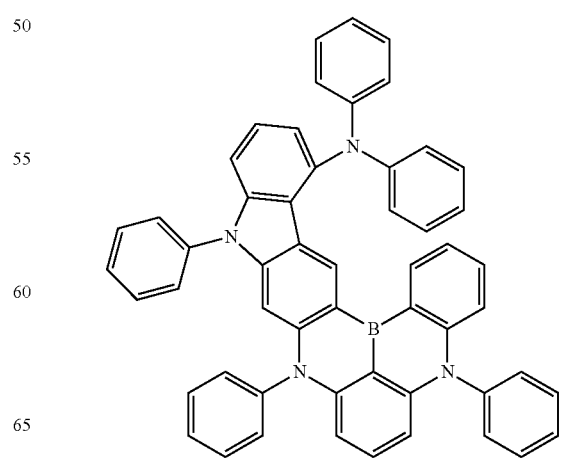

-continued
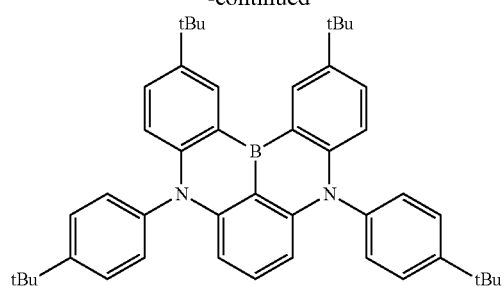
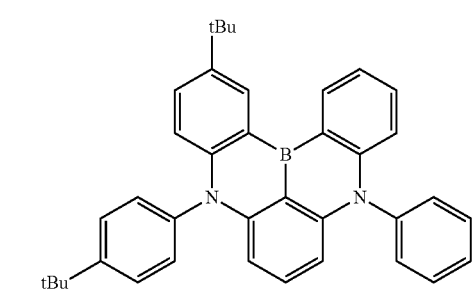
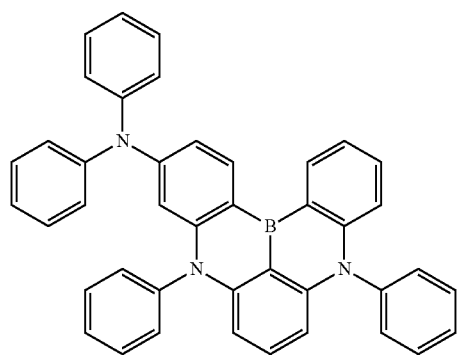
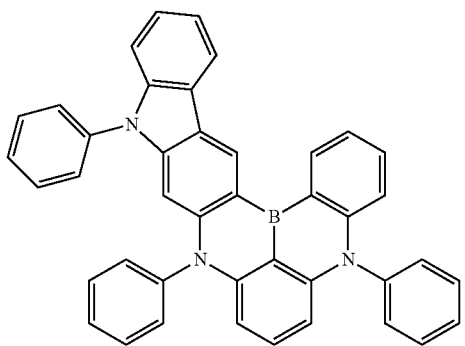
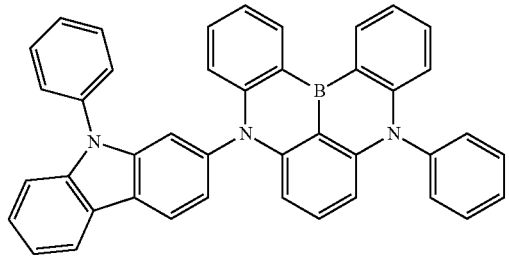
-continued
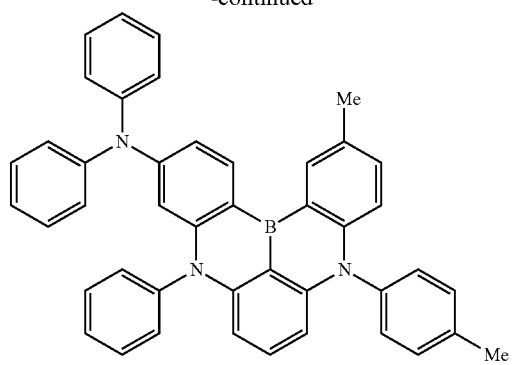
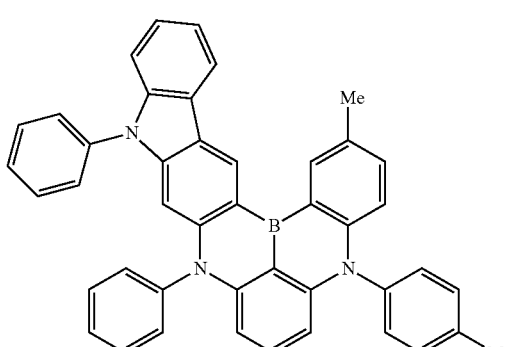
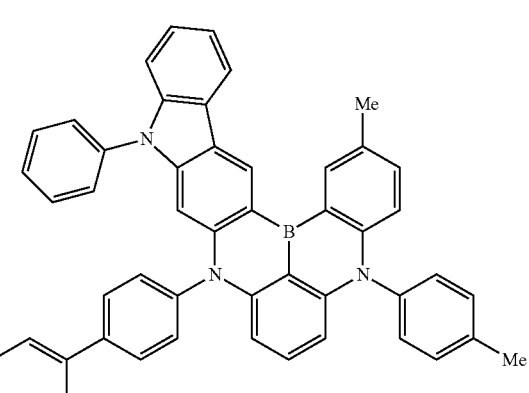
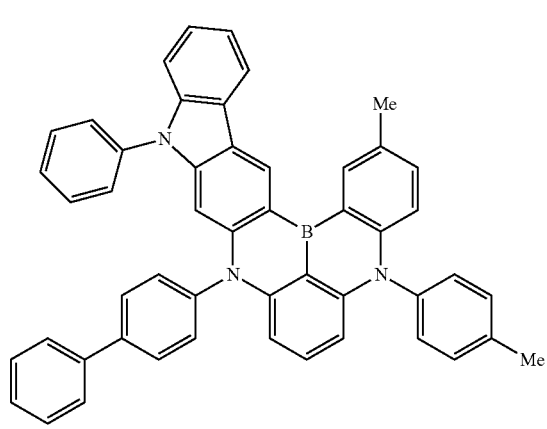
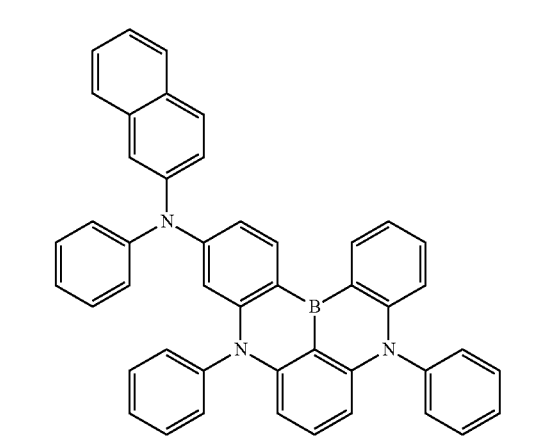

63
-continued
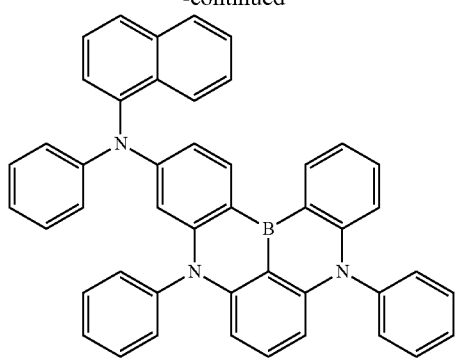
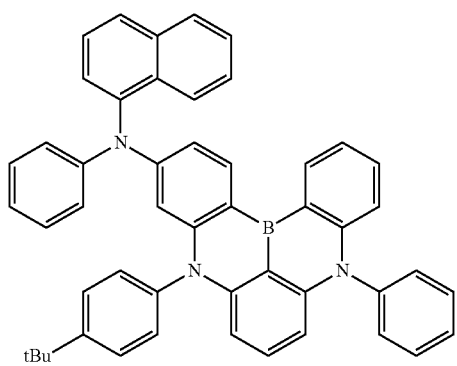
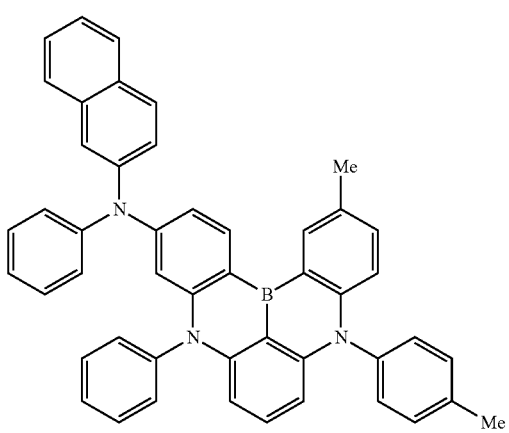
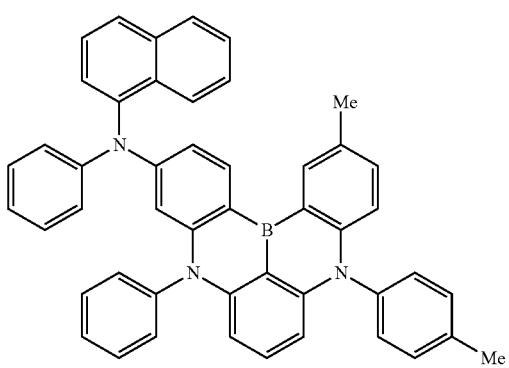
64
-continued
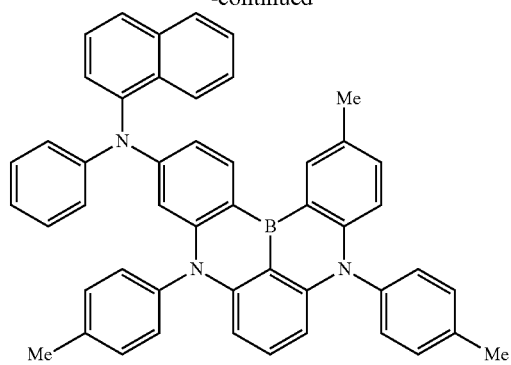
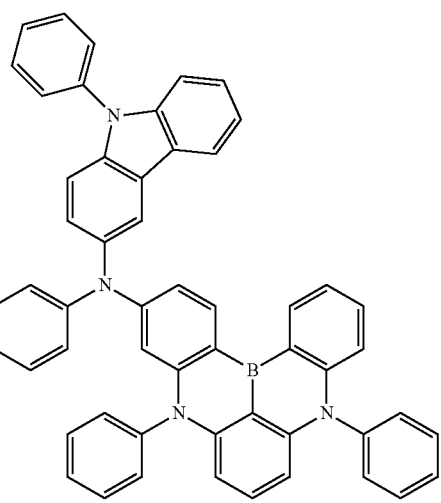
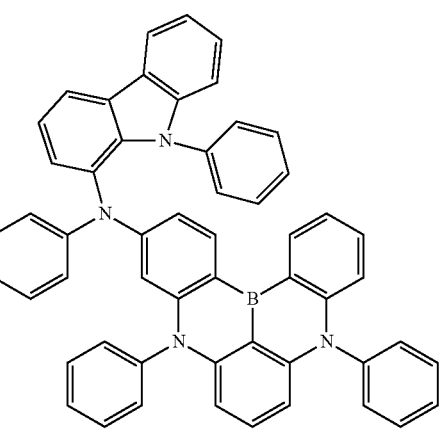

65
-continued
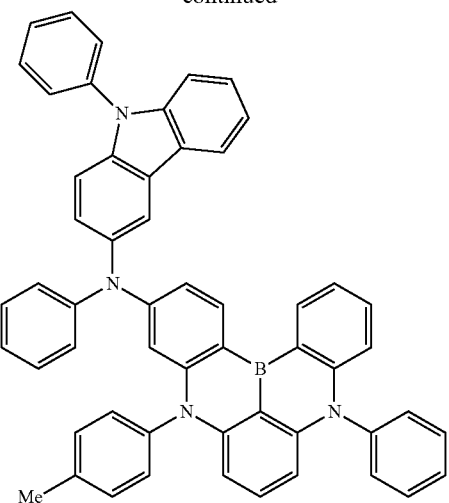
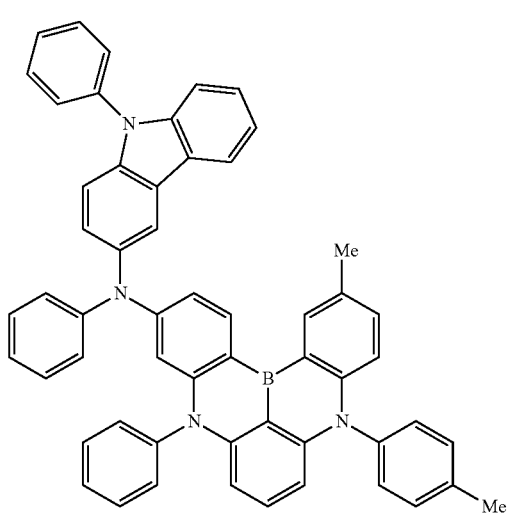
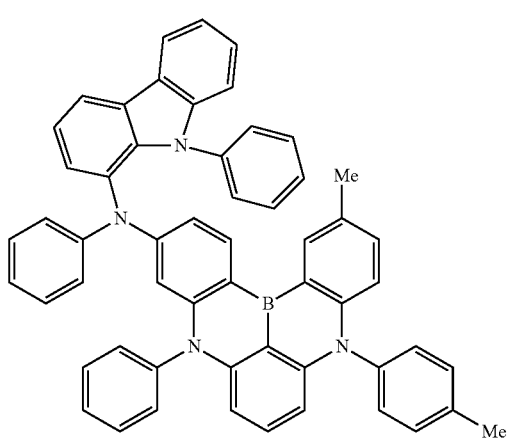
66
-continued
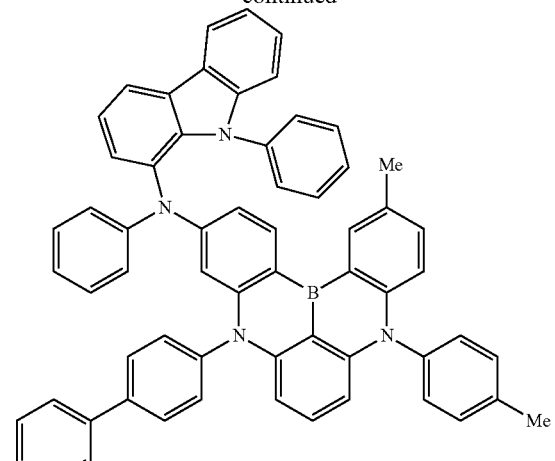
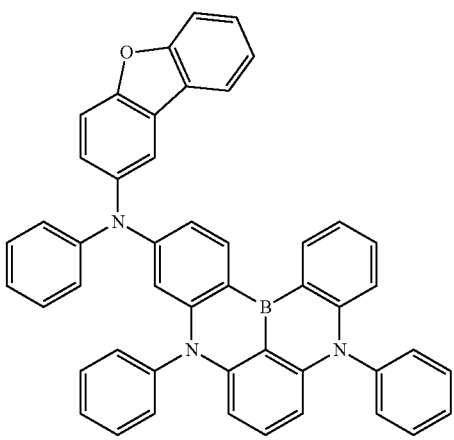

67
-continued
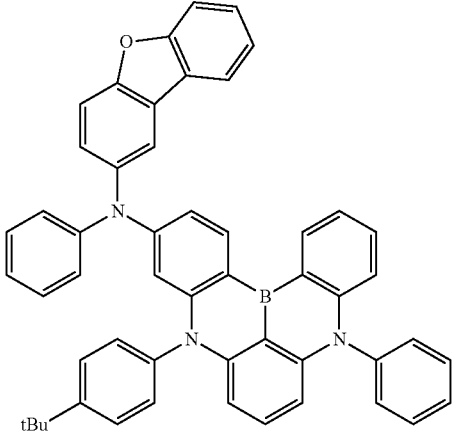
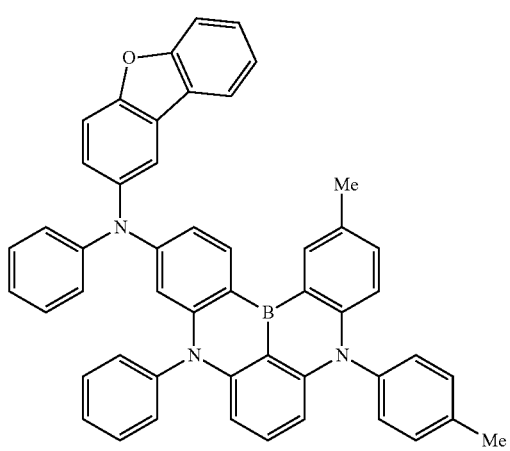
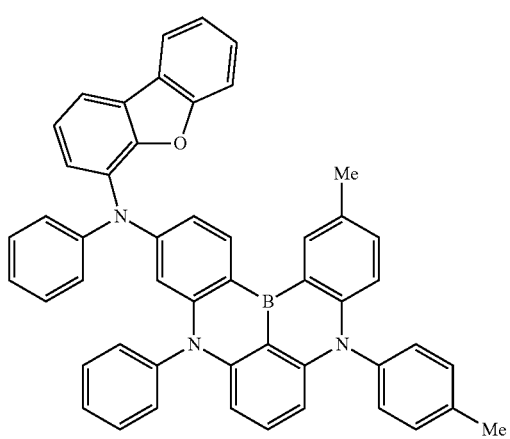
68
-continued
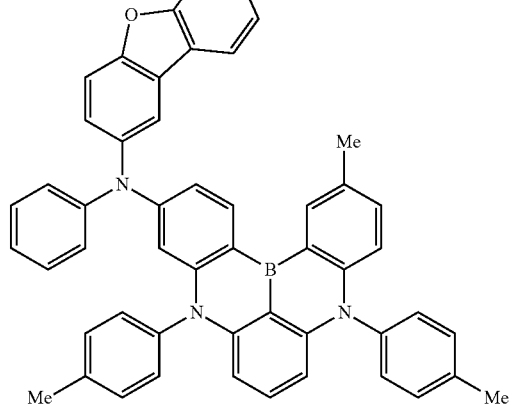
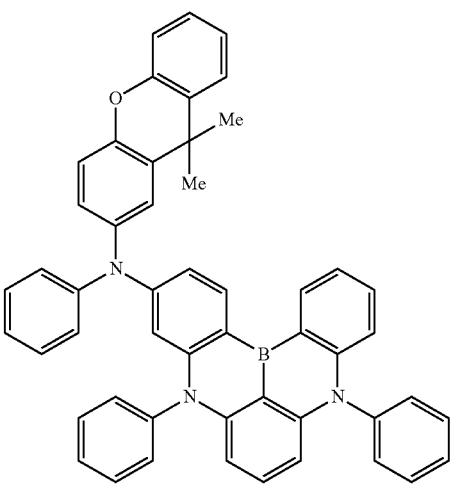
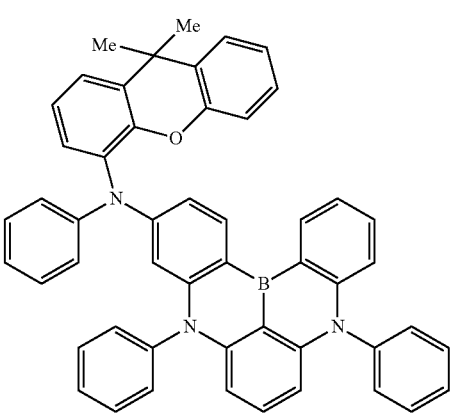

69
-continued
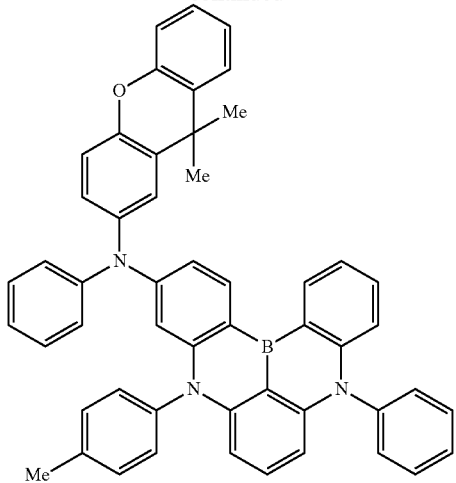
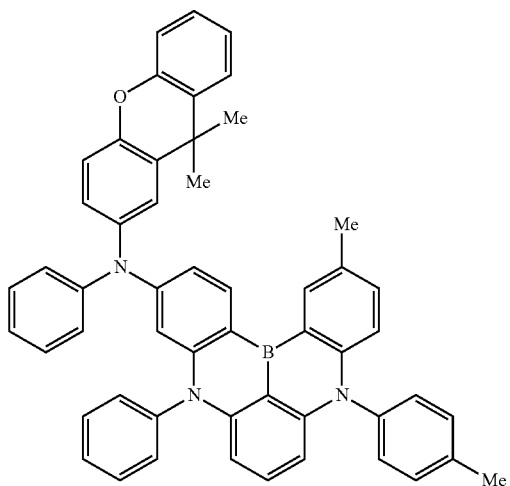
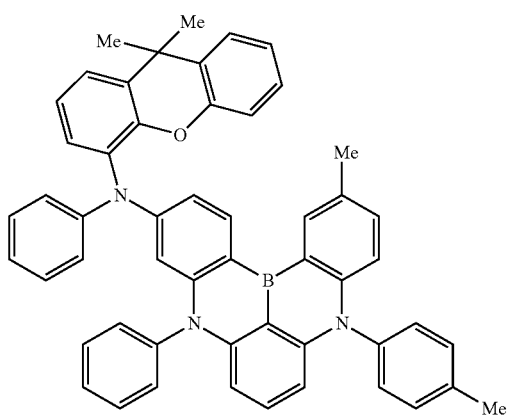
70
-continued
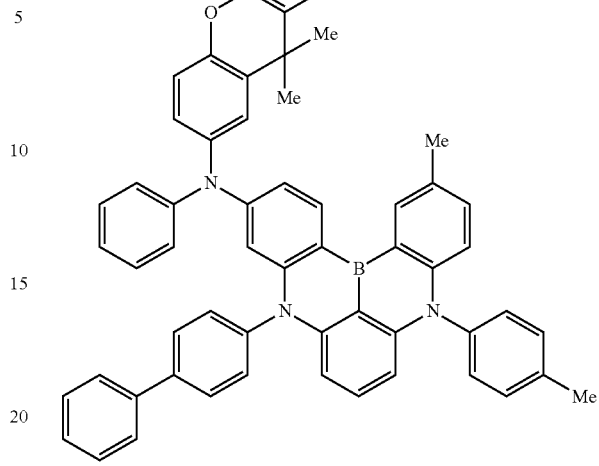
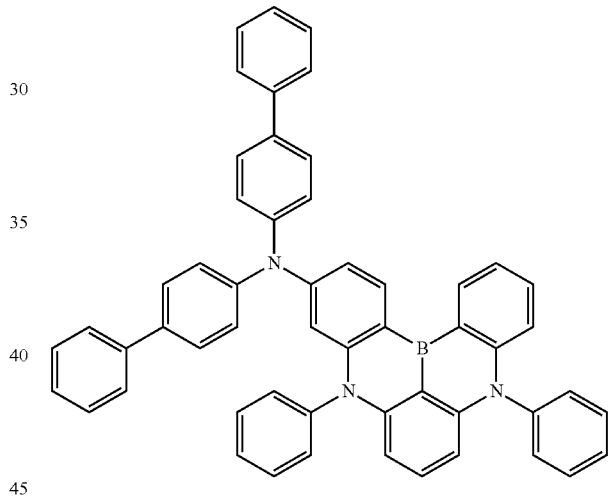
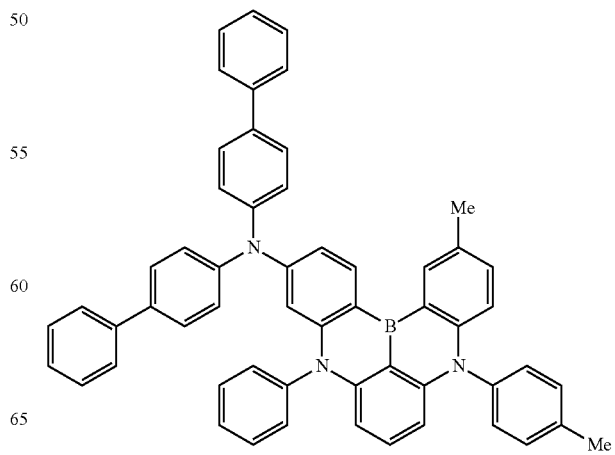

71
-continued
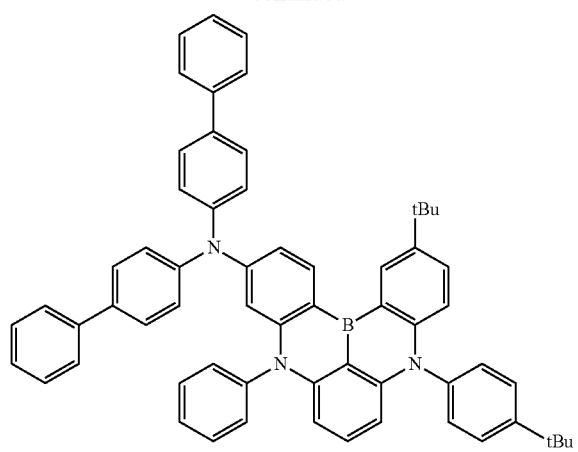
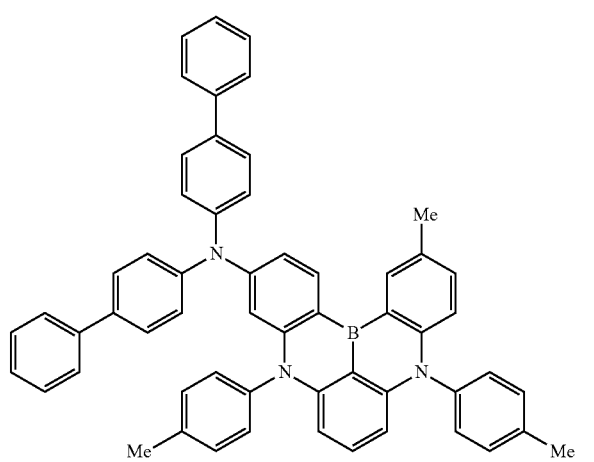
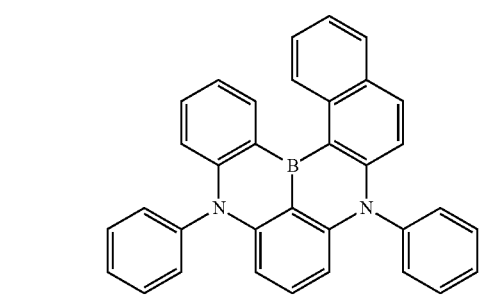
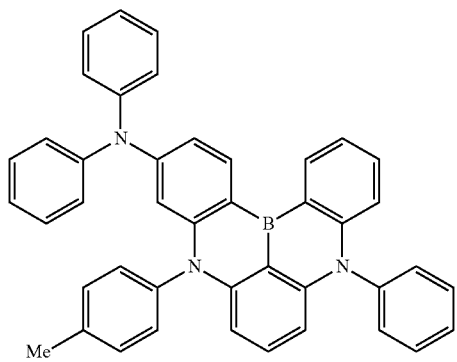
72
-continued
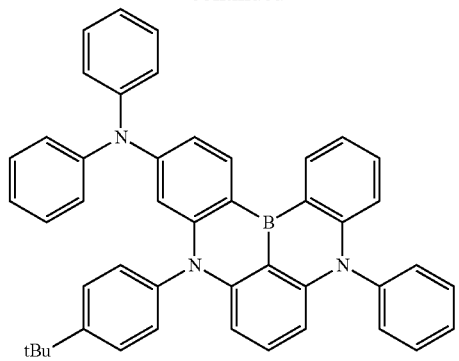
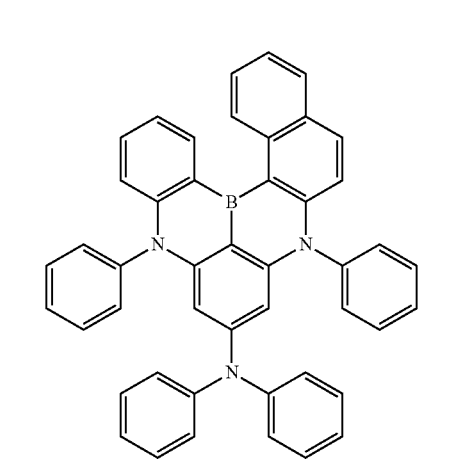
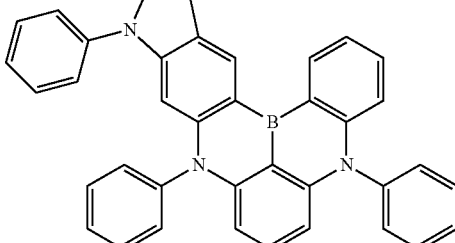
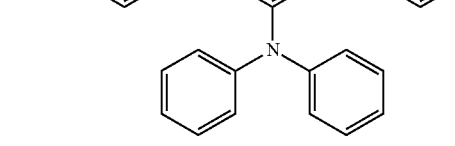
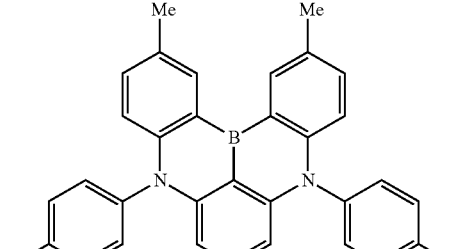
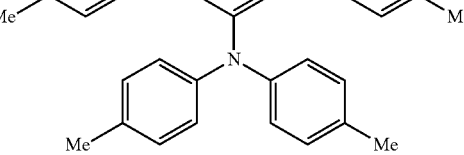

73
-continued
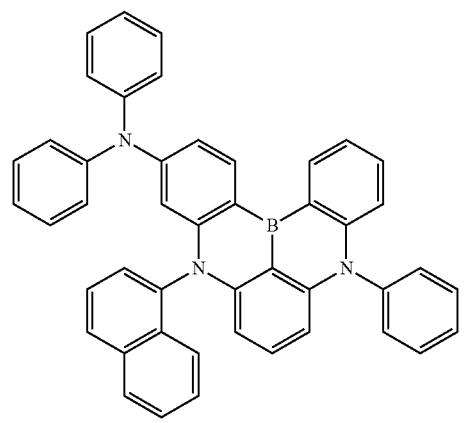
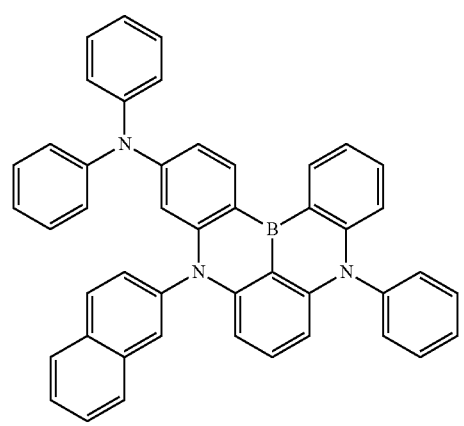
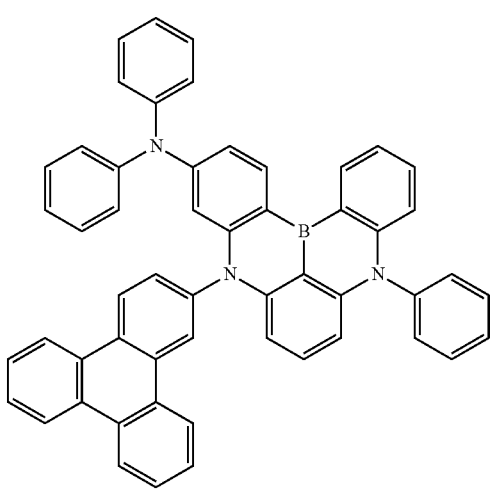
74
-continued
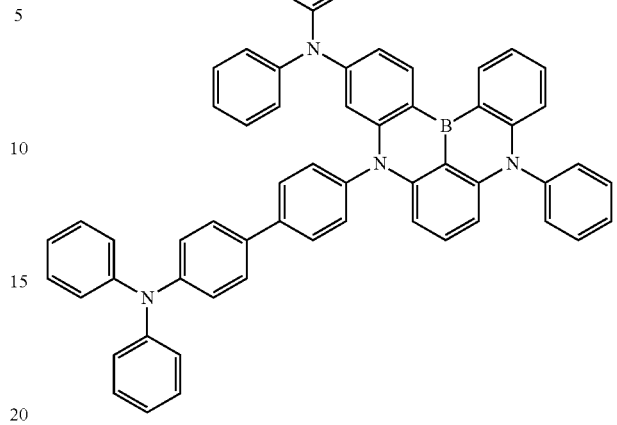
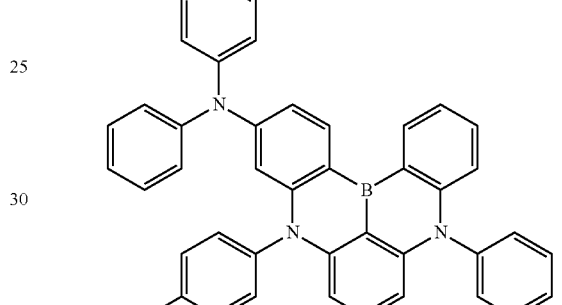
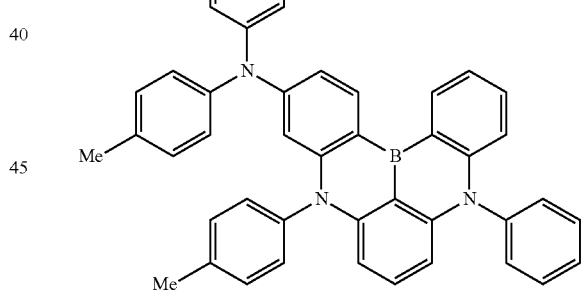
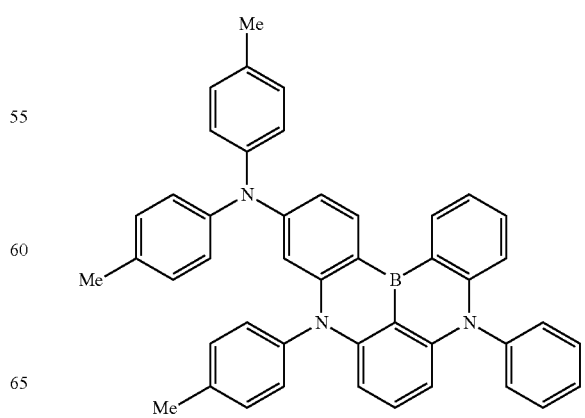

75
-continued
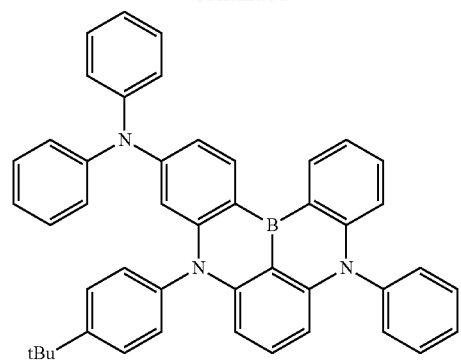
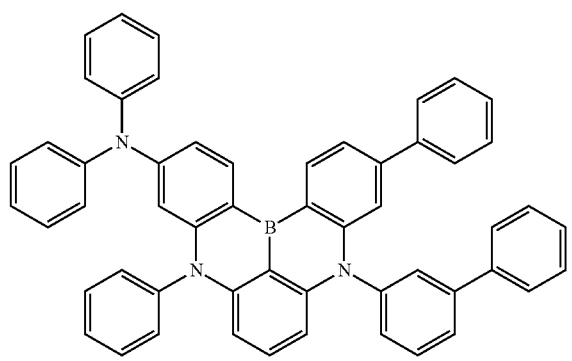
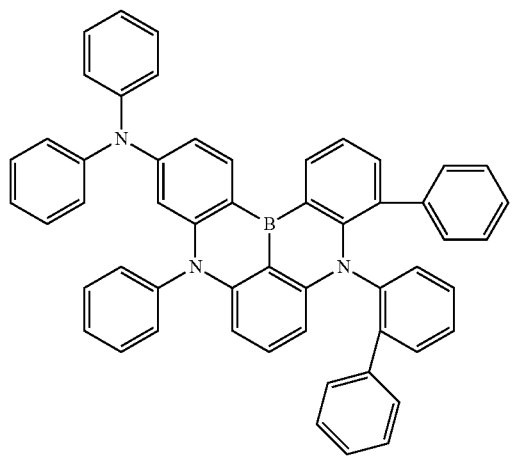
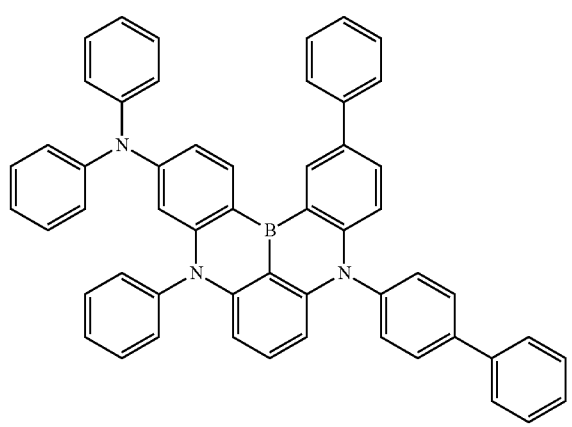
76
-continued
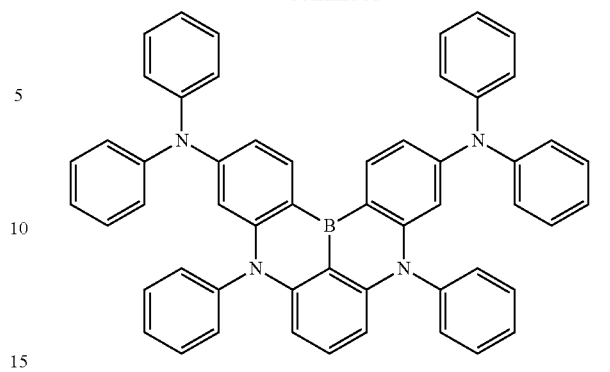
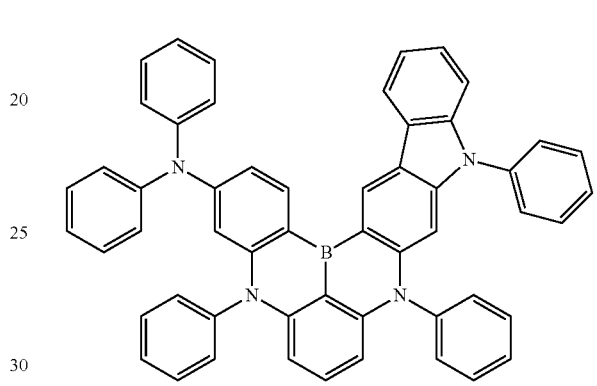
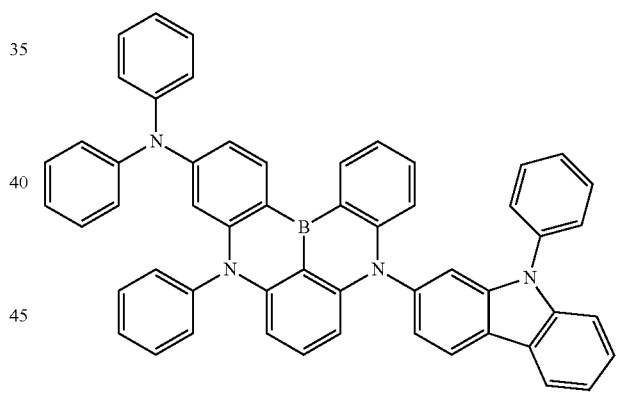
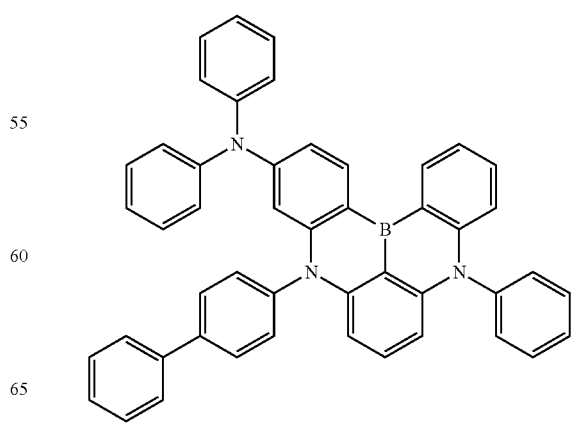

77
-continued
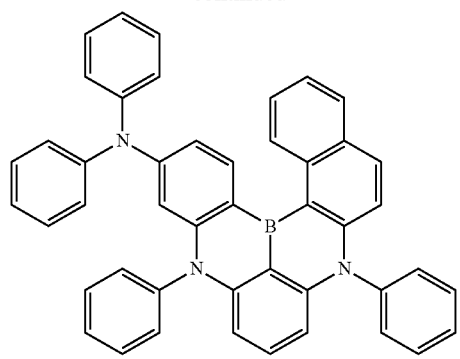
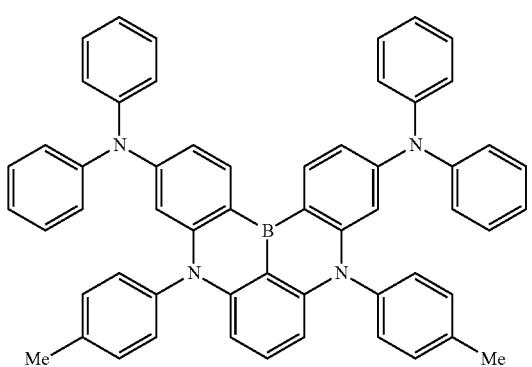
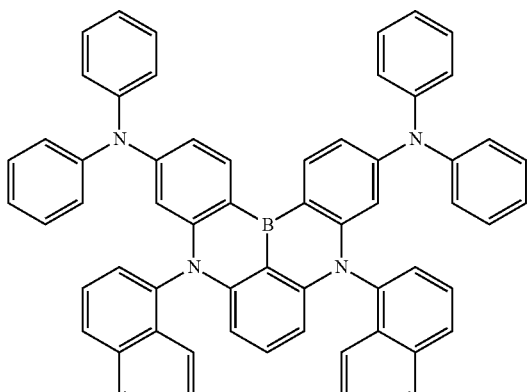
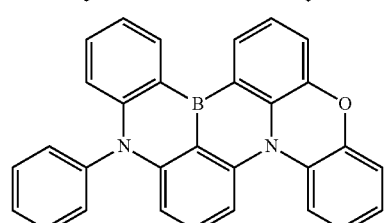
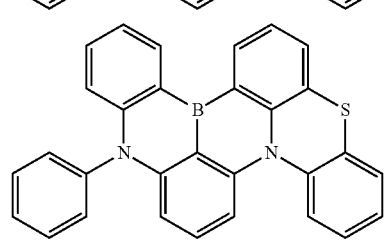
78
-continued
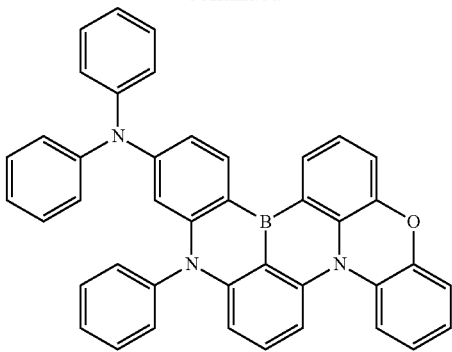
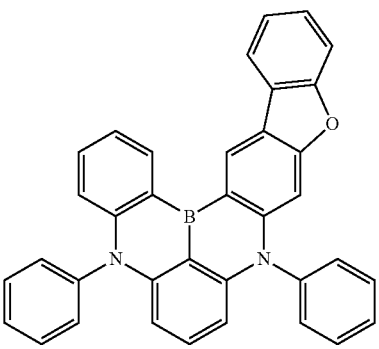
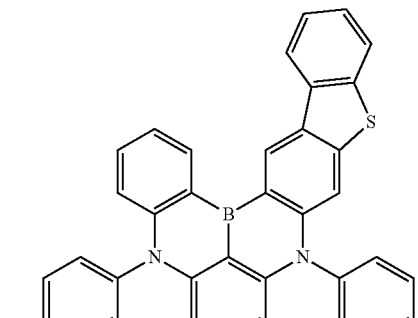
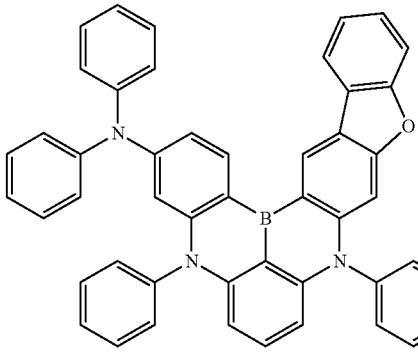
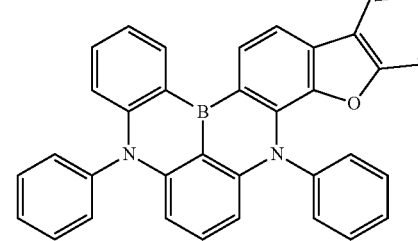

79
-continued
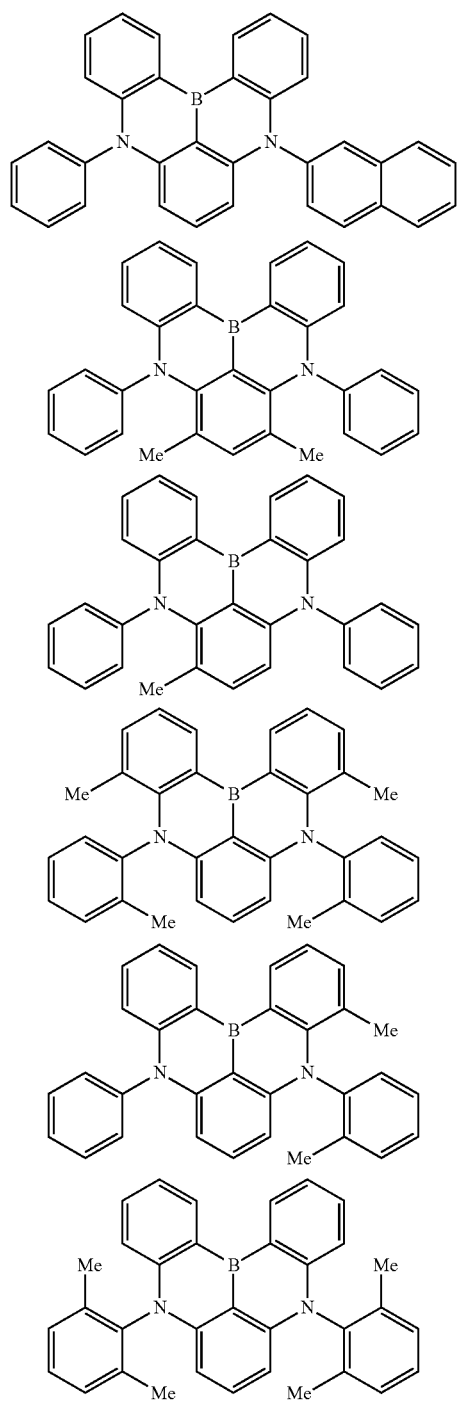
80
-continued
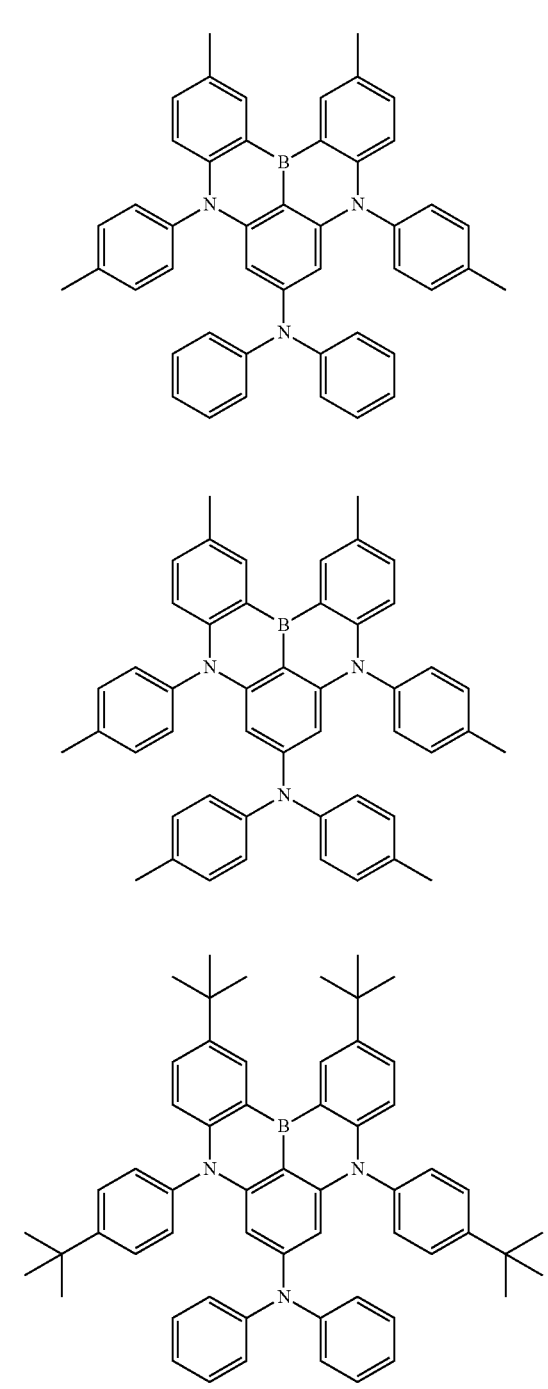

81
-continued
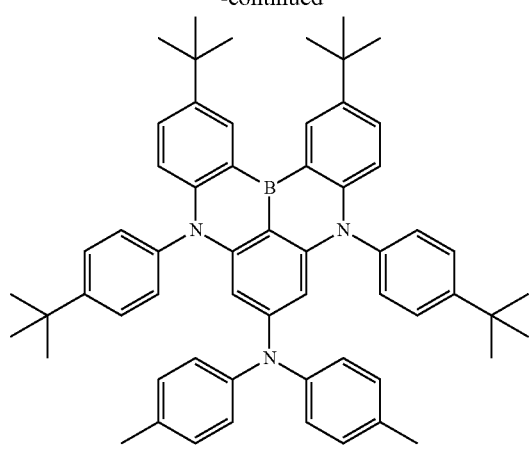
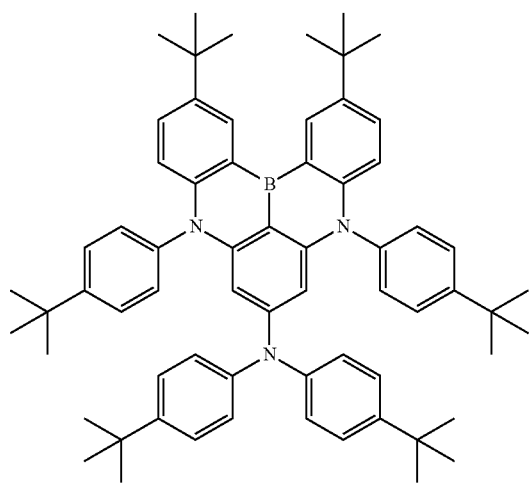
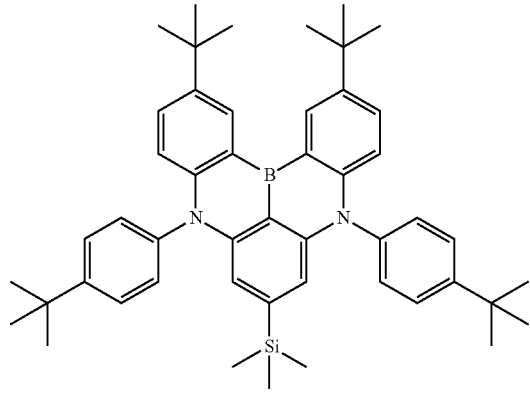
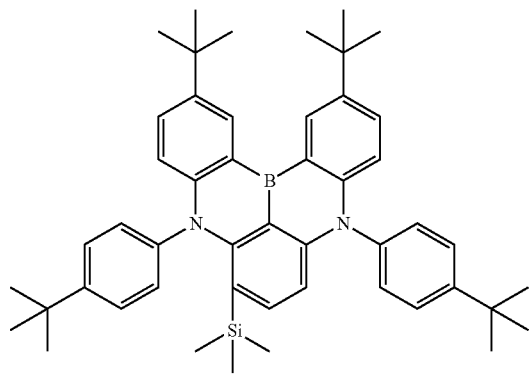
82
-continued
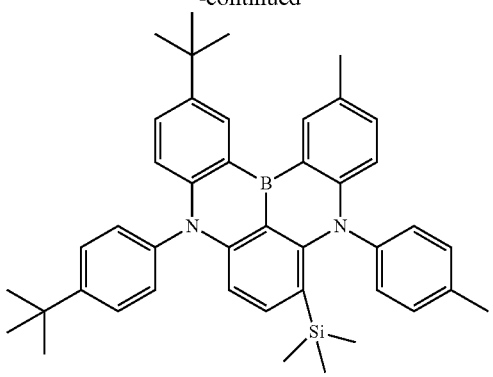
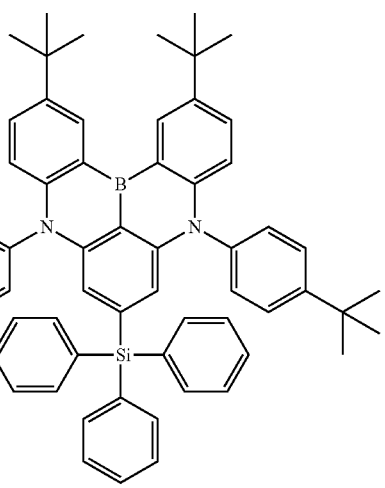
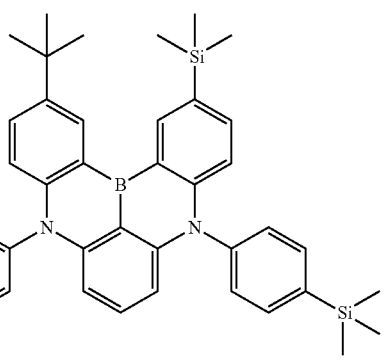
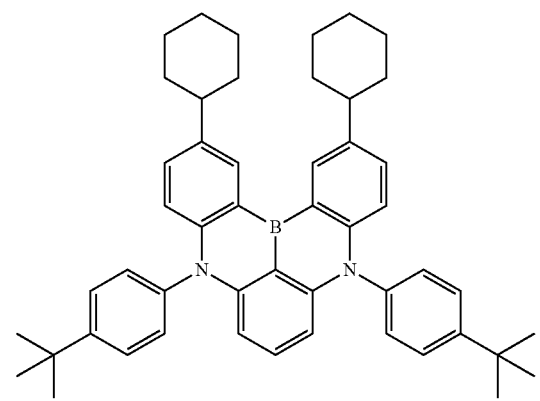

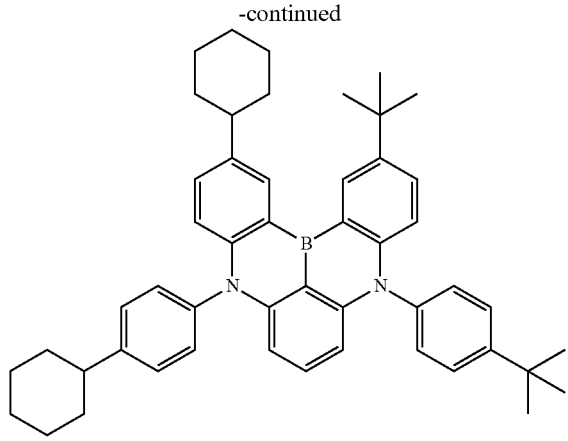

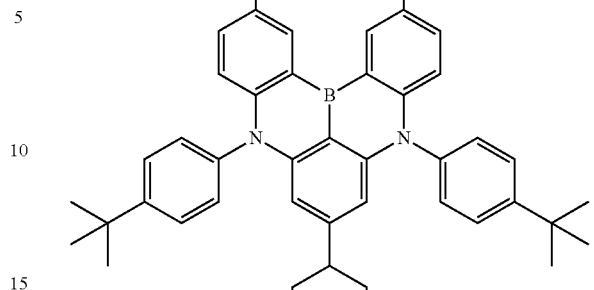

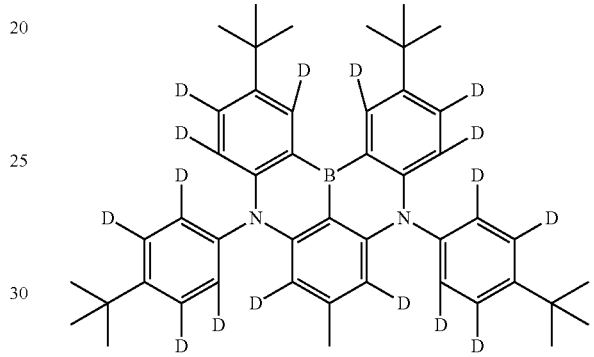

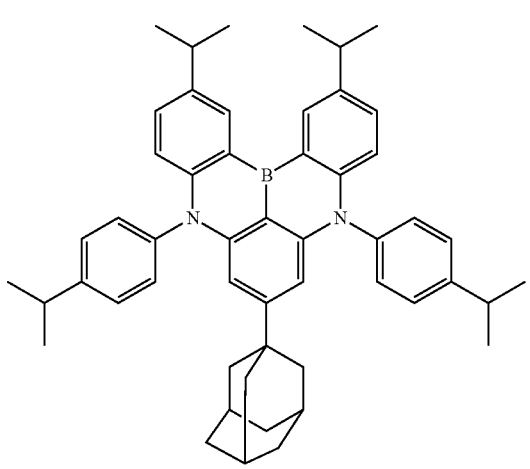

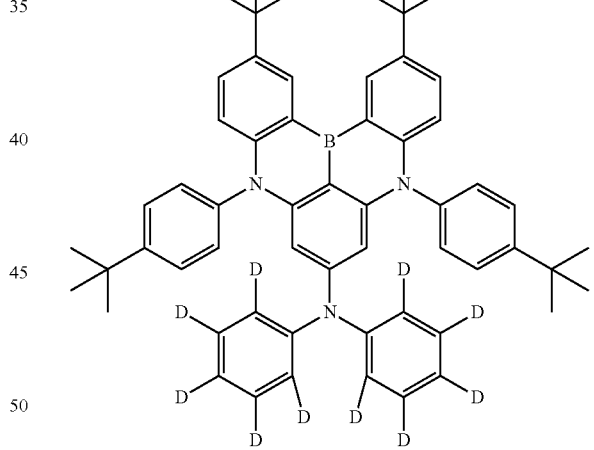

The compound represented by the formula (1) can be prepared by first bonding a ring a, a ring b, and a ring c through linking groups (a group containing N—$R_1$ and a group containing N—$R_2$) to form an intermediate (first reaction), followed by bonding of the ring a, the ring b, and the ring c through a linking group (which contains B) to produce a final product (second reaction). In the first reaction, an amination reaction such as a Buchwald-Hartwig reaction can be applied. In the second reaction, a tandem hetero-Friedel-Crafts reaction or the like can be applied.

(Compound Represented by the Formula (11))

Next, a compound represented by the formula (11) will be described.

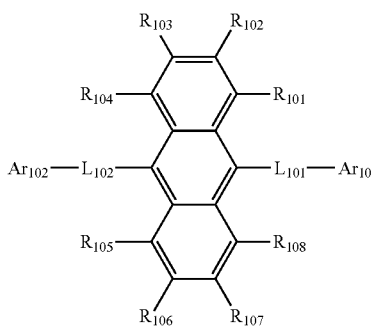
(11)

In the formula (11),
$R_{101}$ to $R_{106}$ are independently
a hydrogen atom, a halogen atom, a cyano group, a nitro group,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
—N($R_{906}$)($R_{907}$),
a substituted or unsubstituted aryl group including 6 to 50 ring carbon atoms, or
a substituted or unsubstituted monovalent heterocyclic group including 5 to 50 ring atoms;
  adjacent two or more among $R_{101}$ to $R_{104}$, and adjacent two or more among $R_{106}$ to $R_{108}$ do not form a ring by bonding with each other,
  $R_{901}$ to $R_{907}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms;
  when two or more of each of $R_{901}$ to $R_{907}$ are present, the two or more of each of $R_{901}$ to $R_{907}$ may be the same or different;
  $L_{101}$ and $L_{102}$ are independently
a single bond,
a substituted or unsubstituted arylene group including 6 to 30 ring carbon atoms, or
a substituted or unsubstituted divalent heterocyclic group including 5 to 30 ring atoms;
  at least one of $Ar_{101}$ and $Ar_{102}$ is a monovalent group represented by the following formula (12);
  $Ar_{101}$ or $Ar_{102}$ which are not the monovalent group represented by the following formula (12) is
a substituted or unsubstituted aryl group including 6 to 50 ring carbon atoms, or
a substituted or unsubstituted monovalent heterocyclic group including 5 to 50 ring atoms; and when $Ar_{101}$ and $Ar_{102}$ are both the monovalent groups represented by the following formula (12), $Ar_{101}$ and $Ar_{102}$ which are the monovalent groups represented by the following formula (12) may be the same as or different from each other.

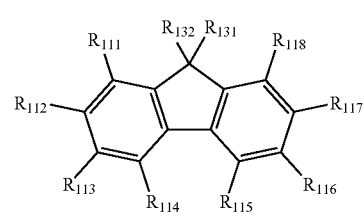
(12)

In the formula (12),
$R_{131}$ and $R_{132}$ are independently
a hydrogen atom, a halogen atom, a cyano group, a nitro group,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms, or
a substituted or unsubstituted cycloalkyl group including 3 to 50 ring carbon atoms;
  $R_{131}$ and $R_{132}$ do not form a ring by bonding with each other; and
  one or more sets of adjacent two or more of $R_{111}$ to $R_{118}$ forms an unsaturated ring represented by the following formula (20) by bonding with each other, or do not form the unsaturated ring represented by the following formula (20).

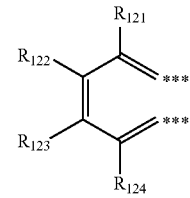
(20)

In the formula (20), "***" indicates a position bonding to adjacent two among $R_{111}$ to $R_{118}$;
  when one or more sets of adjacent two among $R_{111}$ to $R_{118}$ form the unsaturated ring represented by the formula (20) by bonding with each other, one of $R_{111}$ to $R_{118}$ which do not form the unsaturated ring represented by the formula (20) and $R_{121}$ to $R_{124}$ is a single bond bonding with $L_{101}$ or $L_{102}$;
  when two or more unsaturated rings represented by the formula (20) are formed, a plurality of each of $R_{121}$ to $R_{124}$ may be the same as or different from each other,
  when one or more sets of adjacent two among $R_{111}$ to $R_{118}$ do not form the unsaturated ring represented by the formula (20), one of $R_{111}$ to $R_{118}$ is a single bond bonding with $L_{101}$ or $L_{102}$;
  in the case when the unsaturated ring represented by the formula (20) is formed and in the case when the unsaturated ring represented by the formula (20) is not formed, one or more sets of adjacent two among $R_{111}$ to $R_{118}$ which do not form the unsaturated ring represented by the formula (20) and are not a single bond bonding with $L_{101}$ or $L_{102}$ form a substituted or unsubstituted, saturated or unsaturated ring other than the unsaturated ring represented by the formula (20) or do not form a substituted or unsubstituted, saturated or unsaturated ring;

$R_{111}$ to $R_{118}$ which do not form the unsaturated ring represented by the formula (20), do not form a substituted or unsubstituted, saturated or unsaturated ring other than the unsaturated ring represented by the formula (20), and are not a single bond bonding with $L_{101}$ or $L_{102}$, and $R_{121}$ to $R_{124}$ which are not a single bond bonding with $L_{101}$ or $L_{102}$ are independently a hydrogen atom, a halogen atom, a cyano group, a nitro group, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si$(R_{901})(R_{902})(R_{903})$,

—O—$(R_{904})$,

—S—$(R_{905})$,

—N$(R_{906})(R_{907})$, a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formula (11).

In one embodiment, it is preferable that $R_{112}$ or $R_{113}$ in the monovalent group represented by the formula (12) be a single bond bonding with $L_{101}$ or $L_{102}$ in the formula (11).

In one embodiment, -$L_{101}$-$Ar_{101}$ and -$L_{102}$-$Ar_{102}$ in the formula (11) do not contain one or both of a group derived from a substituted or unsubstituted dibenzofuran ring and a group derived from a substituted or unsubstituted dibenzothiophene ring. This means that neither $L_{101}$, $L_{102}$, $Ar_{101}$ nor $Ar_{102}$ is a group derived from a substituted or unsubstituted dibenzofuran ring or a group derived from a substituted or unsubstituted dibenzothiophene ring, and further means that arbitrary substituents of $L_{101}$, $L_{102}$, $Ar_{101}$, and $Ar_{102}$ are not a group derived from a substituted or unsubstituted dibenzofuran ring and a group derived from a substituted or unsubstituted dibenzothiophene ring.

In one embodiment, $Ar_{101}$ and $Ar_{102}$ which are not a monovalent group represented by the formula (12) are preferably a substituted or unsubstituted aryl group selected from the group consisting of: a phenyl group, a p-biphenyl group, an m-biphenyl group, an o-biphenyl group, a p-terphenyl-4-yl group, a p-naphthyl-3-yl group, a p-terphenyl-2-yl group, an m-terphenyl-4-yl group, an m-terphenyl-3-yl group, an m-terphenyl-2-yl group, an o-terphenyl-4-yl group, an o-terphenyl-3-yl group, an o-terphenyl-2-yl group, a 1-naphthyl group, a 2-naphthyl group, an anthryl group, a phenanthryl group, a pyrenyl group, a chrysenyl group, a triphenylenyl group, a fluorenyl group, a 9,9'-spirobifluorenyl group, and a 9,9-diphenylfluorenyl group; or a substituted or unsubstituted monovalent heterocyclic group selected from the group consisting of: a pyridyl group, a pyrimidinyl group, a triazinyl group, a quinolyl group, an isoquinolyl group, a quinazolinyl group, a benzimidazolyl group, a phenanthrolinyl group, a carbazolyl group, a benzocarbazolyl group, an azacarbazolyl group, a diazacarbazolyl group, an azadibenzofuranyl group, a diazadibenzofuranyl group, an azadibenzothiophenyl group, a diazadibenzothiophenyl group, a (9-phenyl)carbazolyl group, a (9-biphenylyl)carbazolyl group, a (9-phenyl)phenylcarbazolyl group, a diphenylcarbazol-9-yl group, a phenylcarbazol-9-yl group, a phenyltriazinyl group, a biphenylyltriazinyl group, a diphenyltriazinyl group, a phenyldibenzofuranyl group, and a phenyldibenzothiophenyl group.

In one embodiment, $L_{101}$ and $L_{102}$ in the formula (11) are preferably a single bond;

a divalent group derived from a substituted or unsubstituted aryl group selected from the group consisting of: a phenyl group, a p-biphenyl group, an m-biphenyl group, an o-biphenyl group, a p-terphenyl-4-yl group, a p-naphthyl-3-yl group, a p-terphenyl-2-yl group, an m-terphenyl-4-yl group, an m-terphenyl-3-yl group, an m-terphenyl-2-yl group, an o-terphenyl-4-yl group, an o-terphenyl-3-yl group, an o-terphenyl-2-yl group, a 1-naphthyl group, a 2-naphthyl group, an anthryl group, a phenanthryl group, a pyrenyl group, a chrysenyl group, a triphenylenyl group, a fluorenyl group, a 9,9'-spirobifluorenyl group, and a 9,9-diphenylfluorenyl group; or a divalent group derived from a substituted or unsubstituted monovalent heterocyclic group selected from the group consisting of: a pyridyl group, a pyrimidinyl group, a triazinyl group, a quinolyl group, an isoquinolyl group, a quinazolinyl group, a benzimidazolyl group, a phenanthrolinyl group, a carbazolyl group, a benzocarbazolyl group, an azacarbazolyl group, a diazacarbazolyl group, an azadibenzofuranyl group, a diazadibenzofuranyl group, an azadibenzothiophenyl group, a diazadibenzothiophenyl group, a (9-phenyl)carbazolyl group, a (9-biphenylyl)carbazolyl group, a (9-phenyl)phenylcarbazolyl group, a diphenylcarbazol-9-yl group, a phenylcarbazol-9-yl group, a phenyltriazinyl group, a biphenylyltriazinyl group, a diphenyltriazinyl group, a phenyldibenzofuranyl group, and a phenyldibenzothiophenyl group.

Furthermore, when $L_{101}$, $L_{102}$, $Ar_{101}$ and $Ar_{102}$ have an arbitrary substituent, the arbitrary substituent is preferably a group selected from the group consisting of:

unsubstituted alkyl groups such as a methyl group, an ethyl group, a propyl group, an isopropyl group, an n-butyl group, an isobutyl group, and a t-butyl group;

unsubstituted aryl groups such as a phenyl group, a p-biphenyl group, an m-biphenyl group, an o-biphenyl group, a p-terphenyl-4-yl group, a p-naphthyl-3-yl group, a p-terphenyl-2-yl group, an m-terphenyl-4-yl group, an m-terphenyl-3-yl group, an m-terphenyl-2-yl group, an o-terphenyl-4-yl group, an o-terphenyl-3-yl group, an o-terphenyl-2-yl group, a 1-naphthyl group, a 2-naphthyl group, an anthryl group, a phenanthryl group, a pyrenyl group, a chrysenyl group, a triphenylenyl group, and a fluorenyl group; and unsubstituted monovalent heterocyclic groups such as a pyridyl group, a pyrimidinyl group, a triazinyl group, a quinolyl group, an isoquinolyl group, a quinazolinyl group, a benzimidazolyl group, a phenanthrolinyl group, a carbazolyl group, a benzocarbazolyl group, an azacarbazolyl group, a diazacarbazolyl group, an azadibenzofuranyl group, a diazadibenzofuranyl group, an azadibenzothiophenyl group, and a diazadibenzothiophenyl group In one embodiment, one of $Ar_{101}$ and $Ar_{102}$ in the formula (11) is a monovalent group represented by the formula (12).

In one embodiment, the compound represented by the formula (11) is a compound represented by the following formula (13).

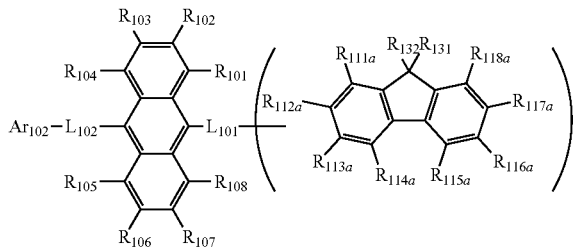

(13)

In the formula (13), $R_{101}$ to $R_{106}$, $L_{101}$, and $L_{102}$ are as defined in the formula (11);

$Ar_{102}$ is a monovalent group represented by the formula (12), a substituted or unsubstituted aryl group including 6 to 50 ring carbon atoms, or a substituted or unsubstituted monovalent heterocyclic group including 5 to 50 ring atoms;

$R_{131}$ and $R_{132}$ are as defined in the formula (12);

one of $R_{112a}$ to $R_{114a}$ is a single bond bonding with $L_{101}$;

one or more sets of adjacent two among $R_{111a}$, $R_{112a}$ to $R_{114a}$ which are not a single bond bonding with $L_{101}$, and $R_{115a}$ to $R_{118a}$ forms an unsaturated ring represented by the formula (20) by bonding with each other, or do not form an unsaturated ring represented by the formula (20);

$R_{111a}$, $R_{112a}$ to $R_{114a}$ which are not a single bond bonding with $L_{101}$ and do not form an unsaturated ring represented by the formula (20), and $R_{115a}$ to $R_{118a}$ which do not form an unsaturated ring represented by the formula (20) are independently a hydrogen atom, a halogen atom, a cyano group, a nitro group, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—$O$—$(R_{904})$,

—$S$—$(R_{905})$,

—$N(R_{906})(R_{907})$, a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formula (11).

In one embodiment, the compound represented by the formula (11) is a compound represented by the following formula (14).

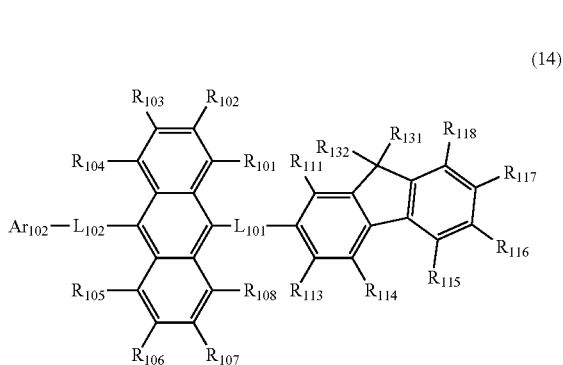

(14)

In the formula (14), $R_{101}$ to $R_{106}$, $L_{101}$, $L_{102}$, $R_{111}$, $R_{113}$ to $R_{118}$, $R_{131}$ and $R_{132}$ are as defined in any of the formulas (11) and (12); and $Ar_{102}$ is a monovalent group represented by the formula (12), a substituted or unsubstituted aryl group including 6 to 50 ring carbon atoms, or a substituted or unsubstituted monovalent heterocyclic group including 5 to 50 ring atoms.

In one embodiment, the monovalent group represented by the formula (12) is selected from monovalent groups represented by each of the following formulas (12A) to (12F).

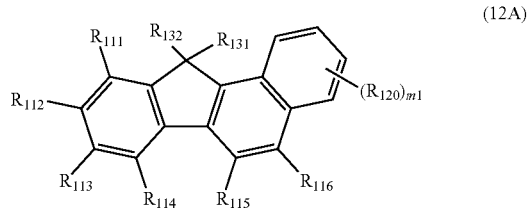

(12A)

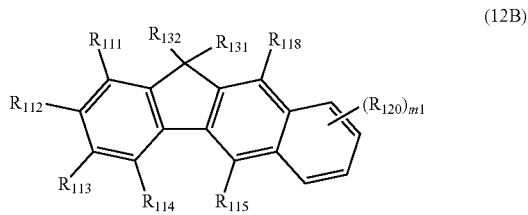

(12B)

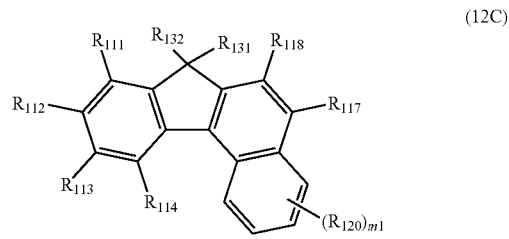

(12C)

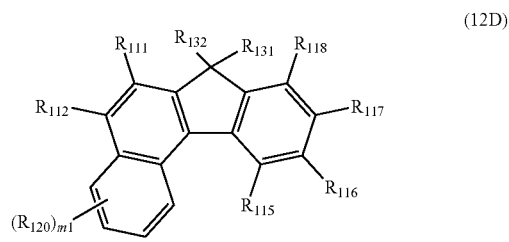

(12D)

-continued

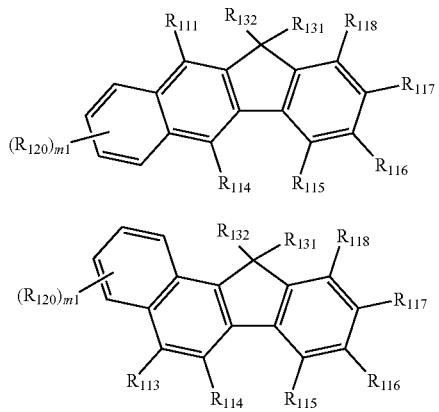

(12E)

(12F)

In the formula (12A) to (12F), $R_{111}$ to $R_{118}$, $R_{131}$, and $R_{132}$ are as defined in the formula (12);

$R_{120}$ is
a halogen atom, a cyano group, a nitro group,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
—N($R_{906}$)($R_{907}$),
a substituted or unsubstituted aryl group including 6 to 50 ring carbon atoms, or
a substituted or unsubstituted monovalent heterocyclic group including 5 to 50 ring atoms;

$R_{901}$ to $R_{907}$ are as defined in the formula (11);
m1 is an integer of 0 to 4;
when m1 is 2 or more, a plurality of $R_{120}$'s may be the same as or different from each other, and
when m1 is 2 or more, a plurality of adjacent $R_{120}$'s form a substituted or unsubstituted, saturated or unsaturated ring by bonding with each other, or do not form a substituted or unsubstituted, saturated or unsaturated ring.

In one embodiment, one of $Ar_{101}$ and $Ar_{102}$ in the formula (11) is a monovalent group represented by the formula (12) and the other is a substituted or unsubstituted aryl group including 6 to 50 ring carbon atoms.

In one embodiment, $Ar_{101}$ or $Ar_{102}$ in the formula (11) which is not a monovalent group represented by the formula (12) is selected from groups represented by each of the following formulas (a1) to (a4).

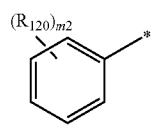

(a1)

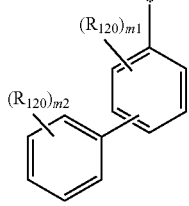

(a2)

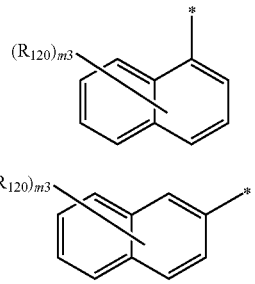

(a3)

(a4)

In the formulas (a1) to (a4), "*" is a single bond bonding with $L_{101}$ or $L_{102}$;

$R_{120}$ is
a halogen atom, a cyano group, a nitro group,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
—N($R_{906}$)($R_{907}$),
a substituted or unsubstituted aryl group including 6 to 50 ring carbon atoms, or
a substituted or unsubstituted monovalent heterocyclic group including 5 to 50 ring atoms;

$R_{901}$ to $R_{907}$ are as defined in the formula (11);
m1 is an integer of 0 to 4;
m2 is an integer of 0 to 5;
m3 is an integer of 0 to 7;
when each of m1 to m3 is 2 or more, a plurality of $R_{120}$'s may be the same as or different from each other; and
when each of m1 to m3 is 2 or more, a plurality of adjacent $R_{120}$'s form a substituted or unsubstituted, saturated or unsaturated ring by bonding with each other, or do not form a substituted or unsubstituted, saturated or unsaturated ring.

In one embodiment, $L_{101}$ and $L_{102}$ in the formula (11) are independently a substituted or unsubstituted arylene group including 6 to 14 ring carbon atoms.

In one embodiment, when $L_{101}$ and $L_{102}$ in the formula (11) are divalent linking groups, the linking groups are independently selected from groups represented by each of the following formulas (b1) to (b17).

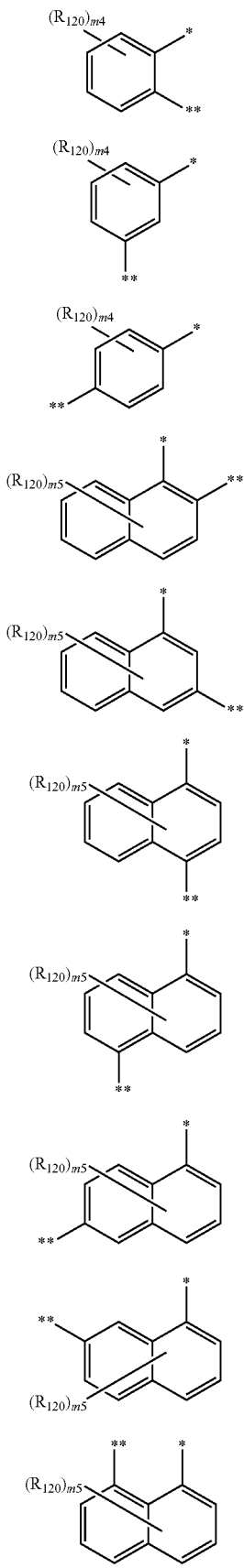

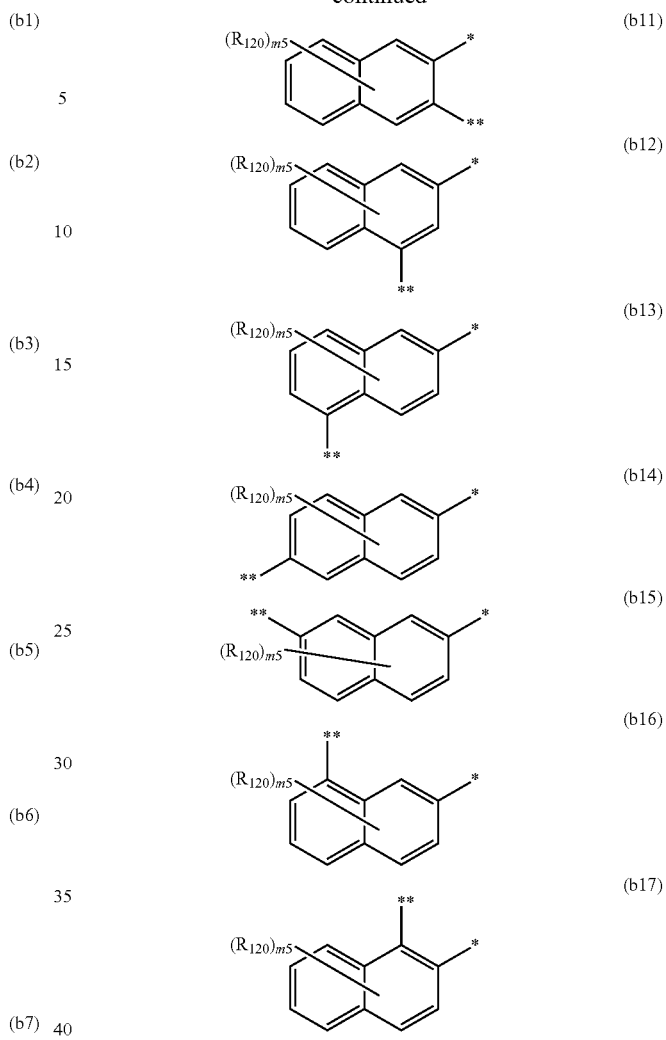

In the formulas (b1) to (b17), "*" is a single bond bonding with Ar$_{101}$ or Ar$_{102}$;

"**" is a single bond bonding with anthracene skeleton in the formula (11);

R$_{120}$ is
a halogen atom, a cyano group, a nitro group,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si(R$_{901}$)(R$_{902}$)(R$_{903}$),
—O—(R$_{904}$),
—S—(R$_{905}$),
—N(R$_{906}$)(R$_{907}$),
a substituted or unsubstituted aryl group including 6 to 50 ring carbon atoms, or
a substituted or unsubstituted monovalent heterocyclic group including 5 to 50 ring atoms;
R$_{901}$ to R$_{907}$ are as defined in the formula (11);
m4 is an integer of 0 to 4;
m5 is an integer of 0 to 6;

when m4 and m5 are each 2 or more, the plurality of $R_{120}$ may be the same as or different from each other; and when m4 and m5 are each 2 or more, a plurality of adjacent $R_{120}$'s form a saturated or unsaturated ring by bonding with each other, or do not form a saturated or unsaturated ring.

In one embodiment, $R_{131}$ and $R_{132}$ in the formula (12) are independently a substituted or unsubstituted aryl group including 1 to 18 ring carbon atoms, or a substituted or unsubstituted alkyl group including 1 to 10 carbon atoms.

In one embodiment, $R_{131}$ and $R_{132}$ in the formula (12) are independently a substituted or unsubstituted alkyl group including 1 to 10 carbon atoms.

In one embodiment, $R_{131}$ and $R_{132}$ in the formula (12) are independently a substituted or unsubstituted phenyl group, or a substituted or unsubstituted methyl group.

In one embodiment, $R_{131}$ and $R_{132}$ in the formula (12) are independently an unsubstituted phenyl group, or an unsubstituted methyl group.

In one embodiment, $R_{131}$ and $R_{132}$ in the formula (12) are independently a substituted or unsubstituted alkyl group including 1 to 10 carbon atoms.

In one embodiment, $R_{131}$ and $R_{132}$ in the formula (12) are independently a substituted or unsubstituted methyl group.

In one embodiment, $R_{131}$ and $R_{132}$ in the formula (12) are independently an unsubstituted methyl group.

In one embodiment, the compound represented by the formula (11) is a compound represented by the following formula (15).

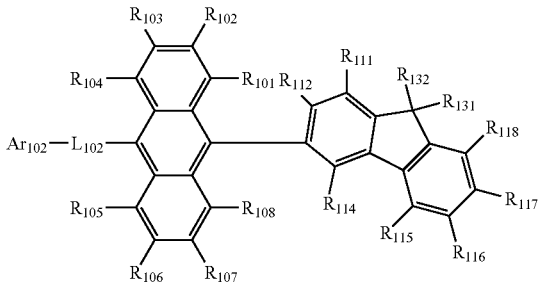

(15a)

In the formula (15a), $R_{101}$ to $R_{108}$ and $L_{102}$ are as defined in the formula (11);

$Ar_{102}$ is a monovalent group represented by the formula (12), a substituted or unsubstituted aryl group including 6 to 50 ring carbon atoms, or a substituted or unsubstituted monovalent heterocyclic group including 5 to 50 ring atoms; and $R_{111}$, $R_{112}$, $R_{114}$ to $R_{118}$, $R_{131}$, and $R_{132}$ are as defined in the formula (12).

In one embodiment, the compound represented by the formula (11) is a compound represented by the following formula (16).

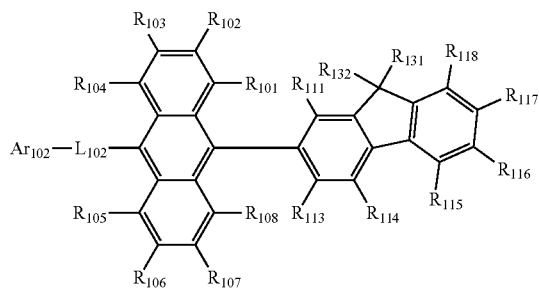

(15)

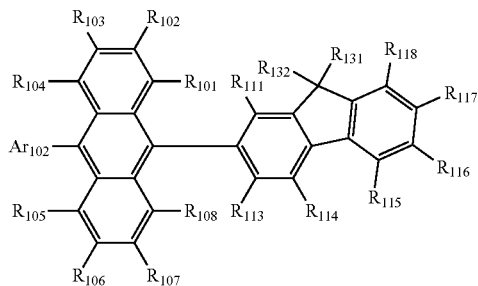

(16)

In the formula (15), $R_{101}$ to $R_{108}$ and $L_{102}$ are as defined in the formula (11);

$Ar_{102}$ is a monovalent group represented by the formula (12), a substituted or unsubstituted aryl group including 6 to 50 ring carbon atoms, or a substituted or unsubstituted monovalent heterocyclic group including 5 to 50 ring atoms; and $R_{111}$, $R_{113}$ to $R_{118}$, $R_{131}$, and $R_{132}$ are as defined in the formula (12).

In one embodiment, the compound represented by the formula (11) is a compound represented by the following formula (15a).

In the formula (16), $R_{101}$ to $R_{108}$ and $L_{101}$ are as defined in the formula (11);

$Ar_{102}$ is a monovalent group represented by the formula (12), a substituted or unsubstituted aryl group including 6 to 50 ring carbon atoms, or a substituted or unsubstituted monovalent heterocyclic group including 5 to 50 ring atoms; and $R_{111}$, $R_{113}$ to $R_{118}$, $R_{131}$, and $R_{132}$ are as defined in the formula (12).

In one embodiment, the compound represented by the formula (11) is a compound represented by the following formula (16a).

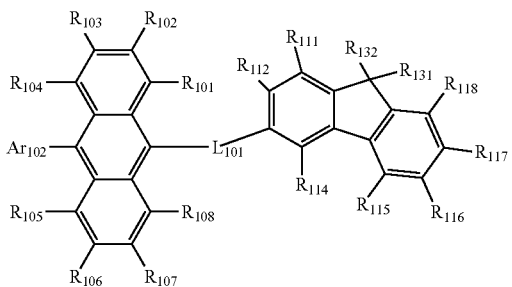

(16a)

In the formula (16a), $R_{101}$ to $R_{108}$ and $L_{101}$ are as defined in the formula (11);

$Ar_{102}$ is a monovalent group represented by the formula (12),
a substituted or unsubstituted aryl group including 6 to 50 ring carbon atoms, or
a substituted or unsubstituted monovalent heterocyclic group including 5 to 50 ring atoms; and $R_{111}$, $R_{112}$, $R_{114}$ to $R_{118}$, $R_{131}$, and $R_{132}$ are as defined in the formula (12).

In one embodiment, the compound represented by the formula (11) is a compound represented by the following formula (17).

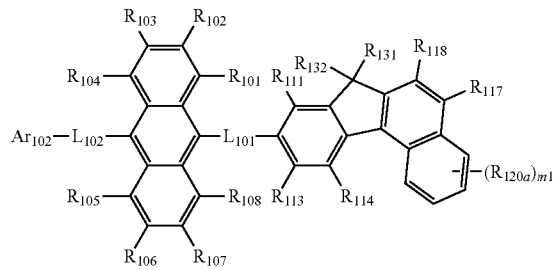

(17)

In the formula (17), $R_{101}$ to $R_{108}$, $L_{101}$, and $L_{102}$ are as defined in the formula (11);

$Ar_{102}$ is a monovalent group represented by the formula (12),
a substituted or unsubstituted aryl group including 6 to 50 ring carbon atoms, or
a substituted or unsubstituted monovalent heterocyclic group including 5 to 50 ring atoms; and $R_{111}$, $R_{113}$ to $R_{114}$, $R_{117}$, $R_{118}$, $R_{131}$, and $R_{132}$ are as defined in the formula (12).

$R_{120a}$ is
a halogen atom, a cyano group, a nitro group,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
—N($R_{906}$)($R_{907}$),
a substituted or unsubstituted aryl group including 6 to 50 ring carbon atoms, or
a substituted or unsubstituted monovalent heterocyclic group including 5 to 50 ring atoms;

$R_{901}$ to $R_{907}$ are as defined in the formula (11);
m1 is an integer of 0 to 4;
when m1 is 2 or more, a plurality of $R_{120a}$ may be the same as or different from each other, and
when m1 is 2 or more, a plurality of adjacent $R_{120a}$'s do not form a saturated or unsaturated ring by bonding with each other.

In one embodiment, the compound represented by the formula (11) is a compound represented by the following formula (17a).

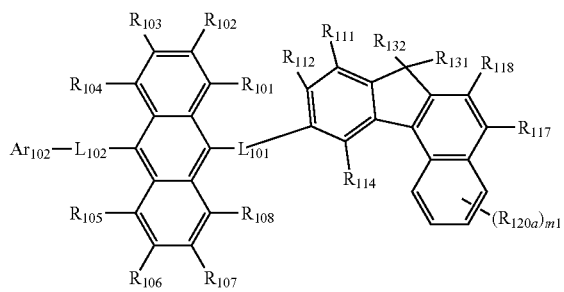

(17a)

In the formula (17a), $R_{101}$ to $R_{108}$, $L_{101}$, and $L_{102}$ are as defined in the formula (11);

$Ar_{102}$ is a monovalent group represented by the formula (12),
a substituted or unsubstituted aryl group including 6 to 50 ring carbon atoms, or
a substituted or unsubstituted monovalent heterocyclic group including 5 to 50 ring atoms; and $R_{111}$, $R_{112}$, $R_{114}$, $R_{117}$, $R_{118}$, $R_{131}$, and $R_{132}$ are as defined in the formula (12).

$R_{120a}$ is
a halogen atom, a cyano group, a nitro group,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
—N($R_{906}$)($R_{907}$),
a substituted or unsubstituted aryl group including 6 to 50 ring carbon atoms, or
a substituted or unsubstituted monovalent heterocyclic group including 5 to 50 ring atoms;

$R_{901}$ to $R_{907}$ are as defined in the formula (11);
m1 is an integer of 0 to 4;
when m1 is 2 or more, a plurality of $R_{120a}$'s may be the same as or different from each other, and
when m1 is 2 or more, a plurality of adjacent $R_{120a}$'s do not form a saturated or unsaturated ring by bonding with each other.

In one embodiment, $R_{101}$ to $R_{108}$ in the formula (11) are hydrogen atoms.

In one embodiment, $R_{111}$ to $R_{118}$ in the formula (12) which are not a single bond bonding with $L_{101}$ are hydrogen atoms.

In one embodiment, one set of $R_{111}$ and $R_{112}$, $R_{112}$ and $R_{113}$, $R_{113}$ and $R_{114}$, $R_{115}$ and $R_{116}$, $R_{116}$ and $R_{117}$, and $R_{117}$ and $R_{118}$ in the formula (12) forms a substituted or unsubstituted, saturated or unsaturated ring by bonding with each other.

In one embodiment, the compound represented by the formula (11) is a compound represented by the following formula (18).

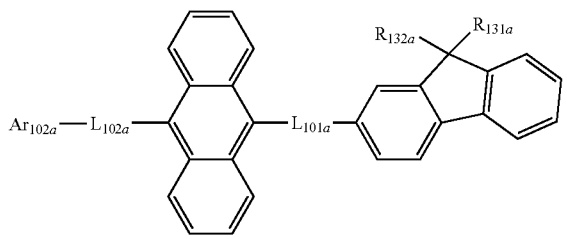

(18)

In the formula (18), $L_{101a}$ and $L_{102a}$ are independently a single bond, or a substituted or unsubstituted arylene group including 6 to 10 ring carbon atoms;

$Ar_{102a}$ is a substituted or unsubstituted aryl group including 6 to 10 ring carbon atoms; and $R_{131a}$ and $R_{132a}$ are independently
a hydrogen atom,
a substituted or unsubstituted aryl group including 1 to 18 ring carbon atoms, or
a substituted or unsubstituted alkyl group including 1 to 10 carbon atoms.

In one embodiment, the compound represented by the formula (11) is a compound represented by the following formula (18a).

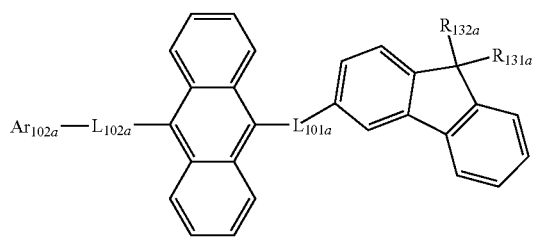

(18a)

In the formula (18a), $L_{101a}$ and $L_{102a}$ are independently a single bond, or a substituted or unsubstituted arylene group including 6 to 10 ring carbon atoms;

$Ar_{102a}$ is a substituted or unsubstituted aryl group including 6 to 10 ring carbon atoms; and $R_{131a}$ and $R_{132a}$ are independently
a hydrogen atom,
a substituted or unsubstituted aryl group including 1 to 18 ring carbon atoms, or
a substituted or unsubstituted alkyl group including 1 to 10 carbon atoms.

In one embodiment, $R_{131a}$ and $R_{132a}$ in the formulas (18) and (18a) are independently a substituted or unsubstituted phenyl group, or a substituted or unsubstituted methyl group.

In one embodiment, $R_{131a}$ and $R_{132a}$ in the formulas (18) and (18a) are independently an unsubstituted phenyl group, or an unsubstituted methyl group.

In one embodiment, $R_{131a}$ and $R_{132a}$ in the formulas (18) and (18a) are independently a substituted or unsubstituted alkyl group including 1 to 10 carbon atoms.

In one embodiment, $R_{131a}$ and $R_{132a}$ in the formulas (18) and (18a) are independently a substituted or unsubstituted methyl group.

In one embodiment, $R_{131a}$ and $R_{132a}$ in the formulas (18) and (18a) are independently an unsubstituted methyl group.

Details of each substituent in the formulas (11), (12), (12A) to (12F), (20), (13) to (18), (15a) to (18a), (a1) to (a4) and (b1) to (b17), and each substituent in the case of "a substituted or unsubstituted" are as defined in the [Definition] part of this specification.

Specific examples of the compound represented by the formula (11) will be described below.

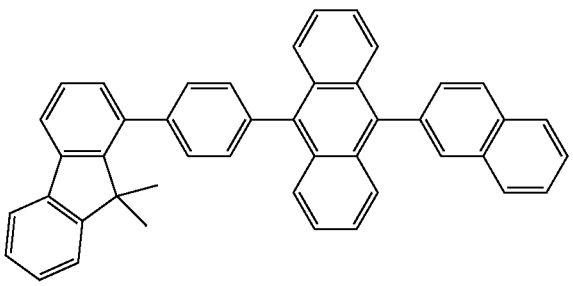

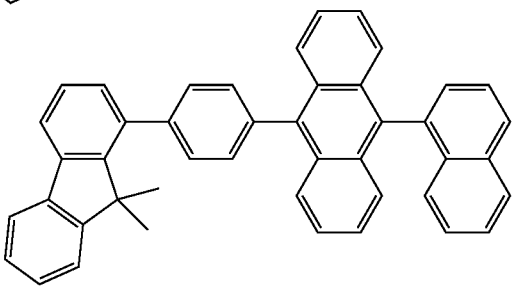

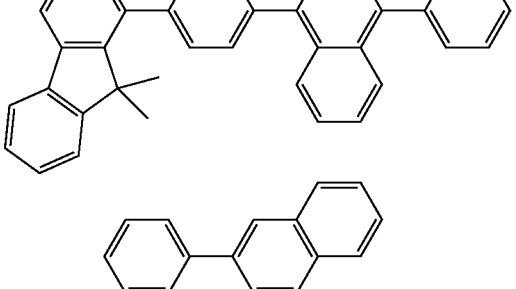

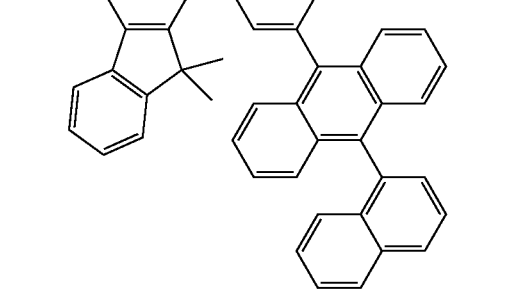

101
-continued
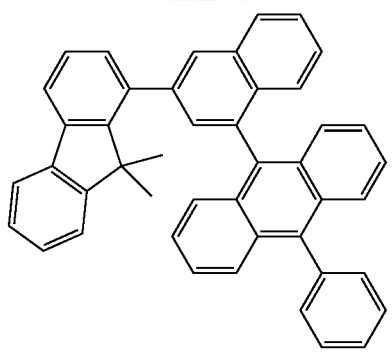
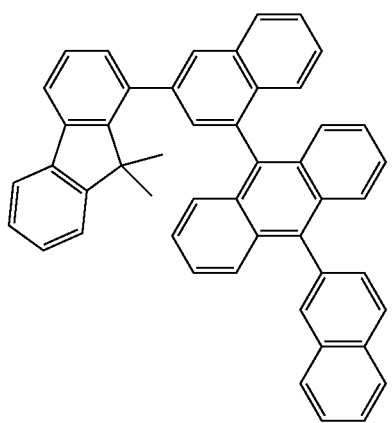
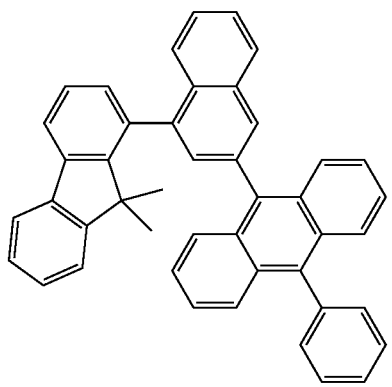
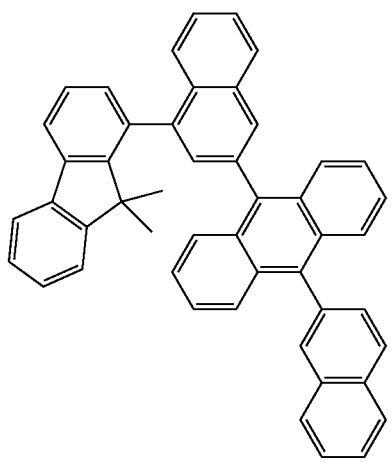
102
-continued
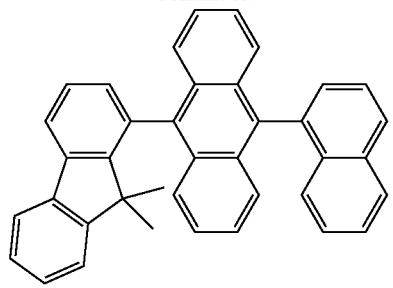
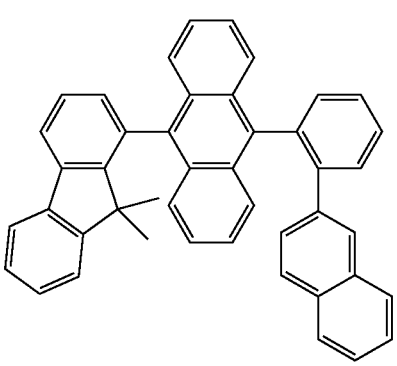
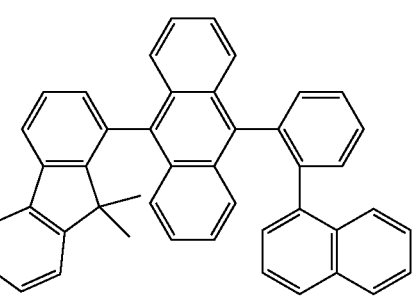
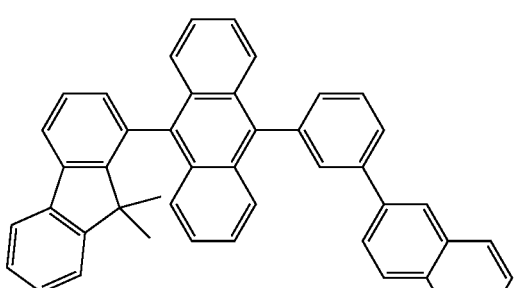
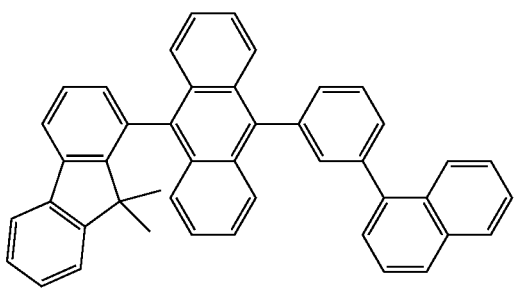

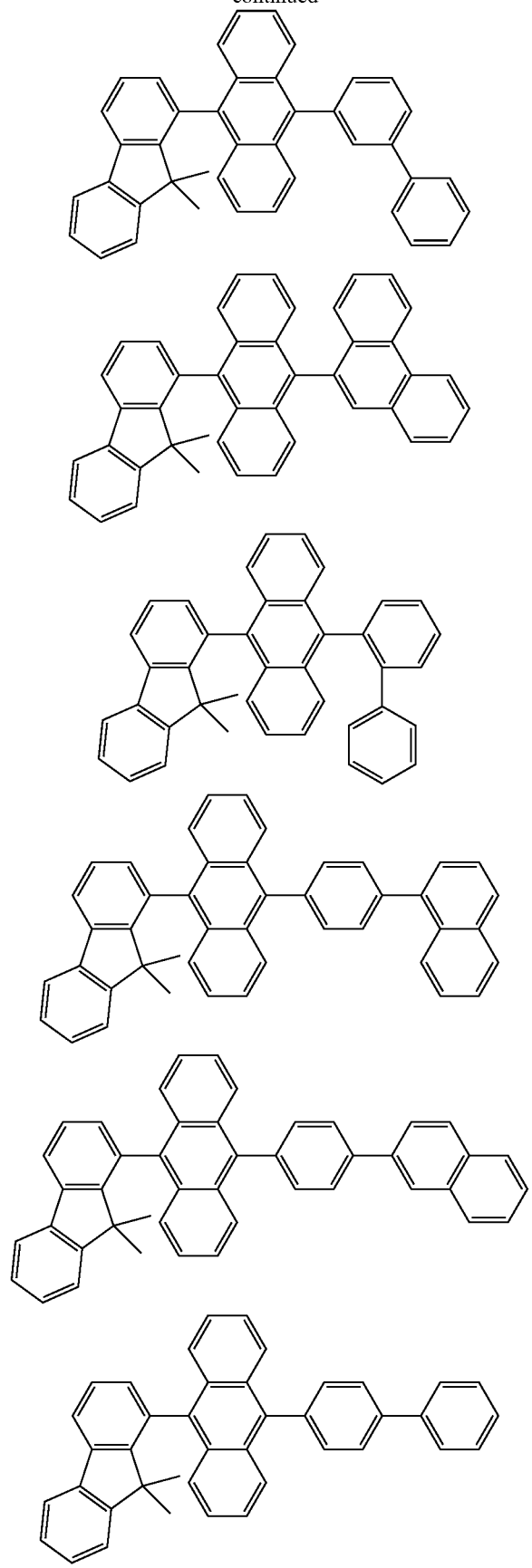

-continued
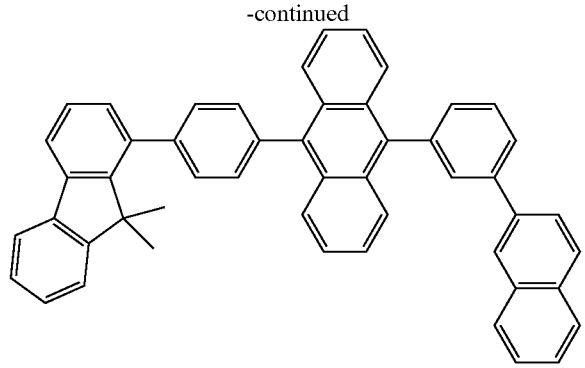
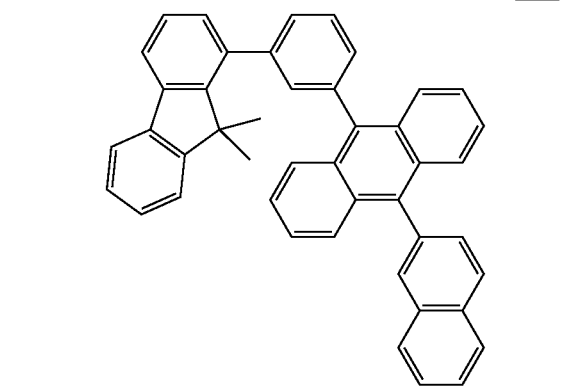
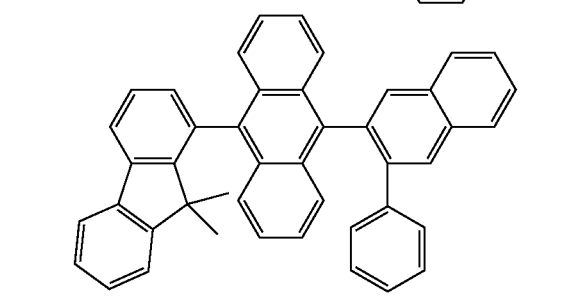
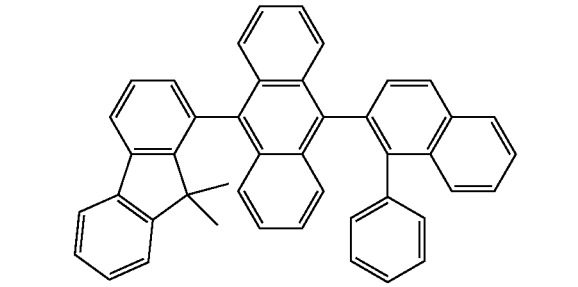
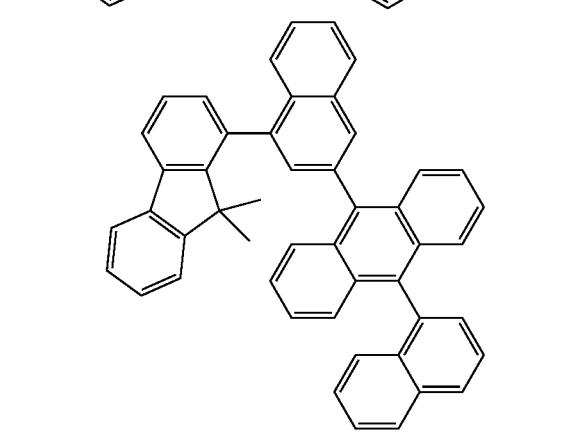
-continued
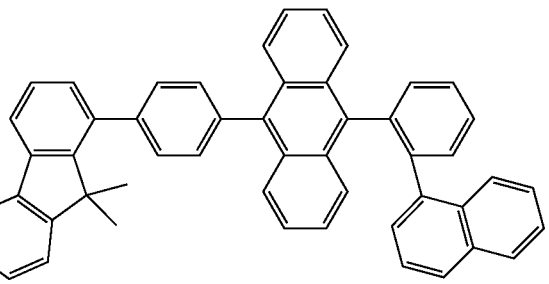
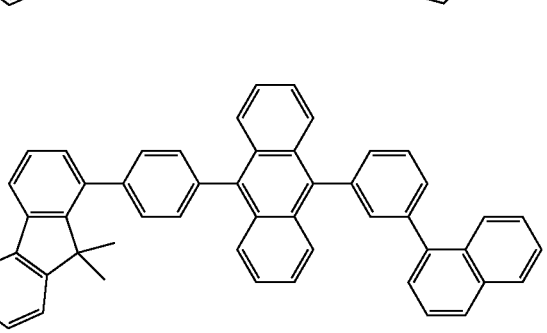
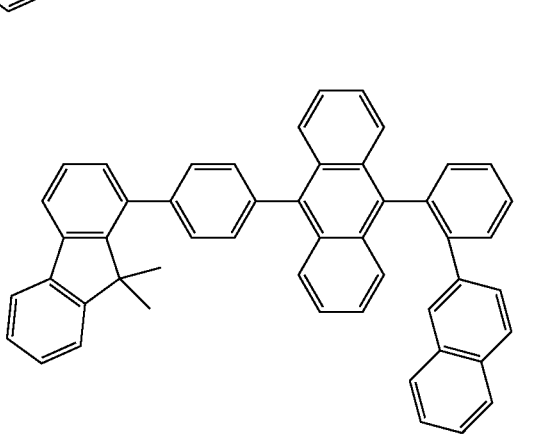
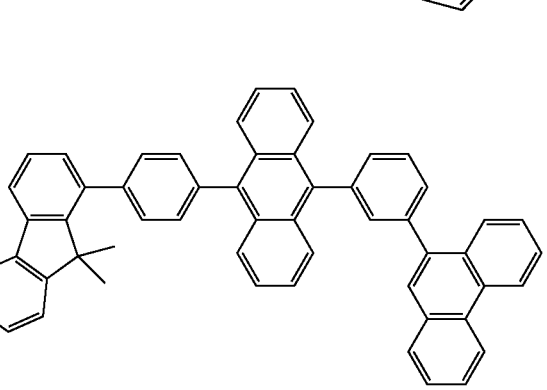

107
-continued
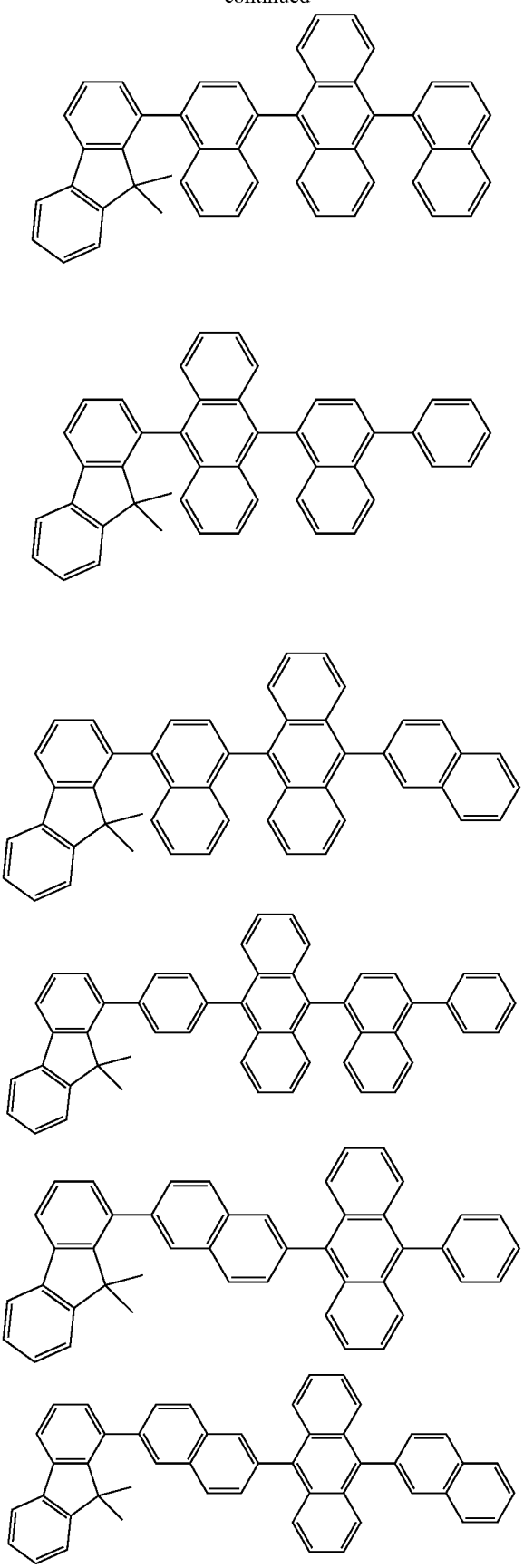
108
-continued
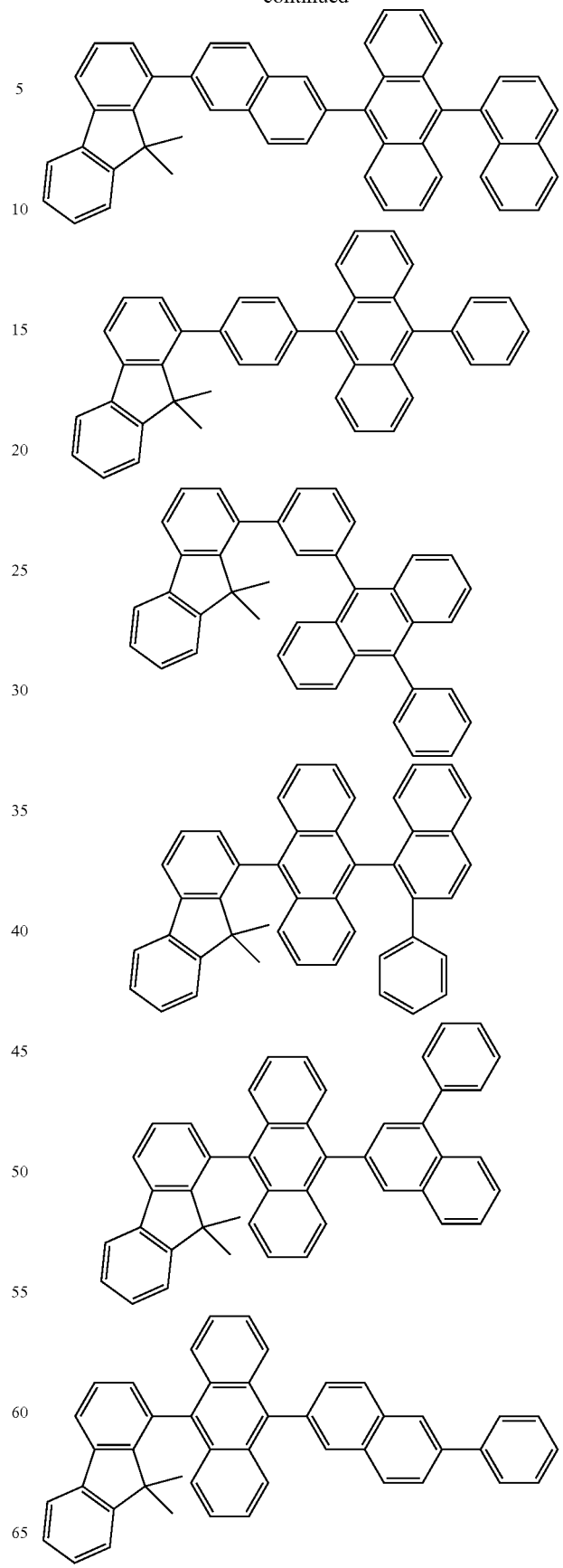

-continued
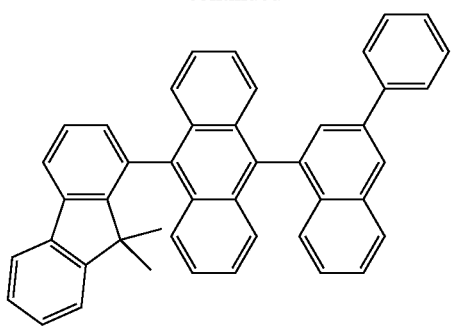
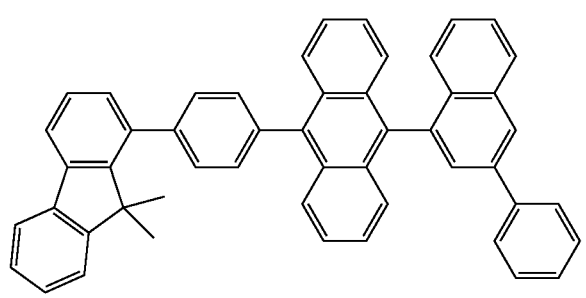
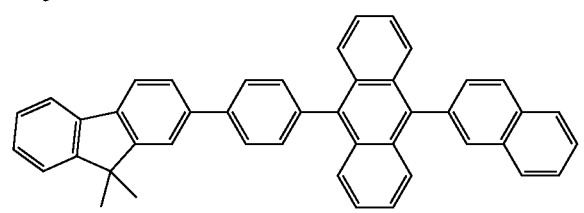
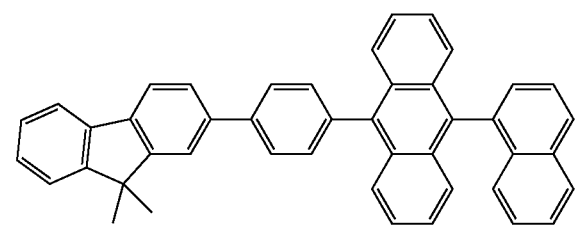
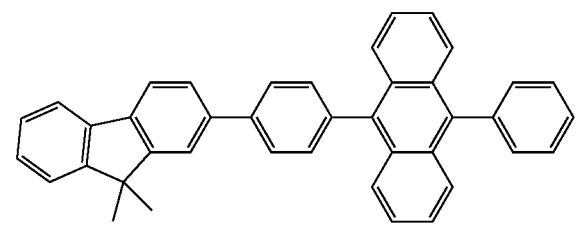
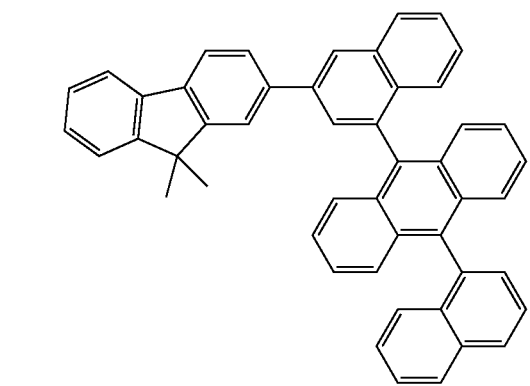
-continued
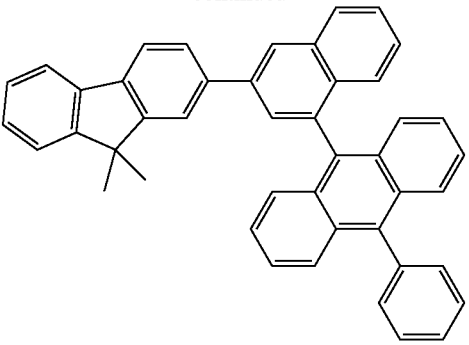
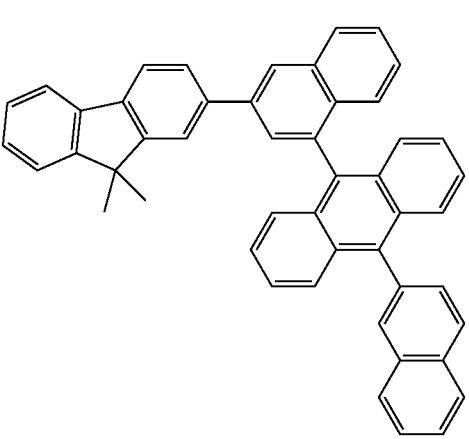
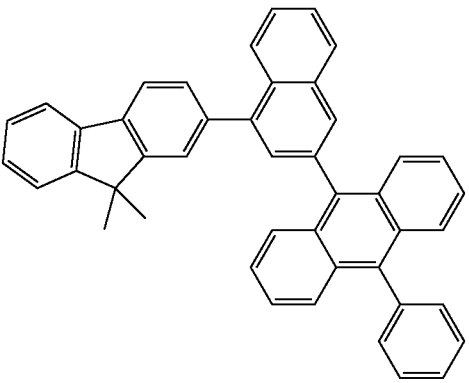
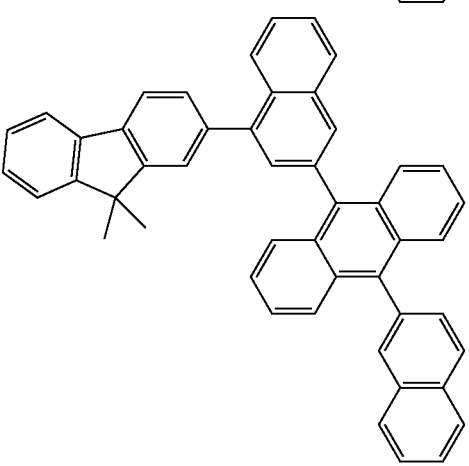

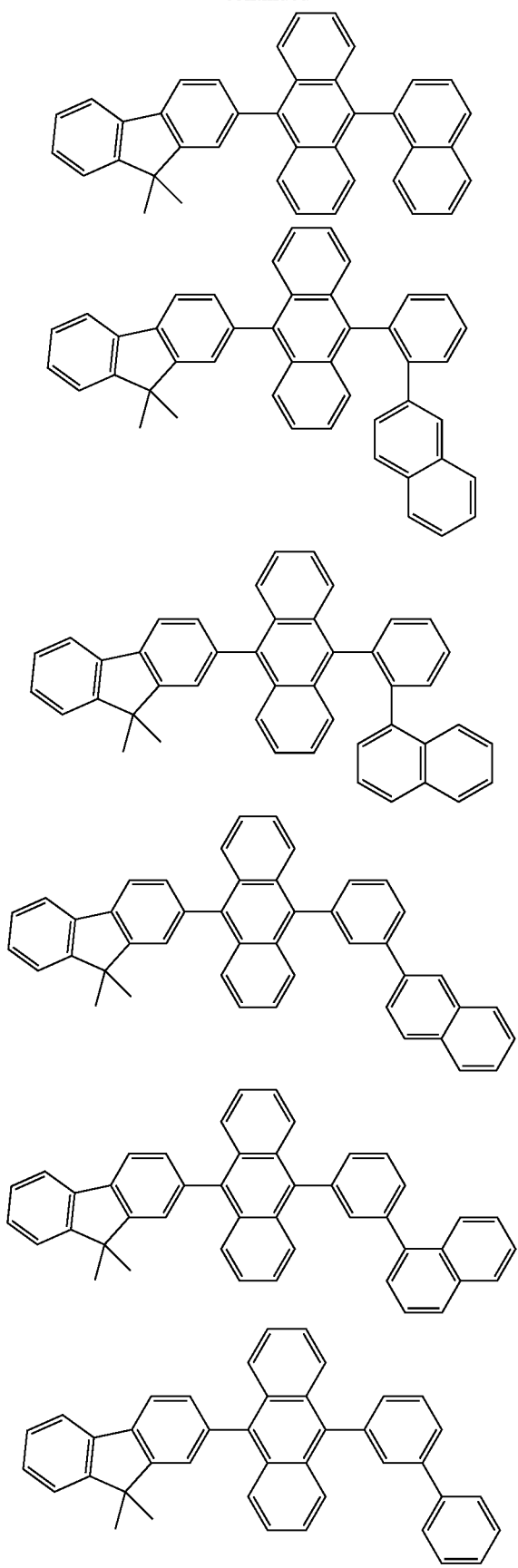
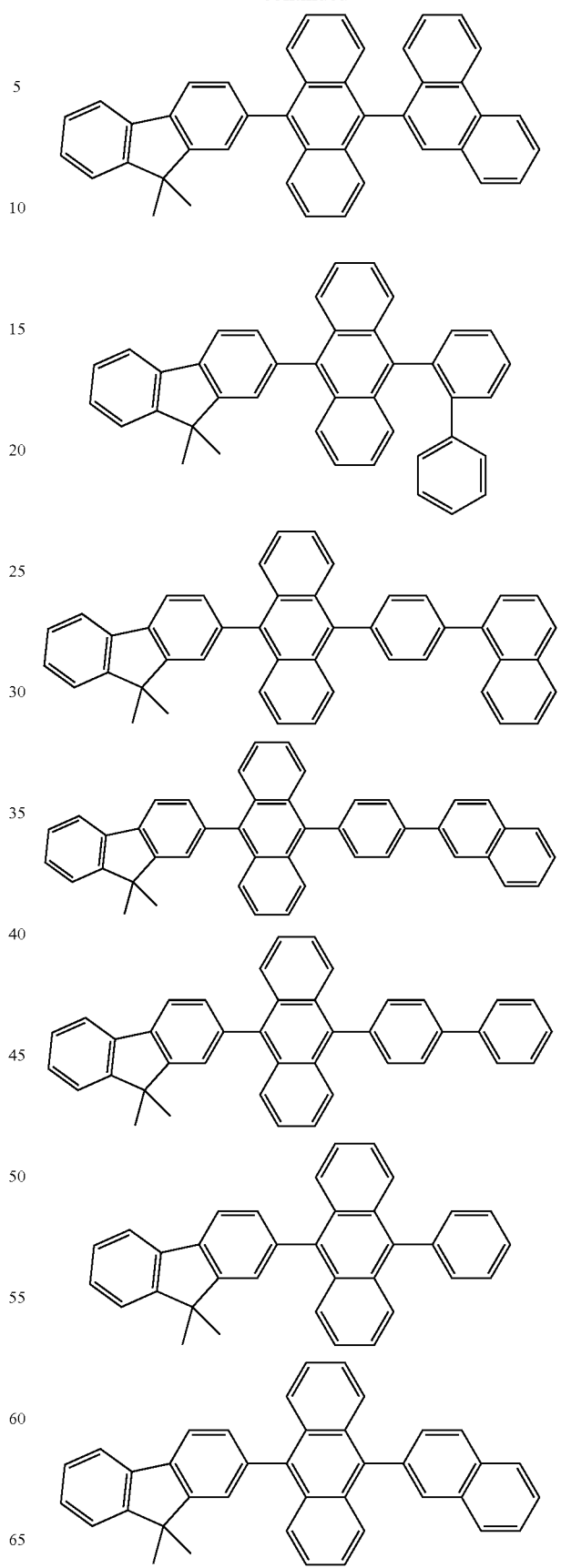

-continued
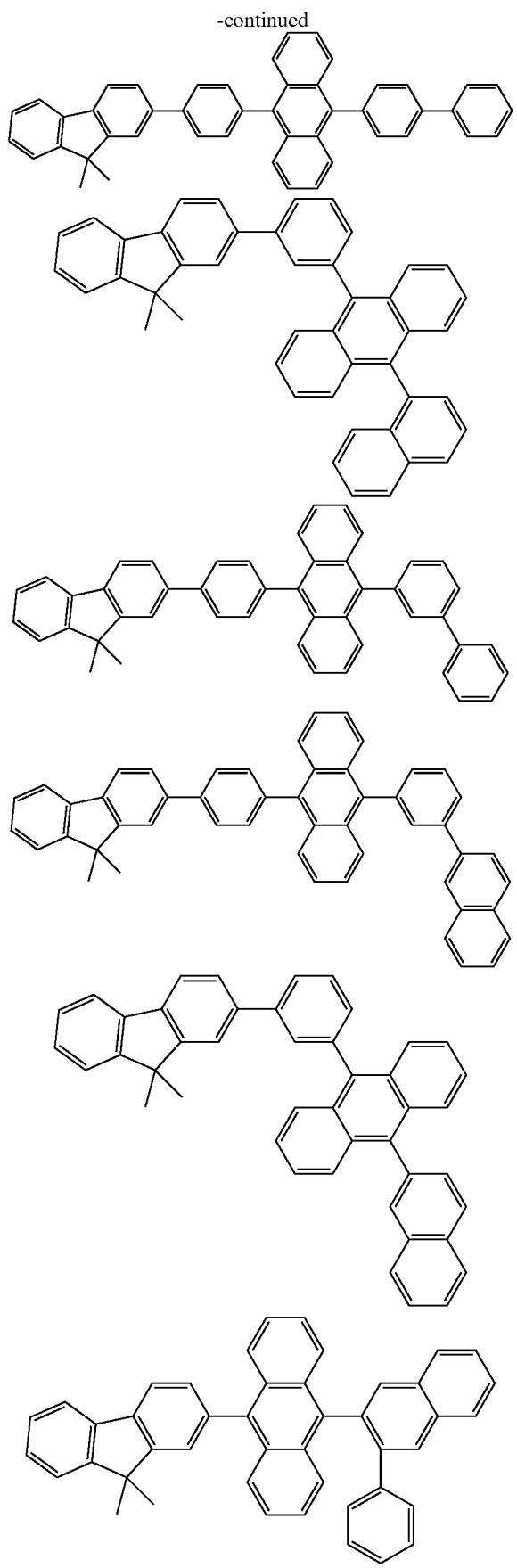
-continued
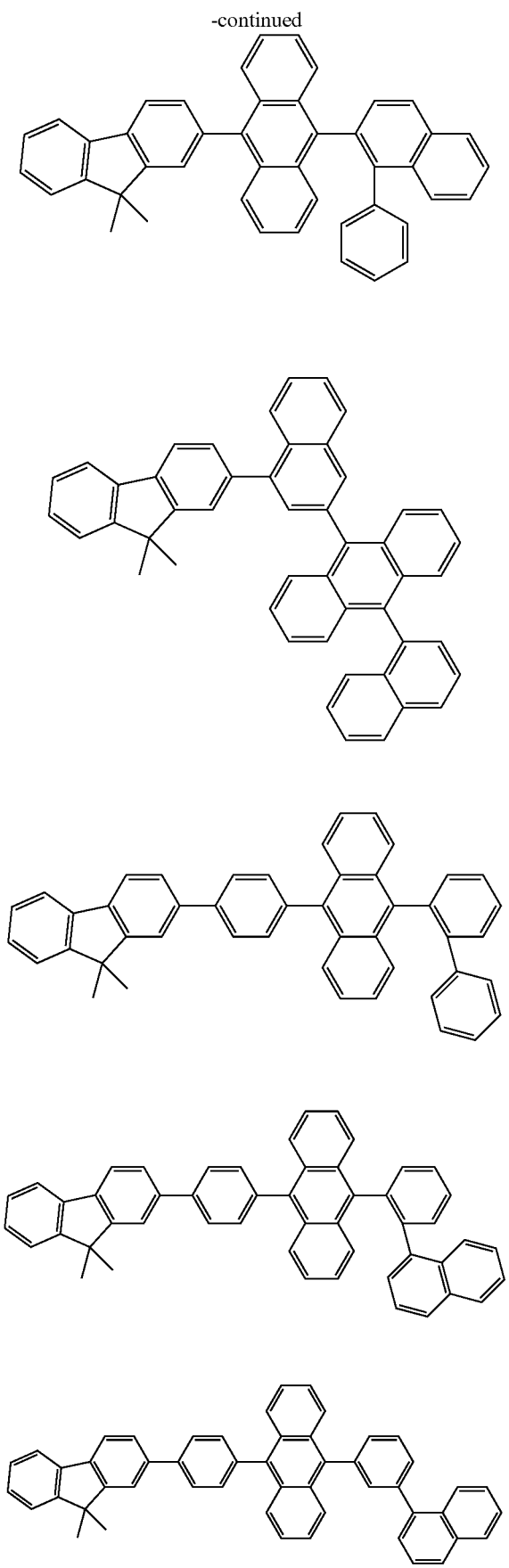

115
-continued
116
-continued
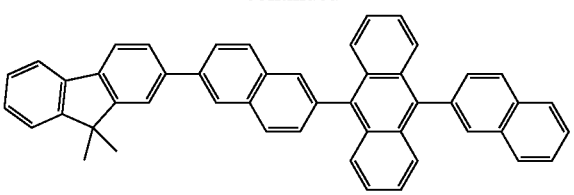
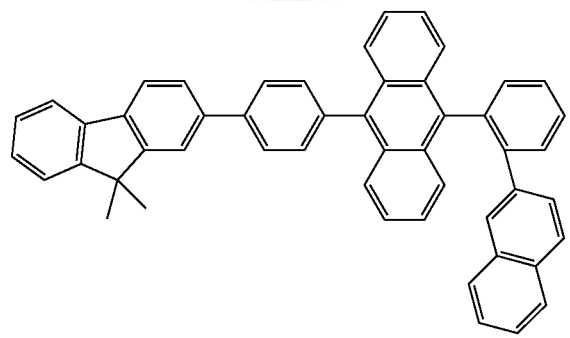
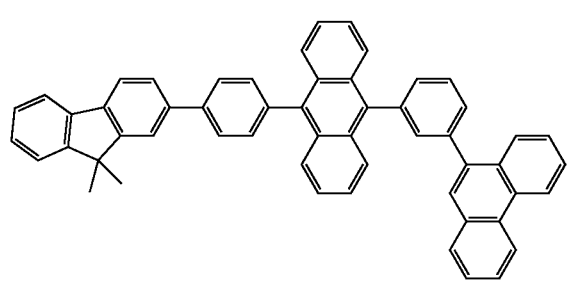
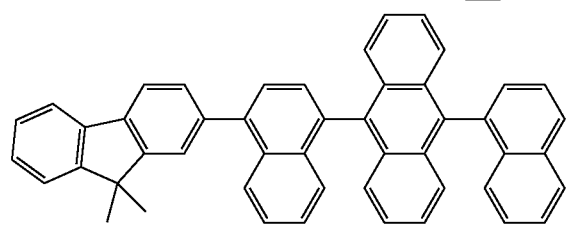

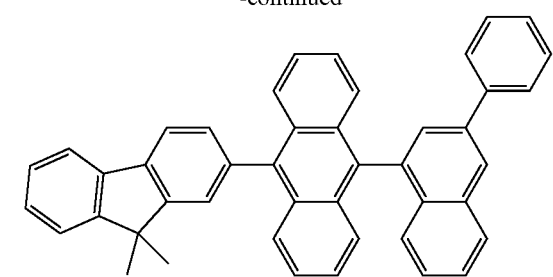
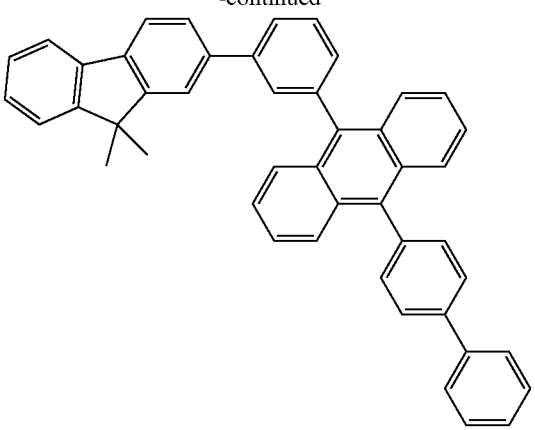
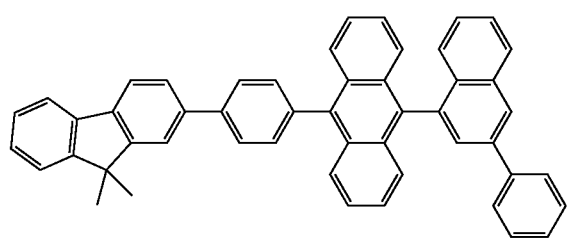
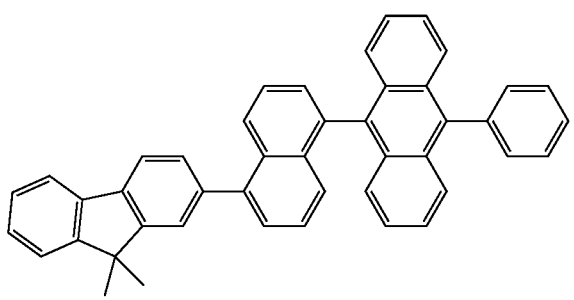
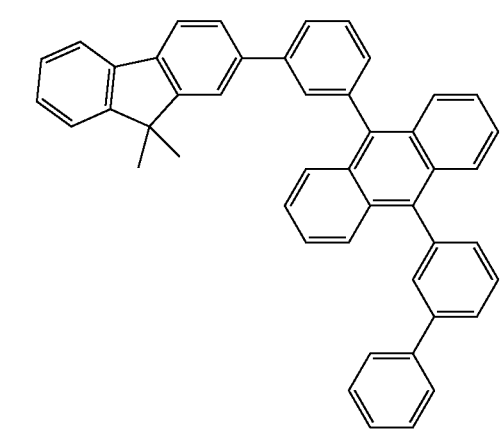
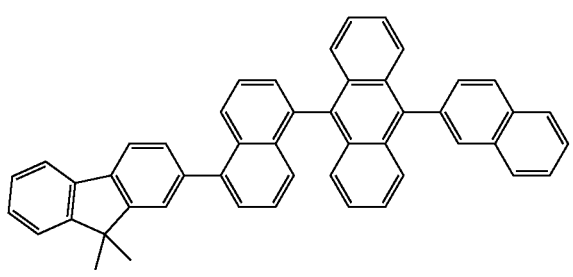
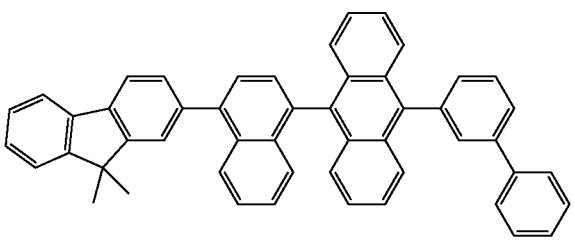
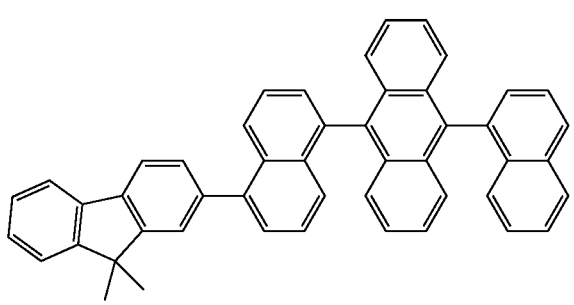
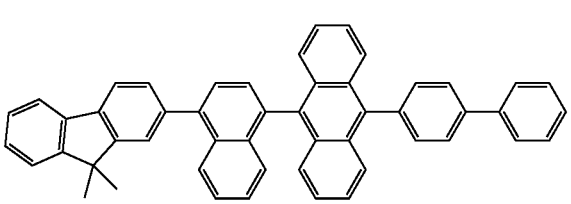

119
-continued
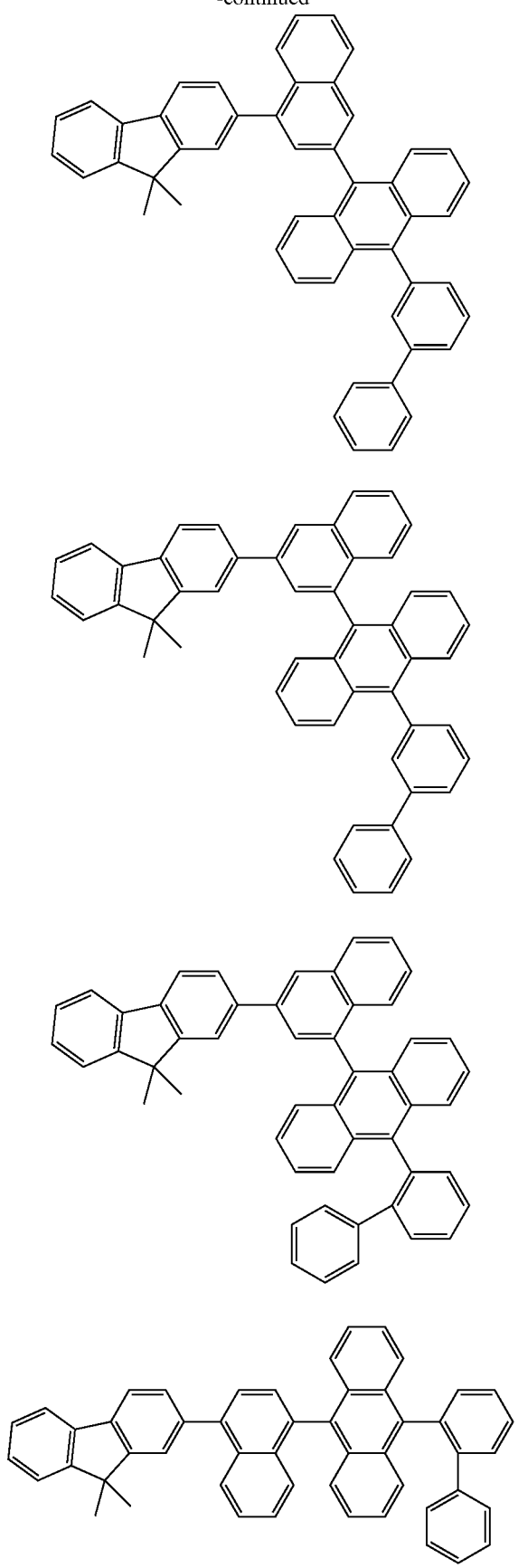
120
-continued
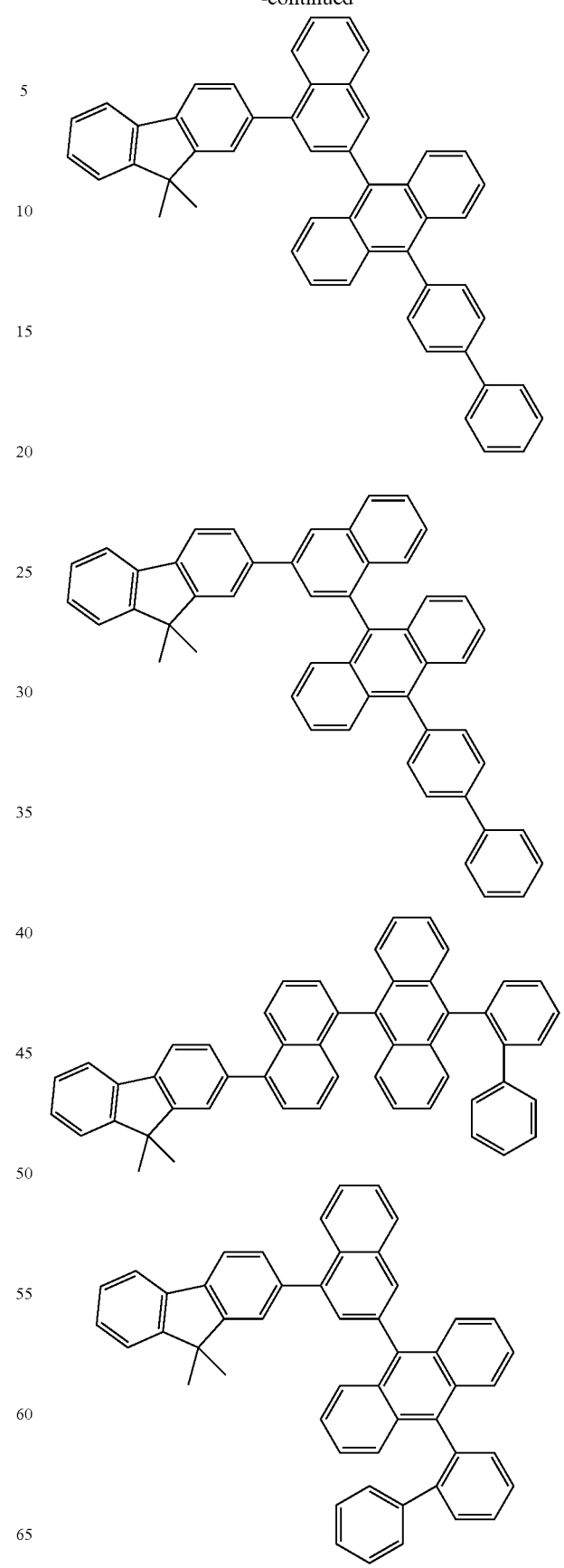

121
-continued
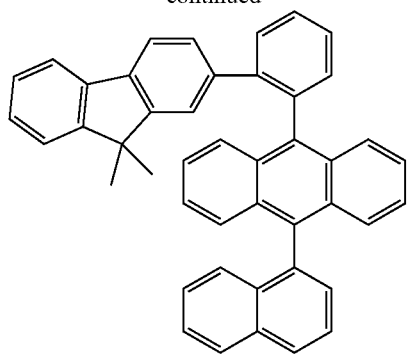
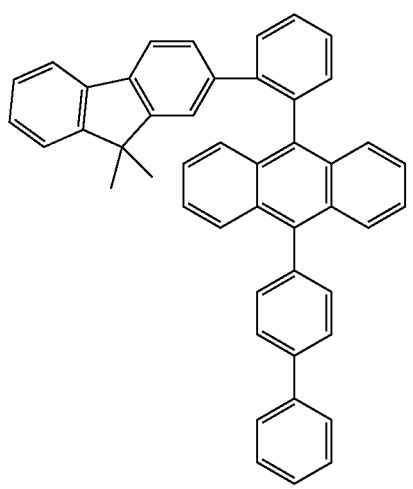
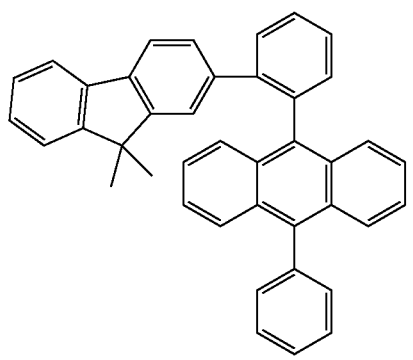
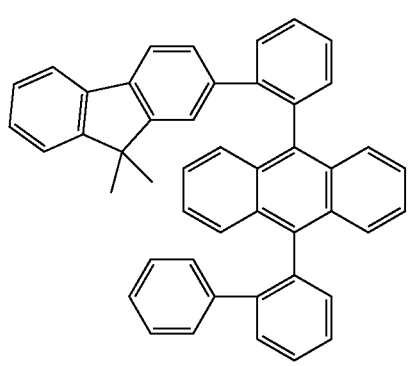
122
-continued
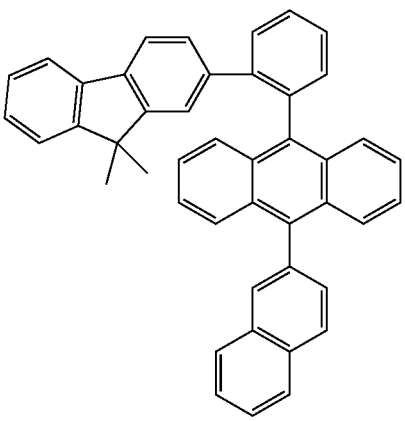
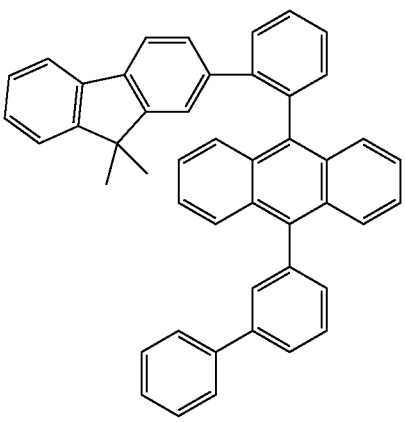
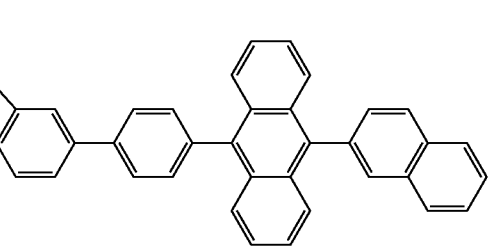
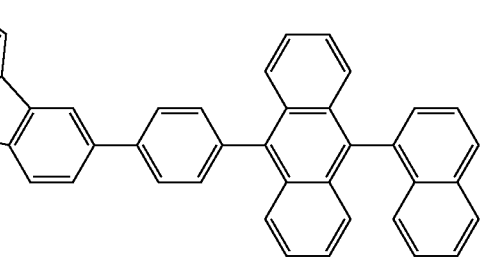
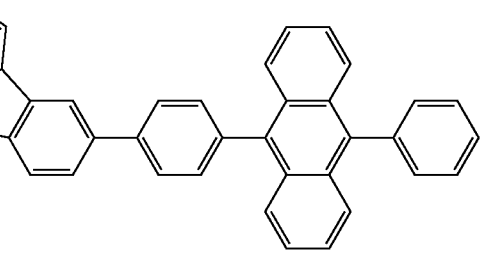

123
-continued
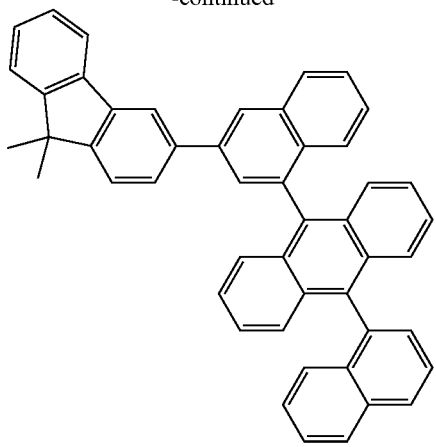
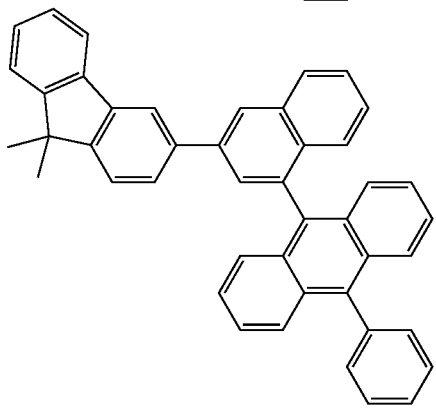
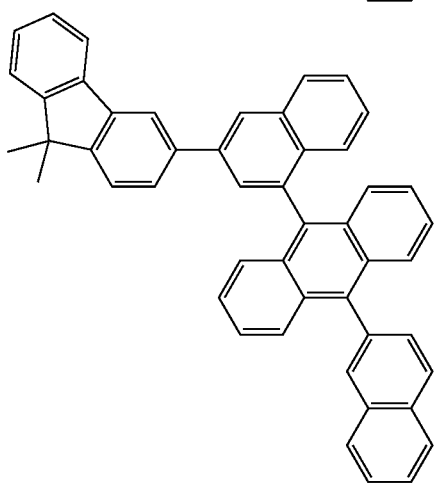
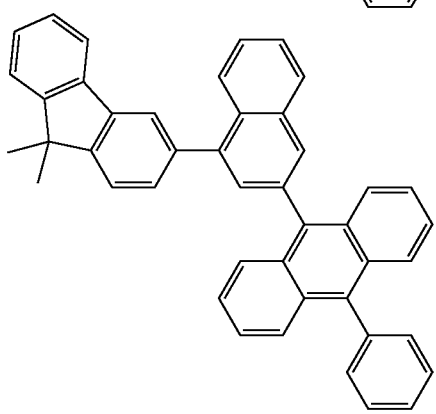
124
-continued
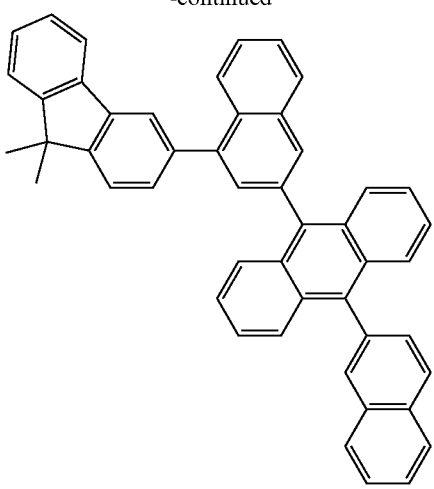
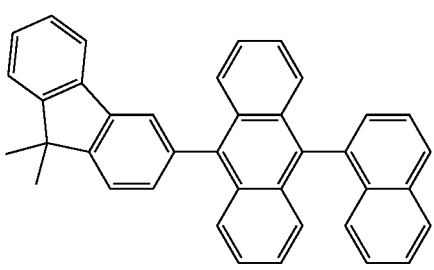
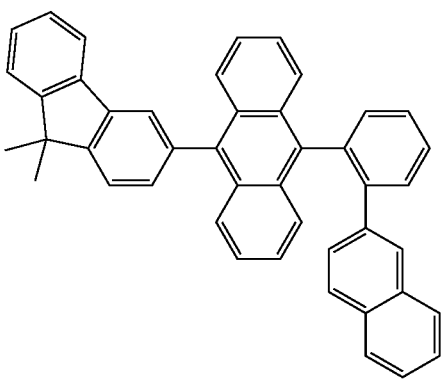
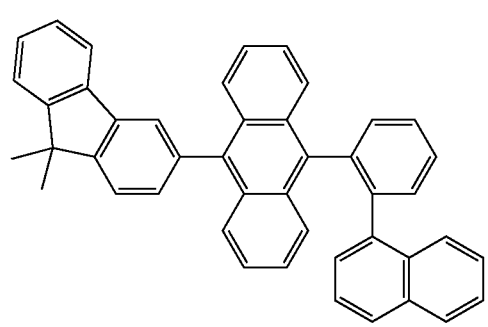

125
-continued
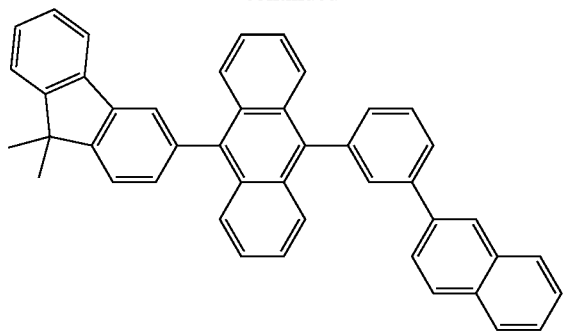
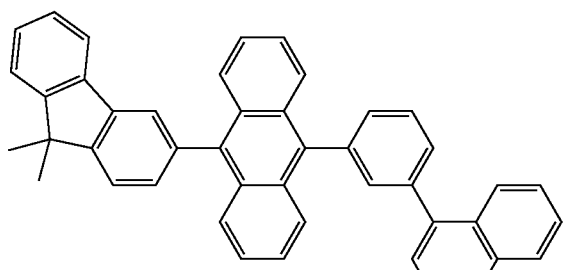
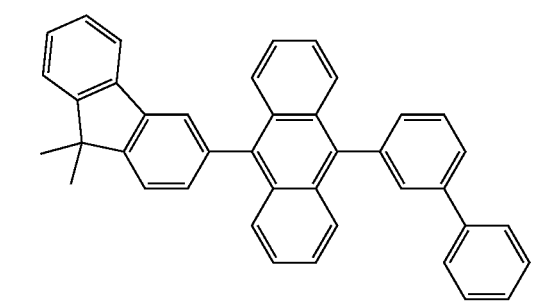
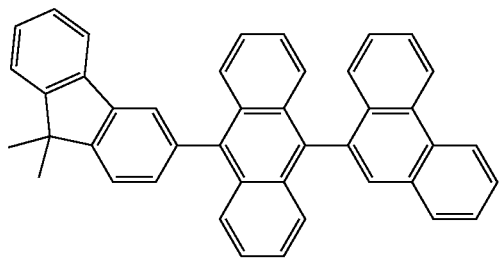
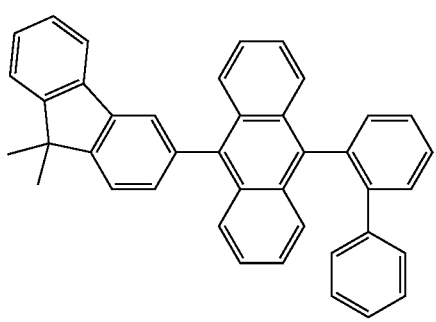
126
-continued
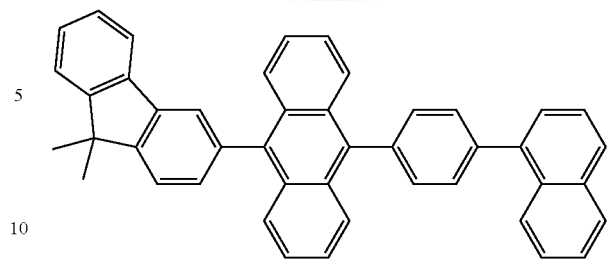
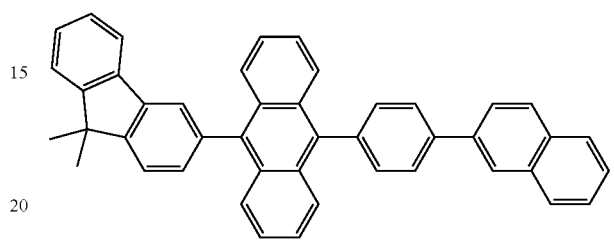
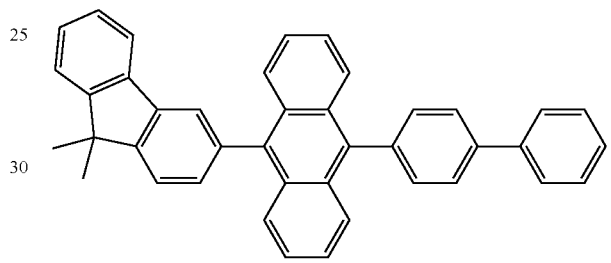
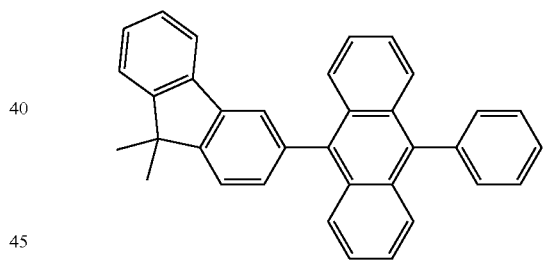
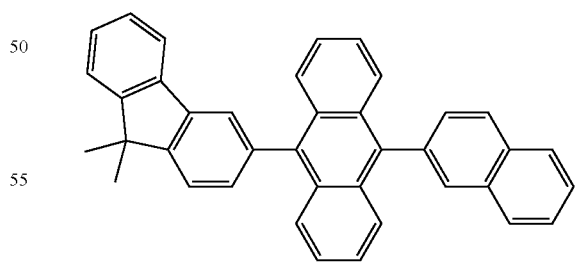
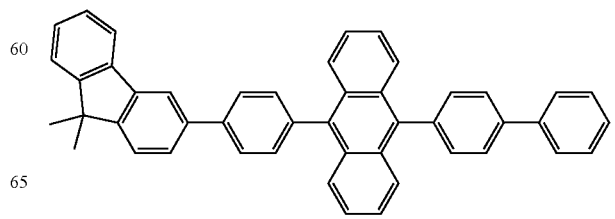

127
-continued
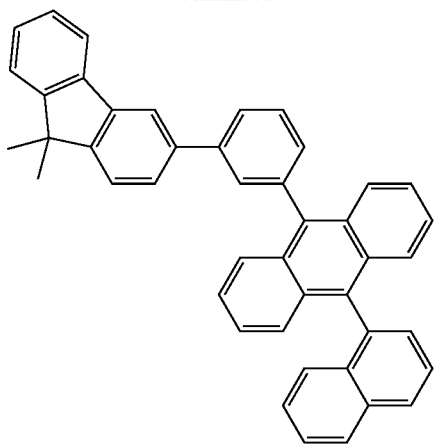
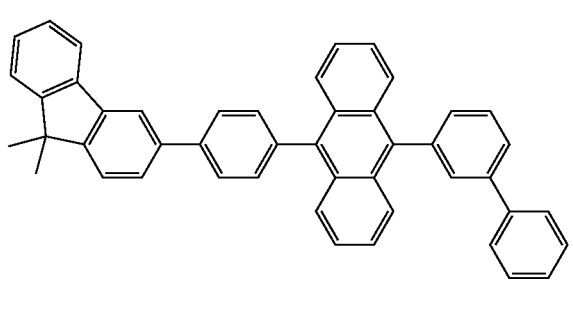
128
-continued
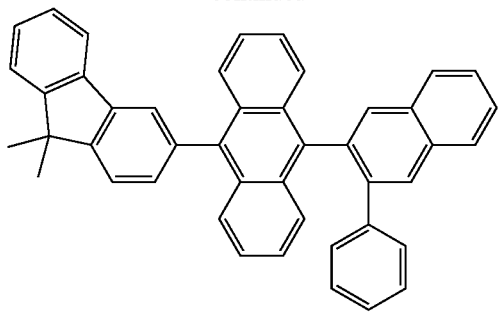
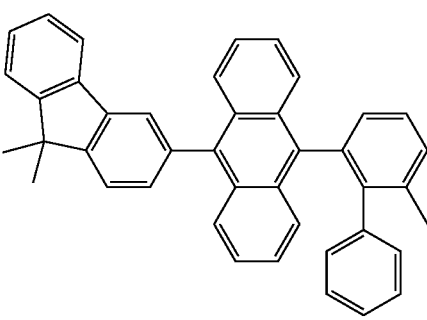
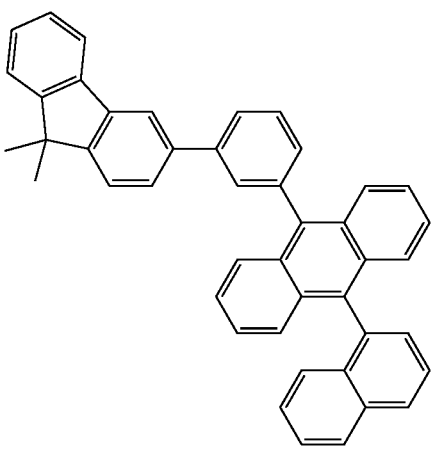
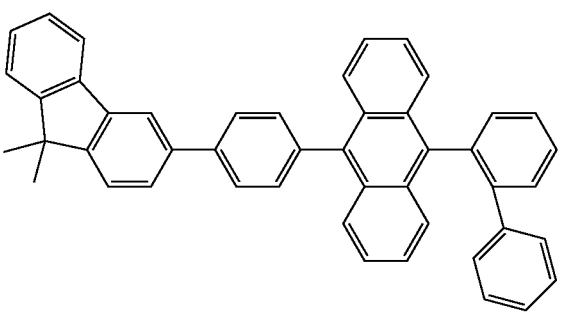
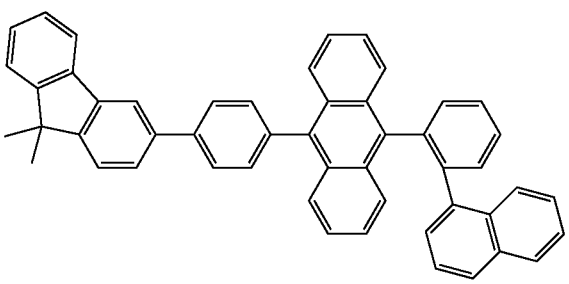

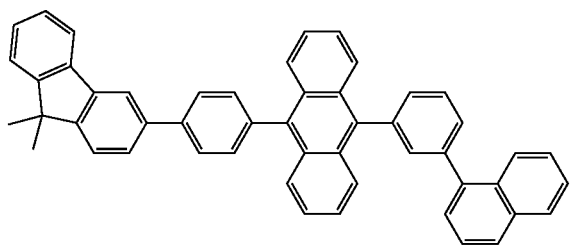
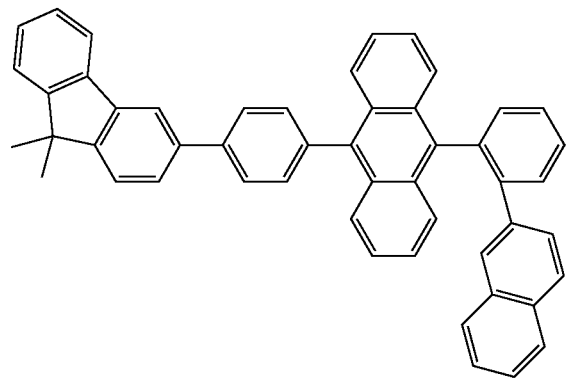
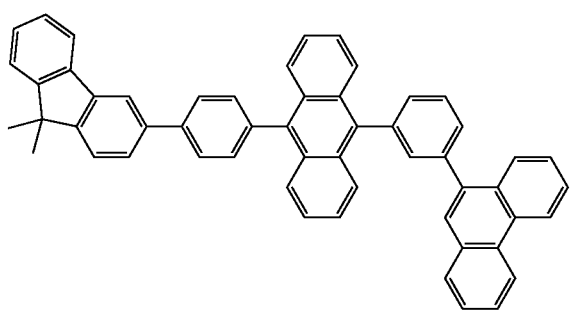
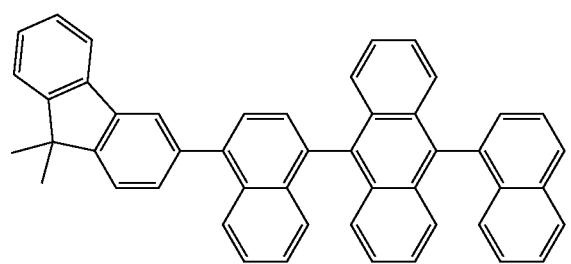
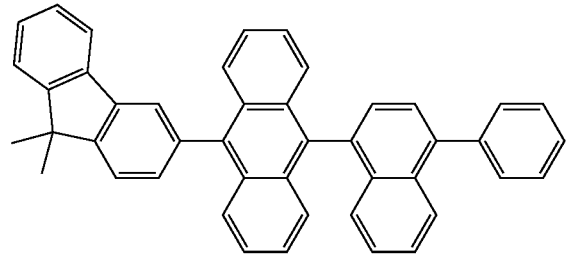
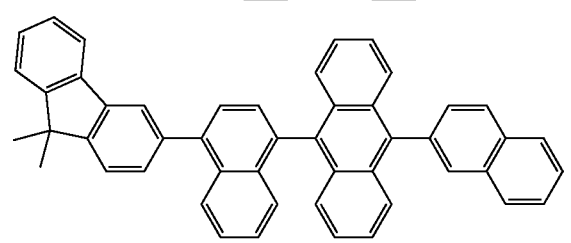
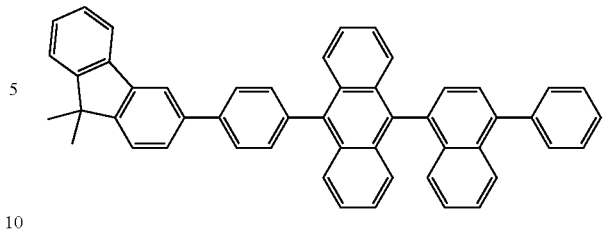
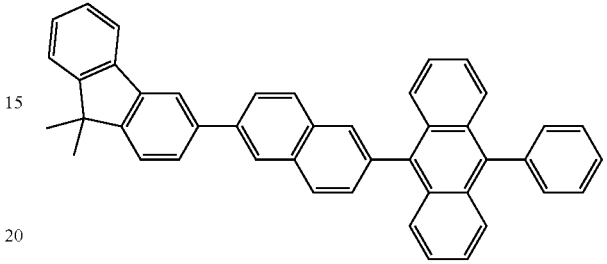
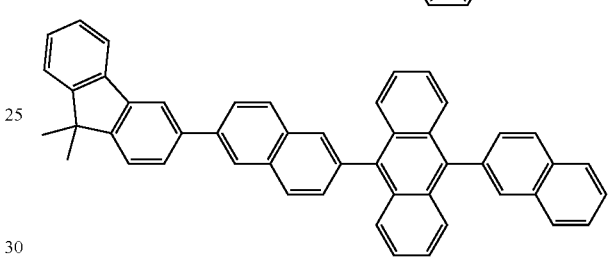
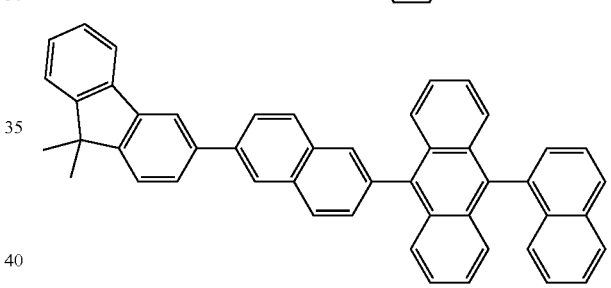
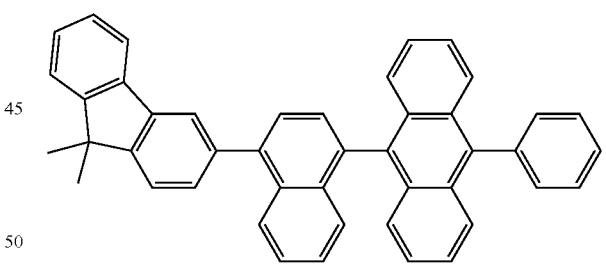
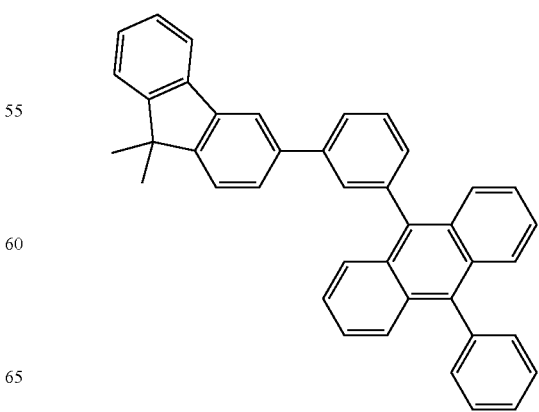

131
-continued
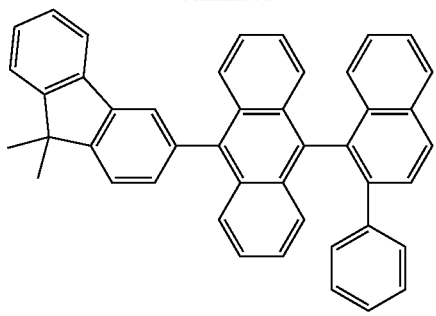
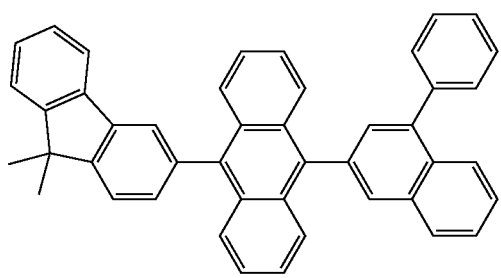
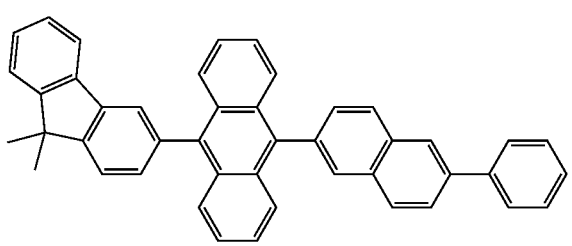
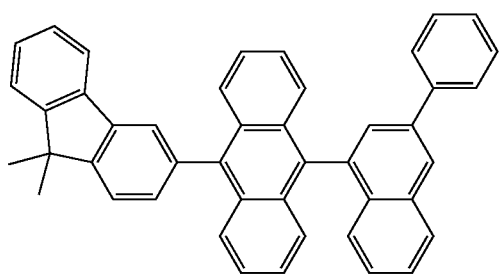
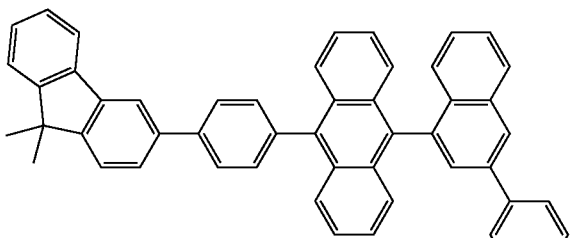
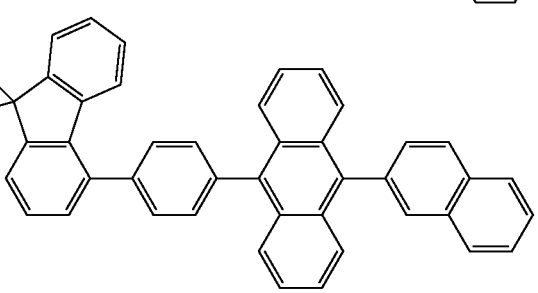
132
-continued
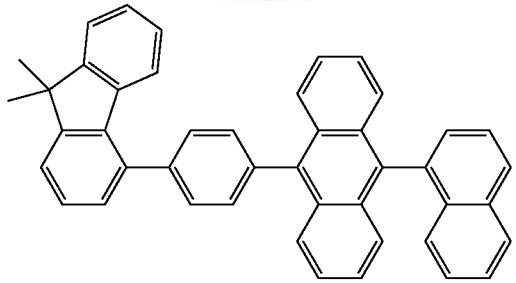
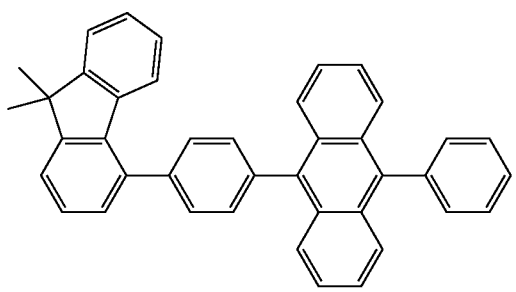
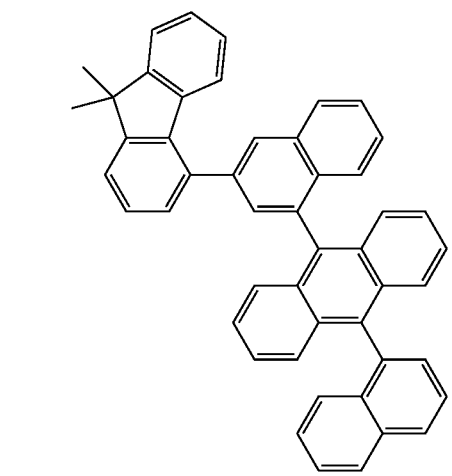
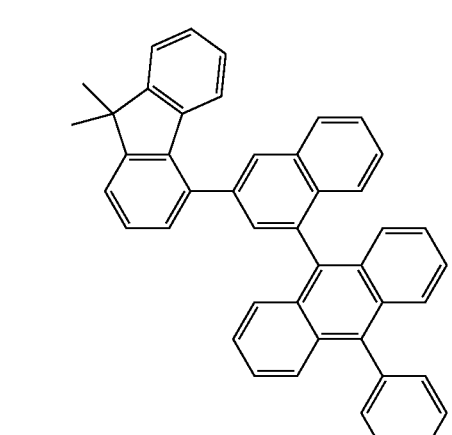

133
-continued
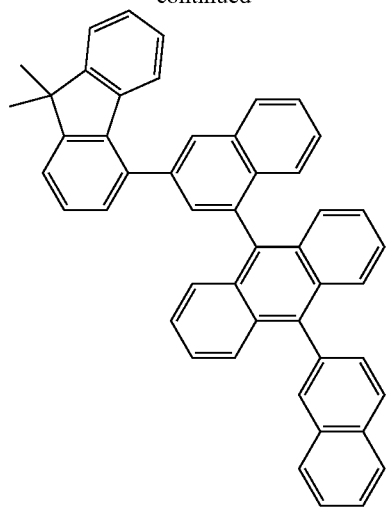
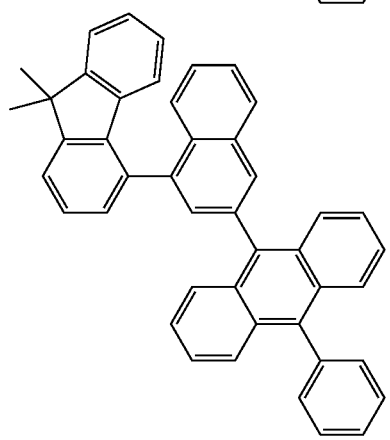
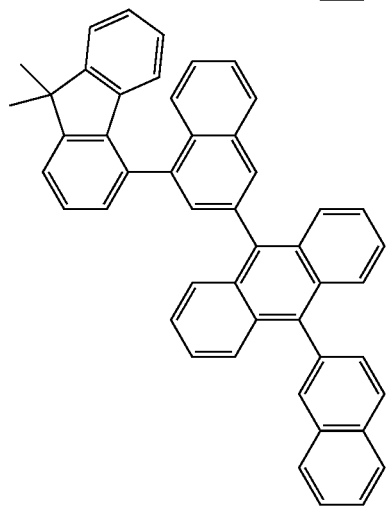
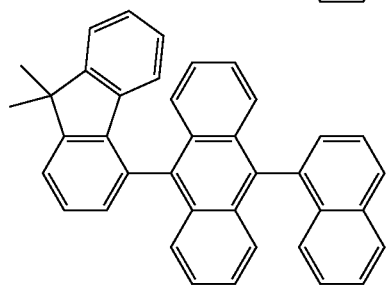
134
-continued
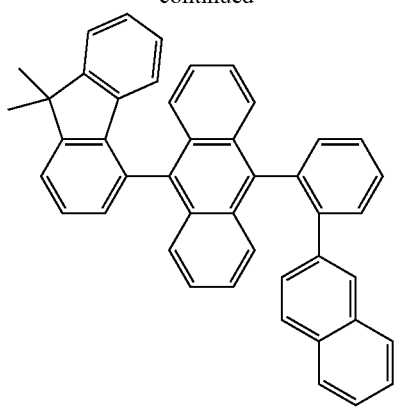
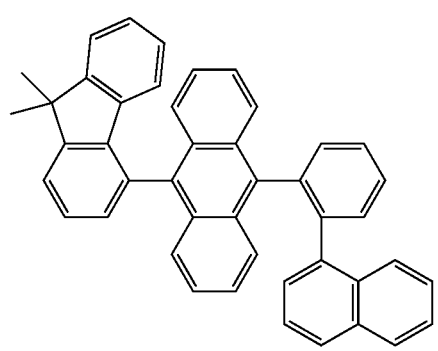
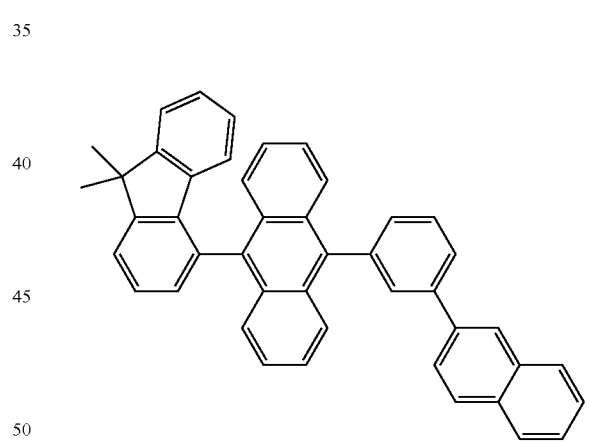
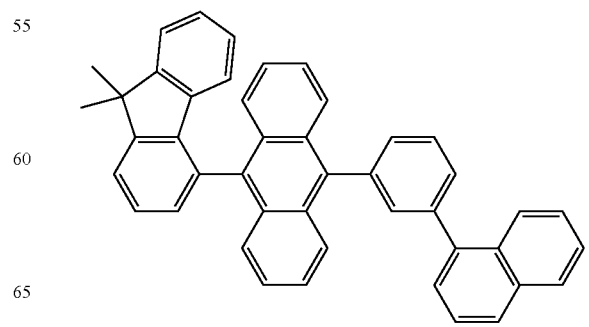

135
-continued
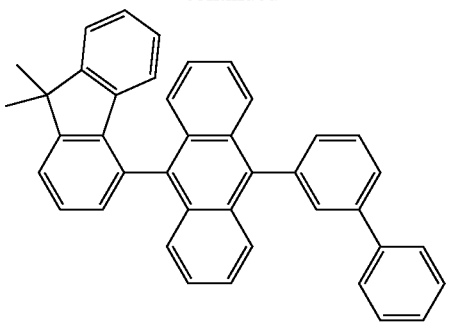
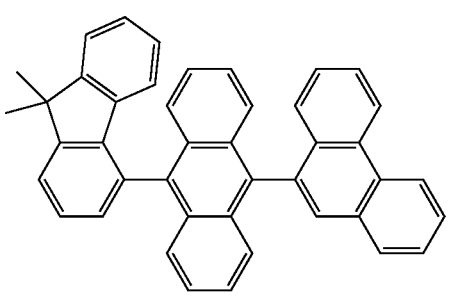
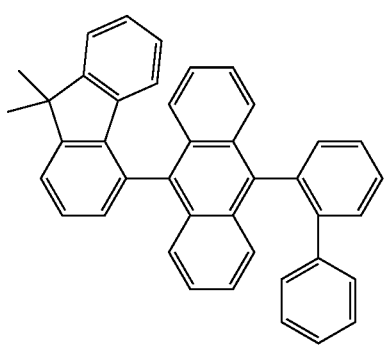
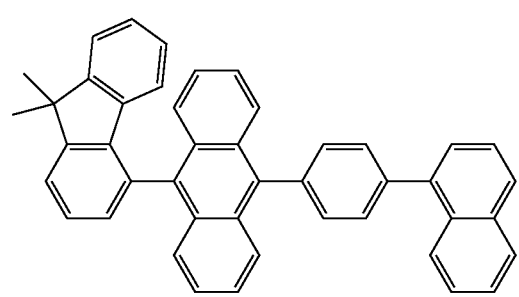
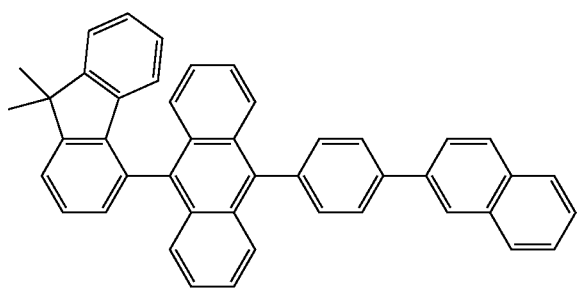
136
-continued
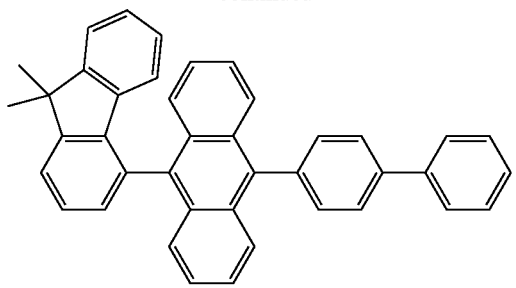
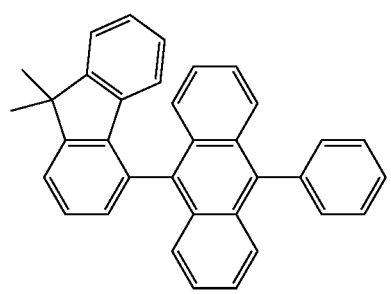
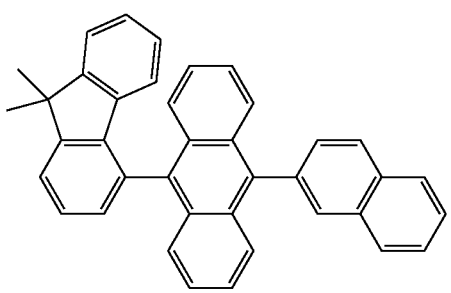
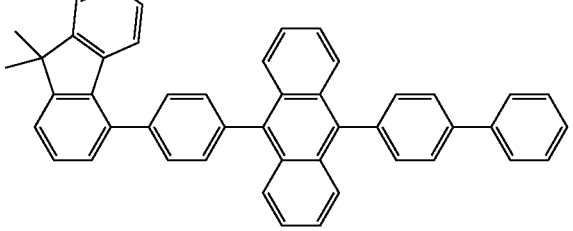
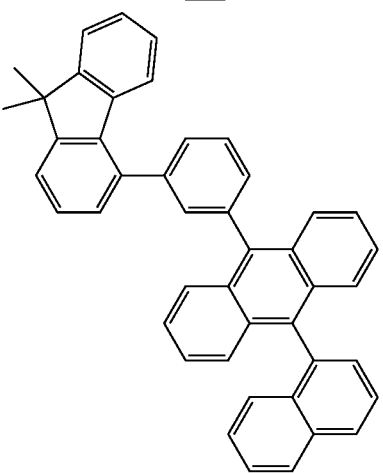

137
-continued
138
-continued
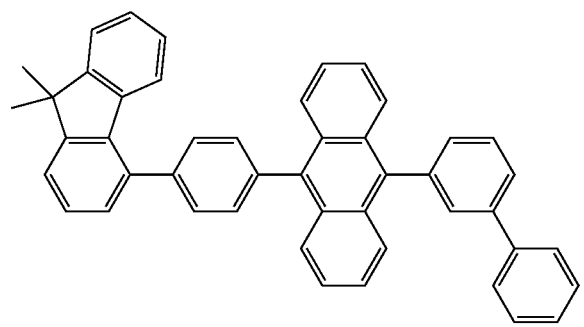
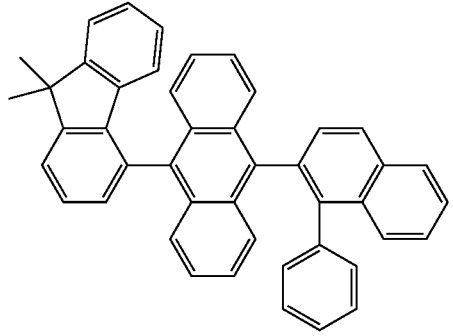
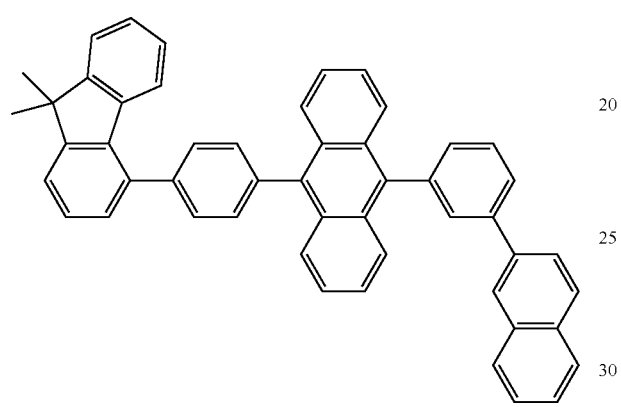
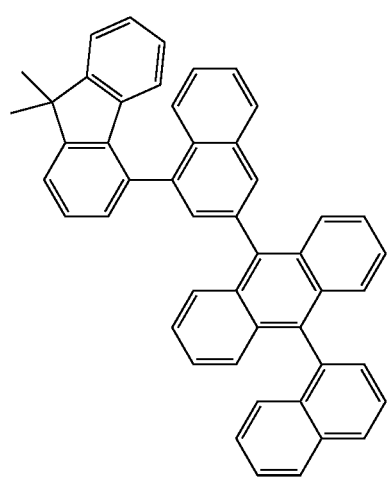
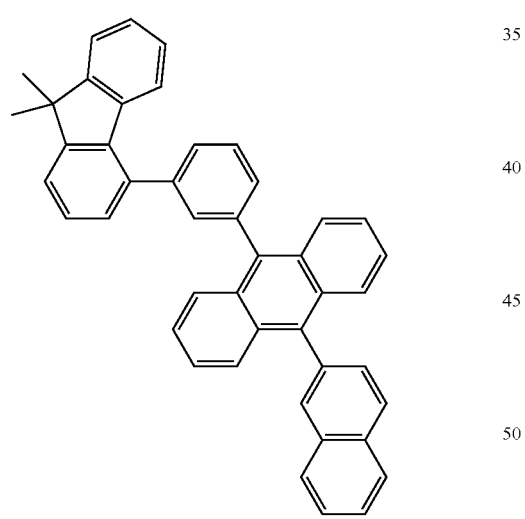
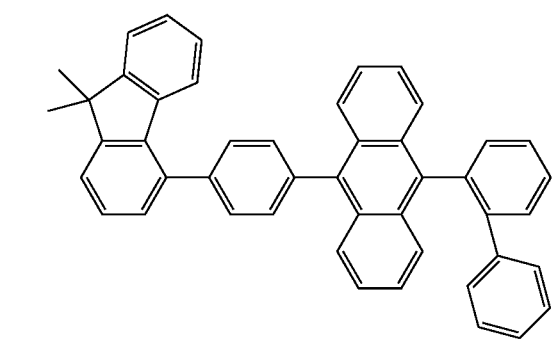
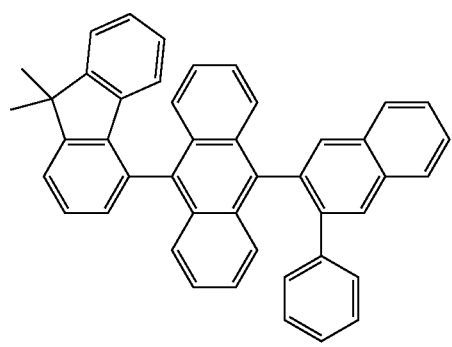
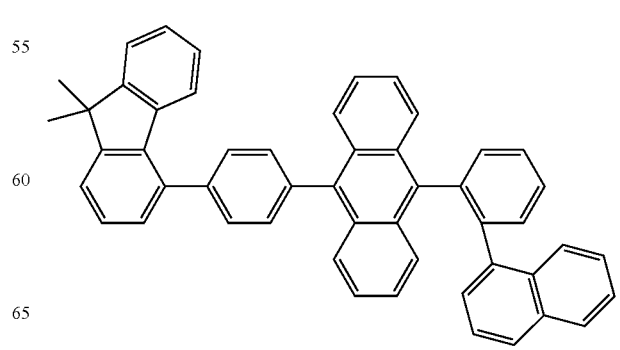

139
-continued
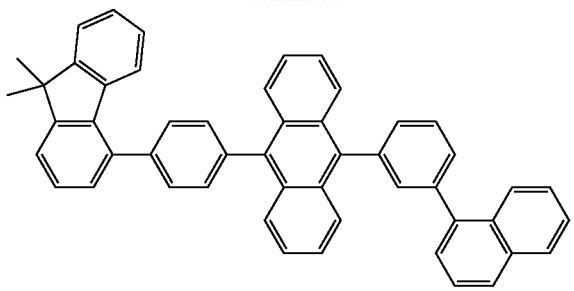
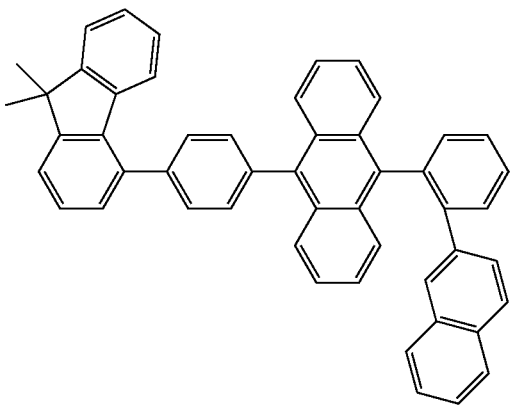
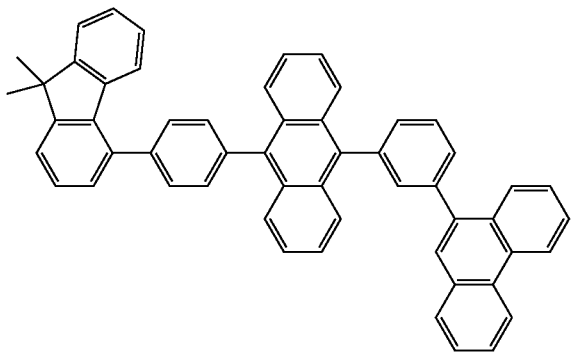
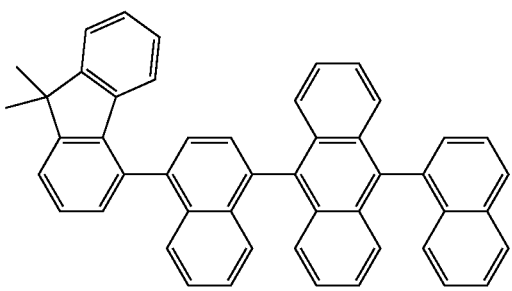
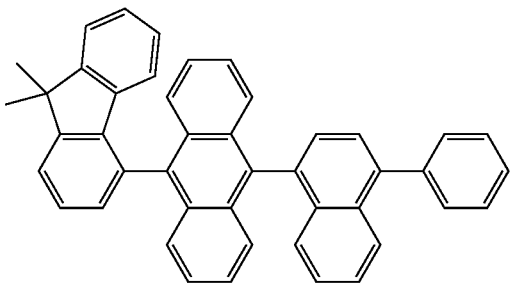
140
-continued
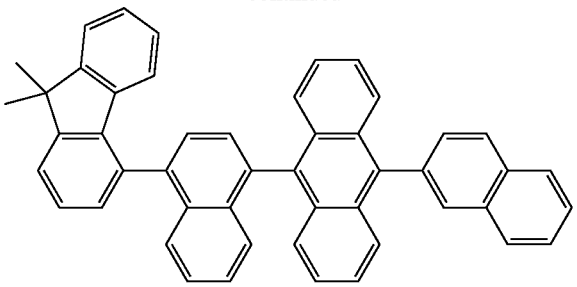
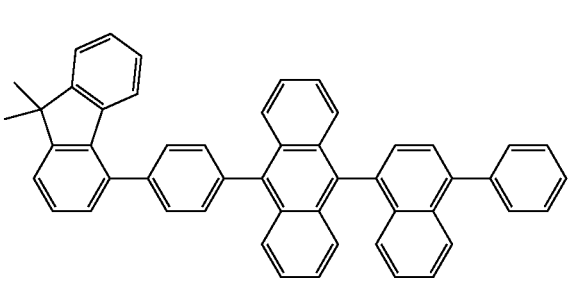
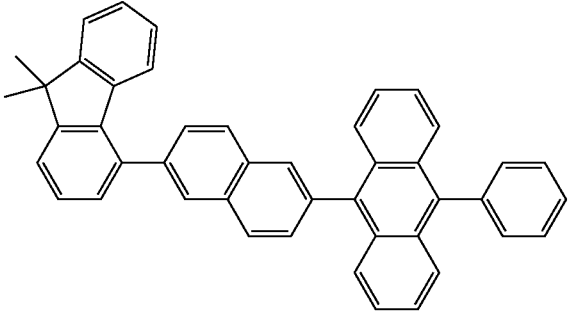
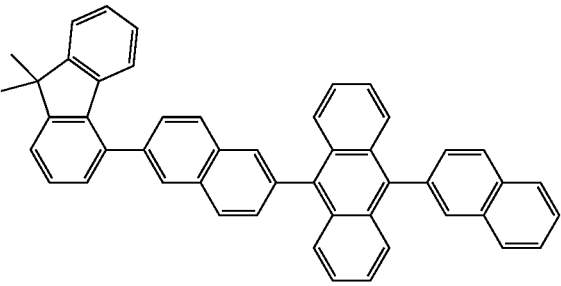
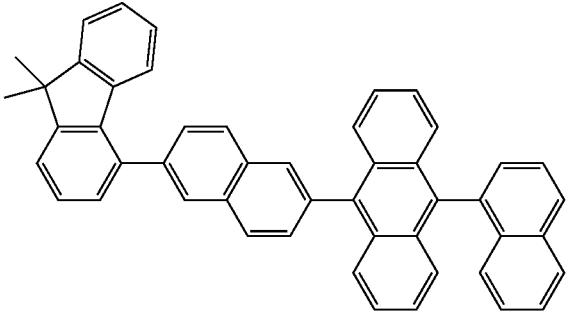

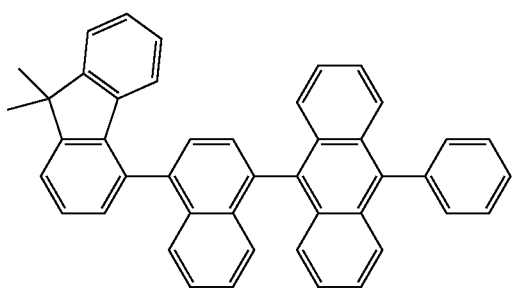
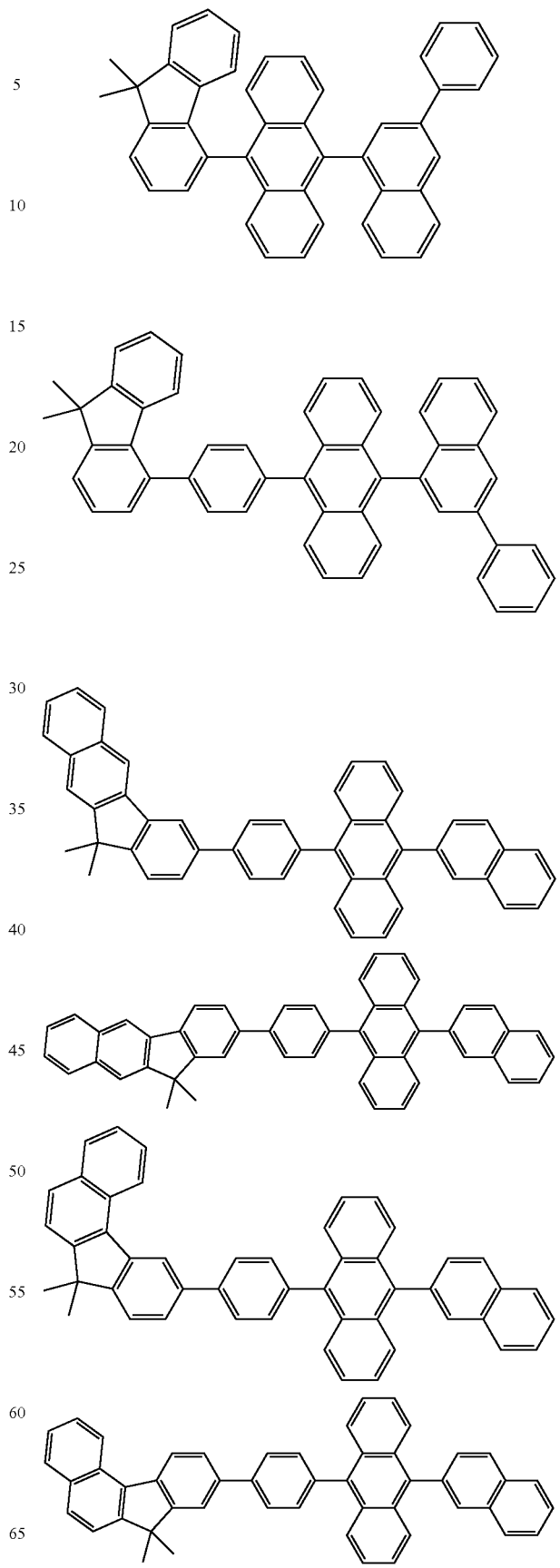

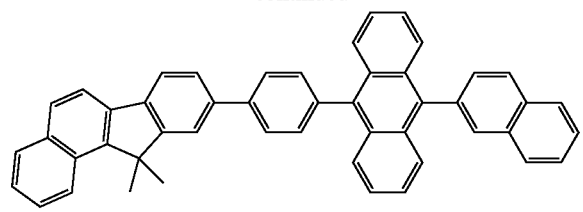
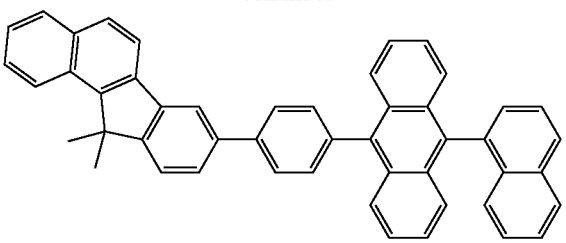
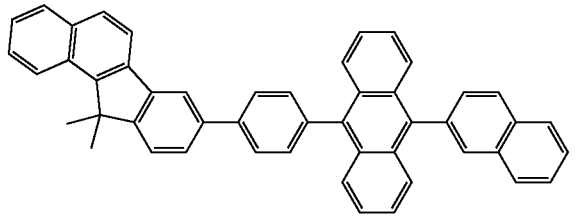
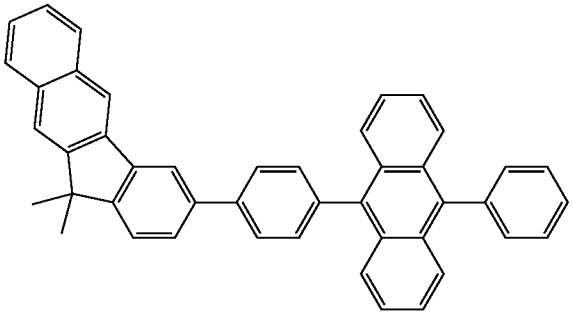
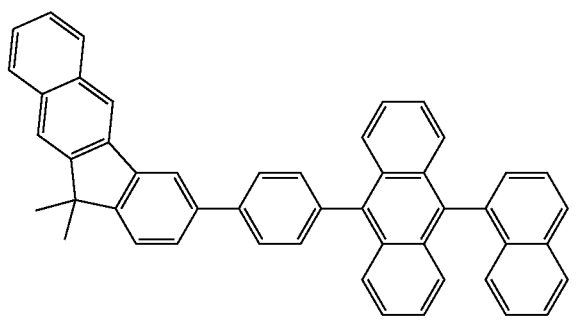
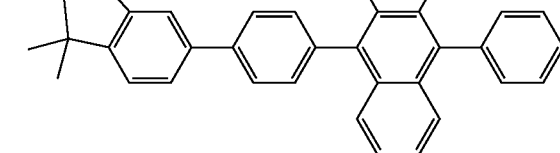
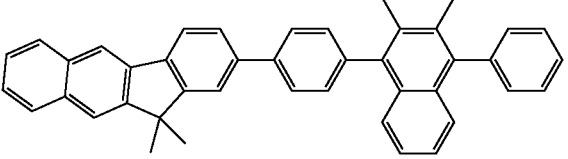
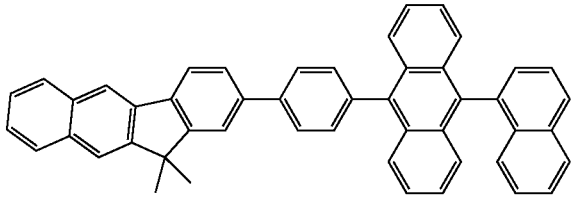
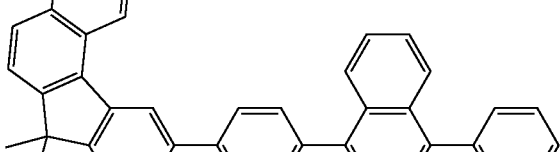
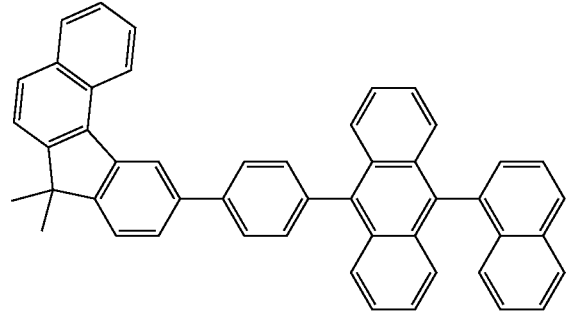
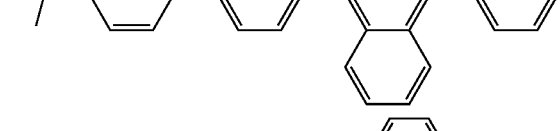
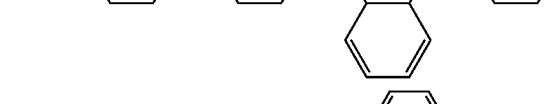
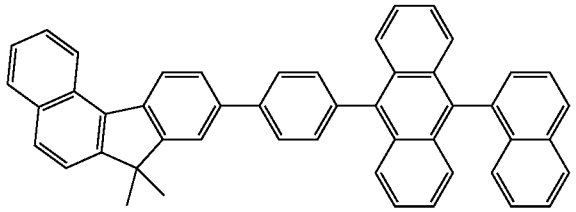
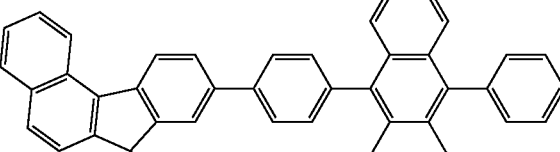
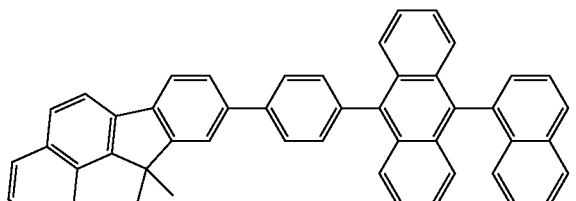
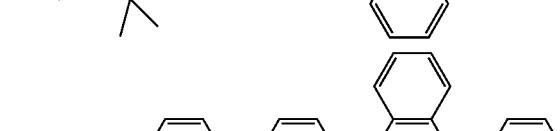
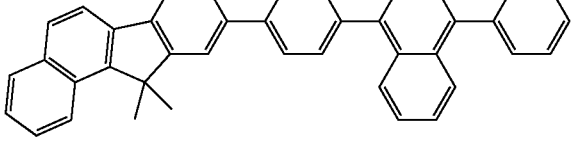

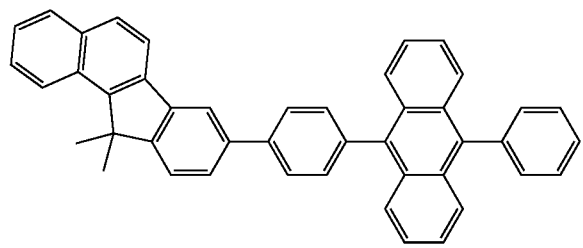
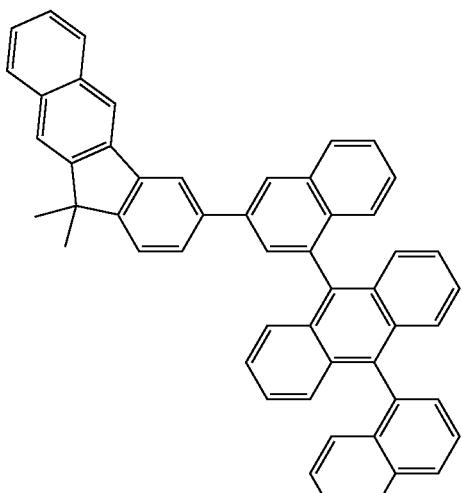
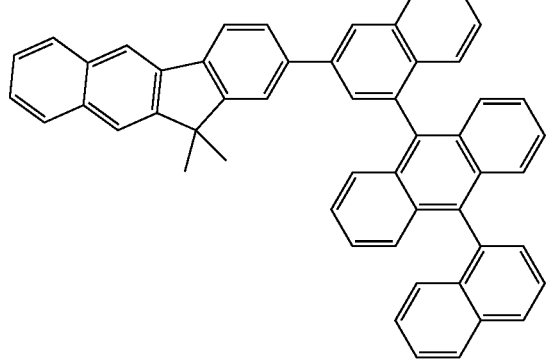
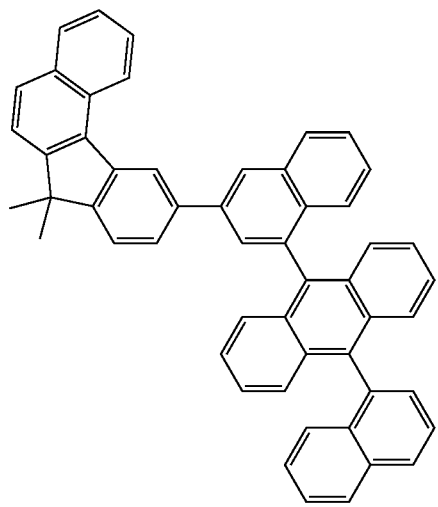
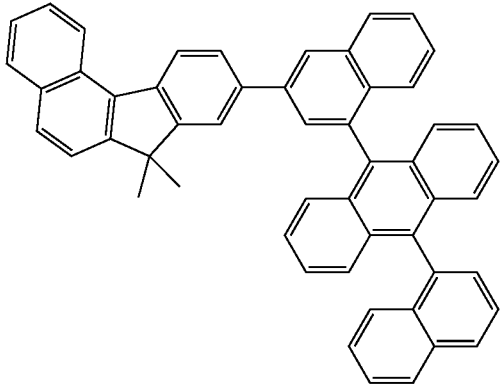
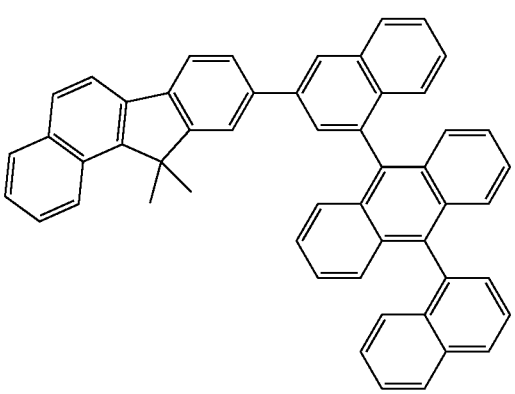
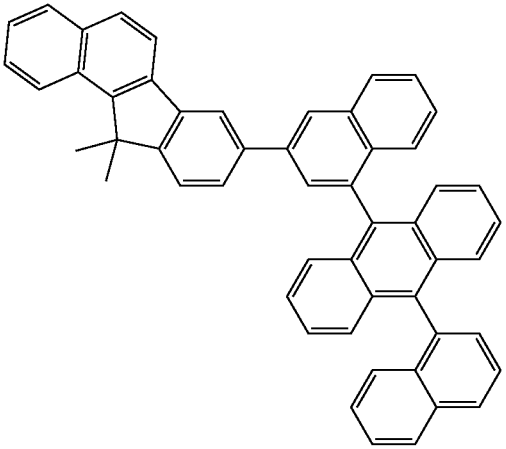
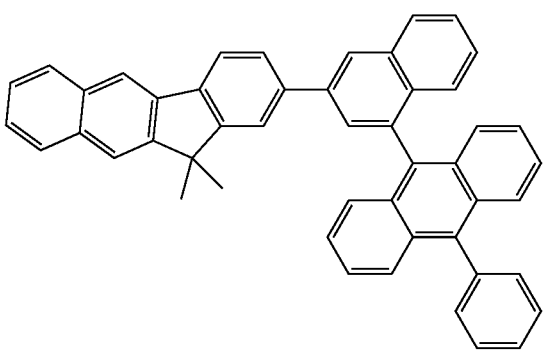

147
-continued
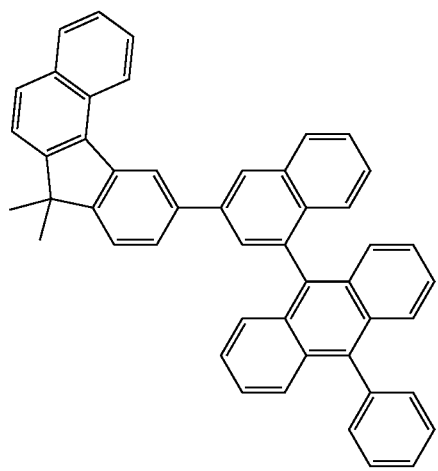
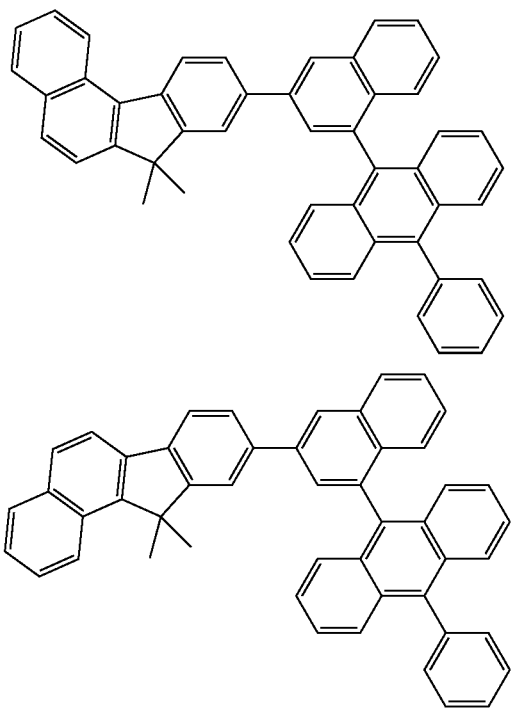
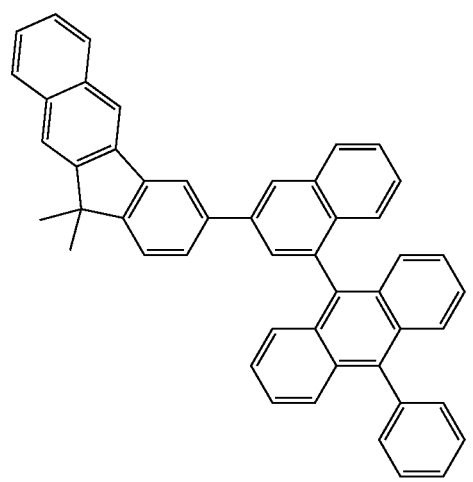
148
-continued
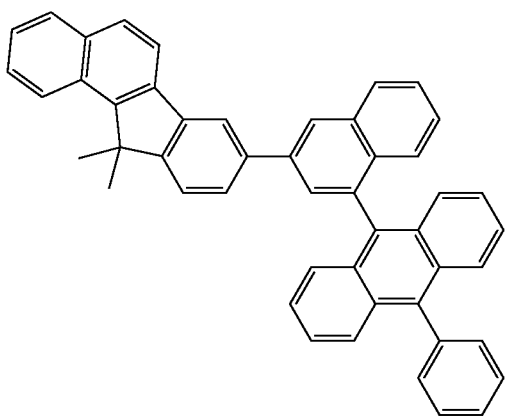
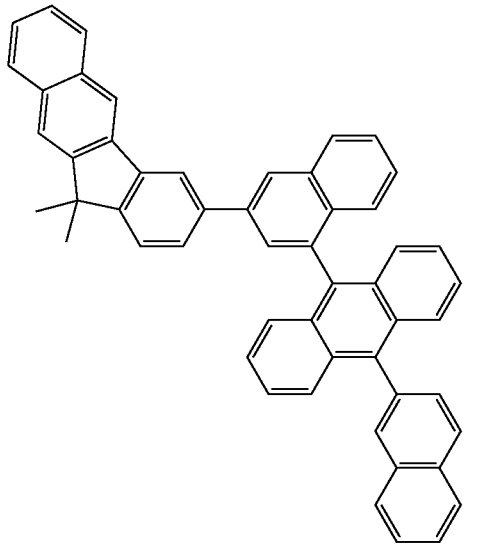
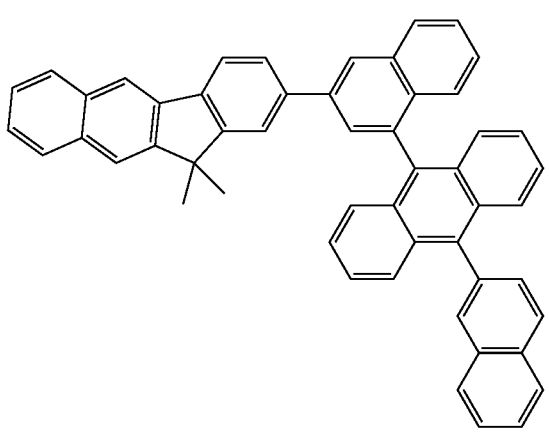

149
-continued
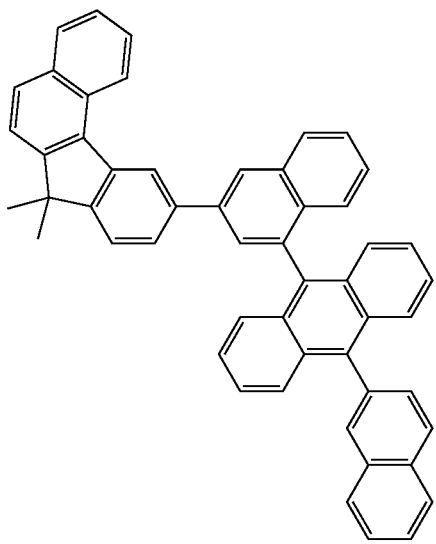
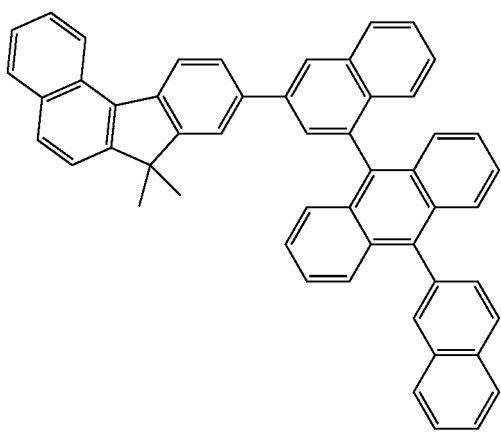
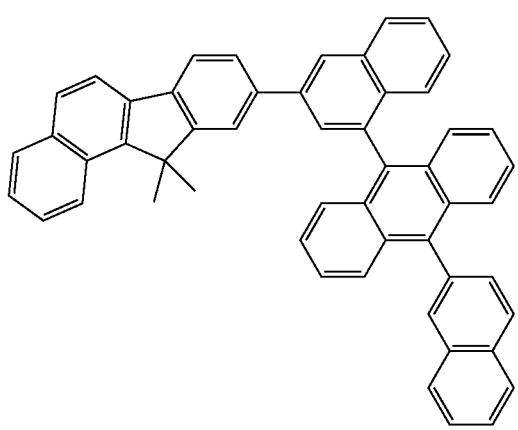
150
-continued
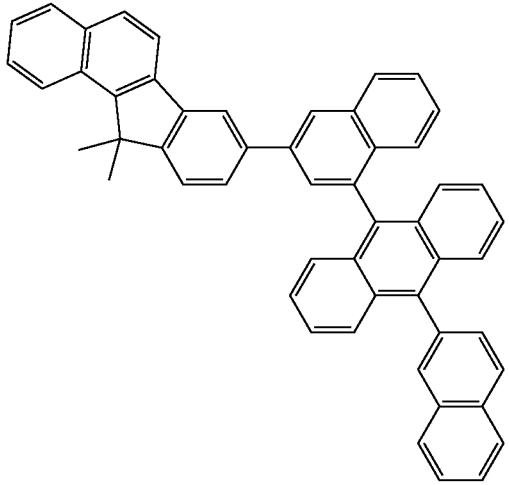
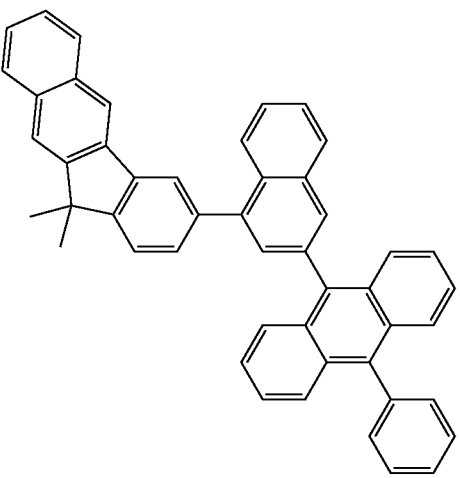
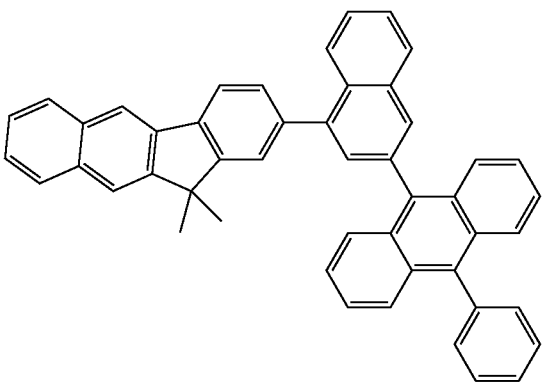

151
-continued
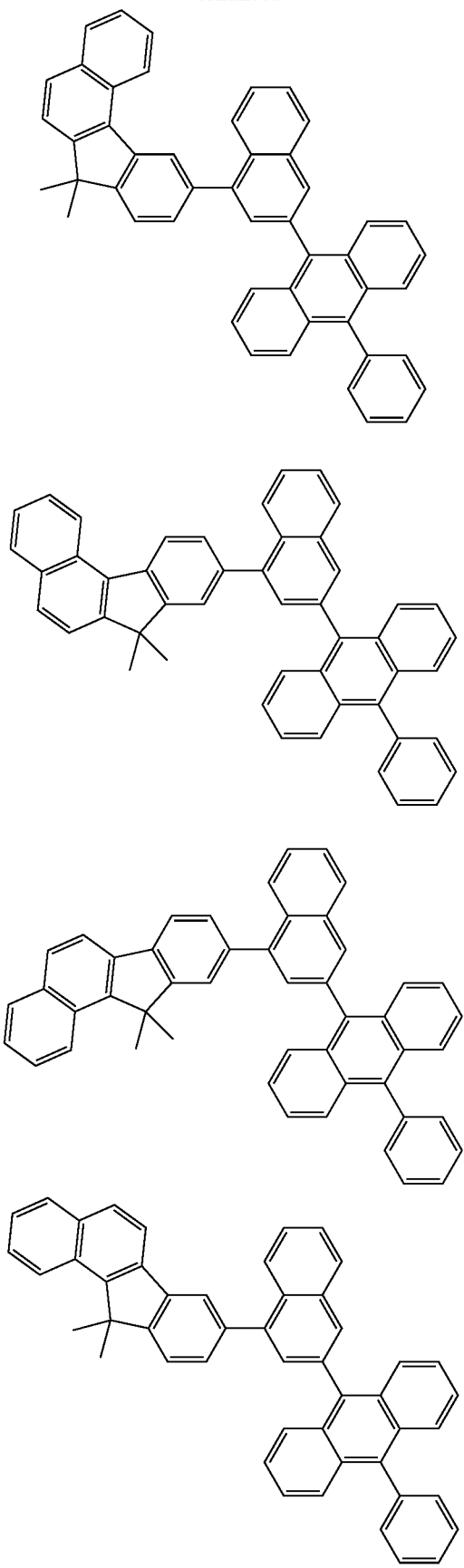
152
-continued

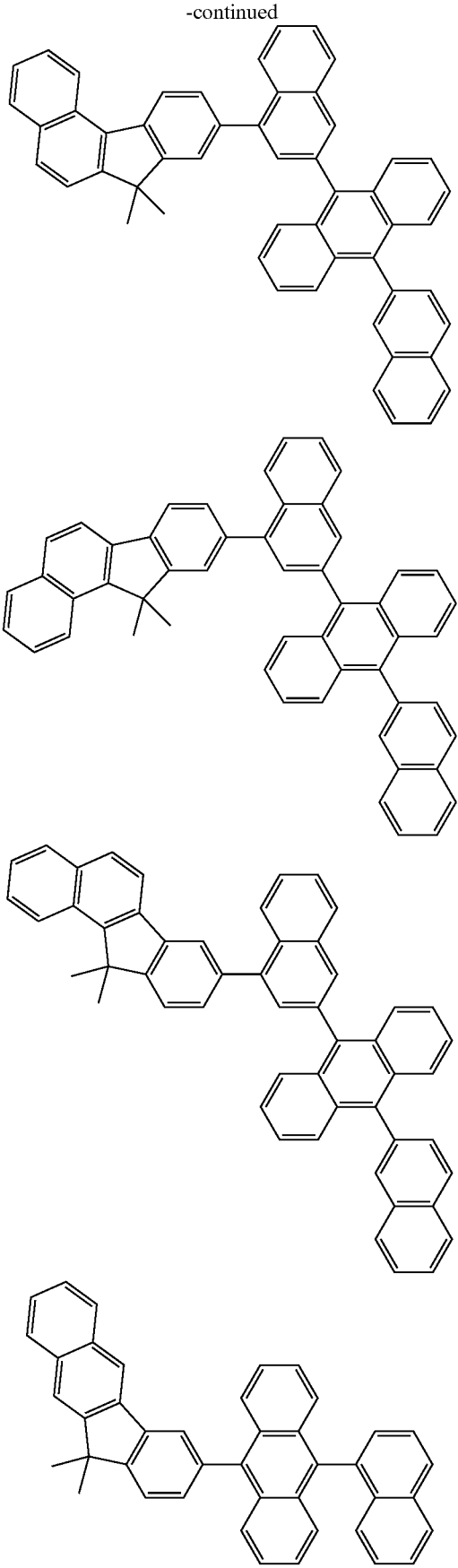
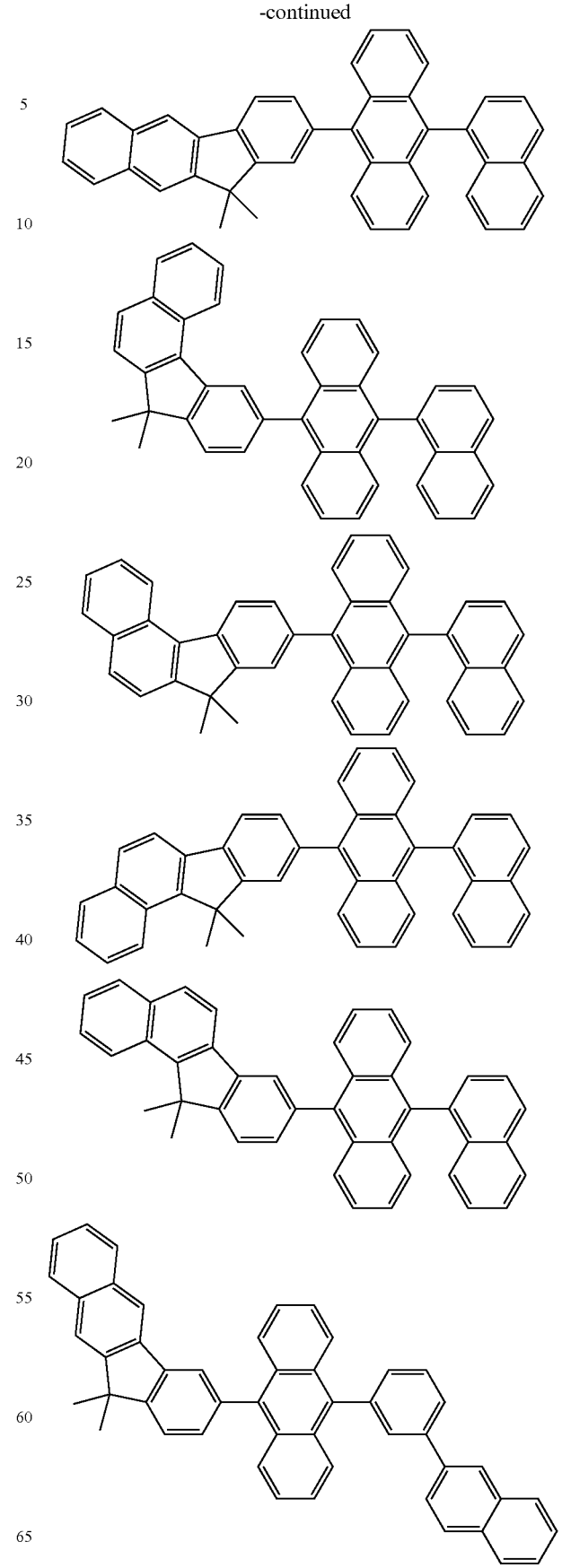

-continued
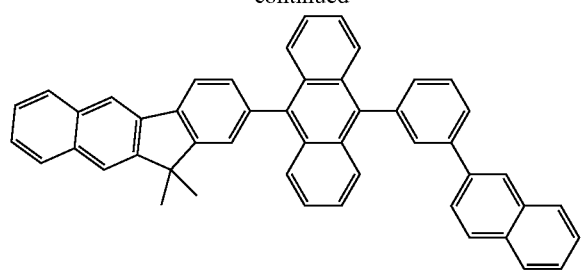
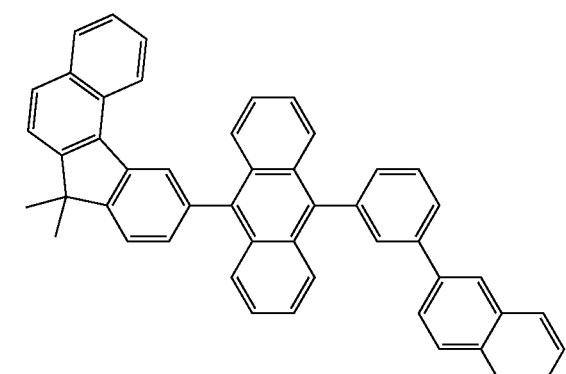
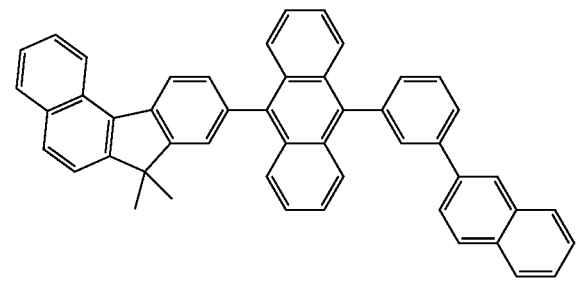
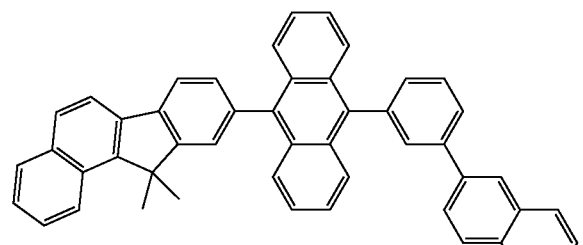
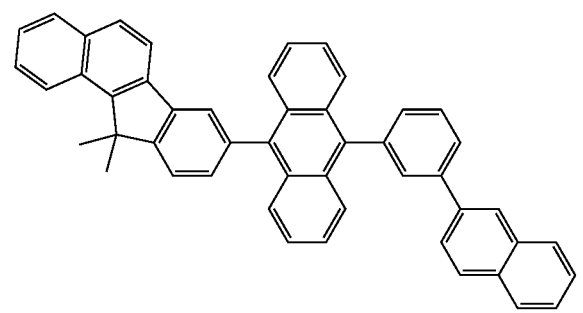
-continued
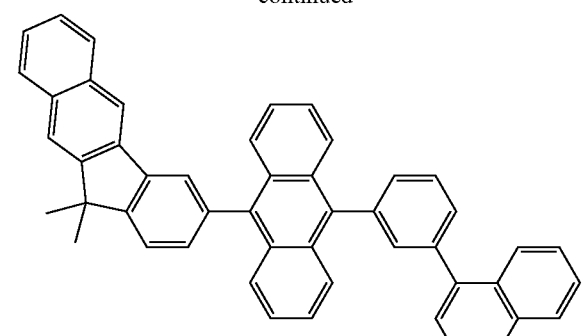

157
-continued
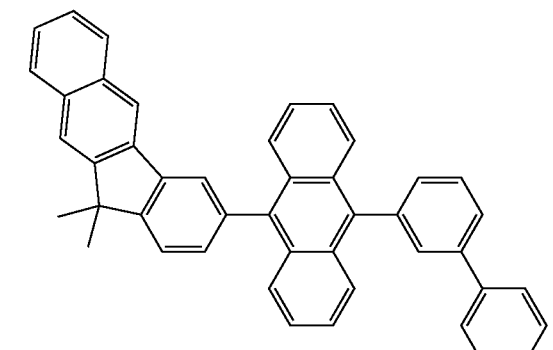
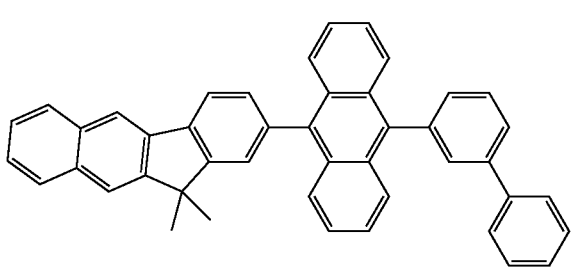
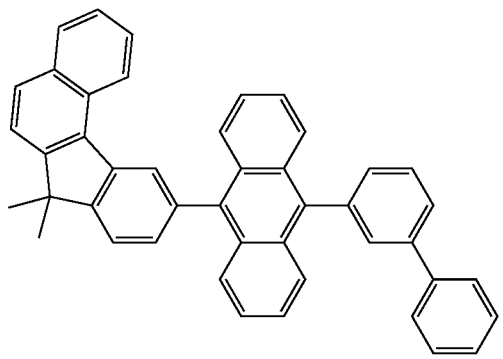
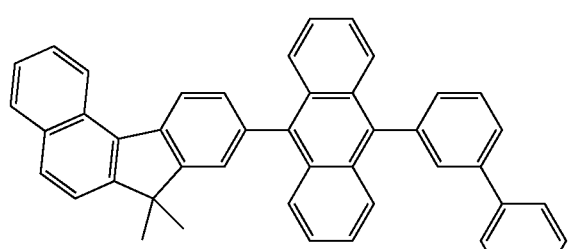
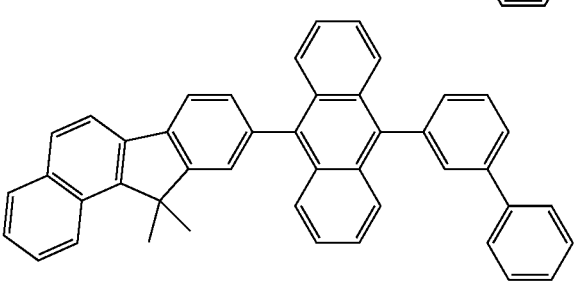
158
-continued
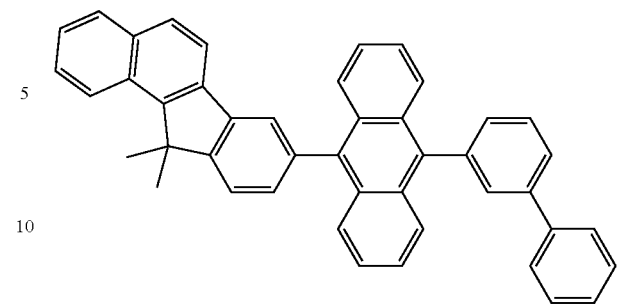
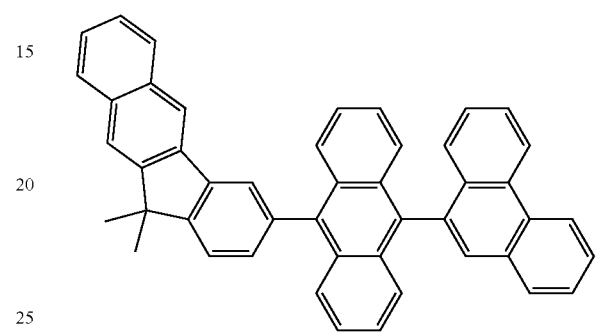
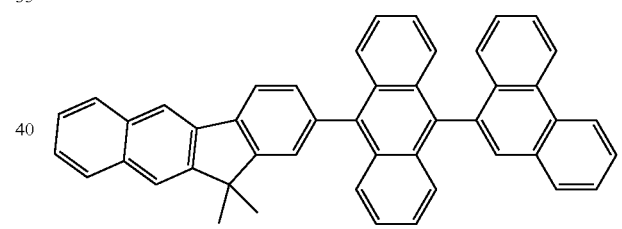
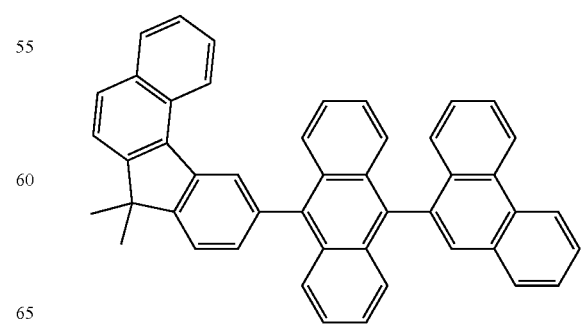

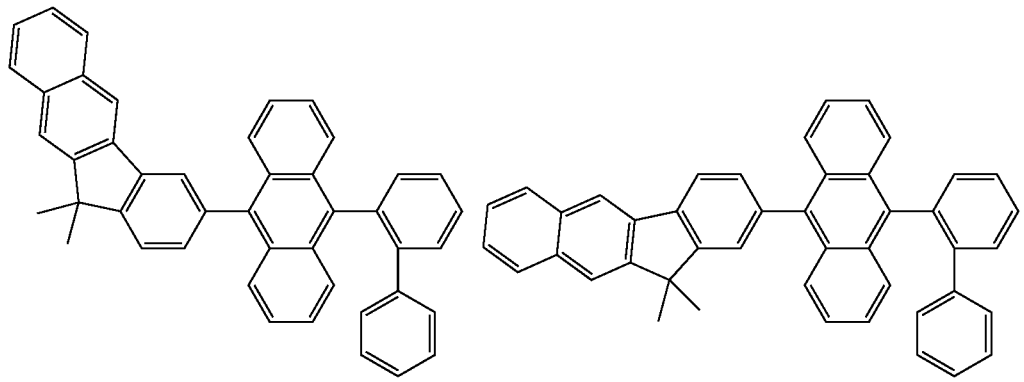
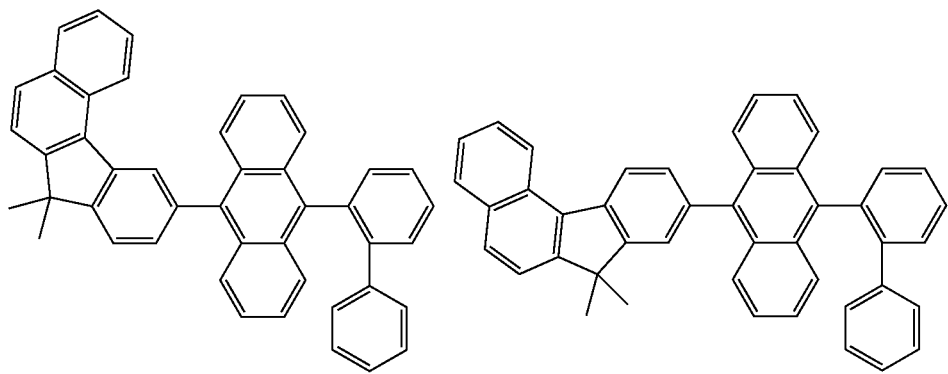
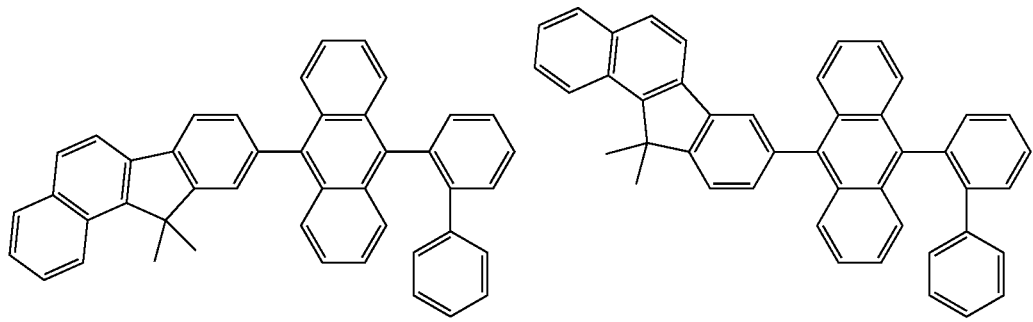
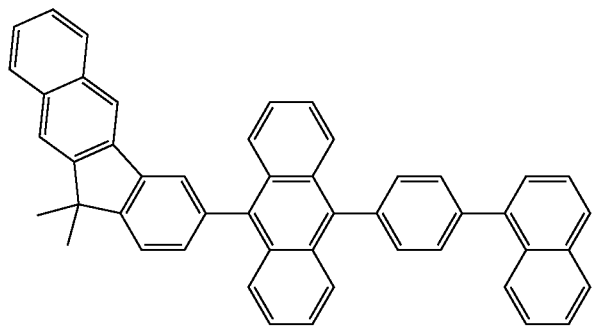
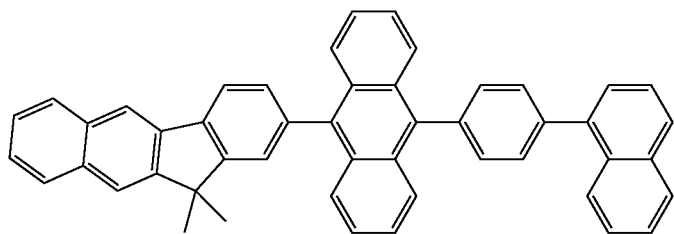

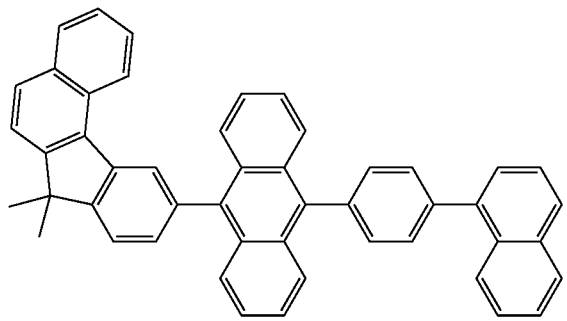
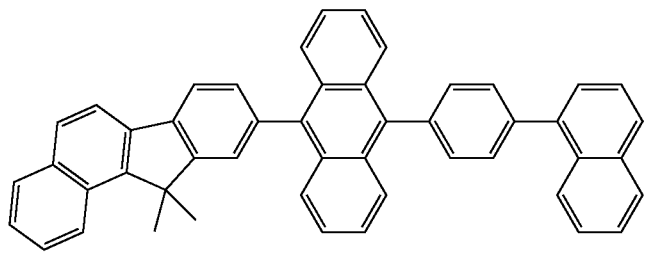
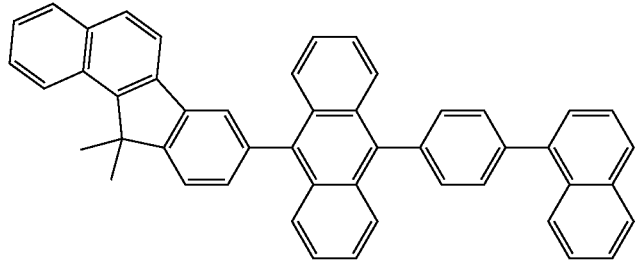
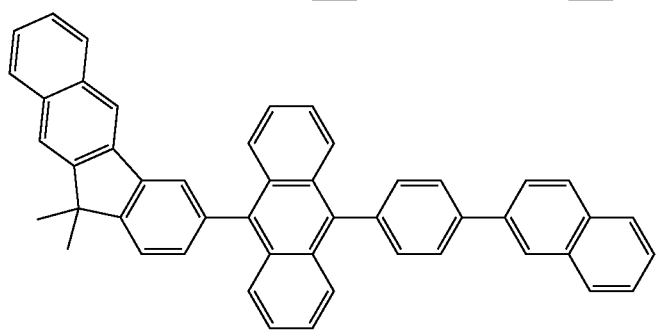
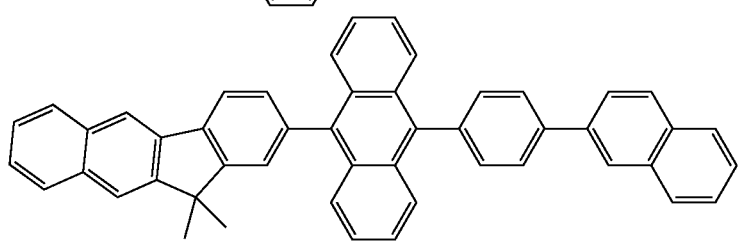
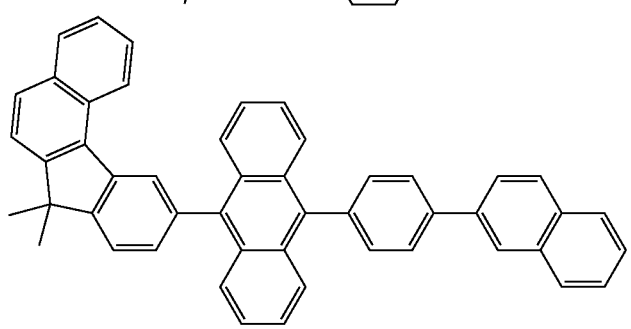

-continued
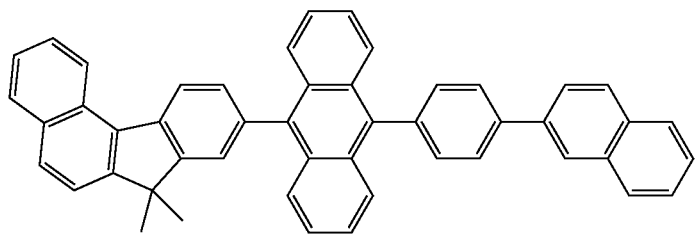
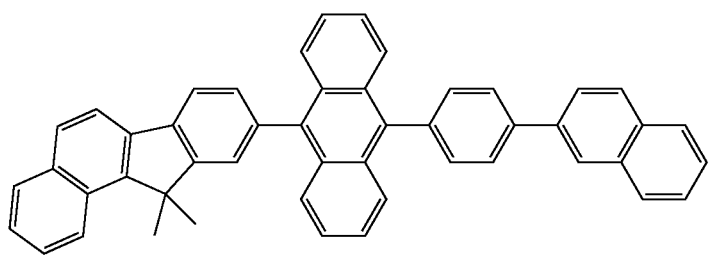
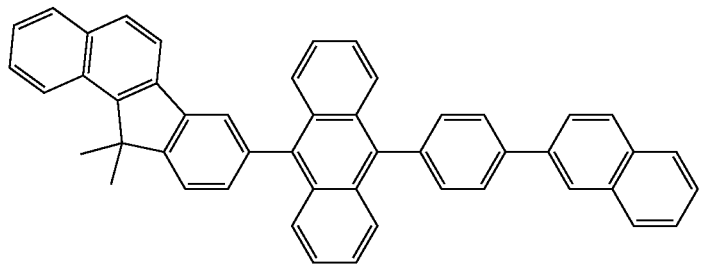
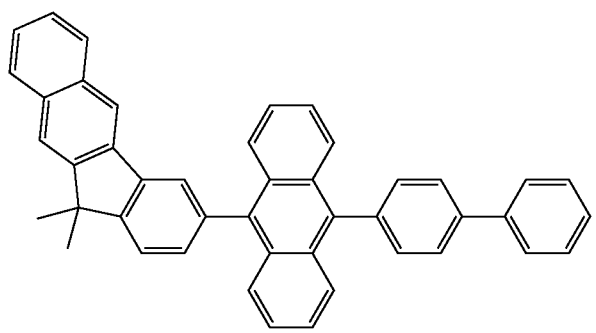
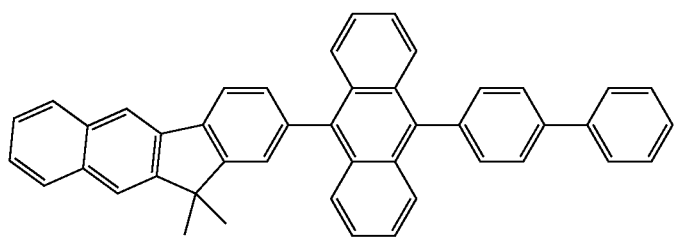
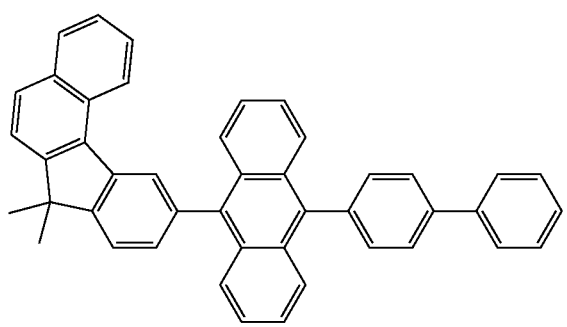

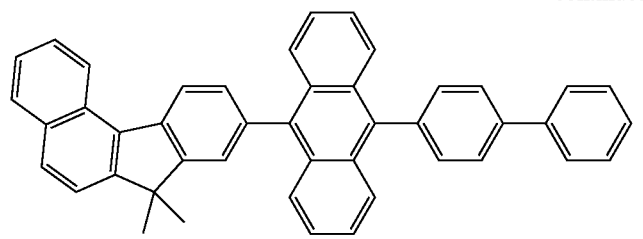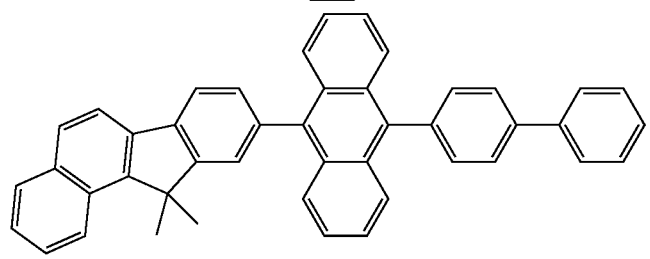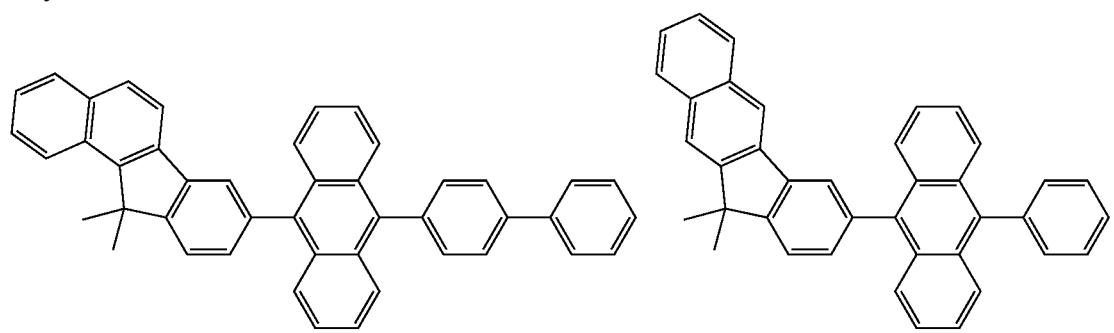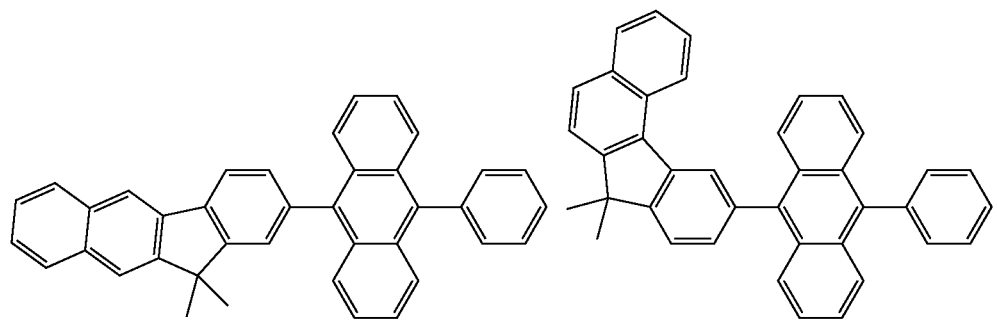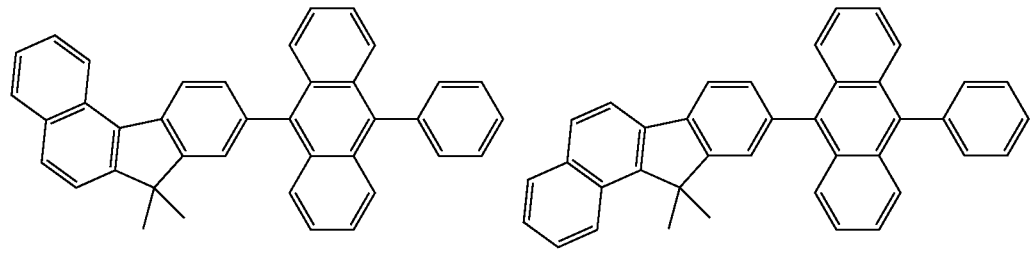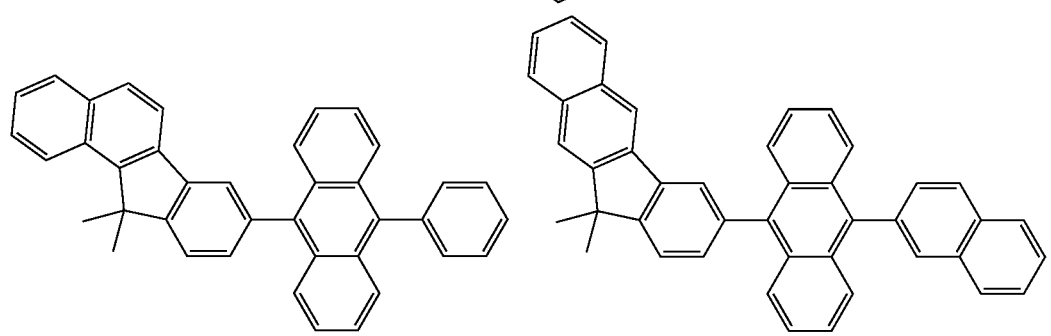

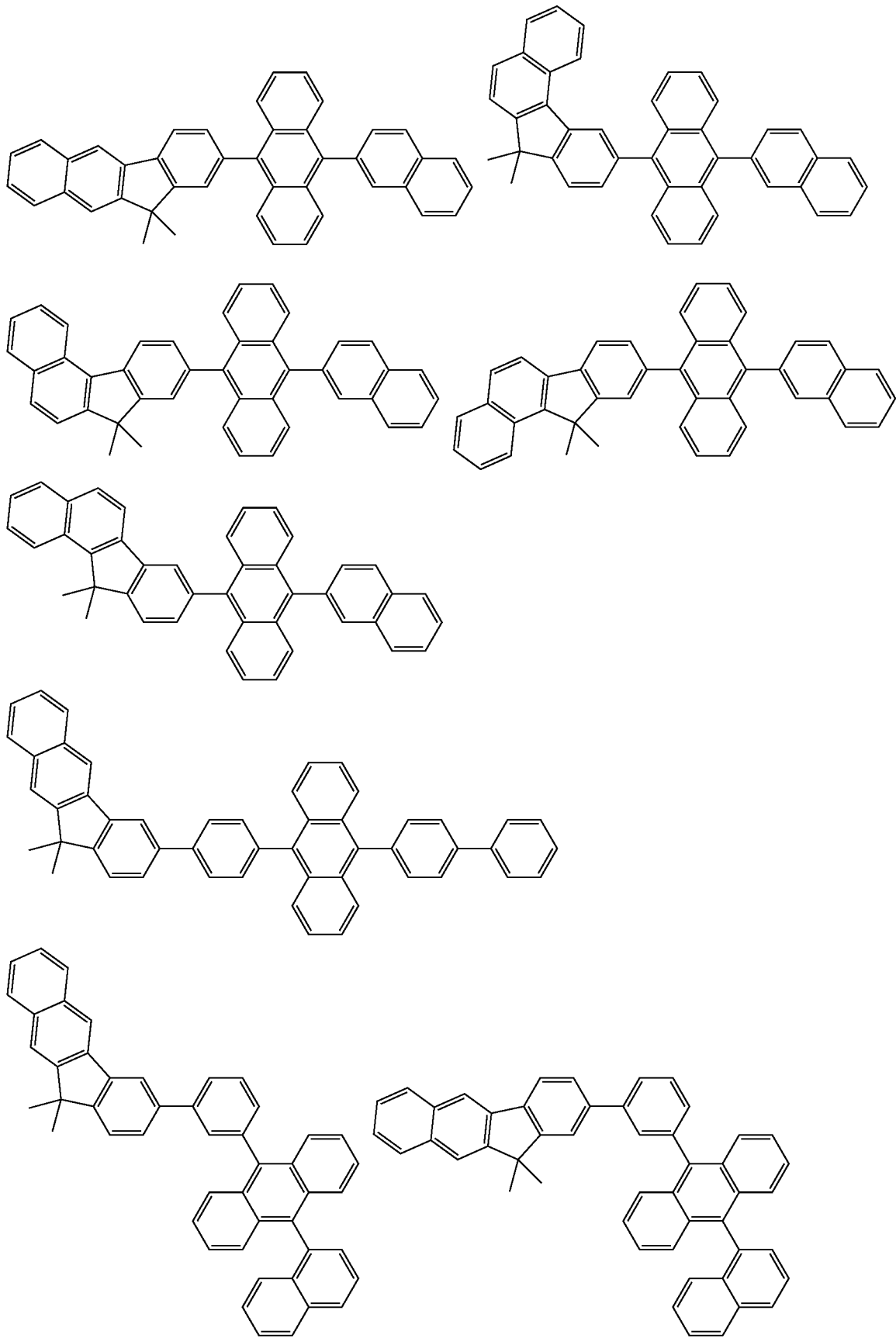

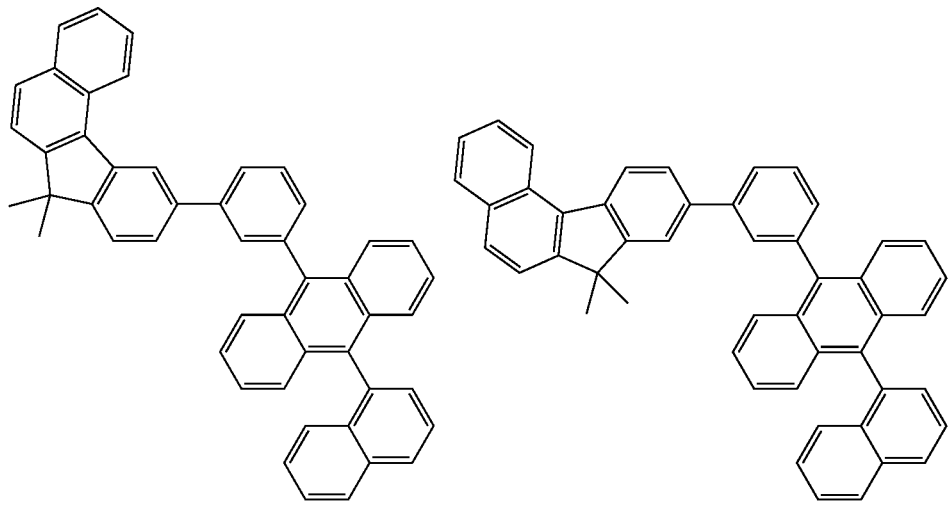
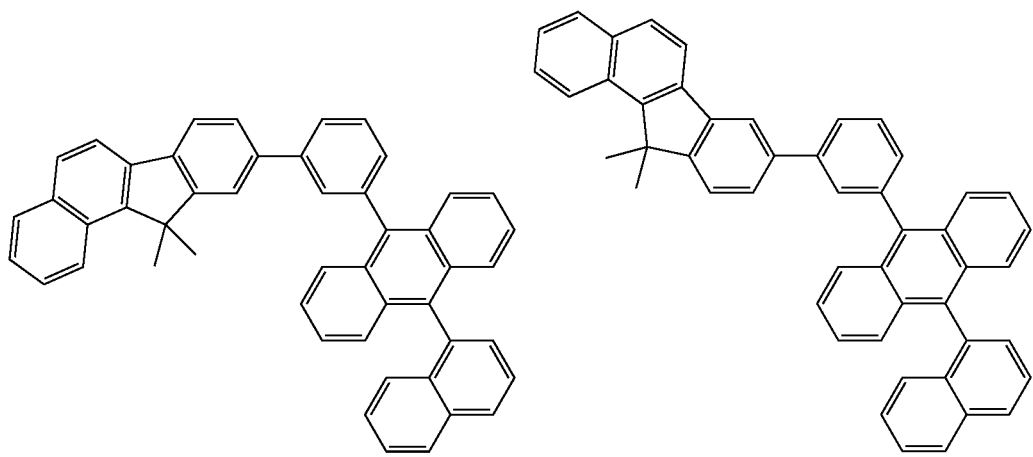
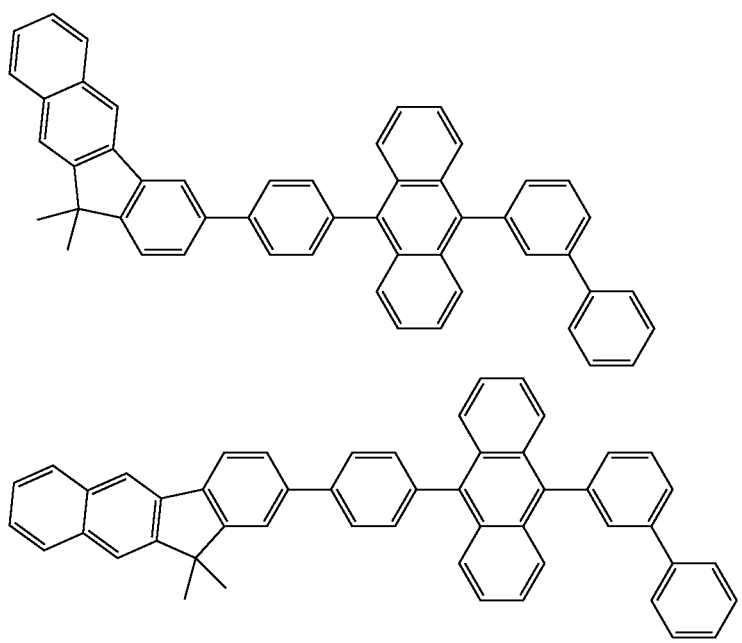

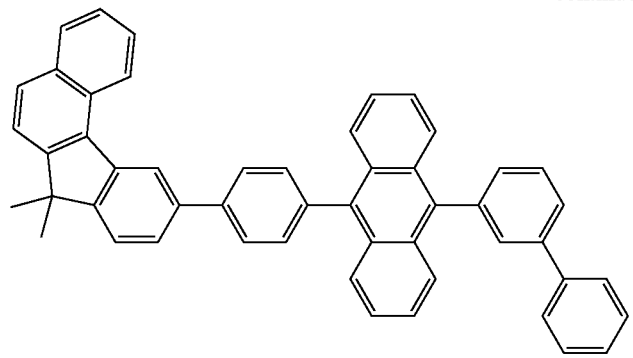
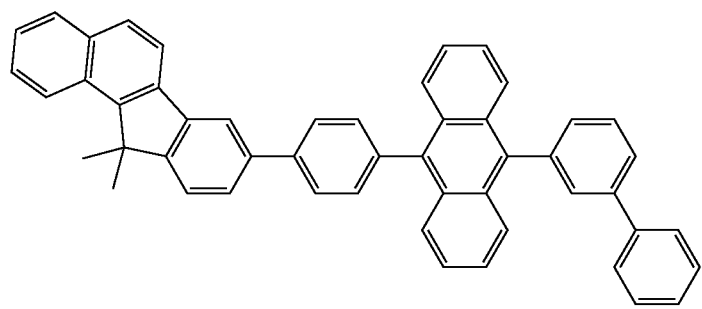
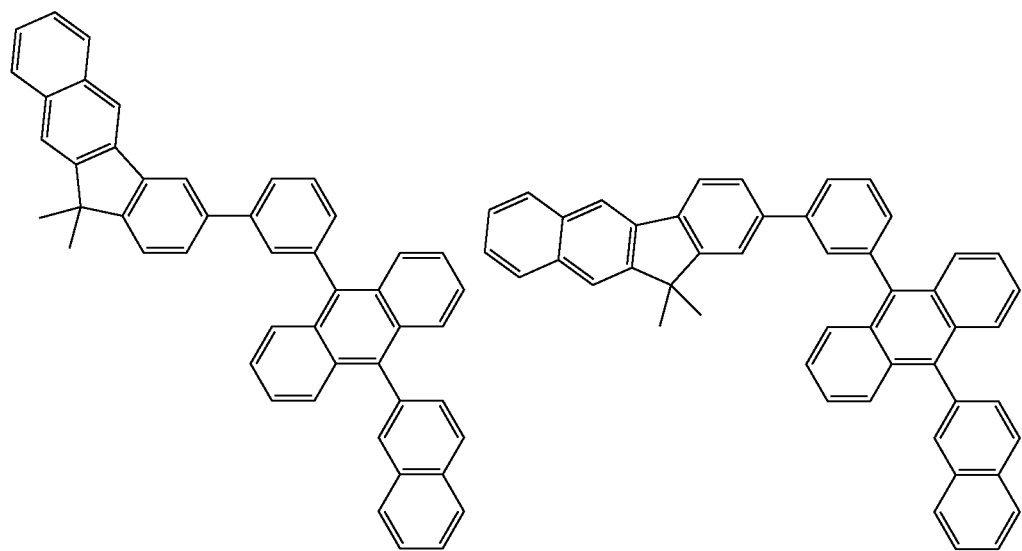

-continued
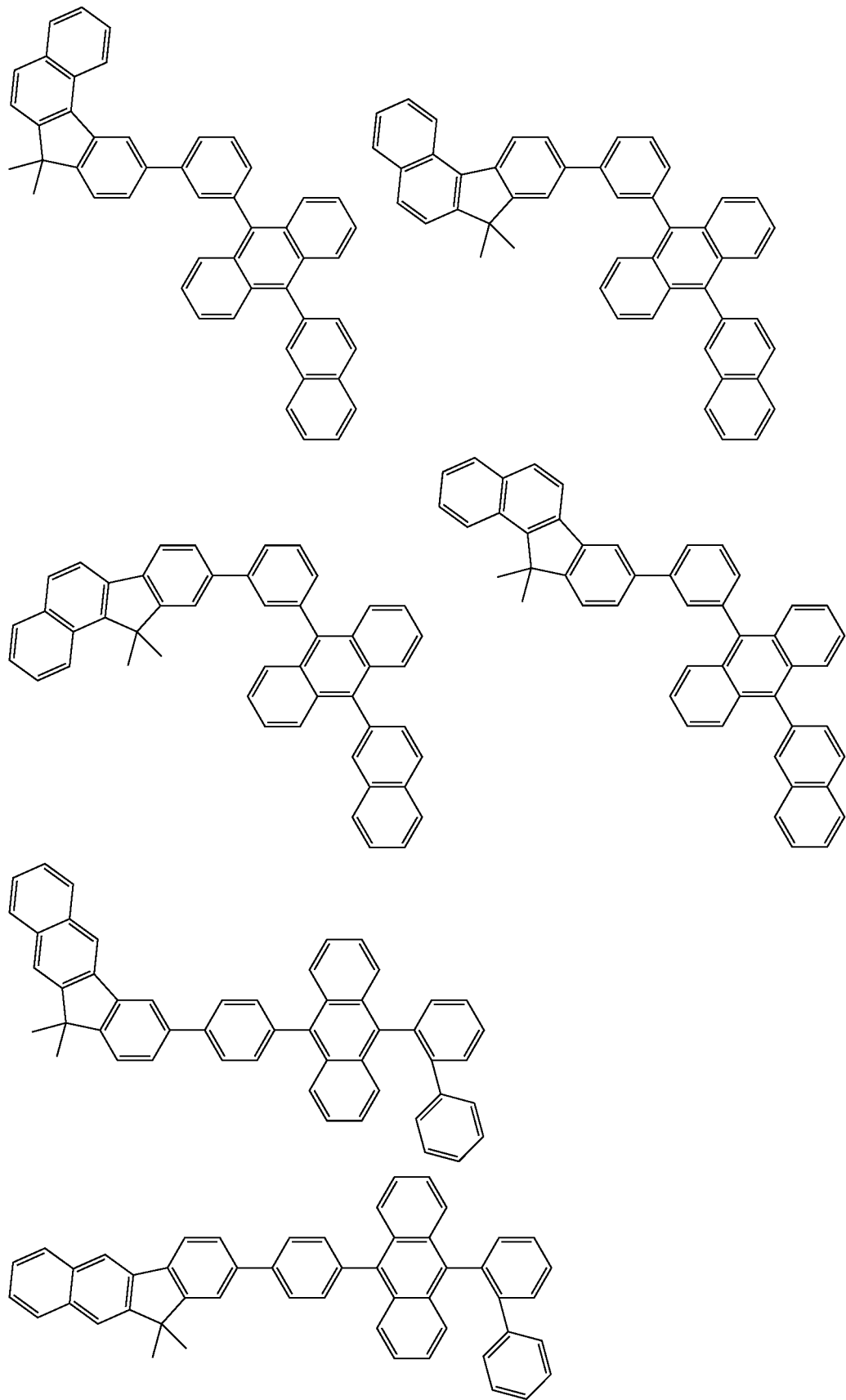

-continued
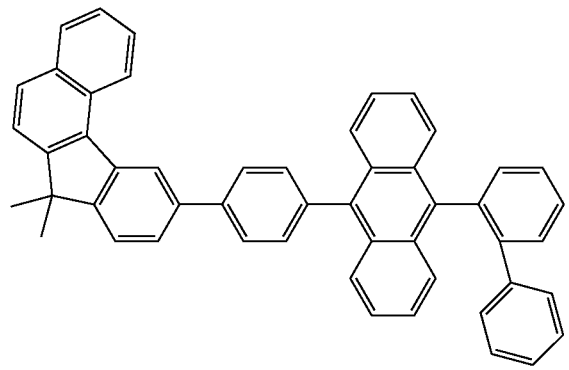
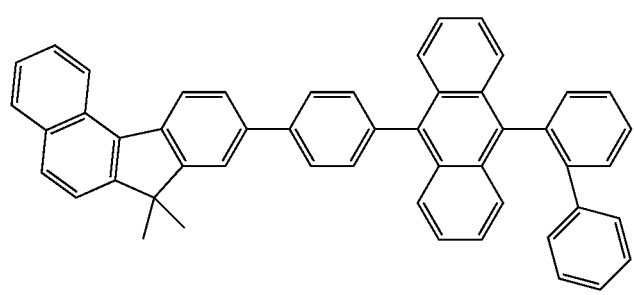
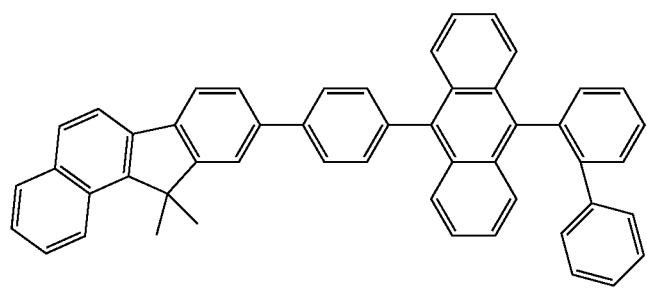
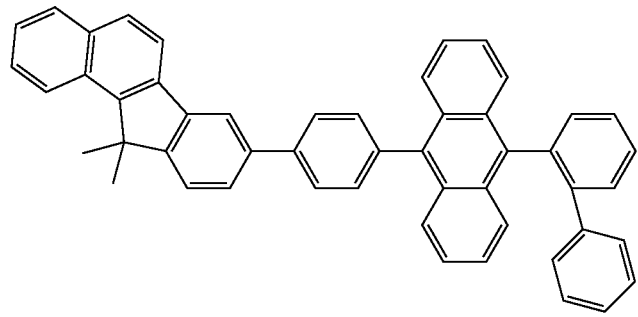
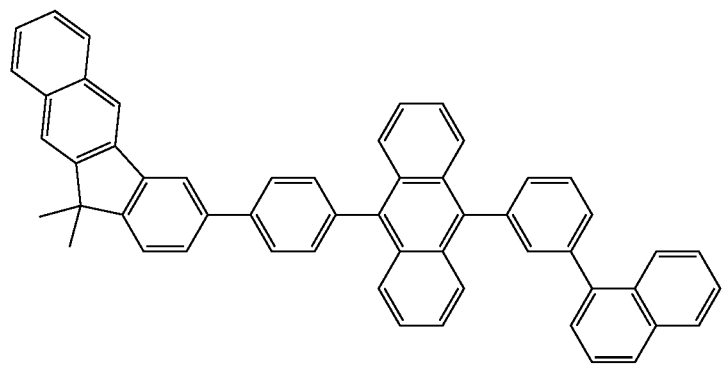

-continued
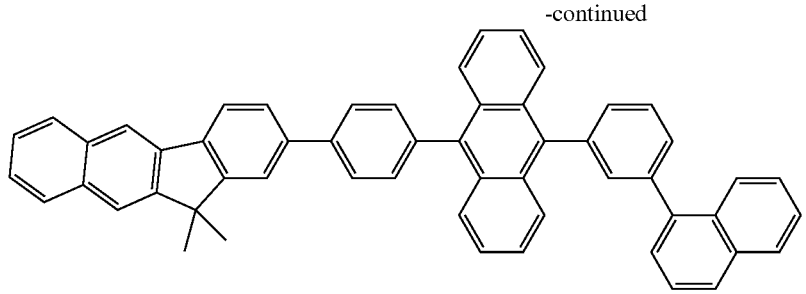
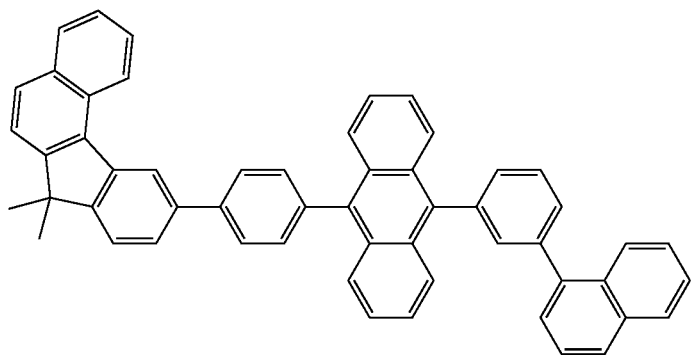
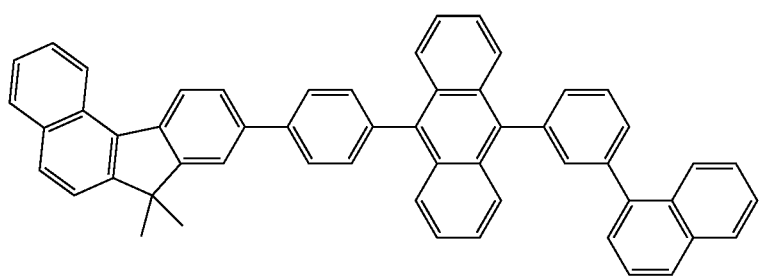
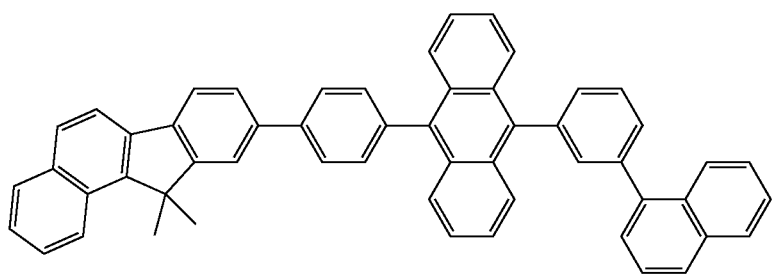
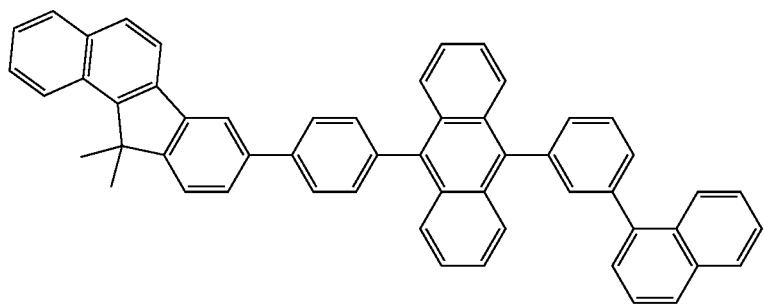

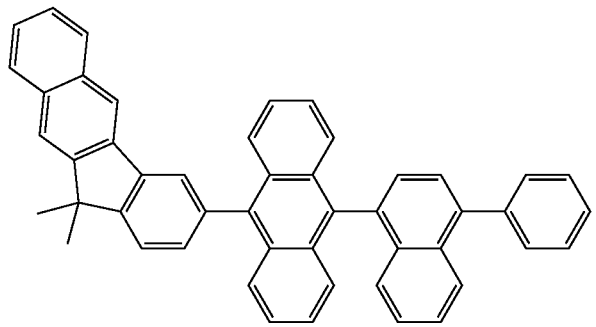
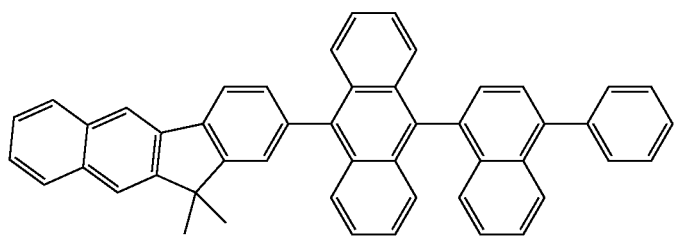
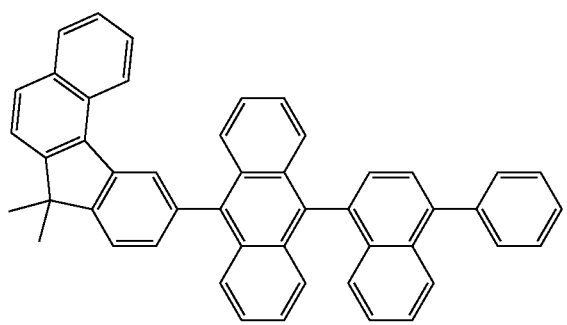
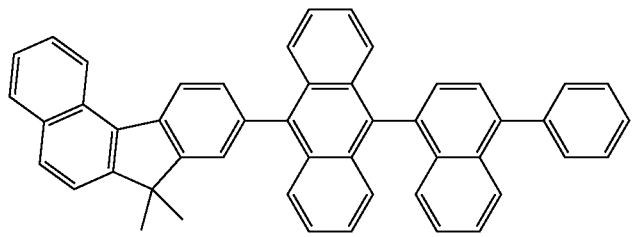
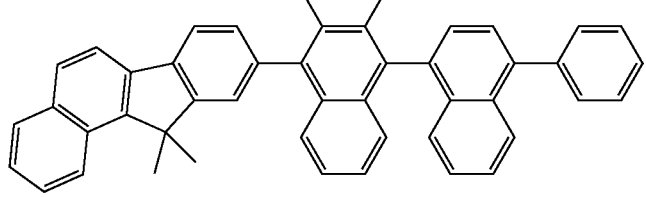
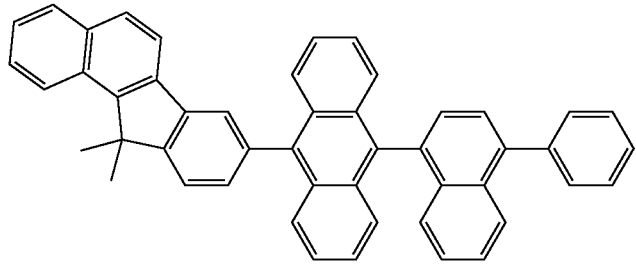

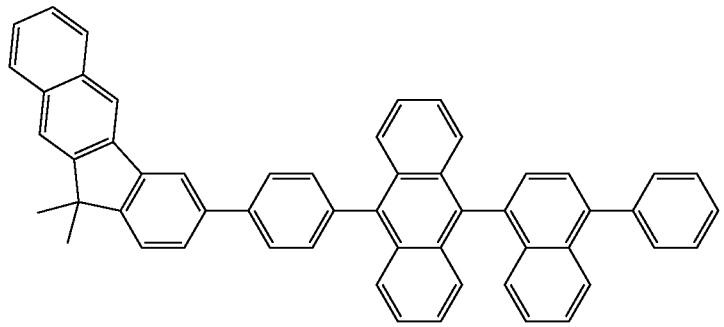
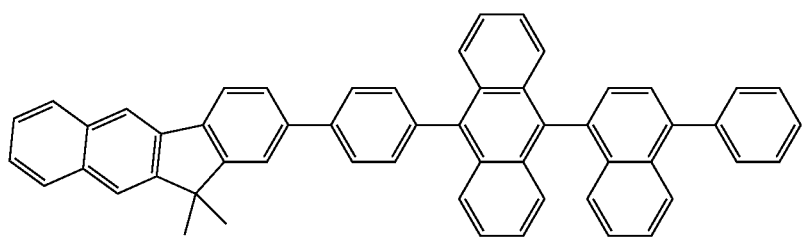
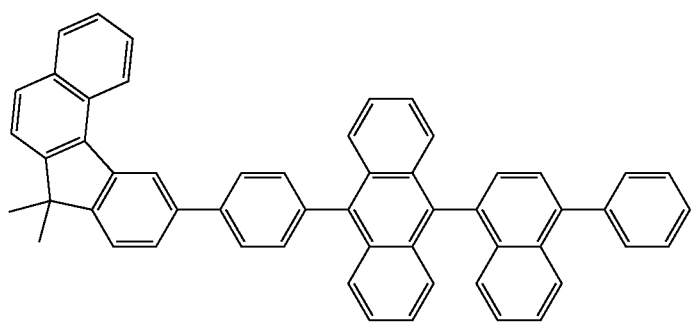
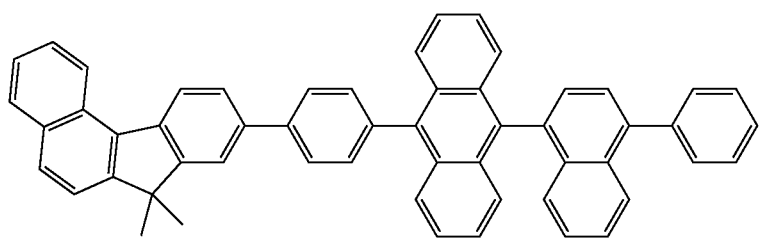
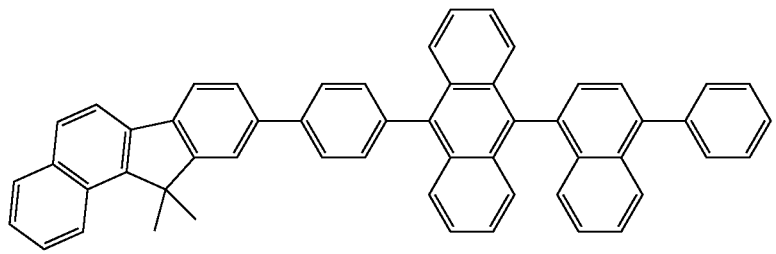
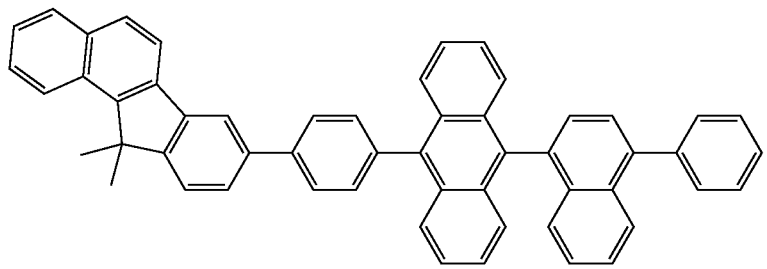

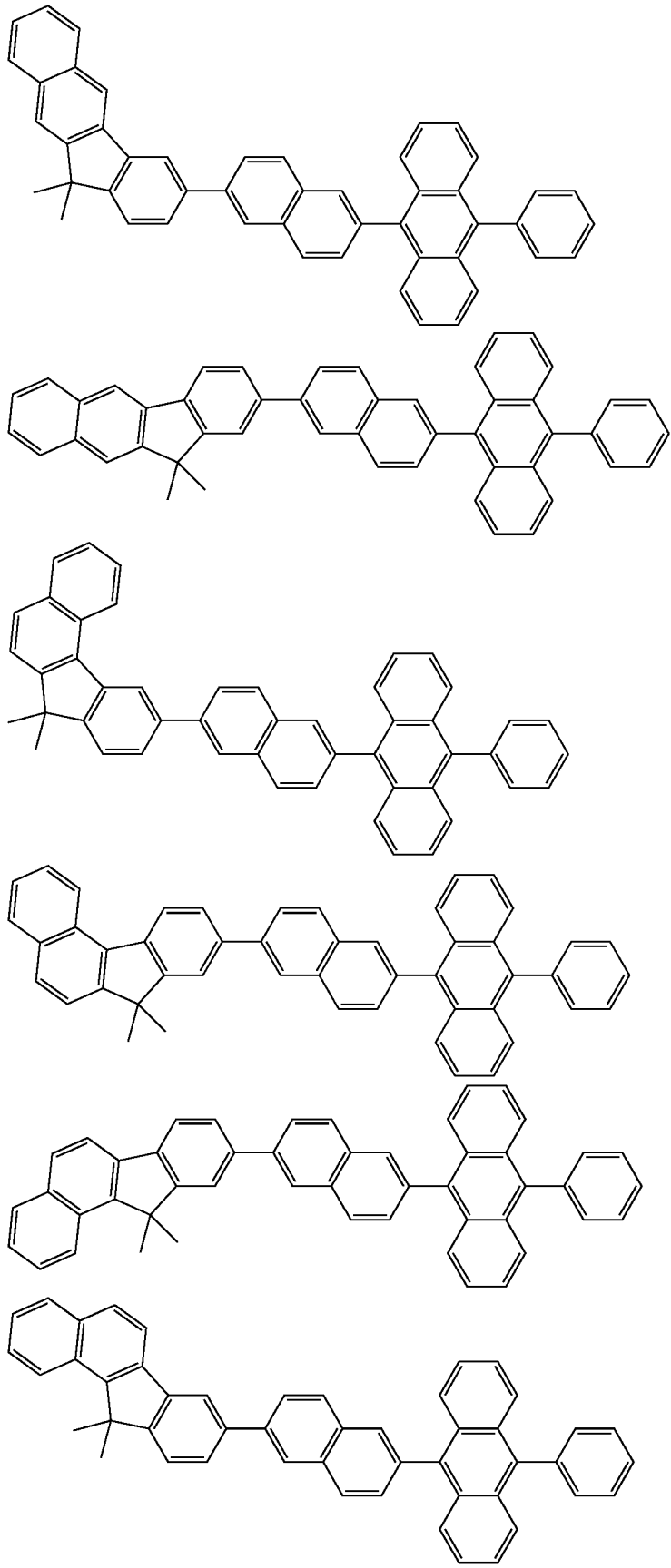

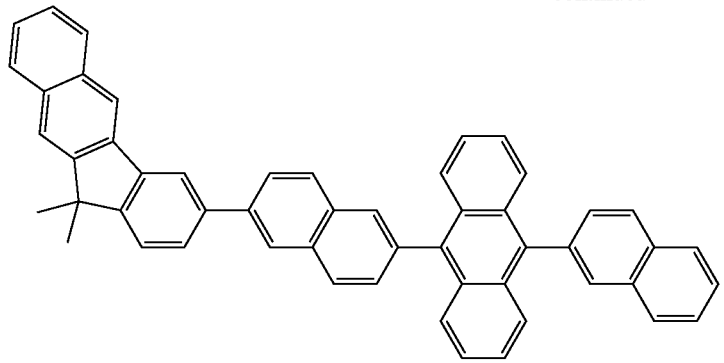
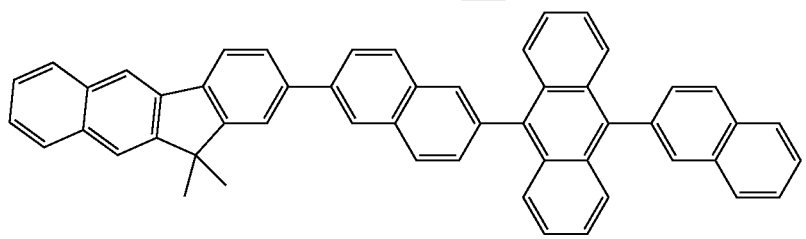
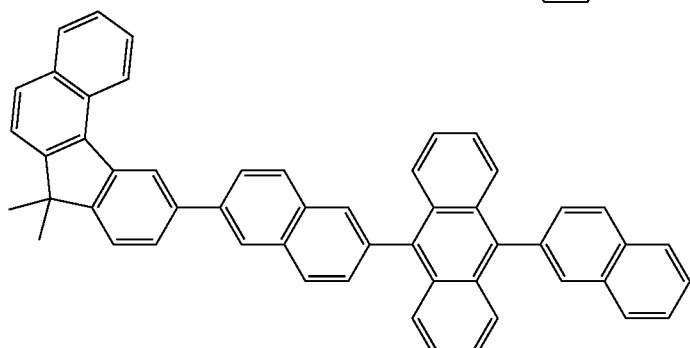
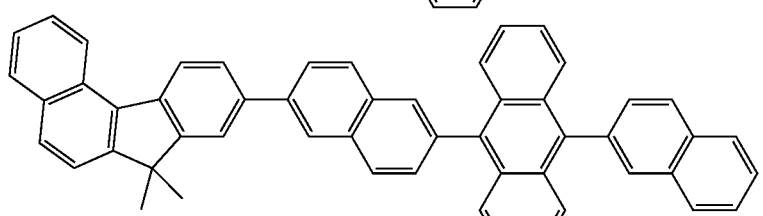
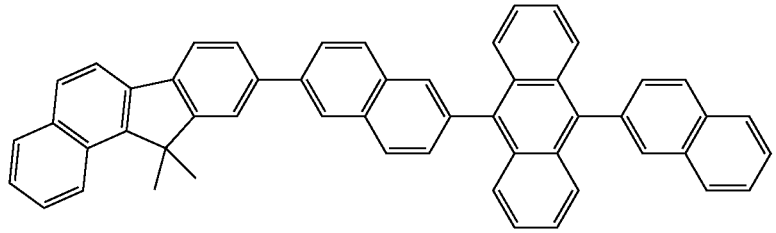
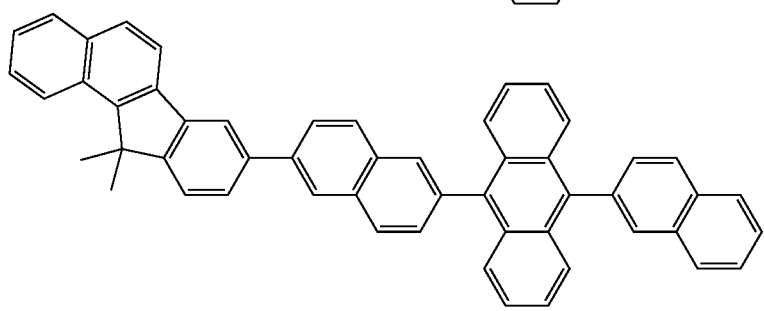

-continued
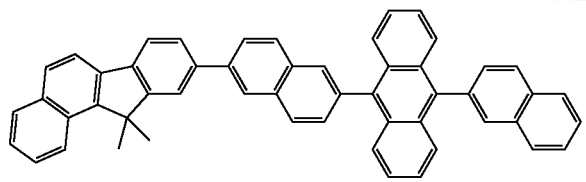
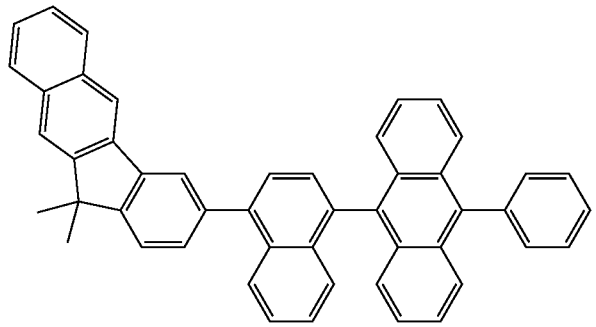
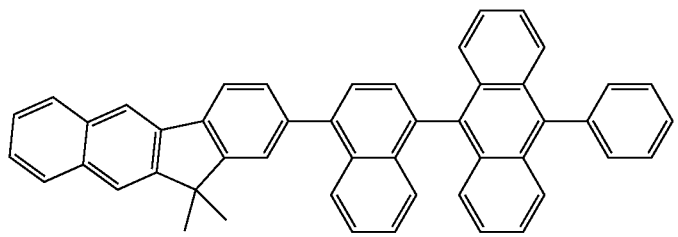
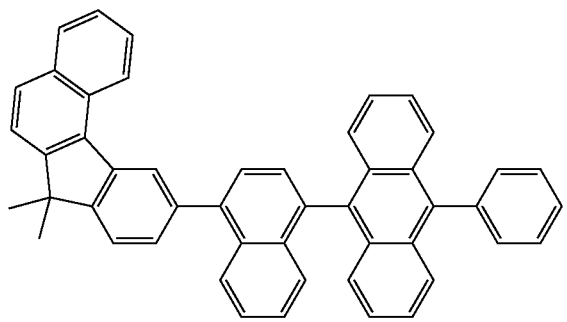
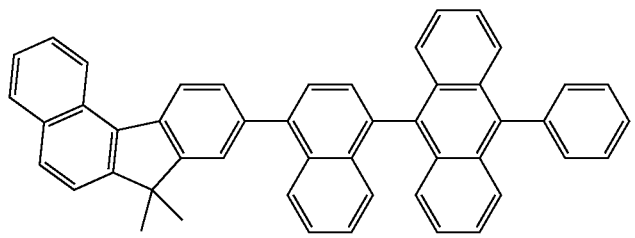
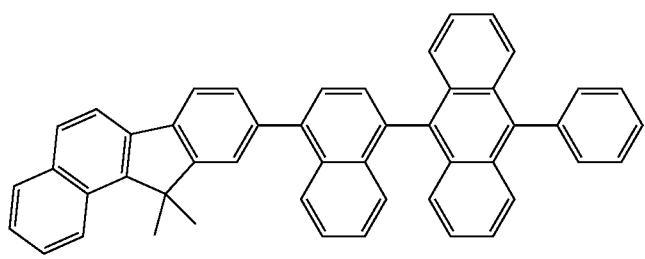

-continued
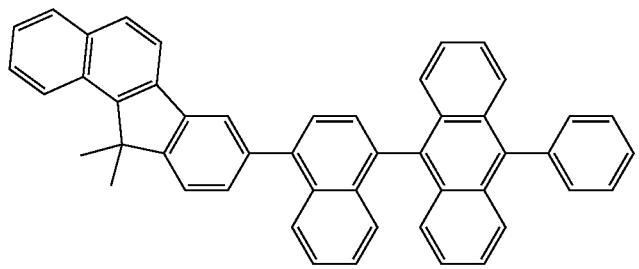
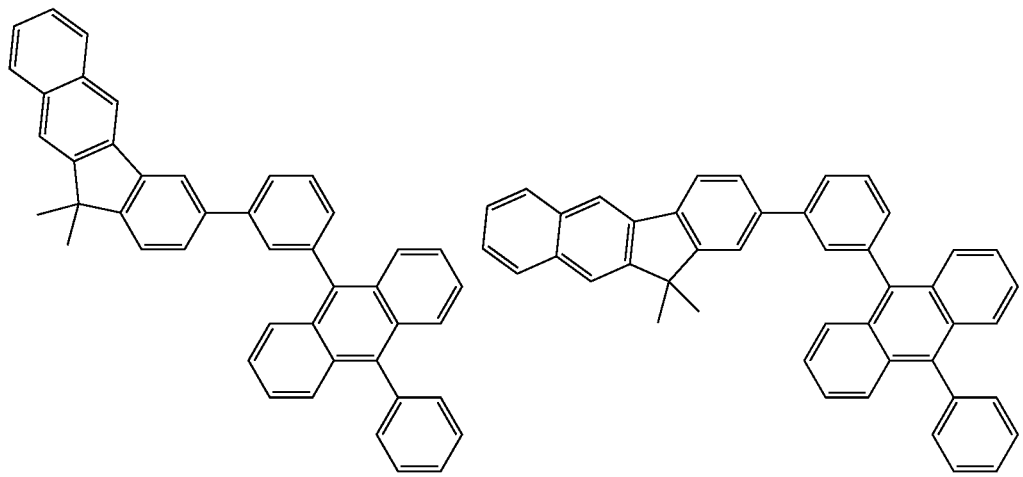
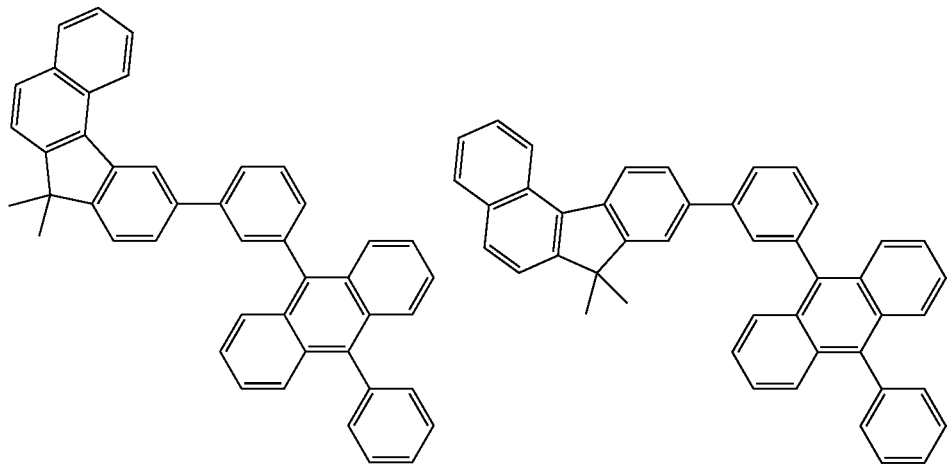
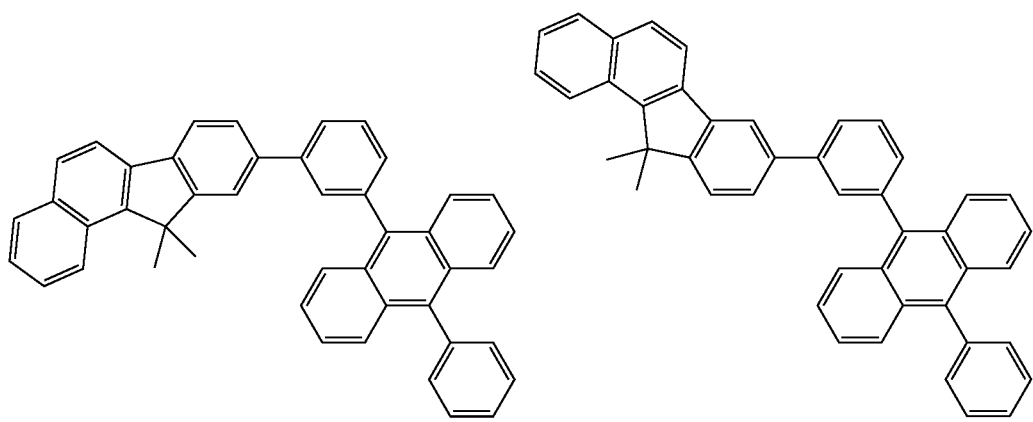

-continued
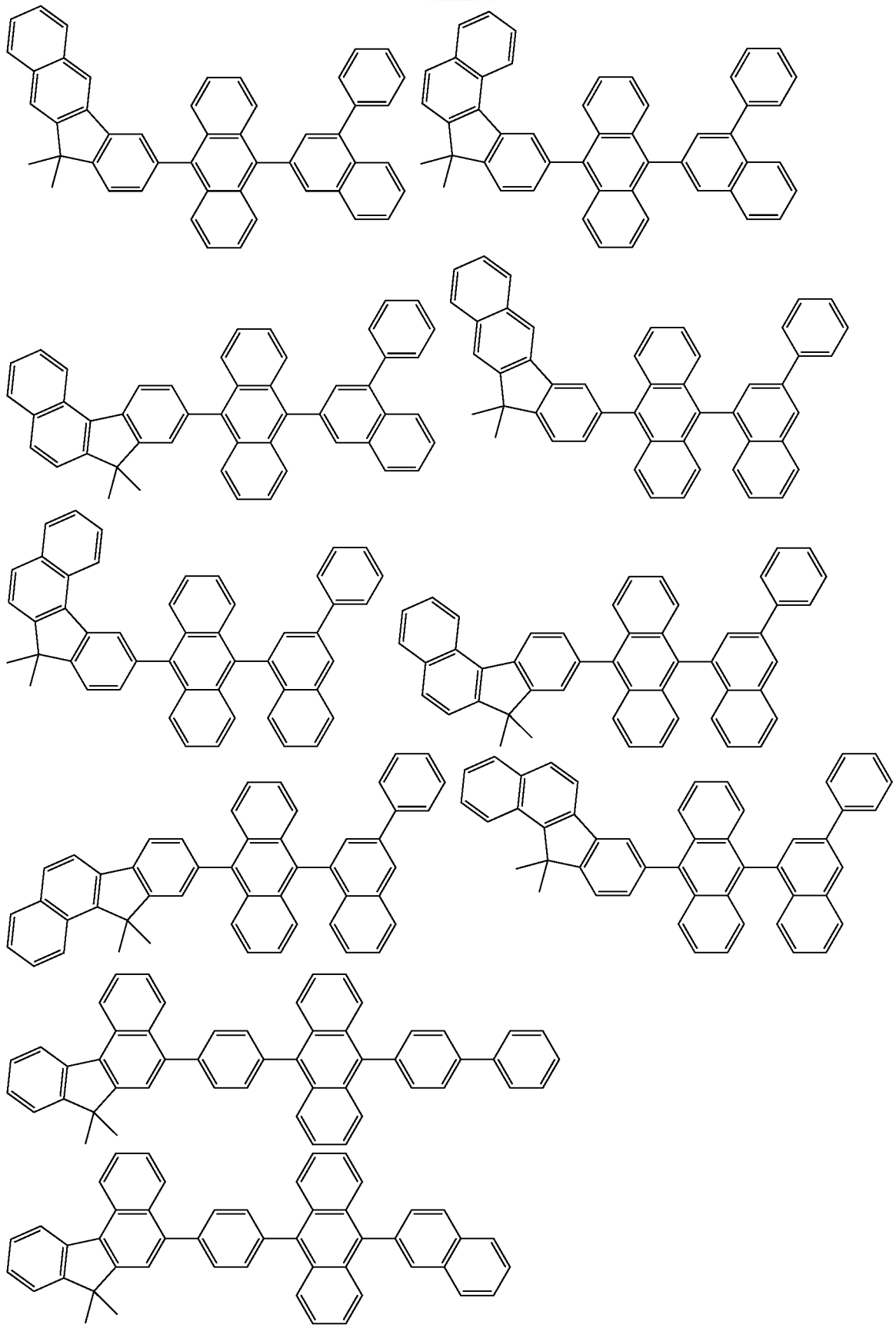

-continued
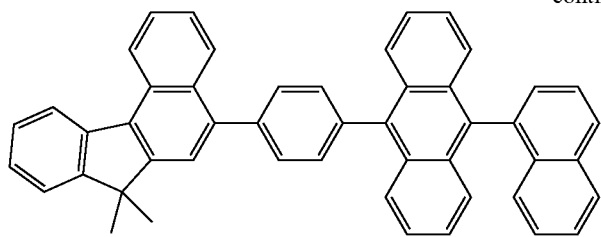
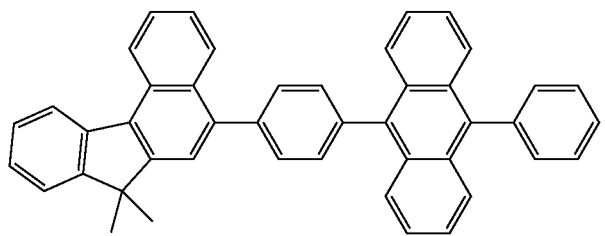
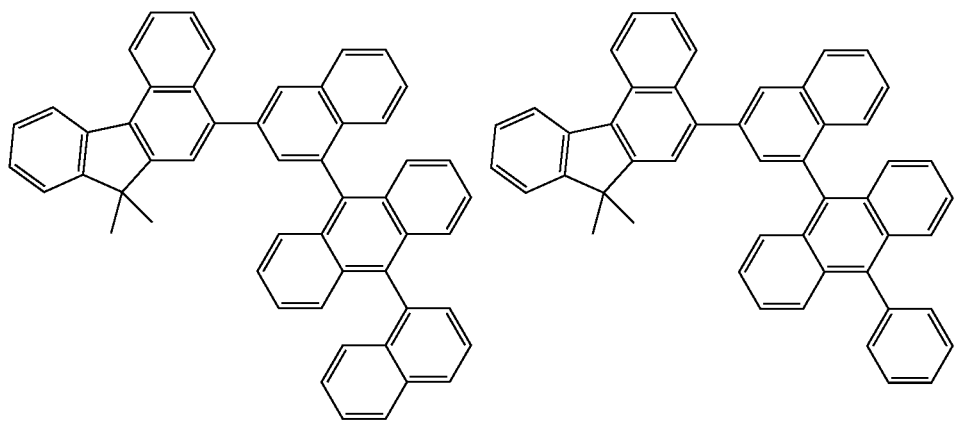
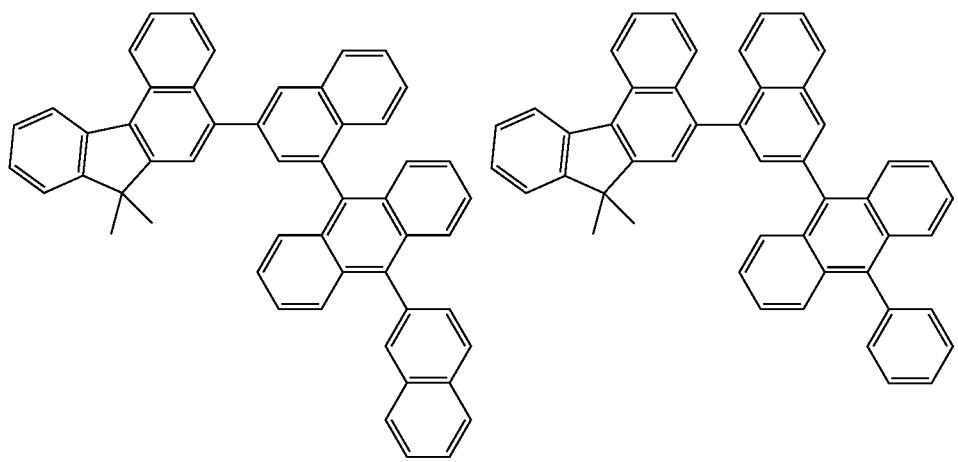

195 196
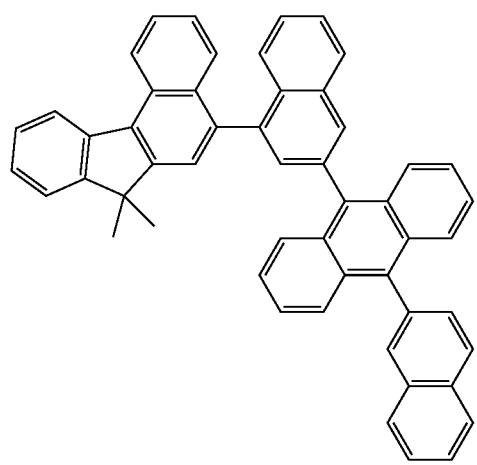
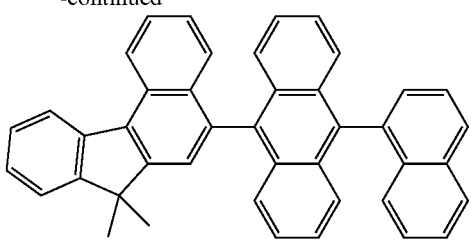
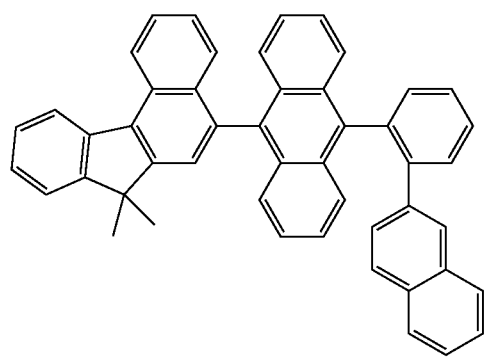
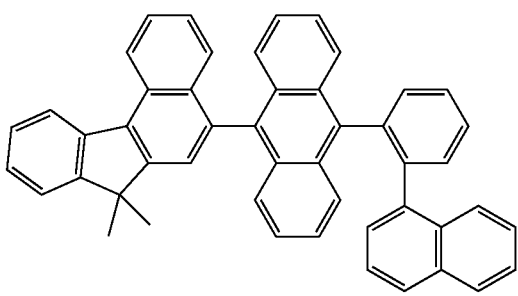
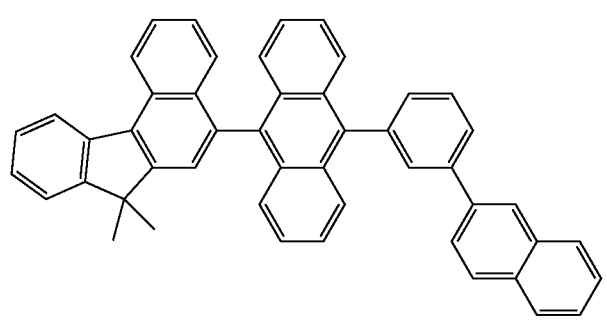
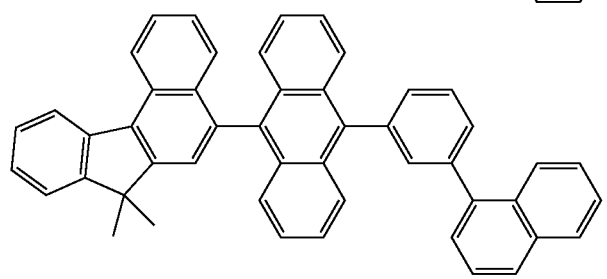
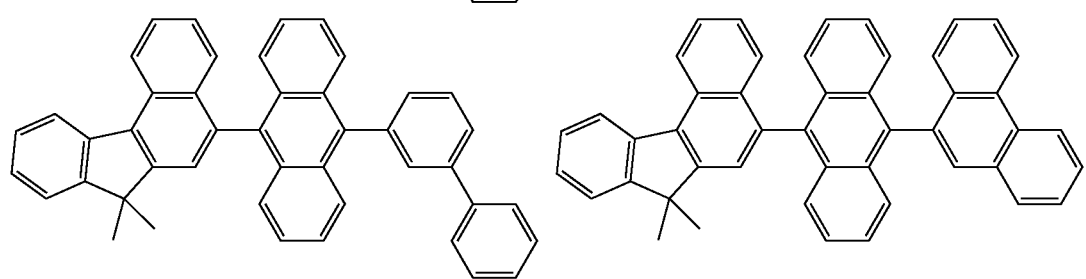

197
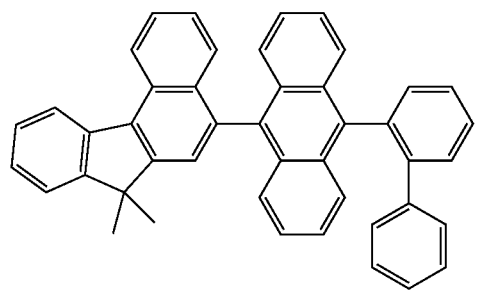
198
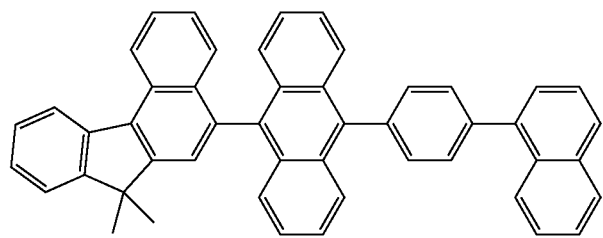
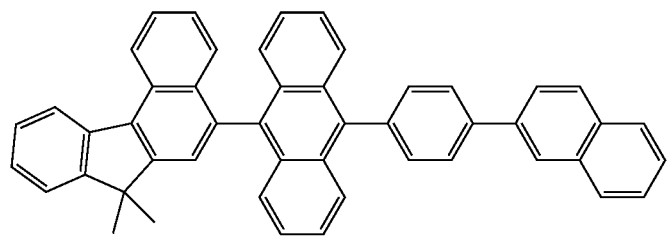
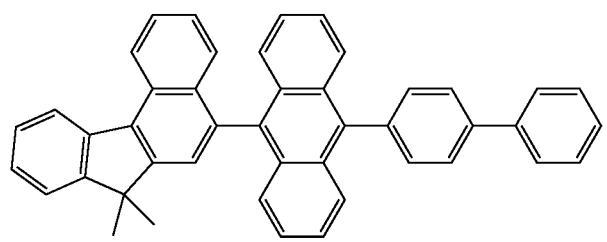
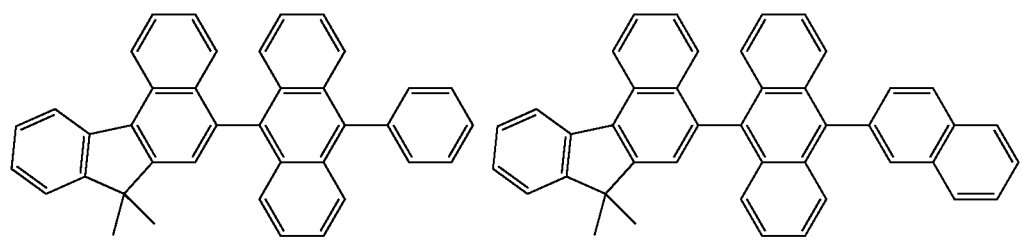
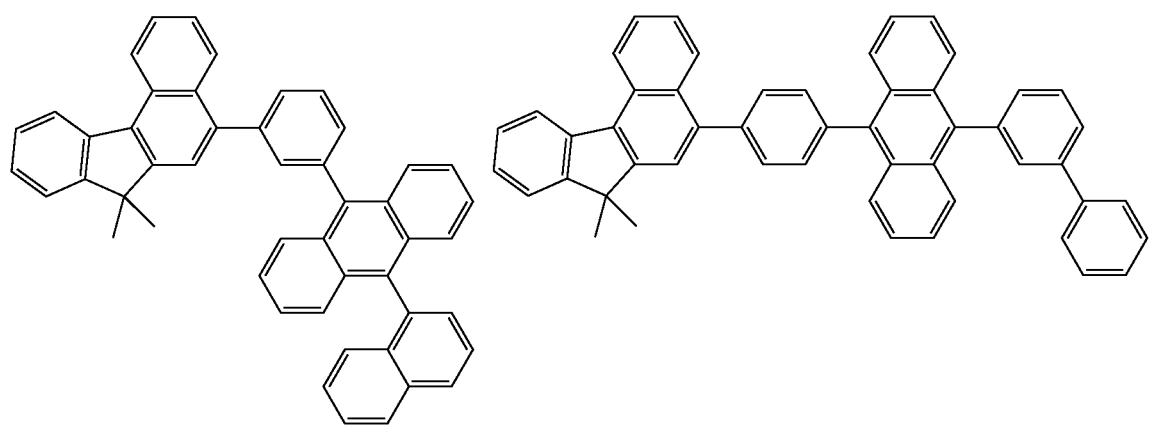

199 200
-continued
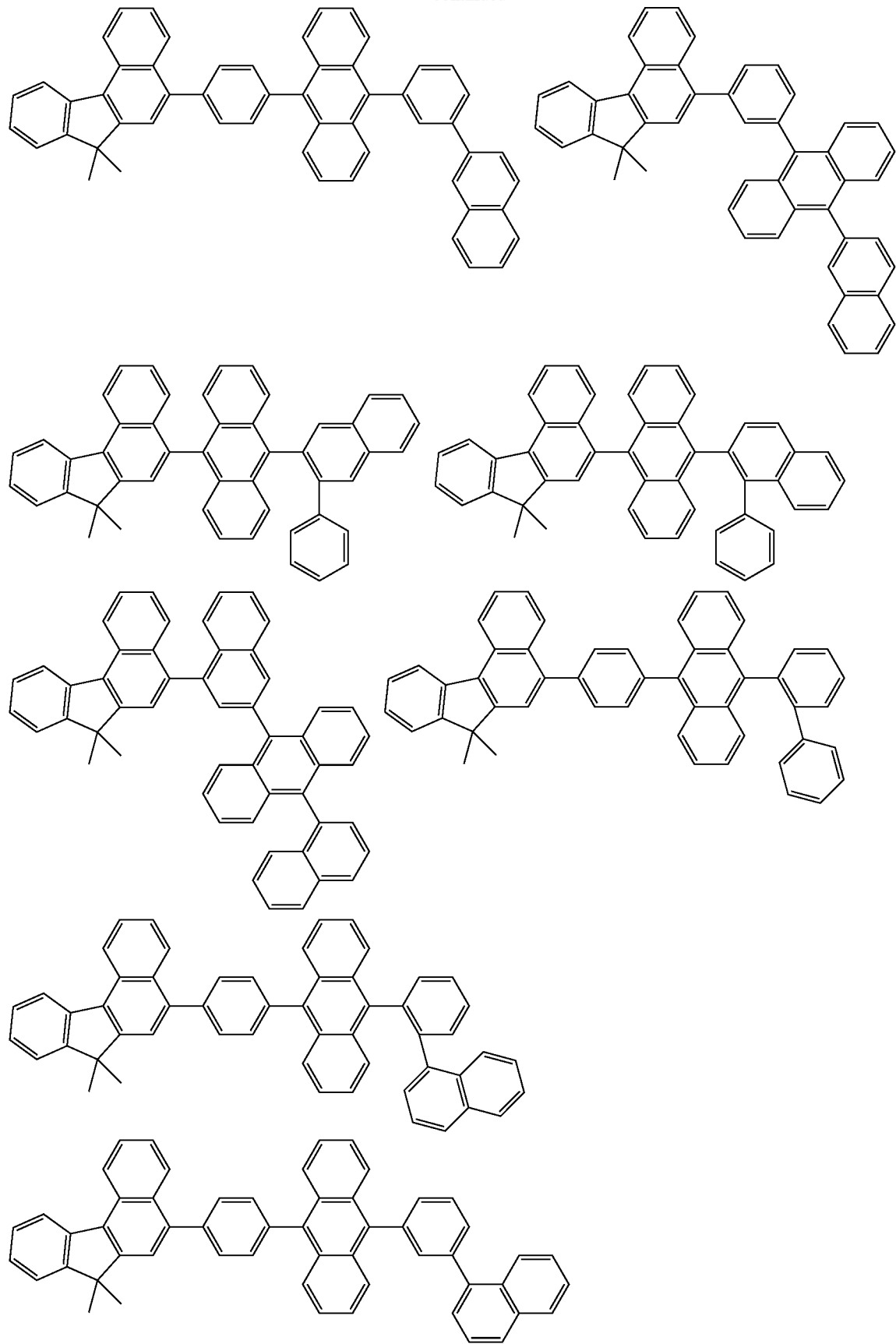

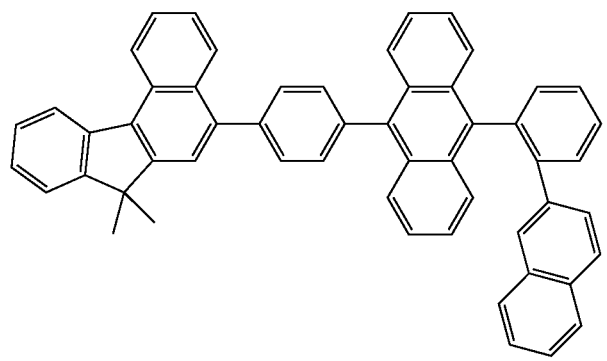
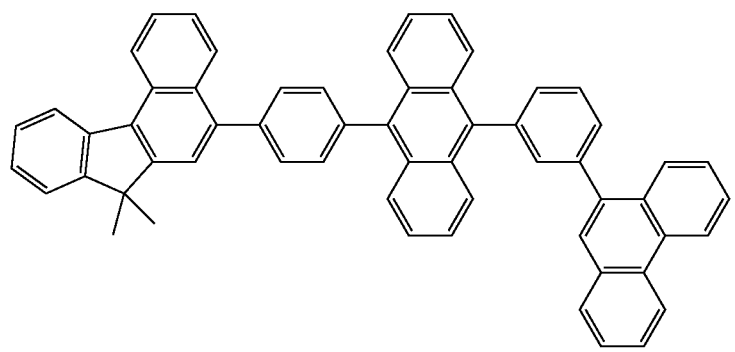
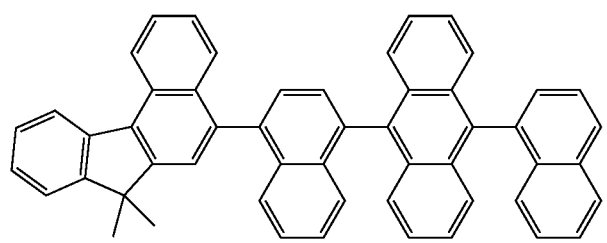
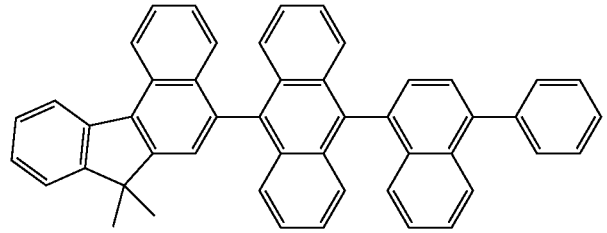
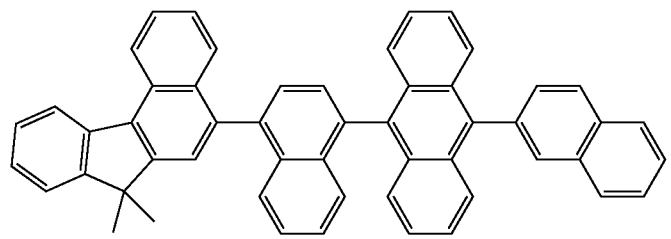
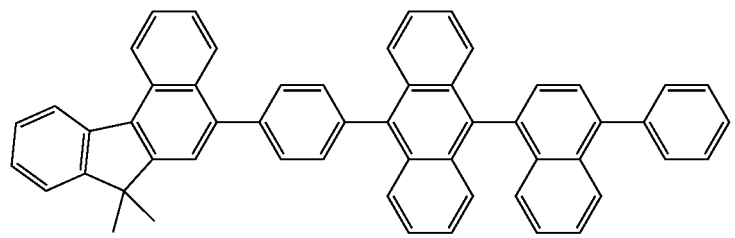

-continued
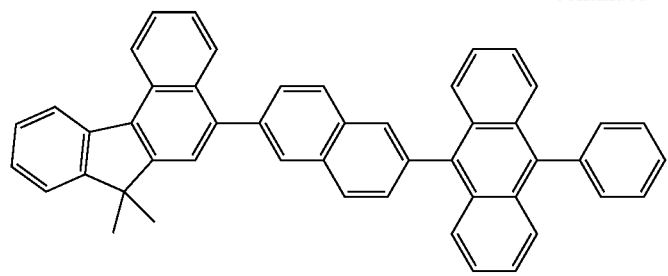
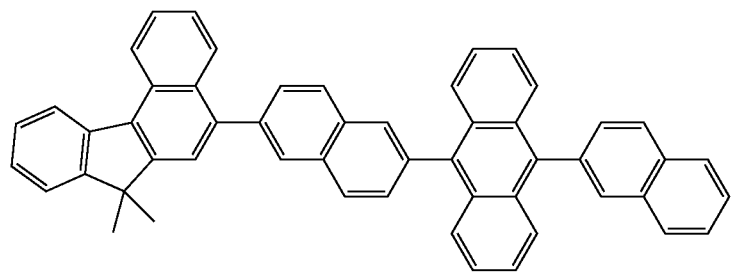
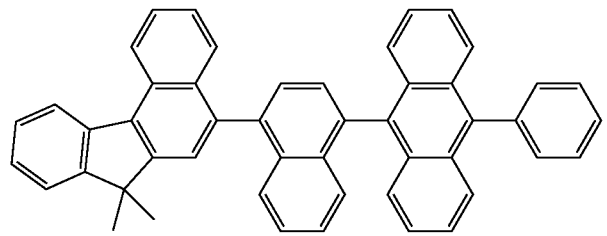
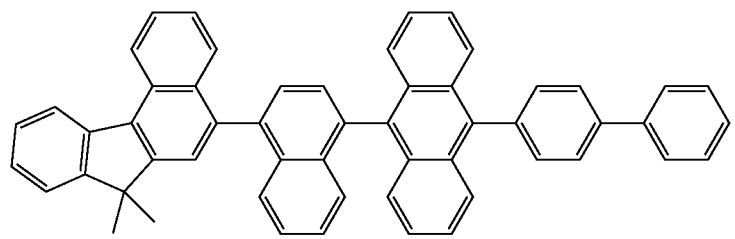
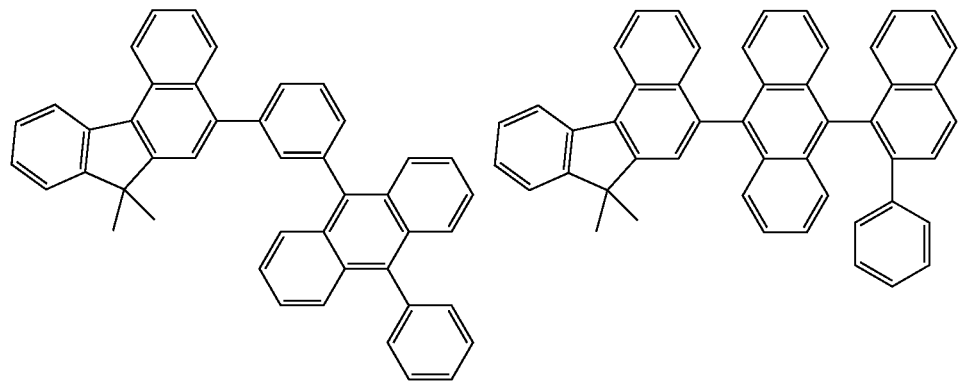
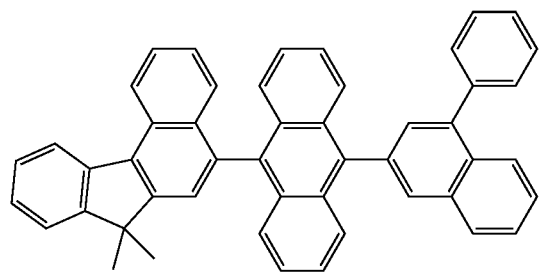

-continued
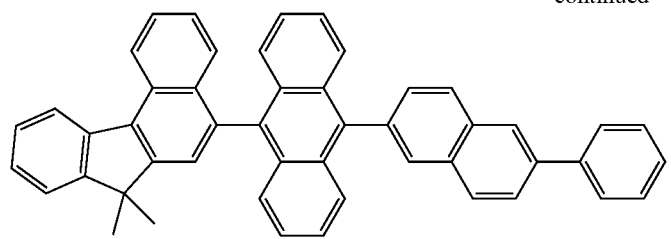
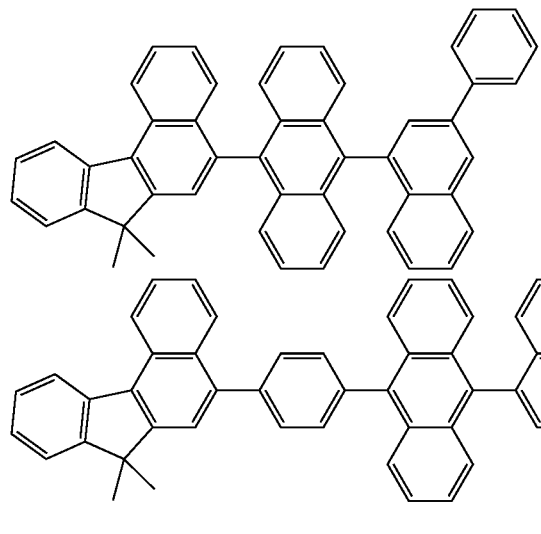
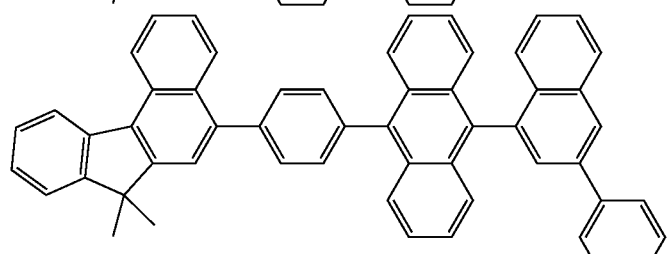
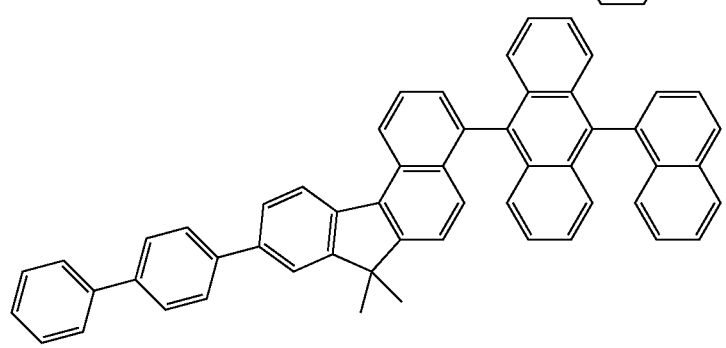
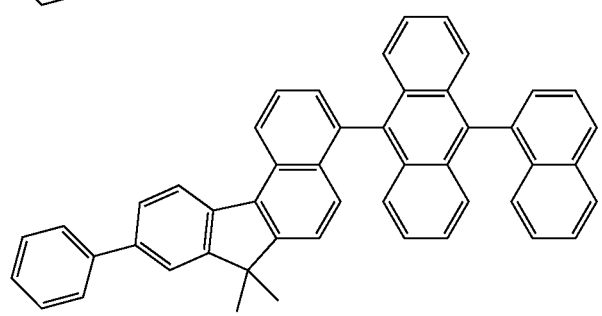
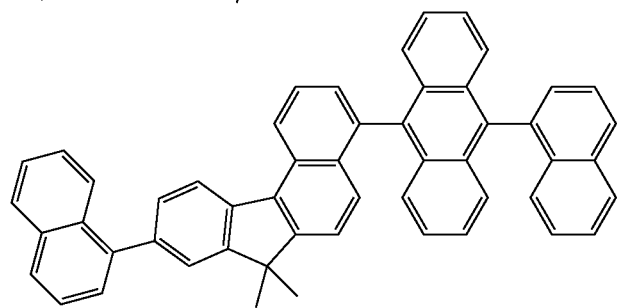

-continued
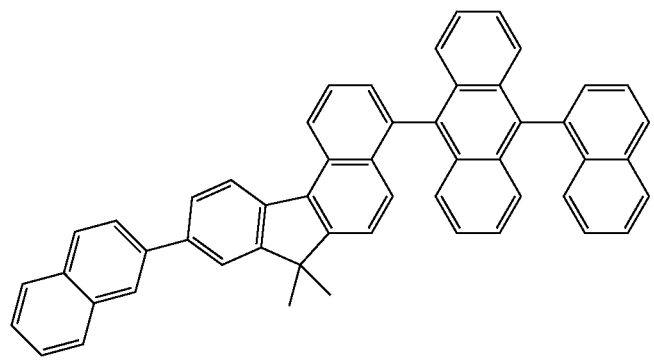
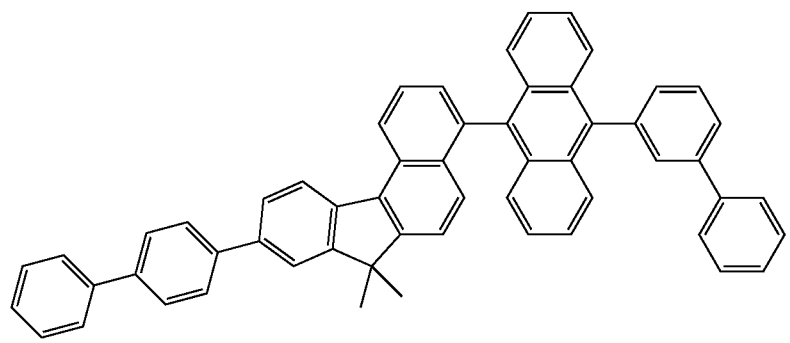
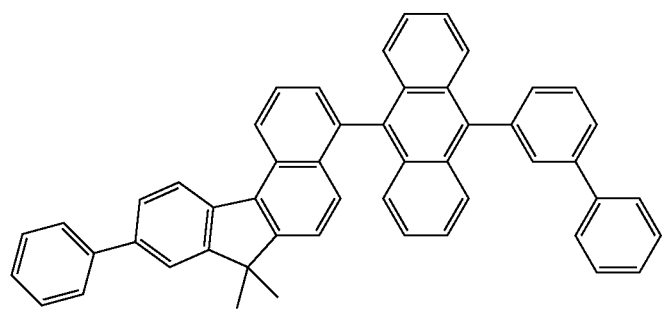
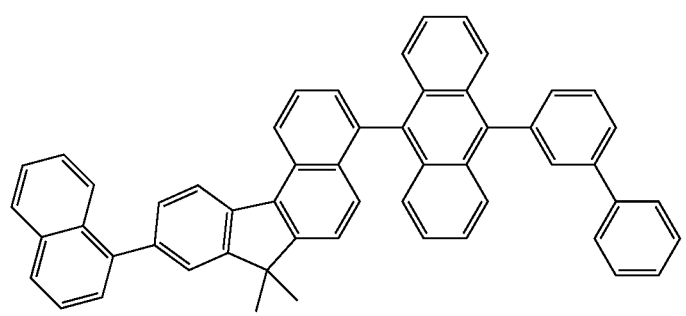
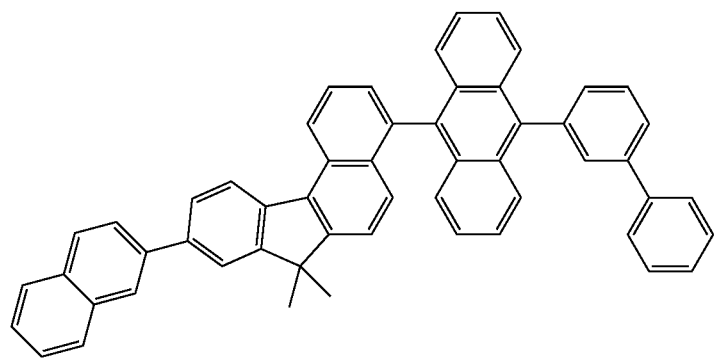

-continued
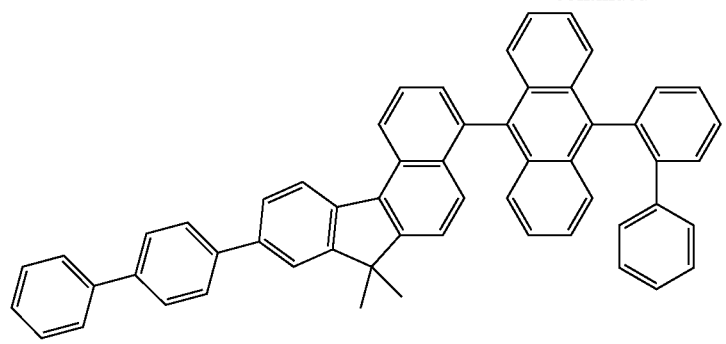
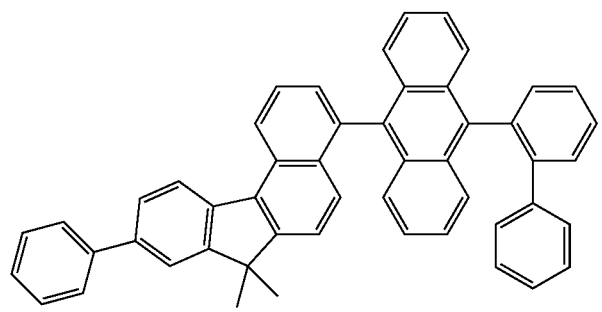
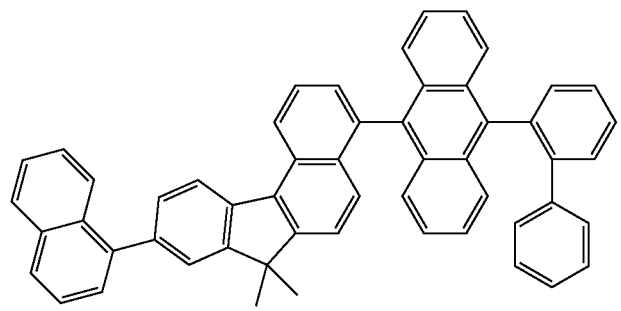
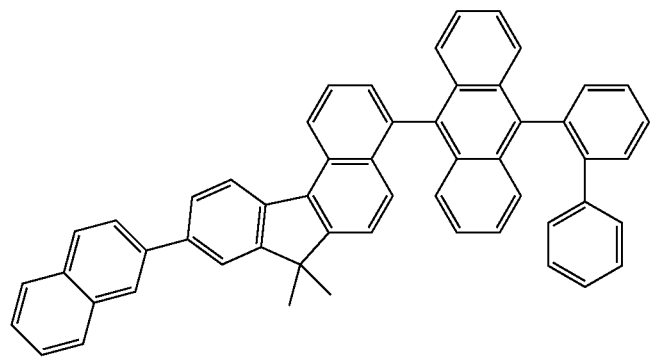
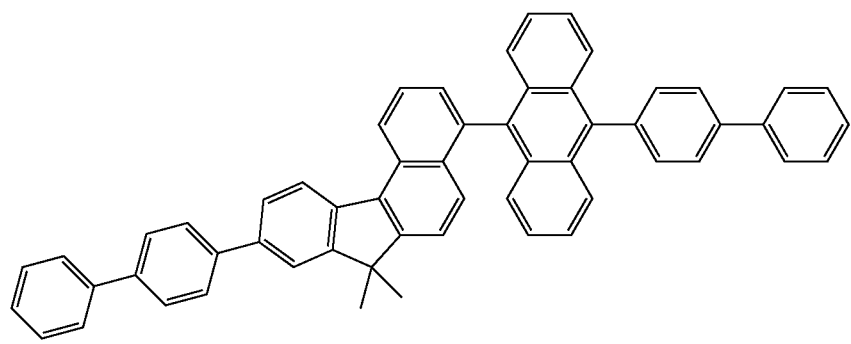

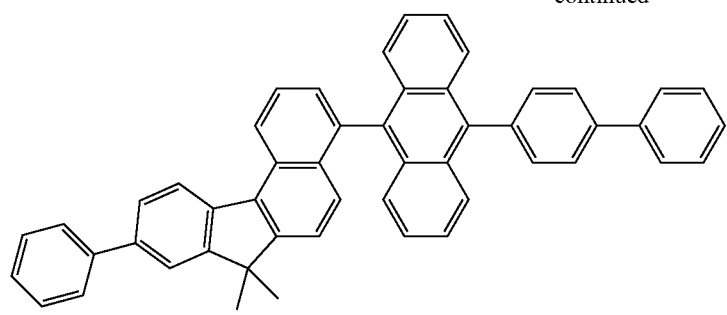
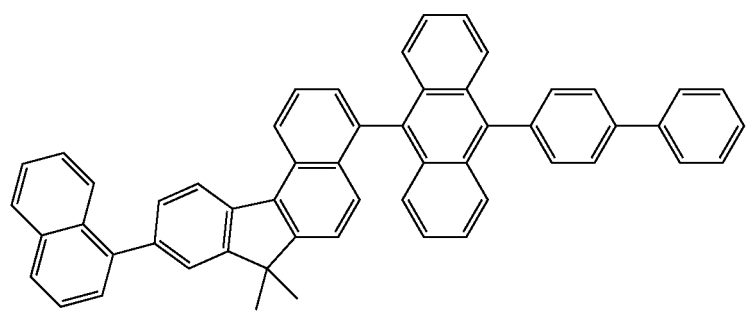
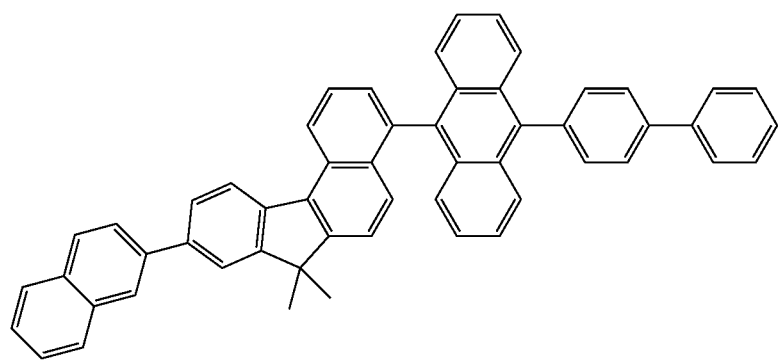
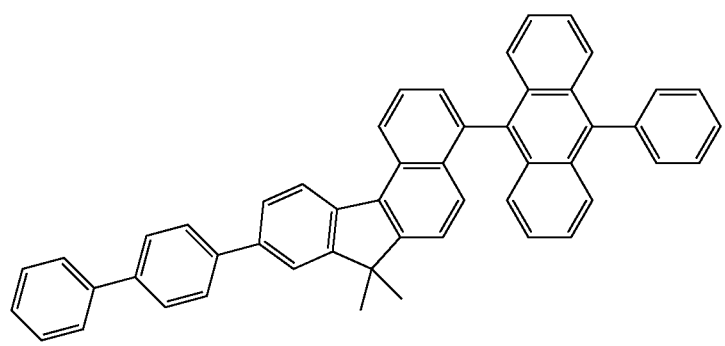
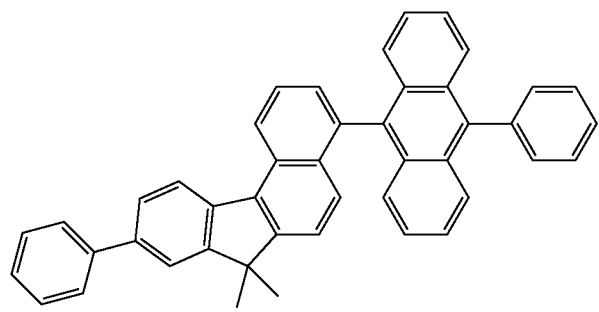

-continued
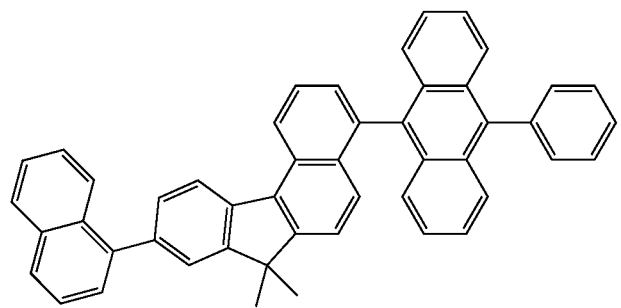
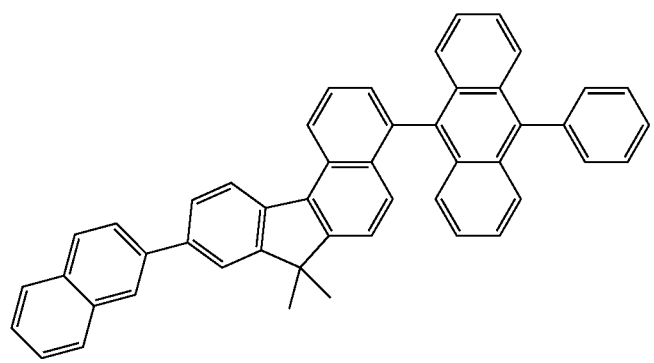
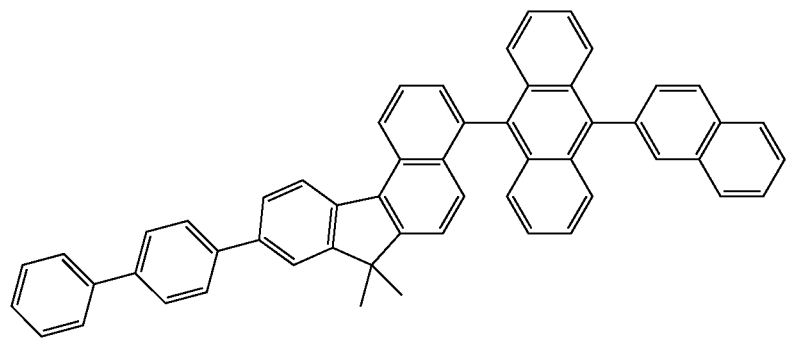
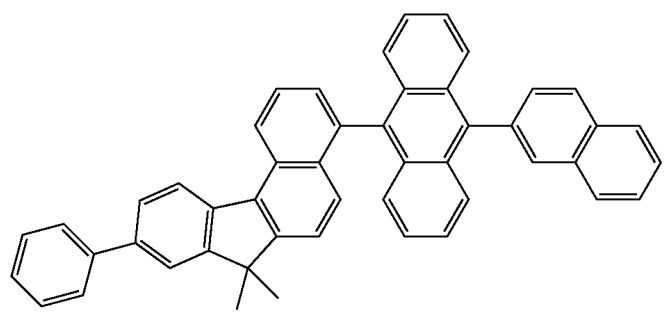
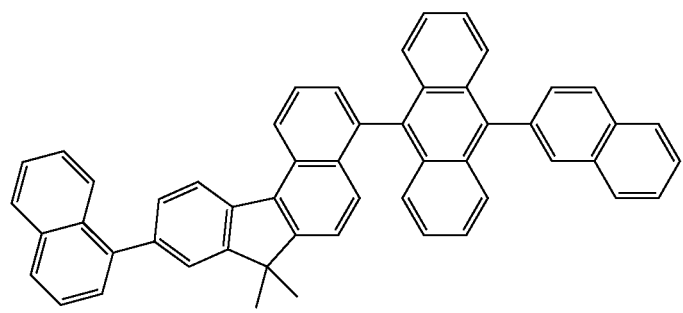

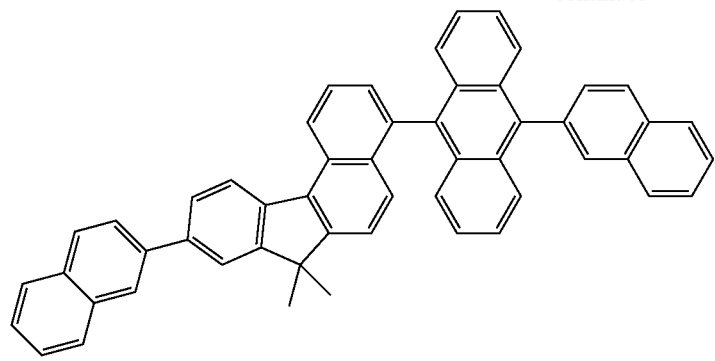
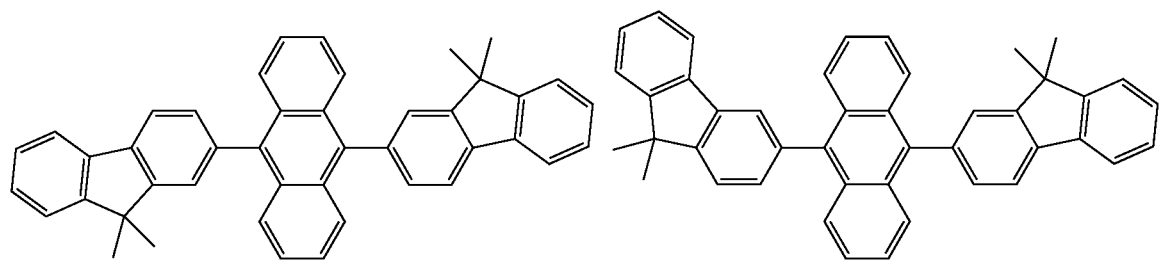
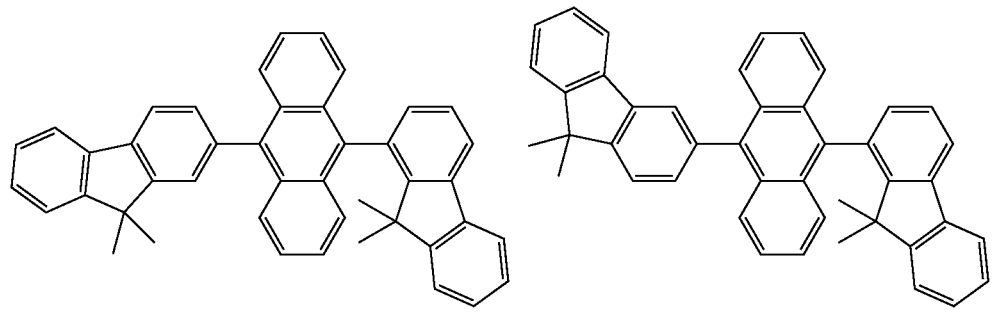
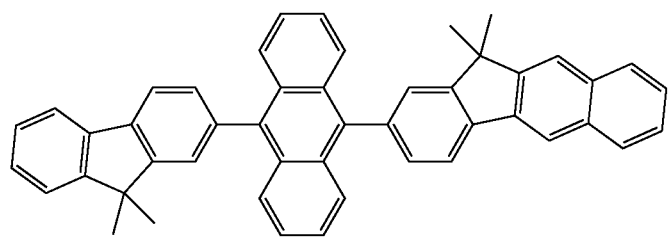
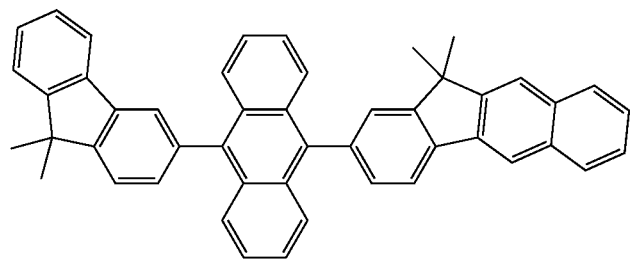

-continued
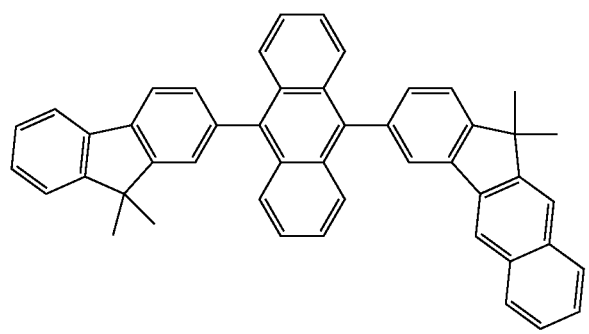
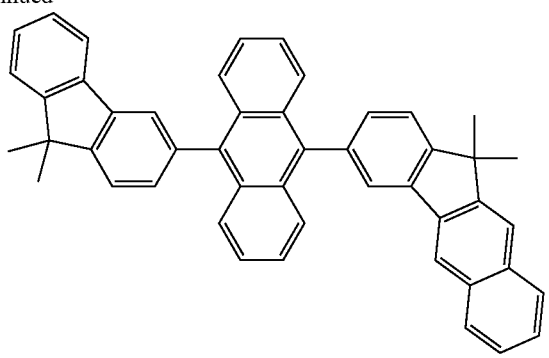
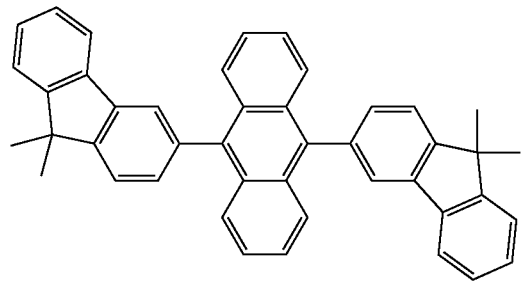
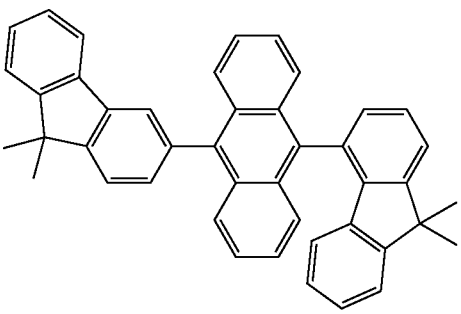
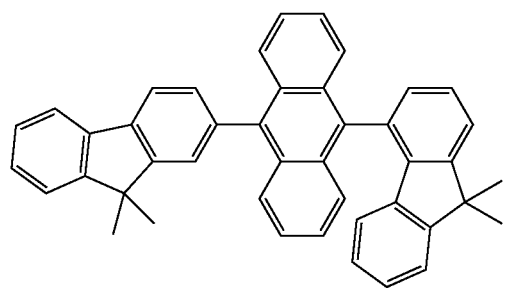
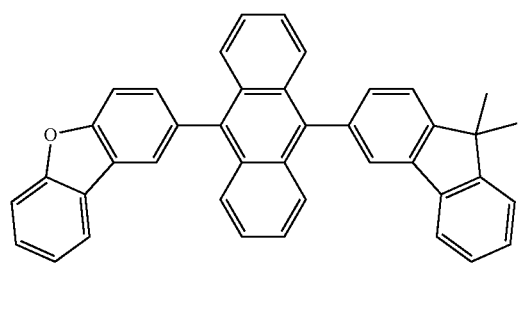
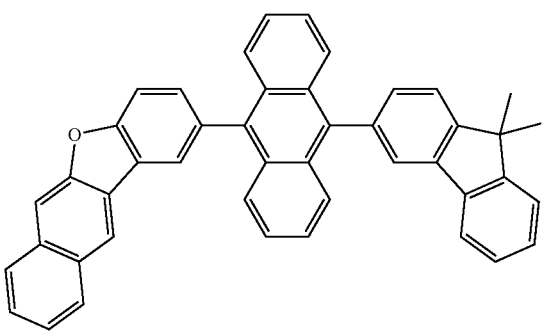
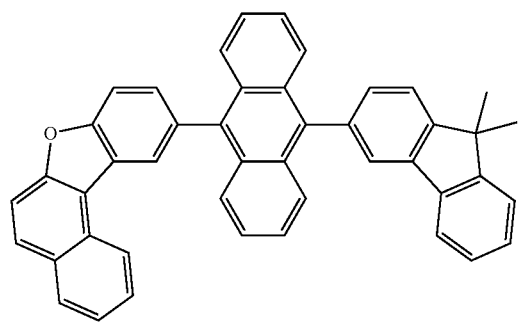
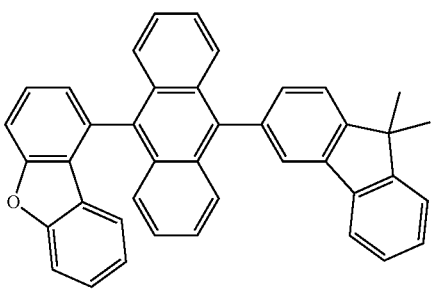

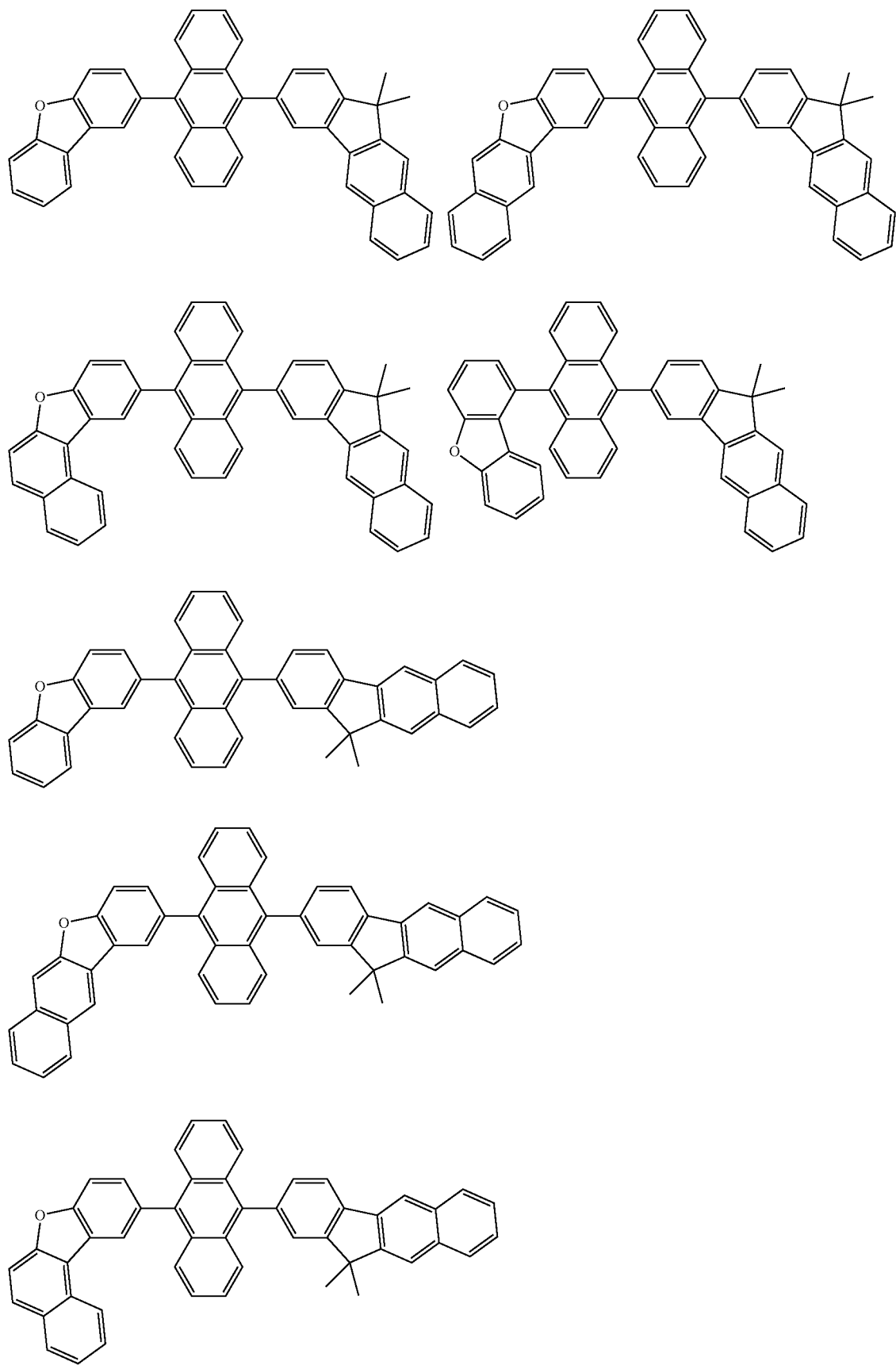

221   222

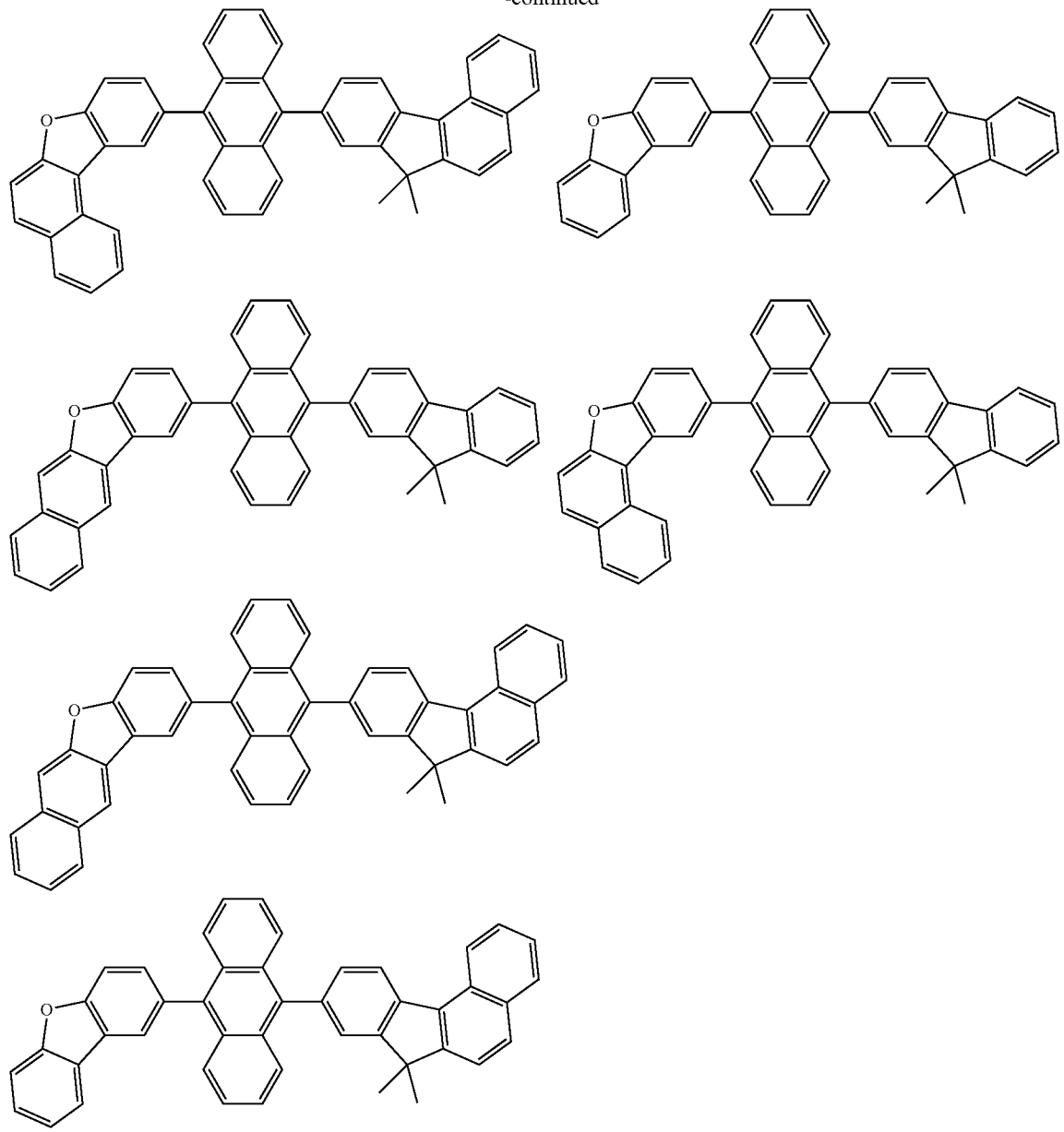

-continued

Specific examples of the above groups are as described in the [Definition] part of this specification As described above, known materials and device configurations may be applied to the organic EL device according to an aspect of the invention, as long as the device includes a cathode, an anode, and an emitting layer between the cathode and the anode, wherein the emitting layer contains a compound represented by the formula (1) and a compound represented by the formula (11), and the effect of the invention is not impaired.

The content of the compound represented by the formula (1) in the emitting layer is preferably 1 mass % or more and 20 mass % or less based on the total mass of the emitting layer. The content of the compound represented by the formula (11) in the emitting layer is preferably 80 mass % or more and 99 mass % or less based on the total mass of the emitting layer.

An aspect of the organic EL device of the invention preferably includes a hole-transporting layer between the anode and the emitting layer.

An aspect of the organic EL device of the invention preferably includes an electron-transporting layer between the cathode and the emitting layer.

Specific examples of typified device configurations of the organic EL device of the invention include structures such as
(1) an anode/an emitting layer/a cathode,
(2) an anode/a hole-injecting layer/an emitting layer/a cathode,
(3) an anode/an emitting layer/an electron-injecting-transporting layer/a cathode,
(4) an anode/a hole-injecting layer/an emitting layer/an electron-injecting-transporting layer/a cathode,
(5) an anode/an organic semiconductor layer/an emitting layer/a cathode, (6) an anode/an organic semiconductor layer/an electron barrier layer/an emitting layer/a cathode,
(7) an anode/an organic semiconductor layer/an emitting layer/an adhesion improving layer/a cathode,
(8) an anode/a hole-injecting-transporting layer/an emitting layer/an electron-injecting-transporting layer/a cathode,
(9) an anode/an insulating layer/an emitting layer/an insulating layer/a cathode,
(10) an anode/an inorganic semiconductor layer/an insulating layer/an emitting layer/an insulating layer/a cathode,
(11) an anode/an organic semiconductor layer/an insulating layer/an emitting layer/an insulating layer/a cathode,
(12) an anode/an insulating layer/a hole-injecting-transporting layer/an emitting layer/an insulating layer/a cathode, and
(13) an anode/an insulating layer/a hole-injecting-transporting layer/an emitting layer/an electron-injecting-transporting layer/a cathode.

Among the above-described structures, the configuration of (8) is preferably used, but the device configuration of the organic EL device is not limited thereto.

The "hole-injecting-transporting layer" in this specification means "at least one of the hole-injecting layer and the hole-transporting layer", and the "electron-injecting-transporting layer" in this specification means "at least one of the electron-injecting layer and the electron-transporting layer".

Parts which can be used in the organic EL device according to an aspect of the invention, materials for forming respective layers, other than the above compounds, and the like, will be described below.

(Substrate)

A substrate is used as a support of an emitting device. As the substrate, glass, quartz, plastics, or the like can be used, for example. Further, a flexible substrate may be used. The flexible substrate means a bendable (flexible) substrate, and specific examples thereof include a plastic substrate formed of polycarbonate or polyvinyl chloride.

(Anode)

For the anode formed on the substrate, metals, alloys, electrically conductive compounds, mixtures thereof, and the like, each having a large work function (specifically 4.0 eV or more), is preferably used. Specific examples include indium oxide-tin oxide (ITO: Indium Tin Oxide), indium oxide-tin oxide containing silicon or silicon oxide, indium oxide-zinc oxide, tungsten oxide, indium oxide containing zinc oxide, graphene, and the like. In addition thereto, specific examples thereof include gold (Au), platinum (Pt), a nitride of a metal material (for example, titanium nitride), and the like.

(Hole-Injecting Layer)

The hole-injecting layer is a layer containing a material having a high hole-injection property. As the material having a high hole-injection property, molybdenum oxide, titanium oxide, vanadium oxide, rhenium oxide, ruthenium oxide, chromium oxide, zirconium oxide, hafnium oxide, tantalum oxide, silver oxide, tungsten oxide, manganese oxide, an aromatic amine compound, or a polymer compound (an oligomer, a dendrimer, a polymer, or the like) can also be used.

(Hole-Transporting Layer)

The hole-transporting layer is a layer containing a material having a high hole-transporting property. For the hole-transporting layer, an aromatic amine compound, a carbazole derivative, an anthracene derivative, or the like can be used. A polymer compound such as poly(N-vinylcarbazole) (abbreviation: PVK) and poly(4-vinyltriphenylamine) (abbreviation: PVTPA) can also be used. However, a material other than the above-described materials may be used as long as the material has a higher transporting property of holes in comparison with that of electrons. It should be noted that the layer containing the material having a high hole-transporting property may be formed into not only a monolayer, but also a layer in which two or more layers each formed of the above-described material are stacked.

(Guest Material for Emitting Layer)

The emitting layer is a layer containing a material having a high emitting property, and formed of various materials can be used. For example, as the substance having a high emitting property, a fluorescent compound which emits fluorescence or a phosphorescent compound which emits phosphorescence can be used. The fluorescent compound is a compound which can emit light from a singlet excited state, and the phosphorescent compound is a compound which can emit light from a triplet excited state.

As blue fluorescent emitting materials which can be used for an emitting layer, pyrene derivatives, styrylamine derivatives, chrysene derivatives, fluoranthene derivatives, fluorene derivatives, diamine derivatives, triarylamine derivatives, and the like can be used. As green fluorescent emitting materials which can be used for an emitting layer, aromatic amine derivatives and the like can be used. As red fluorescent emitting materials which can be used for an emitting layer, tetracene derivatives, diamine derivatives and the like can be used.

As blue phosphorescent emitting materials which can be used for an emitting layer, metal complexes such as iridium complexes, osmium complexes, and platinum complexes are used. As a green phosphorescent emitting material which can be used for an emitting layer, iridium complexes, and the like are used. As red phosphorescent emitting materials which can be used for an emitting layer, metal complexes such as iridium complexes, platinum complexes, terbium complexes, and europium complexes.

(Host Material for Emitting Layer)

The emitting layer may have a constitution in which the above-mentioned material having a high emitting property (guest material) is dispersed in another substance (host material). As substances for dispersing the substance having a high emitting property, a variety of substances can be used, and it is preferable to use a material having a lowest unoccupied orbital level (LUMO level) higher than the material having a high emitting property and a highest occupied orbital level (HOMO level) lower than the material having a high emitting property.

As substance for dispersing the substance having a high emitting property (host material),
1) metal complexes such as aluminum complexes, beryllium complexes, and zinc complexes;
2) heterocyclic compounds such as oxadiazole derivatives, benzimidazole derivatives, and phenanthroline derivatives;
3) fused aromatic compounds such as carbazole derivatives, anthracene derivatives, phenanthrene derivatives, pyrene derivatives, and chrysene derivatives; and
4) aromatic amine compounds such as triarylamine derivatives, and polycyclic aromatic amine derivatives are used.

(Electron-Transporting Layer)

An electron-transporting layer is a layer which contains a material having a high electron-transporting property. For the electron-transporting layer, 1) metal complexes such as aluminum complexes, beryllium complexes, and zinc complexes;
2) heteroaromatic compounds such as imidazole derivatives, benzimidazole derivatives, azine derivatives, carbazole derivatives, and phenanthroline derivatives; and
3) polymer compounds can be used.

(Electron-Injecting Layer)

An electron-injecting layer is a layer which contains a material having a high electron-injecting property. For the electron-injecting layer, metal complex compounds such as lithium (Li), ytterbium (Yb), lithium fluoride (LiF), cesium fluoride (CsF), calcium fluoride ($CaF_2$), and 8-hydroxyquinolinolato-lithium (Liq); alkali metals such as lithium oxide ($LiO_x$); alkaline earth metals; and compounds thereof can be used.

(Cathode)

For the cathode, metals, alloys, electrically conductive compounds, mixtures thereof, and the like, each having a small work function (specifically, 3.8 eV or less) are preferably used. Specific examples of such cathode materials include elements belonging to Group 1 and Group 2 of the Periodic Table of the Elements, i.e., alkali metals such as lithium (Li) and cesium (Cs); alkaline earth metals such as magnesium (Mg), calcium (Ca) and strontium (Sr); alloys containing these metals (e.g., MgAg and AlLi); rare earth metals such as europium (Eu) and ytterbium (Yb), and alloys containing these metals.

In the organic EL device according to an aspect of the invention, the methods for forming the respective layers are not particularly limited. A conventionally-known method for forming each layer by a vacuum deposition process, a spin coating process or the like can be used. Each layer such as the emitting layer can be formed by a known method such as a vacuum deposition process, a molecular beam deposition process (MBE process), or an application process such as a dipping process, a spin coating process, a casting process, a bar coating process, or a roll coating process, using a solution prepared by dissolving the material in a solvent.

In the organic EL device according to an aspect of the invention, the thickness of each layer is not particularly limited, but is generally preferable that the thickness be in the range of several nm to 1 µm in order to suppress generation of defects such as pinholes, to suppress applied voltages to be low, and to increase luminous efficiency.

[Electronic Appliance]

The electronic appliance according to an aspect of the invention is provided with the organic EL device according to an aspect of the invention.

Specific examples of the electronic appliance include display components such as an organic EL panel module; display devices such as a television set, a cellular phone, and a personal computer, and emitting devices such as a light, and a vehicular lamp.

EXAMPLES

Next, the invention will be described in more detail by referring to Examples and Comparative Examples, but the invention is not limited in any way to the description of these Examples.

The compounds used in the following Examples and Comparative Examples are as follows.

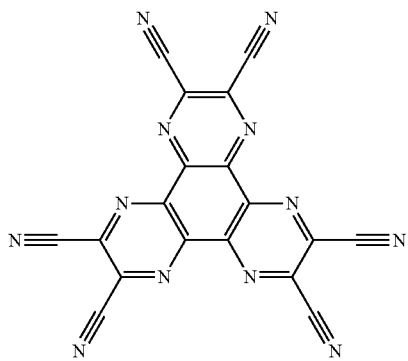

HI

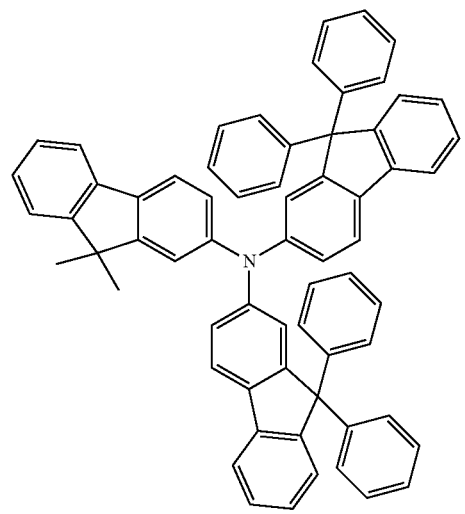

HT1

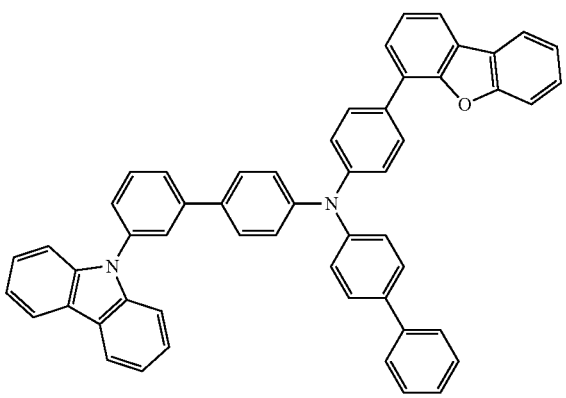

HT2

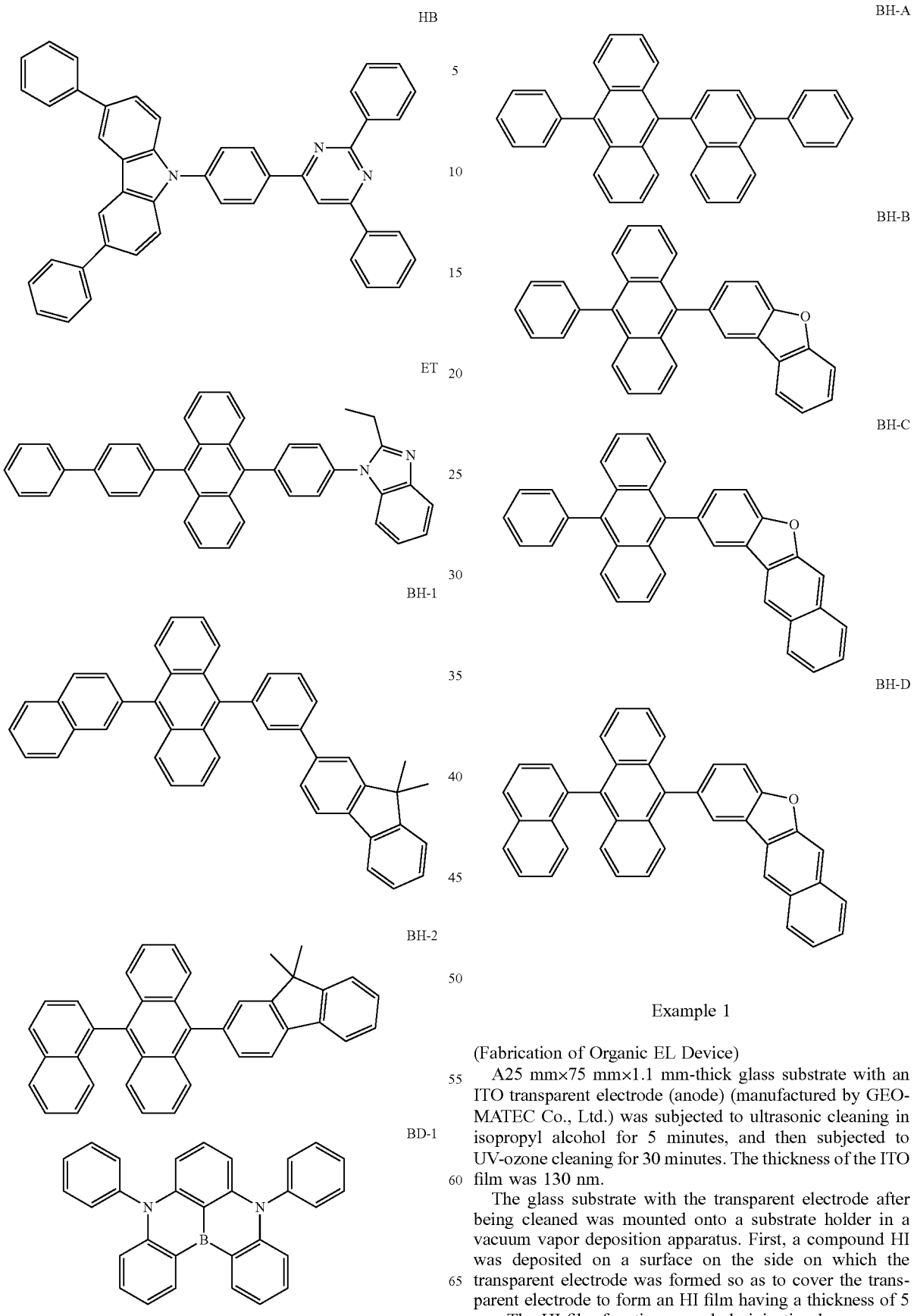

Example 1

(Fabrication of Organic EL Device)

A 25 mm×75 mm×1.1 mm-thick glass substrate with an ITO transparent electrode (anode) (manufactured by GEOMATEC Co., Ltd.) was subjected to ultrasonic cleaning in isopropyl alcohol for 5 minutes, and then subjected to UV-ozone cleaning for 30 minutes. The thickness of the ITO film was 130 nm.

The glass substrate with the transparent electrode after being cleaned was mounted onto a substrate holder in a vacuum vapor deposition apparatus. First, a compound HI was deposited on a surface on the side on which the transparent electrode was formed so as to cover the transparent electrode to form an HI film having a thickness of 5 nm. The HI film functions as a hole-injecting layer.

Subsequent to the formation of the HI film, a compound HT1 was deposited thereon to form an HT1 film having a thickness of 80 nm on the HI film. The HT1 film functions as a hole-transporting layer (first hole-transporting layer).

Subsequent to the formation of the HT1 film, a compound HT2 was deposited thereon to form an HT2 film having a thickness of 10 nm on the HT1 film. The HT2 film functions as an electron-blocking layer (second hole-transporting layer).

A compound BH-1 (host material) and a compound BD-1 (dopant material) were co-deposited on the HT2 film to be 2 mass % in a proportion of the compound BD-1 to form a BH-1:BD-1 film having a thickness of 25 nm. The BH-1: BD-1 film functions as an emitting layer.

A compound HB was deposited on this emitting layer to form an HB film having a thickness of 10 nm. The HB film functions as a hole barrier layer.

A compound ET was deposited on the HB film to form an ET film having a thickness of 15 nm. The ET film functions as an electron-transporting layer. LiF was deposited on the ET film to form a LiF film having a thickness of 1 nm. Al metal was deposited on the LiF film to form a metal cathode having a thickness of 80 nm, thereby an organic EL device was fabricated.

The layer configuration of the obtained organic EL device is as follows.

ITO(130)/HI(5)/HT1(80)/HT2(10)BH-1:BD-1(25:2 mass %)/HB(10)/ET(15)/LiF(1)/Al(80)

The numerical values in parentheses indicate the film thickness (unit: nm).
(Evaluation of Organic EL Device)

Initial characteristics of the obtained organic EL device were measured under the conditions of DC (direct current)-constant current of 10 mA/cm$^2$ and at room temperature. The measurement results of the driving voltage are shown in Table 1.

Furthermore, in the state that a voltage was applied to the organic EL device to be 10 mA/cm$^2$ in current density, an EL emission spectrum was measured by using Spectroradiometer CS-1000 (manufactured by Konica Minolta, Inc.). External quantum efficiency (EQE) (%) was calculated from the obtained spectral emission luminance spectrum. The results are shown in Table 1.

Example 2 and Comparative Examples 1 to 4

The organic EL devices were fabricated and evaluated in the same manner as in Example 1 except that the compounds shown in Table 1 were used as the host material. The results are shown in Table 1.

TABLE 1

|  | Emitting layer | | | |
| --- | --- | --- | --- | --- |
|  | Host material | Dopant material | Driving Voltage (V) | EQE (%) |
| Example 1 | BH-1 | BD-1 | 3.56 | 7.1 |
| Example 2 | BH-2 | BD-1 | 3.52 | 6.9 |
| Comp. Ex. 1 | BH-A | BD-1 | 3.81 | 5.3 |
| Comp. Ex. 2 | BH-B | BD-1 | 3.62 | 5.5 |
| Comp. Ex. 3 | BH-C | BD-1 | 3.43 | 6.3 |
| Comp. Ex. 4 | BH-D | BD-1 | 3.51 | 5.0 |

From the results of Table 1, it can be seen that the organic EL devices of Examples 1 and 2 in which a specific host material and a specific dopant material are used in combination exhibit external quantum efficiencies of at least 0.6% and up to 2.1% higher than those of Comparative Examples 1 to 4.

Examples 3 and 4, and Comparative Examples 5 and 6

The organic EL devices were fabricated and evaluated in the same manner as in Example 1 except that the compounds shown in Table 2 were used as the host material and the dopant material. The results are shown in Table 2.

TABLE 2

|  | Emitting layer | | | |
| --- | --- | --- | --- | --- |
|  | Host material | Dopant material | Driving Voltage (V) | EQE(%) |
| Example 3 | BH-1 | BD-2 | 3.54 | 8.5 |
| Example 4 | BH-2 | BD-2 | 3.49 | 3.4 |
| Comp. Ex. 5 | BH-A | BD-2 | 3.80 | 6.9 |
| Comp. Ex. 6 | BH-B | BD-2 | 3.61 | 7.2 |

Compound BD-2 used as the dopant material is as follows.

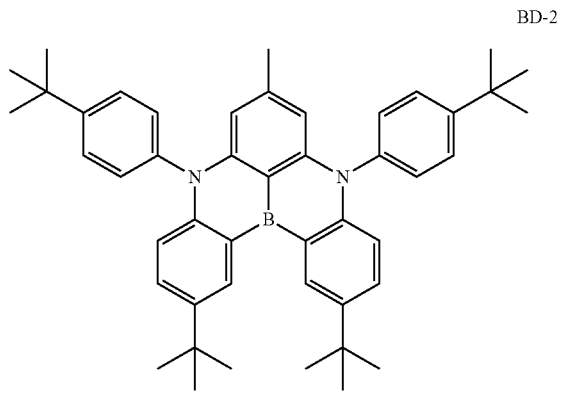 [SMILES: Cc1cc2c3c(c1)N(c1ccc(C(C)(C)C)cc1)c1ccc(C(C)(C)C)cc1B3c1cc(C(C)(C)C)ccc1N2c1ccc(C(C)(C)C)cc1]

BD-2

From the results of Table 2, it can be seen that the organic EL devices of Examples 3 and 4 in which a specific host material and a specific dopant material are used in combination exhibit external quantum efficiencies of at least 1.2% and up to 1.6% higher than those of Comparative Examples 5 and 6.

Examples 5 and 6, and Comparative Examples 7 and 8

The organic EL devices were fabricated and evaluated in the same manner as in Example 1 except that the compounds shown in Table 3 were used as the host material and the dopant material. The results are shown in Table 3.

TABLE 3

|  | Emitting layer | | | |
| --- | --- | --- | --- | --- |
|  | Host material | Dopant material | Driving Voltage (V) | EQE(%) |
| Example 5 | BH-1 | BD-3 | 3.53 | 8.1 |
| Example 6 | BH-2 | BD-3 | 3.47 | 8.0 |

TABLE 3-continued

|  | Emitting layer | | Driving Voltage (V) | EQE(%) |
|---|---|---|---|---|
|  | Host material | Dopant material | | |
| Comp. Ex. 7 | BH-A | BD-3 | 3.80 | 6.6 |
| Comp. Ex. 8 | BH-B | BD-3 | 3.60 | 6.9 |

Compound BD-3 used as the dopant material is as follows.

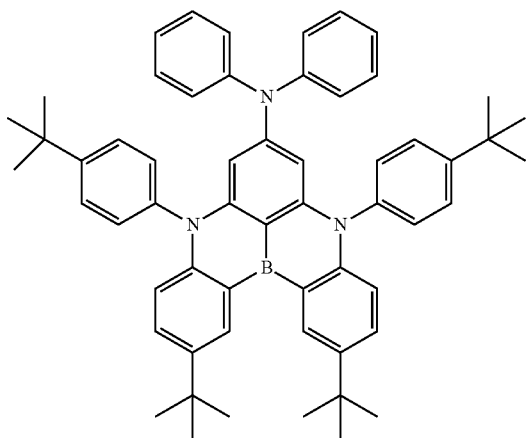

BD-3

From the results of Table 3, it can be seen that the organic EL devices of Examples 5 and 6 in which a specific host material and a specific dopant material are used in combination exhibit external quantum efficiencies at least 1.1% and up to 1.5% higher than those of Comparative Examples 7 and 8.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, many of these modifications are within the scope of the invention.

The invention claimed is:

1. An organic electroluminescence device, comprising:
a cathode;
an anode; and
an emitting layer disposed between the cathode and the anode,
wherein the emitting layer comprises a compound represented by the following formula (2) and a compound represented by the following formula (11):

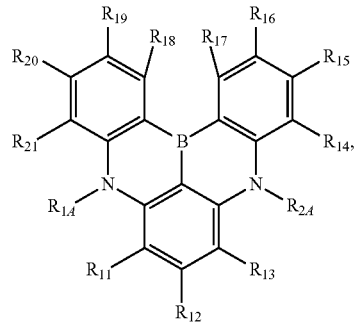

(2)

wherein in the formula (2), $R_{1A}$ forms a substituted or unsubstituted heterocyclic ring by bonding with one or more selected from the group consisting of $R_{11}$ and $R_{21}$, or do not form a substituted or unsubstituted heterocyclic ring;

$R_{2A}$ forms a substituted or unsubstituted heterocyclic ring by bonding with one or more selected from the group consisting of $R_{13}$ and $R_{14}$, or do not form a substituted or unsubstituted heterocyclic ring;

$R_{1A}$ and $R_{2A}$ which do not form the substituted or unsubstituted heterocyclic ring are independently a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms;

one or more sets of adjacent two or more among $R_{11}$ to $R_{21}$ form a substituted or unsubstituted, saturated or unsaturated ring by bonding with each other, or do not form a substituted or unsubstituted, saturated or unsaturated ring;

$R_{11}$ to $R_{21}$ which do not form the substituted or unsubstituted heterocyclic ring or the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$)($R_{907}$), a halogen atom, a cyano group, a nitro group, a substituted or unsubstituted aryl group including 6 to 50 ring carbon atoms, or a substituted or unsubstituted monovalent heterocyclic group including 5 to 50 ring atoms; and $R_{901}$ to $R_{907}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms;
when two or more of each of $R_{901}$ to $R_{907}$ are present, the two or more of each of $R_{901}$ to $R_{907}$ may be the same or different;

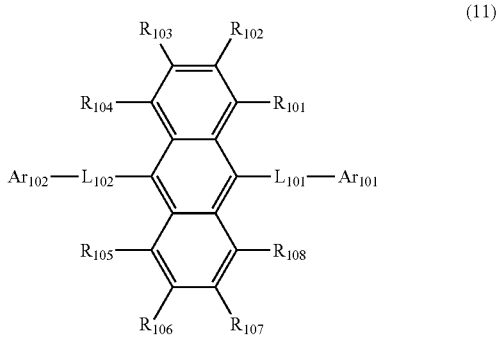

(11)

wherein in the formula (11),
$R_{101}$ to $R_{108}$ is independently
a hydrogen atom, a halogen atom, a cyano group, a nitro group,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
—N($R_{906}$)($R_{907}$),
a substituted or unsubstituted aryl group including 6 to 50 ring carbon atoms, or
a substituted or unsubstituted monovalent heterocyclic group including 5 to 50 ring atoms;
adjacent two or more among $R_{101}$ to $R_{104}$, and adjacent two or more among $R_{105}$ to $R_{108}$ do not form a ring by bonding with each other;
$R_{901}$ to $R_{907}$ are as defined in formula (2);
$L_{101}$ and $L_{102}$ are independently
a single bond,
a substituted or unsubstituted arylene group including 6 to 30 ring carbon atoms, or
a substituted or unsubstituted divalent heterocyclic group including 5 to 30 ring atoms;
at least one of $Ar_{101}$ and $Ar_{102}$ is a monovalent group represented by the following formula (12);
$Ar_{101}$ and $Ar_{102}$ which are not the monovalent groups represented by the following formula (12) are
a substituted or unsubstituted aryl group including 6 to 50 ring carbon atoms, or
a substituted or unsubstituted monovalent heterocyclic group including 5 to 50 ring atoms; and
when $Ar_{101}$ and $Ar_{102}$ are both the monovalent group represented by the following formula (12), $Ar_{101}$ and $Ar_{102}$ which are the monovalent groups represented by the following formula (12) may be the same as or different from each other:

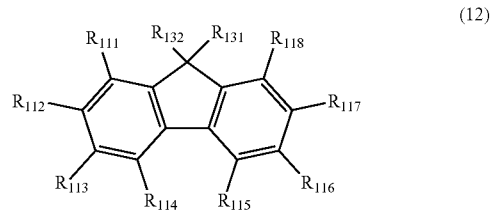

(12)

wherein in the formula (12),
$R_{131}$ and $R_{132}$ are independently
a hydrogen atom, a halogen atom, a cyano group, a nitro group,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms, or
a substituted or unsubstituted cycloalkyl group including 3 to 50 ring carbon atoms;
$R_{131}$ and $R_{132}$ do not form a ring by bonding with each other; and
one or more sets of adjacent two of $R_{111}$ to $R_{118}$ form an unsaturated ring represented by the following formula (20) by bonding with each other, or do not form the unsubstituted ring represented by the following formula (20):

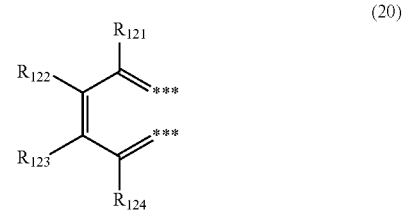

(20)

wherein in the formula (20), "***" indicates a position bonding to adjacent two among $R_{111}$ to $R_{118}$;
when one or more sets of adjacent two among $R_{111}$ to $R_{118}$ form the unsaturated ring represented by the formula (20) by bonding with each other, one of $R_{111}$ to $R_{118}$ which do not form the unsaturated ring represented by the formula (20) and $R_{121}$ to $R_{124}$ is a single bond bonding with $L_{101}$ or $L_{102}$;
when two or more unsaturated rings represented by the formula (20) are formed, a plurality of each of $R_{121}$ to $R_{124}$ may be the same as or different from each other;
when one or more sets of adjacent two among $R_{111}$ to $R_{118}$ do not form the unsaturated ring represented by the formula (20), one of $R_{111}$ to $R_{118}$ is a single bond bonding with $L_{101}$ or $L_{102}$;
in the case when the unsaturated ring represented by the formula (20) is formed and in the case when the unsaturated ring represented by the formula (20) is not formed, one or more sets of adjacent two among $R_{111}$ to $R_{118}$ which do not form the unsaturated ring represented by the formula (20) and are not a single bond bonding with $L_{101}$ or $L_{102}$ form a substituted or unsubstituted, saturated or unsaturated ring other than the unsaturated ring represented by the formula (20) or do not form a substituted or unsubstituted, saturated or unsaturated ring;

$R_{111}$ to $R_{118}$ which do not form the unsaturated ring represented by the formula (20), do not form a substituted or unsubstituted, saturated or unsaturated ring other than the unsaturated ring represented by the formula (20), and are not a single bond bonding with $L_{101}$ or $L_{102}$, and $R_{121}$ to $R_{124}$ which are not a single bond bonding with $L_{101}$ or $L_{102}$ are independently a hydrogen atom, a halogen atom, a cyano group, a nitro group, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$)($R_{907}$), a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formula (2).

2. The organic electroluminescence device according to claim 1, wherein $R_{1A}$ and $R_{2A}$ in the formula (2) are independently a substituted or unsubstituted aryl group including 6 to 50 ring carbon atoms, or a substituted or unsubstituted monovalent heterocyclic group including 5 to 50 ring atoms.

3. The organic electroluminescence device according to claim 1, wherein $R_{1A}$ and $R_{2A}$ in the formula (2) are independently a substituted or unsubstituted aryl group including 6 to 50 ring carbon atoms.

4. The organic electroluminescence device according to claim 1, wherein the compound represented by the formula (2) is a compound represented by the following formula (3):

wherein in the formula (3), $R_{31}$ forms a substituted or unsubstituted heterocyclic ring by bonding with $R_{46}$, or does not form a substituted or unsubstituted heterocyclic ring;

$R_{33}$ forms a substituted or unsubstituted heterocyclic ring by bonding with $R_{47}$, or does not form a substituted or unsubstituted heterocyclic ring;

$R_{34}$ forms a substituted or unsubstituted heterocyclic ring by bonding with $R_{51}$, or does not form a substituted or unsubstituted heterocyclic ring;

$R_{41}$ forms a substituted or unsubstituted heterocyclic ring by bonding with $R_{42}$, or does not form a substituted or unsubstituted heterocyclic ring;

one or more sets of adjacent two or more among $R_{31}$ to $R_{51}$ form a substituted or unsubstituted, saturated or unsaturated ring by bonding with each other, or do not form a substituted or unsubstituted, saturated or unsaturated ring;

$R_{31}$ to $R_{51}$ which do not form the substituted or unsubstituted heterocyclic ring or the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$)($R_{907}$), a halogen atom, a cyano group, a nitro group, a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formula (2).

5. The organic electroluminescence device according to claim 4, wherein $R_{31}$ to $R_{51}$ in the formula (3) are independently a hydrogen atom, a substituted or unsubstituted alkyl group including 1 to 50 carbon atoms, a substituted or unsubstituted aryl group including 6 to 50 ring carbon atoms, or a substituted or unsubstituted monovalent heterocyclic group including 5 to 50 ring atoms.

6. The organic electroluminescence device according to claim 4, wherein the compound represented by the formula (3) is a compound represented by the following formula (3A):

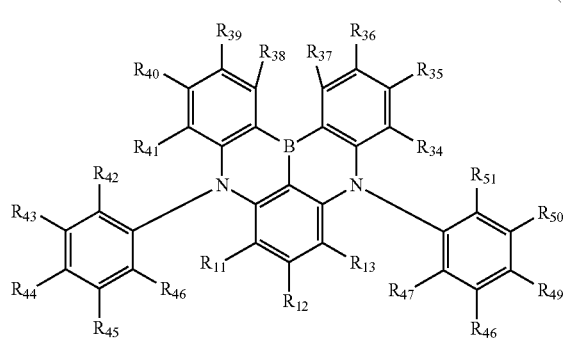

(3)

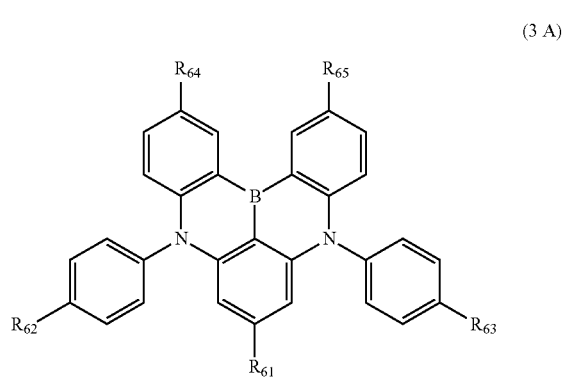

(3A)

wherein in the formula (3A), $R_{61}$ is a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, or a substituted or unsubstituted aryl group including 6 to 50 ring carbon atoms; and $R_{62}$ to $R_{65}$ are independently a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, or a substituted or unsubstituted aryl group including 6 to 50 ring carbon atoms.

7. The organic electroluminescence device according to claim 4, wherein the compound represented by the formula (3) is a compound represented by the following formula (3B):

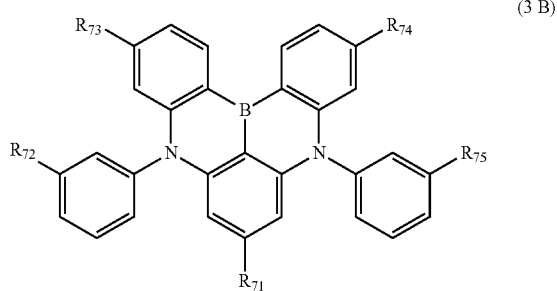

(3 B)

wherein in the formula (3B), $R_{71}$ and $R_{72}$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —N($R_{906}$)($R_{907}$), or a substituted or unsubstituted aryl group including 6 to 50 ring carbon atoms;

$R_{73}$ to $R_{75}$ are independently a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —N($R_{906}$) ($R_{907}$), or a substituted or unsubstituted aryl group including 6 to 50 ring carbon atoms; and $R_{906}$ and $R_{907}$ are as defined in the formula (2).

8. The organic electroluminescence device according to claim 4, wherein the compound represented by the formula (3) is a compound represented by the following formula (3C):

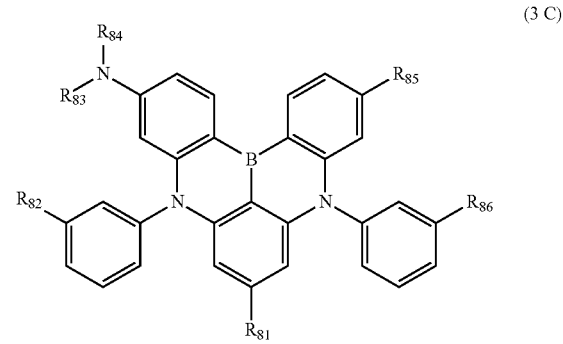

(3 C)

wherein in the formula (3C), $R_{81}$ and $R_{82}$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, or a substituted or unsubstituted aryl group including 6 to 50 ring carbon atoms; and $R_{83}$ to $R_{86}$ are independently a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, or a substituted or unsubstituted aryl group including 6 to 50 ring carbon atoms.

9. The organic electroluminescence device according to claim 1, wherein one of $Ar_{101}$ and $Ar_{102}$ in the formula (11) is a monovalent group represented by the formula (12).

10. The organic electroluminescence device according to claim 1, wherein the compound represented by the formula (11) is a compound represented by the following formula (13):

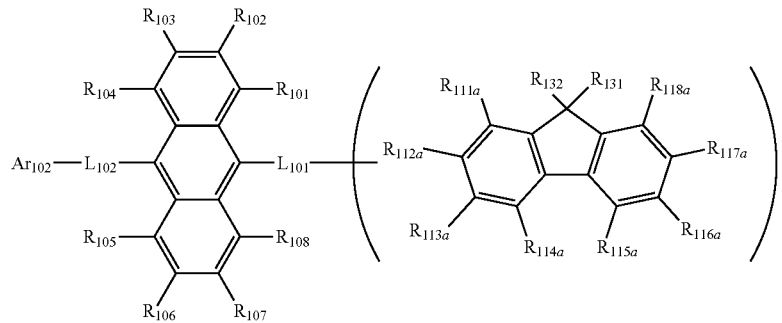

(13)

wherein in the formula (13), $R_{101}$ to $R_{108}$, $L_{101}$ and $L_{102}$ are as defined in the formula (11);

$Ar_{102}$ is a monovalent group represented by the formula (12), a substituted or unsubstituted aryl group including 6 to 50 ring carbon atoms, or a substituted or unsubstituted monovalent heterocyclic group including 5 to 50 ring atoms;

$R_{131}$ and $R_{132}$ are as defined in the formula (12);

one of $R_{112a}$ to $R_{114a}$ is a single bond bonding with $L_{101}$;

one or more sets of adjacent two among $R_{111a}$; $R_{112a}$ to $R_{114a}$ which are not a single bond bonding with $L_{101}$; and $R_{115a}$ to $R_{118a}$ form an unsaturated ring represented by the formula (20) by bonding with each other, or do not form an unsaturated ring represented by the formula (20);

$R_{111a}$; $R_{112a}$ to $R_{114a}$ which are not a single bond bonding with $L_{101}$ and do not form an unsaturated ring represented by the formula (20); and $R_{115a}$ to $R_{118a}$ which do not form an unsaturated ring represented by the formula (20) are independently a hydrogen atom, a halogen atom, a cyano group, a nitro group, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$)($R_{907}$), a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formula (2).

11. The organic electroluminescence device according to claim 1, wherein the compound represented by the formula (11) is a compound represented by the following formula (14):

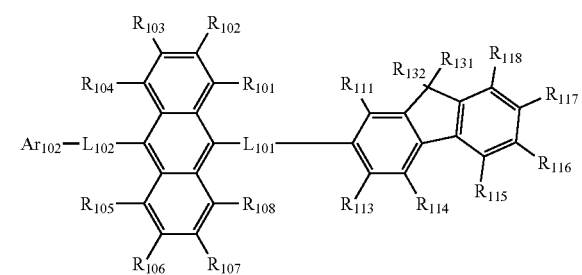

(14)

wherein in the formula (14), $R_{101}$ to $R_{108}$, $L_{101}$, $L_{102}$, $R_{111}$, $R_{113}$ to $R_{118}$, $R_{131}$ and $R_{132}$ are as defined in any of the formulas (11) and (12); and $Ar_{102}$ is a monovalent group represented by the formula (12), a substituted or unsubstituted aryl group including 6 to 50 ring carbon atoms, or a substituted or unsubstituted monovalent heterocyclic group including 5 to 50 ring atoms.

12. The organic electroluminescence device according to claim 1, wherein one of $Ar_{101}$ and $Ar_{102}$ in the formula (11) is a monovalent group represented by the formula (12) and the other is a substituted or unsubstituted aryl group including 6 to 50 ring carbon atoms.

13. The organic electroluminescence device according to claim 1, wherein $Ar_{101}$ or $Ar_{102}$ in the formula (11) which is not a monovalent group represented by the formula (12) is selected from groups represented by each of the following formulas (a1) to (a4):

(a1)

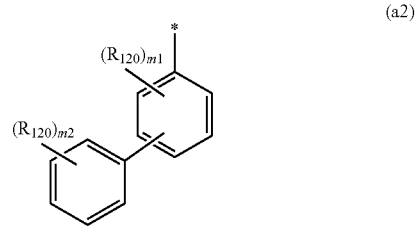

(a2)

-continued (a3)

(a4)

wherein in the formulas (a1) to (a4), "*" is a single bond bonding with $L_{101}$ or $L_{102}$;

$R_{120}$ is a halogen atom, a cyano group, a nitro group, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$)($R_{907}$), a substituted or unsubstituted aryl group including 6 to 50 ring carbon atoms, or a substituted or unsubstituted monovalent heterocyclic group including 5 to 50 ring atoms;

$R_{901}$ to $R_{907}$ are as defined in the formula (2);

m1 is an integer of 0 to 4;

m2 is an integer of 0 to 5;

m3 is an integer of 0 to 7;

when each of m1 to m3 is 2 or more, a plurality of $R_{120}$'s may be the same as or different from each other; and when each of m1 to m3 is 2 or more, a plurality of adjacent $R_{120}$'s form a substituted or unsubstituted, saturated or unsaturated ring by bonding with each other, or do not form a substituted or unsubstituted, saturated or unsaturated ring.

14. The organic electroluminescence device according to claim 1, wherein $L_{101}$ and $L_{102}$ in the formula (11) are independently a substituted or unsubstituted arylene group including 6 to 14 ring carbon atoms.

15. The organic electroluminescence device according to claim 1, wherein $R_{131}$ and $R_{132}$ in the formula (12) are independently a substituted or unsubstituted alkyl group including 1 to 10 carbon atoms.

16. The organic electroluminescence device according to claim 1, wherein the compound represented by the formula (11) is a compound represented by the following formula (15):

(15)

wherein in the formula (15), $R_{101}$ to $R_{108}$ and $L_{102}$ are as defined in the formula (11);

$Ar_{102}$ is a monovalent group represented by the formula (12), a substituted or unsubstituted aryl group including 6 to 50 ring carbon atoms, or a substituted or unsubstituted monovalent heterocyclic group including 5 to 50 ring atoms; and $R_{111}$, $R_{113}$ to $R_{118}$, $R_{131}$, and $R_{132}$ are as defined in the formula (12).

17. The organic electroluminescence device according to claim 1, wherein $R_{101}$ to $R_{108}$ in the formula (11) are hydrogen atoms.

18. The organic electroluminescence device according to claim 1, wherein $R_{111}$ to $R_{118}$ in the formula (12) which are not a single bond bonding with $L_{101}$ are hydrogen atoms.

19. The organic electroluminescence device according to claim 1, wherein one set of $R_{111}$ and $R_{112}$, $R_{112}$ and $R_{113}$, $R_{113}$ and $R_{114}$, $R_{115}$ and $R_{116}$, $R_{116}$ and $R_{117}$, and $R_{117}$ and $R_{118}$ in the formula (12) forms a substituted or unsubstituted, saturated or unsaturated ring by bonding with each other.

20. The organic electroluminescence device according to claim 1, wherein the compound represented by the formula (11) is a compound represented by the following formula (18):

(18)

wherein in the formula (18), $L_{101a}$ and $L_{102a}$ are independently a single bond, or a substituted or unsubstituted arylene group including 6 to 10 ring carbon atoms;

$Ar_{102a}$ is a substituted or unsubstituted aryl group including 6 to 10 ring carbon atoms; and $R_{131a}$ and $R_{132a}$ are independently a hydrogen atom, a substituted or unsubstituted aryl group including 1 to 18 ring carbon atoms, or a substituted or unsubstituted alkyl group including 1 to 10 carbon atoms.

21. The organic electroluminescence device according to claim 1, further comprising a hole-transporting layer between the anode and the emitting layer.

22. The organic electroluminescence device according to claim 1, further comprising an electron-transporting layer between the cathode and the emitting layer.

23. An electronic appliance provided with the organic electroluminescence device according to claim 1.

* * * * *